US005347126A

United States Patent [19]

Krauss et al.

[11] Patent Number: 5,347,126

[45] Date of Patent: Sep. 13, 1994

[54] TIME-OF-FLIGHT DIRECT RECOIL ION SCATTERING SPECTROMETER

[75] Inventors: Alan R. Krauss, Naperville; Dieter M. Gruen, Downers Grove; George J. Lamich, Orland Park, all of Ill.

[73] Assignee: ARCH Development Corporation, Chicago, Ill.

[21] Appl. No.: 908,282

[22] Filed: Jul. 2, 1992

[51] Int. Cl.[5] ............ H01J 37/147

[52] U.S. Cl. ............ 250/309; 250/287

[58] Field of Search ............ 250/309, 287, 396 R

[56] References Cited

U.S. PATENT DOCUMENTS

| | | | |
|---|---|---|---|
| 3,889,115 | 6/1975 | Tamura et al. | 250/309 |
| 4,296,323 | 10/1981 | Gerlach | 250/309 |
| 4,785,172 | 11/1988 | Kubena et al. | 250/309 |
| 5,068,535 | 11/1991 | Rabalais | 250/309 |
| 5,087,815 | 2/1992 | Schultz et al. | 250/309 |
| 5,166,521 | 11/1992 | Hayashi et al. | 250/309 |
| 5,182,453 | 1/1993 | Hayashi | 250/309 |

*Primary Examiner*—Bruce C. Anderson

*Attorney, Agent, or Firm*—Reinhart, Boerner, Van Deuren, Norris & Rieselbach

[57] ABSTRACT

A time of flight direct recoil and ion scattering spectrometer beam line (10). The beam line (10) includes an ion source (12) which injects ions into pulse deflection regions (14) and (16) separated by a drift space (18). A final optics stage includes an ion lens and deflection plate assembly (22). The ion pulse length and pulse interval are determined by computerized adjustment of the timing between the voltage pulses applied to the pulsed deflection regions (14) and (16).

25 Claims, 10 Drawing Sheets

Fig. 9A
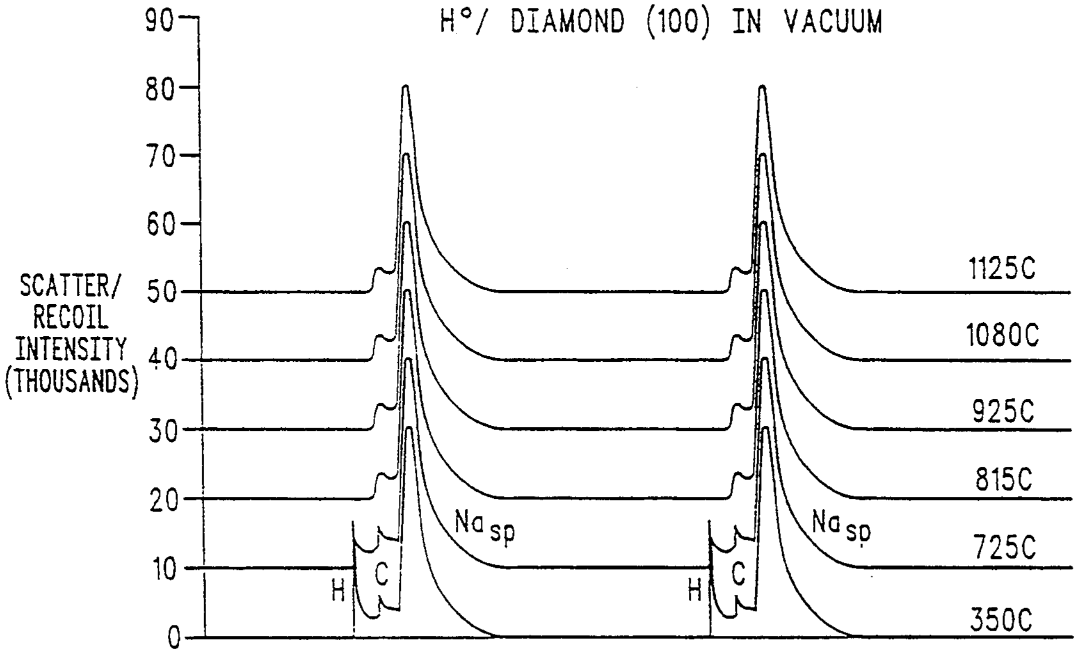
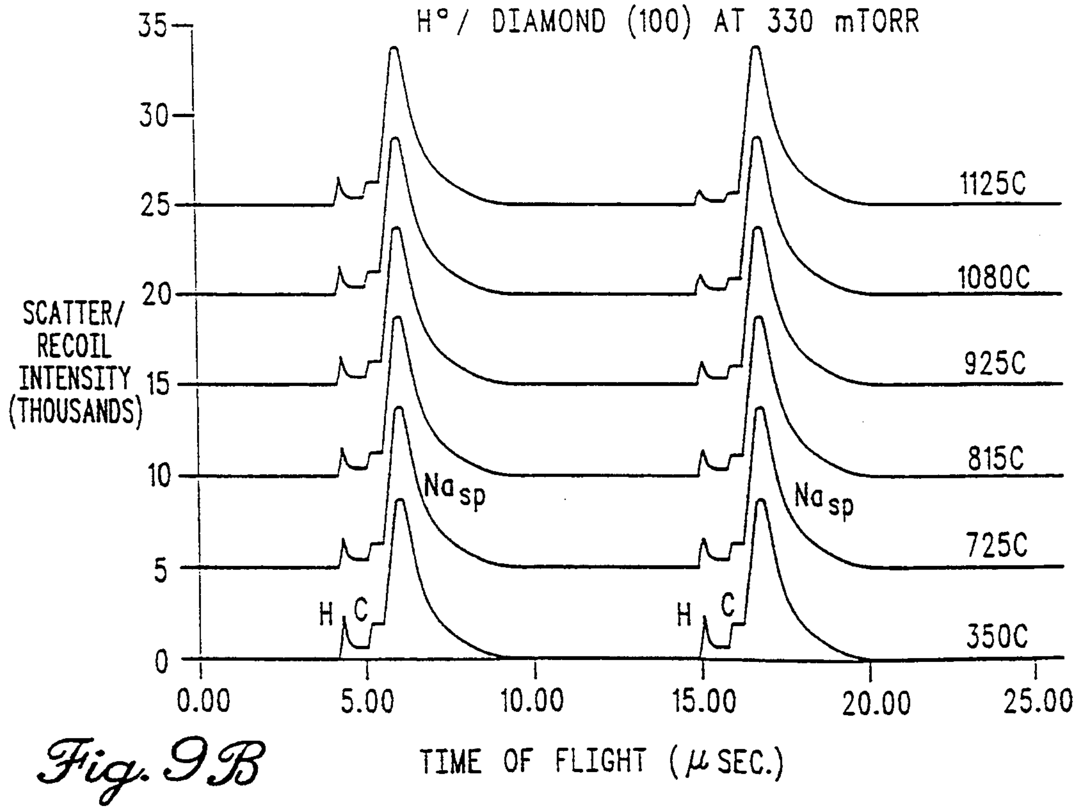
Fig. 9B

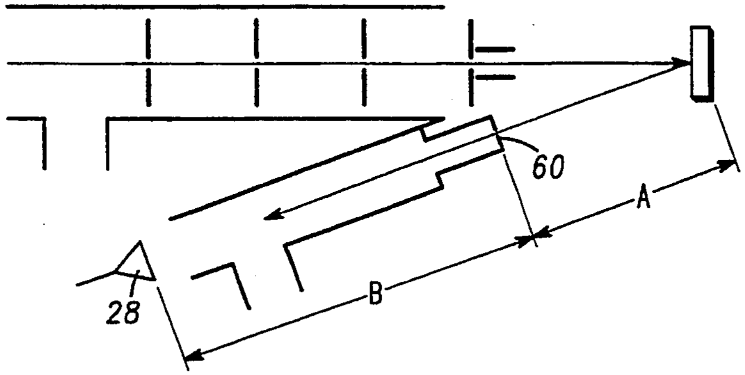
Fig. 13
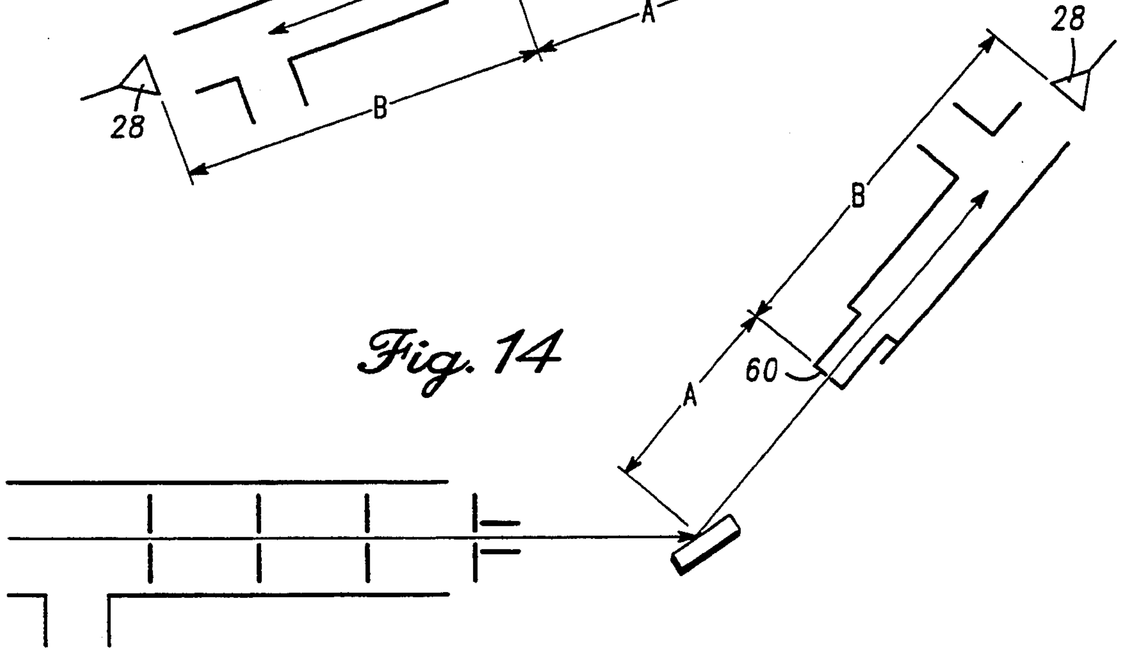
Fig. 14
Fig. 15
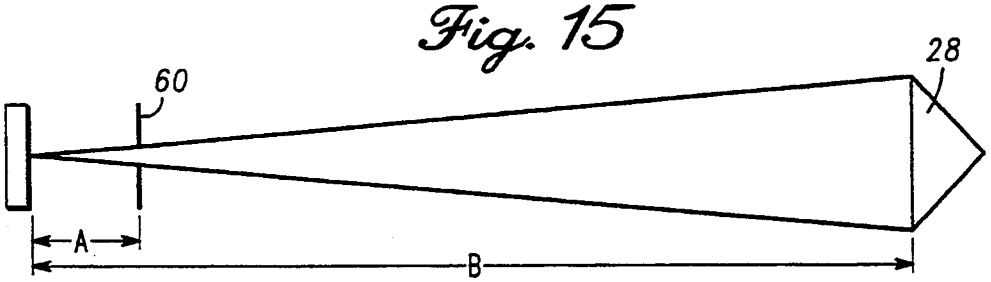
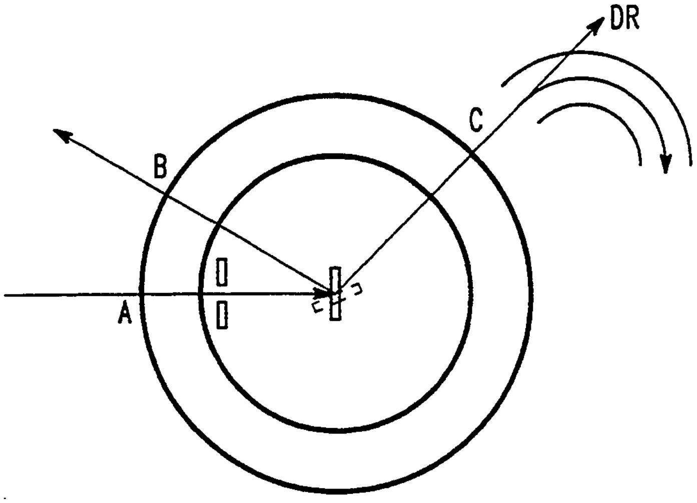
Fig. 16

TIME-OF-FLIGHT DIRECT RECOIL ION SCATTERING SPECTROMETER

This invention was made with Government support under Contract No. W-31-109-ENG-38 awarded by the Department of Energy. The Government has certain rights in this invention.

There are a number of analysis techniques which are able to characterize the surface properties of thin films and bulk materials. This capability is particularly important during the growth of thin films in which there are a plurality of components. Factors such as relative deposition rates of the various species, migration of materials at the surface, differences between surface and sub-surface composition, compositional and thickness uniformity, and nucleation of growth sites are of key importance in determining film properties. For multicomponent films, and particularly for multicomponent films which are grown in an atmosphere of e.g. oxygen or nitrogen, precise control of film properties depends on the ability to monitor the growth process as it occurs. The high temperature superconducting oxides, such as $YBa_2Cu_3O_{7-x}$, and wear-resistant materials, such as TiN and BN, are examples of such materials.

In order to characterize the process occurring at the surface of a growing film, it is necessary to probe the first few atomic layers, and in principle to identify the uppermost monolayer where the growth occurs. Most surface analysis methods however, are unsuitable as in-situ monitors of thin film deposition processes because they either (1) require ultra-high vacuum ($<10^{-8}$ Torr) to operate, (3) physically obstruct the deposition process, (3) take too long to acquire data, or (4) cause significant damage to the film they are trying to characterize. There are several analysis techniques which utilize relatively collimated beams and therefore do not interfere with the deposition process. Reflection High Energy Electron Diffraction (RHEED) utilizes elastically scattered electrons with a kinetic energy in the range of 20 keV. This energy is high enough to provide a reasonably long electron mean free path. RHEED is therefore widely used in molecular beam epitaxy (MBE) systems where the ambient pressure during deposition is relatively low. RHEED provides a measure of the lattice spacing in the direction normal to the substrate, but provides no chemical identification and no information on short-range phenomena such as pinhole formation.

Low energy (5–15 keV) pulsed beam Ion Scattering Spectroscopy (ISS) and Direct Recoil Spectroscopy (DRS) are surface analytical tools which possess the ability to provide a remarkably wide range of information directly relevant to the growth of multi-component semiconductor, metal and metal oxide thin films and layered structures. Ion beam methods have not been widely used for monitoring thin film growth processes however, because the designs of existing commercial instrumentation are unsuitable for the purpose. The inventors have determined that pulsed ion beam surface analysis techniques, if properly implemented, may be used to circumvent these and other problems for application to thin film deposition as well as other processes such as gas phase-surface reactions. This invention disclosure describes an implementation of pulsed ion beam surface analysis which circumvents problems associated with the use of other forms of surface analysis techniques for in-situ analysis purposes, as well as with other implementations of ion beam surface analysis. Additionally, the instrument described provides unique capabilities aside from the application as a monitor of thin film growth and gas phase-surface reaction processes.

The method of ion beam surface analysis generally consists of directing an ion beam of mass $M_1$, kinetic energy $E_o$ at the surface, which is comprised of atoms with mass $M_2$, and detecting either the backscattered primary particles at energy $E_1$ (ISS), or the direct recoil-sputtered surface atoms (DRS) with energy $E_2$. For primary ions in the approximate range 1–100 keV, the primary ion-target atom collisions are adequately described by two-body classical collision dynamics. The kinetic $E_1$ energy of the scattered primary is then given by:

$$E_1=(1+a)^{-2}\,[\cos q_1+(a^2-\sin^2 q_1)^{\frac{1}{2}}]^2 \quad (1)$$

provided $M2>M1$. The kinetic energy $E_2$ of the recoil-sputtered surface atom is $$E_2=4a(1+a)^{-2}\cos^2 q_2 \quad (2)$$

where $a=M2/M1$ and $q_1$ and $q_2$ are the scattering and recoil angles, respectively.

For in-situ thin film analysis, it is necessary to obtain the data over periods of time which are short compared with the time required for the thin film deposition process, using ion beam doses which result in negligible sputtering or other modification of the surface being studied. Since there are roughly $10^{15}$ atoms/cm$^2$ at the surface of a typical solid, a nondamaging dose is approximately $10^{13}$ ions/cm$^2$. Low beam dose and rapid data acquisition are key requirements for real-time, low damage in-situ analysis of thin film growth.

Existing ion scattering spectrometers fall into one of two broad design types: (1) electrostatic energy analyzers (ESA) using DC ion beam currents and detection of the scattered ions only, and (2) time-of-flight (ToF) analyzers using pulsed ion beams with detection of either scattered ions or neutrals. There are no commercially available DRS analyzers.

Commercially available ISS analyzers are all of the electrostatic type which acquire data corresponding only to the scattered ions which constitute $10^{-1}$ to $10^{-3}$ of the total scattered flux. Furthermore, since the electrostatic analyzer only transmits a small portion of the spectrum at any one time, the data acquisition rate is very low and a very high ion dose is required to produce a spectrum. Consequently, the surface undergoes substantial bombardment leading to ion beam damage. The ion beams are operated in the DC mode and are readily focusable. However, it is not desirable to focus down to a small spot size in order to obtain spatially resolved data for two reasons: (1) the required ion dose per unit area would be so high that the surface would have been destroyed before its composition could be measured; and (2) spatially-resolved elemental mapping would take so long that it would not be practical.

The ToF-ISS method consists of directing a pulsed beam of energetic ions onto the surface of the sample, and measuring the arrival times of the scattered primary particles, most of which are scattered as neutral atoms. By pulsing the beam repeatedly, a spectrum containing information on all masses is collected. The data acquisition procedure is not limited to one surface species at a time, and spectra can be accumulated with a much smaller ion dose and consequently smaller surface damage than with the ESA. Since the ToF scheme, independently detects both ions and neutrals, whereas the ESA detects only the ion fraction of the scattered/recoil sputtered atoms, an overall 3–4 order of magnitude increase in sensitivity (or an equivalent 3–4 order of magnitude reduction in beam damage and data acquisition time) is achieved compared with electrostatic analyzers.

If the scattered neutrals are detected, the ToF-ISS method has a depth sensitivity of three to five atomic layers. However, since the neutralization probability for an ion penetrating more than one monolayer into the solid is nearly unity, the detection of the ion species provides a sensitivity only to the uppermost atomic layer of the solid. This capability is unique among surface analytical techniques. Furthermore, by varying the angle of incidence of the primary beam so that atoms in the second and third layers are "shadowed" by atoms in the first layer, it is possible to determine the distance and bond angle between atoms in the first few atomic layers. Therefore, ToF-ISS is not only capable of measuring the average lattice spacing, but unlike the more conventionally used MEED, it is element specific, and can thus map out the detailed crystal structure of the first several atomic layers.

The shape of the scattering peak for any given element, and the variation of that shape with primary beam energy and angle of incidence is related to both the lattice defect density, and the concentration variation of that species with depth over the first several atomic layers. Varying the angle of ion beam incidence from grazing to normal shows pronounced intensity oscillations in the signal corresponding to subsurface atoms, resulting in peaks which may be identified with specific lattice sites. However, atomic species which reside solely on the surface display no intensity variation with angle of incidence. It is therefore possible to distinguish between atomic species which truly reside on the surface from species for which the concentration varies with depth. By varying both the azimuthal and polar angle of incidence, it has been demonstrated by others that it is possible to generate atomic images similar in information content to those produced by the Scanning Tunneling Microscope.

By placing a detector in the forward scattering direction, surface atoms ejected by direct recoil sputtering are seen in addition to the scattered primary beam. Detection of these recoil-sputtered atoms constitutes the basis of the closely related Direct Recoil Spectroscopy (DRS) analysis technique. ISS provides no signal for ions lighter than the probe beam, but DRS is one of the few surface analytical techniques which is sensitive to helium and hydrogen, and is able to distinguish between H and D at levels down to about 1%.

Because of the long source-detector distances associated with the ToF detection scheme, the analysis method does not interfere with the equipment required for the thin film deposition process. The scattering mean free path of low keV ions is much longer than that of the sub-keV electrons, and ToF-DR/ISS is therefore much more tolerant of high background pressures than analytical methods based on the emission of electrons from the surface. It is also possible to provide differential pumping of the incoming and outgoing ion beam paths to extend the pressure limits of the ToF ion beam techniques even further. This capability has been demonstrated by others for diamond-like films during growth by Low Pressure Chemical Vapor Deposition (LPCVD) at pressures up to 1 Torr, and hydrogen adsorption has been measured on (100) diamond at ambient pressures up to 330 mTorr with very little loss of resolution. This represents six to eight orders of magnitude increase in the permissible operating pressure compared with other surface analytical methods.

One of the most obvious uses of an in-situ thin film surface analysis technique is to monitor the composition of the growing film. By simultaneously collecting signal corresponding to both the scattered neutrals and scattered ions, compositional information may be obtained for both the immediate surface and subsurface species. In either case, however, the data is more surface-specific than that produced by other "surface" analysis techniques such as Auger electron spectroscopy. This situation is evident in the 10 keV $Ne^+$ NSS spectrum obtained with the instant invention (FIG. 10) for sulfur which has segregated to the surface of a stainless steel 304 sample. Although S is the dominant species in this spectrum, an Auger spectrum taken on the same sample shows a 6:1 Fe:S ratio. The ISS data is more surface-specific than the Auger data, which samples the iron over an e-folding length of approximately 10 Å. The large S signal in the ISS spectrum therefore confirms the theoretical expectation that segregated S is localized at the uppermost atomic layer.

There are, however, a number of shortcomings associated with existing TOF designs:

1. A number of different species may be used for the primary ion beam. The "best" primary ion is a trade-off between sensitivity and mass resolution, and is also determined by the lowest mass which must be detected. Ideally, the pulse length and pulse repetition rate should be optimized for each primary ion mass and energy. In practice, because of the way in which the pulses are generated in conventional ToF instruments, it is necessary to preset the apertures in the beam line to give the desired time resolution, and to set the pulse repetition rate to match the slowest (i.e., heaviest and lowest kinetic energy) ion species which will be used by the system. The only control available to the operator is the frequency of the oscillatory waveform which drives the beam pulsing. The use of a fixed waveshape with variable frequency as the beam deflection voltage results in a compromise which limits the pulse repetition rate, number of ions per pulse and the attainable mass resolution;

2. In order to offset the resulting limitations on the number of ions per pulse, a rectangular beam spot, which may cover the full length of the sample, is often used. In most existing configurations, this beam spot also sweeps across the width of the sample as the pulse is generated. It is therefore not possible to generate a spatially resolved image of the elemental distribution on the sample or even to analyze a specific area of the sample; and 3. Since the mass resolution of the signal depends on the fact that all detected ions must lie within a relatively well-defined solid angle, good mass resolution is obtainable only at the expense of very low signal collection efficiency. The detector in a typical TOF instrument collects $10^{-4}$–$10^{-5}$ of the total scattered particles. Various features of the preferred embodiment are illustrated by way of comparison with other prior art systems in Table I.

It is, therefore, an object of the invention to provide an improved time of flight direct recoil/ion scattering spectrometer.

It is another object of the invention to provide a novel pulsed time of flight spectrometer.

It is yet a further object of the invention to provide an improved time of flight spectrometer having improved data collection and analysis features.

It is still another object of the invention to provide a novel ion scattering spectrometer and/or microscope.

It is an additional object of the invention to provide an improved time of flight direct recoil/ion scattering spectrometer with very high data acquisition rate and high mass resolution.

It is yet a further object of the invention to provide novel spectrometer for reducing the ion beam damage caused the analysis beam.

It is another object of the invention to provide a novel pulsed time of flight spectrometer with flexible operating parameters to maximize the usefulness of various modes operation.

It is yet a further object of the invention to provide improved time of flight spectrometer having improved data collection and analysis features.

It is an additional object of the invention to provide a novel method and apparatus for performing practical means surface analysis for samples immersed in an atmosphere at an ambient pressure which would make other surface analytical procedures impossible.

It is still another object of the invention to provide a novel ion scattering spectrometer and/or microscope.

It is a final object of the invention to do all of the above in a non-intrusive manner, being therefore compatible with fabrication and processing procedures such as thin film deposition or gas phase-surface reactions.

Other advantages and objects of the invention will become apparent from the detailed description of the method and apparatus and the drawings below, wherein like features have like numerals throughout the several drawings.

BRIEF DESCRIPTION OF THE DRAWINGS

FIGS. 9A–B show a prior art DR analysis of diamond samples in vacuum versus 330 mtorr;

FIG. 13 shows a double pulse edge transmission (DPET) beam line;

FIG. 14 illustrates a beam line with a "sniffer tube" component; and

FIG. 15 shows relational distance parameters among sample, apertures and detectors.

FIG. 16 illustrates the current practice for differentially pumped pulsed ion beam analysis.

DETAILED DESCRIPTION OF PREFERRED EMBODIMENTS

Figure 1A:
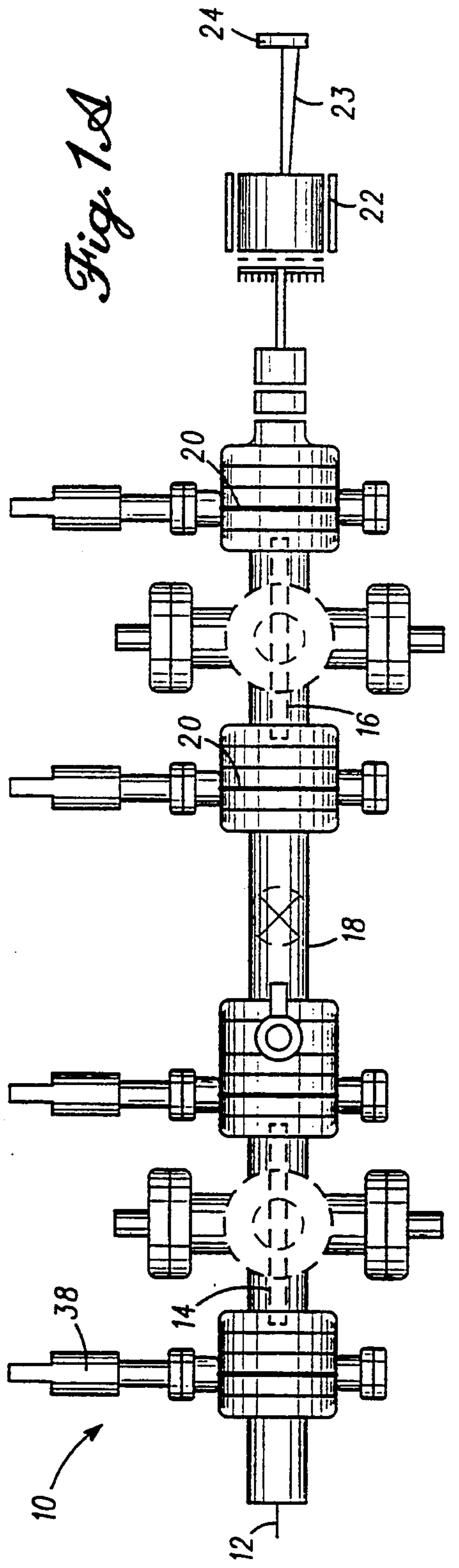
FIG. 1A illustrates a dual deflection pulsed ion beam line.

Because of the manner in which data is collected and the way the beam is pulsed in practicing the invention, we are able to effect significant improvements in all of the three problem areas described herein before. An ion beam line 10 (see FIG. 1A) consists of an Atomika Corp. telefocus ion source 12 injecting a 5–12 keV mass-analyzed ion beam into a transfer tube which includes two pulsed deflection regions 14 and 16, separated by a drift space 18 containing a small set of DC x-y correction plates. Each deflection region is terminated by a pair of apertures selected from among a choice of six sizes ranging from 250 microns to 4 mm in diameter on a movable aperture plate 20.

A final optics stage consisting of an ion lens and deflection plate assembly 22 is added for demagnifying the image of the final aperture and rastering beam 23 to produce a uniform current density over the analyzed area 24. The ion pulse length and interval between pulses are determined by adjusting the timing between the voltage pulses applied to the two sets of deflection plates. The timing sequence is complex, but is under computer control to provide a transparent interface so that the user may specify whatever pulse length he desires in order to optimize the data collection needs of the experiment. This flexibility provides great control over the type of information which can be obtained from the data. An attached Appendix sets forth computer software used to carry out the timing sequence described.

In the preferred embodiment, the interval between successive beam pulses is dynamically set for each combination of ion beam mass and energy to provide the maximum repetition rate consistent with clean separation of the data arising from consecutive ion beam pulses. Insofar as is practical, the deflection plates 14 and 16 run the entire length of the deflection region. This design feature ensures that fringe field effects do not introduce longitudinal velocity components to the beam 23 which would result in degraded temporal and spatial resolution of the beam pulse. The use of an ion source which produces a paraxial beam, coupled with the absence of fringing field effects makes it possible to use relatively simple ion optics to achieve a well-defined beam spot diameter ranging from the selected aperture size (250 microns to 4 mm) to less than 1 micron in diameter. As discussed below, the usable spot size is limited by the damage threshold of the sample and by relatively minor "tail" effects associated with the beam pulsing. Consequently we have been able to design a ToF Ion Scattering Microscope with an anticipated spatial resolution of a few microns.

One form of a data acquisition system 26 consists of two 8 channel, 100 MHz scalers and five detectors (see FIGS. 4 and 5), of which four are differentially pumped small area detectors of channeltron multipliers 28 with an entrance cone 1 cm in diameter. These detectors 28 are positioned 50 cm from sample 30, and have a geometric collection efficiency of $5\times10^{-5}$. Two of the small area detectors 28 are in the backscattering direction, one off-axis and the other in line of sight with the sample 38, permitting simultaneous detection of both ion and neutral backscattering signals. It is useful to refer to the latter signal as the "Neutral Scattering Spectroscopy" (NSS) signal. The other two small area detectors 28 are in the forward direction, where they function as Direct Recoil (DR) detectors.

Conventional ISS instruments using large area detectors are able to gain data acquisition speed only at the expense of reduced angular (and consequently mass) resolution. The fifth detector of the instant invention is a 40 mm dia. channel plate 32 with a segmented anode collector consisting of 8 concentric rings, each connected to a separate preamplifier and discriminator. The most preferred sample-detector distance is ½ that of the small area detectors, providing 4× the count rate/$cm^2$ of detector area.

The data acquisition package for the described system uses custom-designed electronics to partition a commercial histogram memory 34 into eight sections, each section corresponding to a separate data channel of the 100 MHz scalers. Consequently, each of the eight independent data channels sees only a small range of scattering angles and consequently represents a well-defined mass corresponding to a given time-of-flight. An instrument control computer 36 deconvolutes the signals from the eight data channels to produce a single composite spectrum with the same mass resolution as the small area detector, while the data acquisition rate is increased by a factor of sixty-four, resulting in a geometric detection efficiency of $3.2\times10^{-3}$.

Figure 1B:
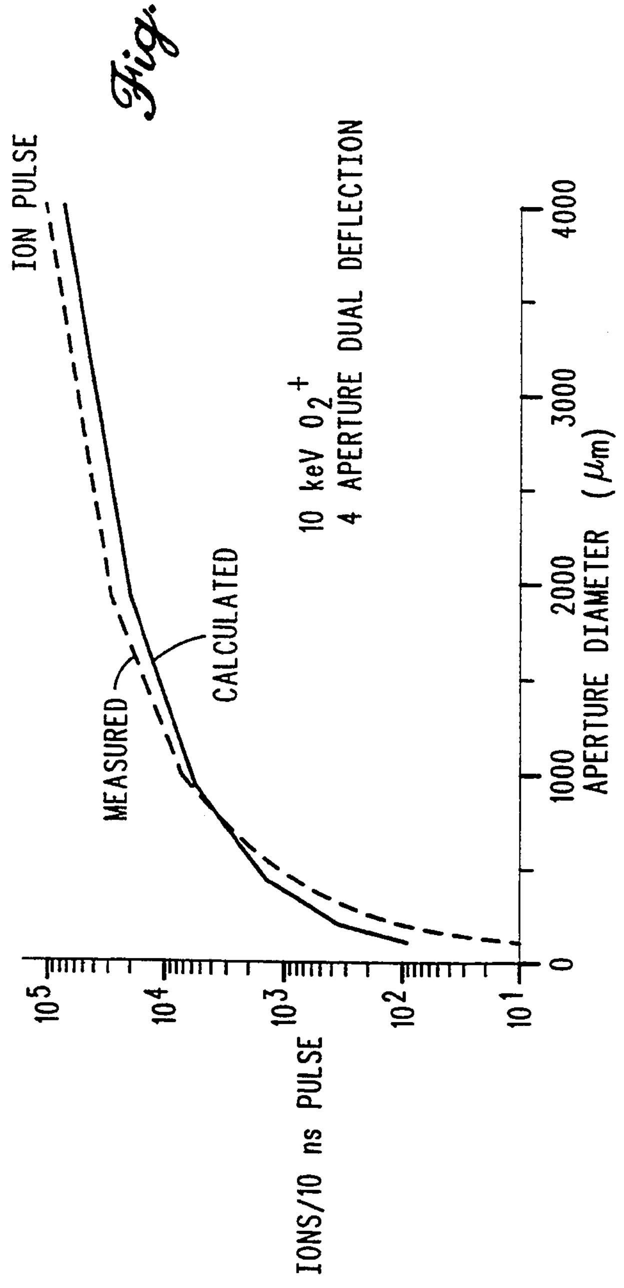
FIG. 1B shows the number of ions transmitted per 10 ns pulse to the sample versus aperture diameter.
Figure 2A:
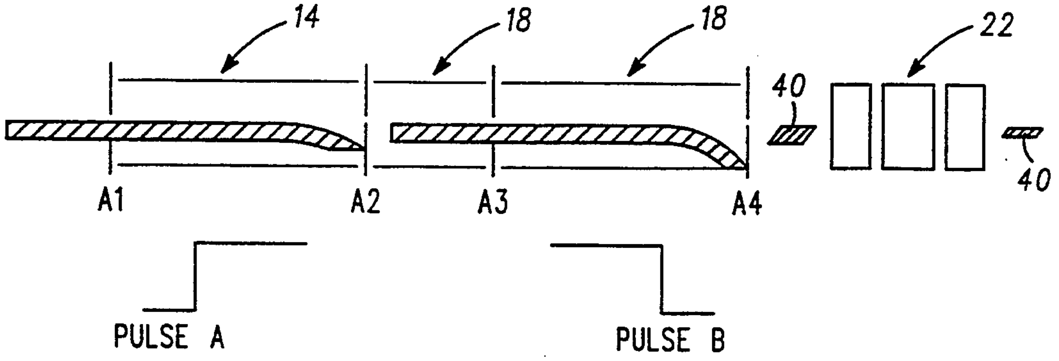
FIG. 2A shows the ion beam path corresponding to the illustrated plate deflection voltage pulses and FIG. 2B shows details of pulse timing in FIG. 2A.
Figure 2B:
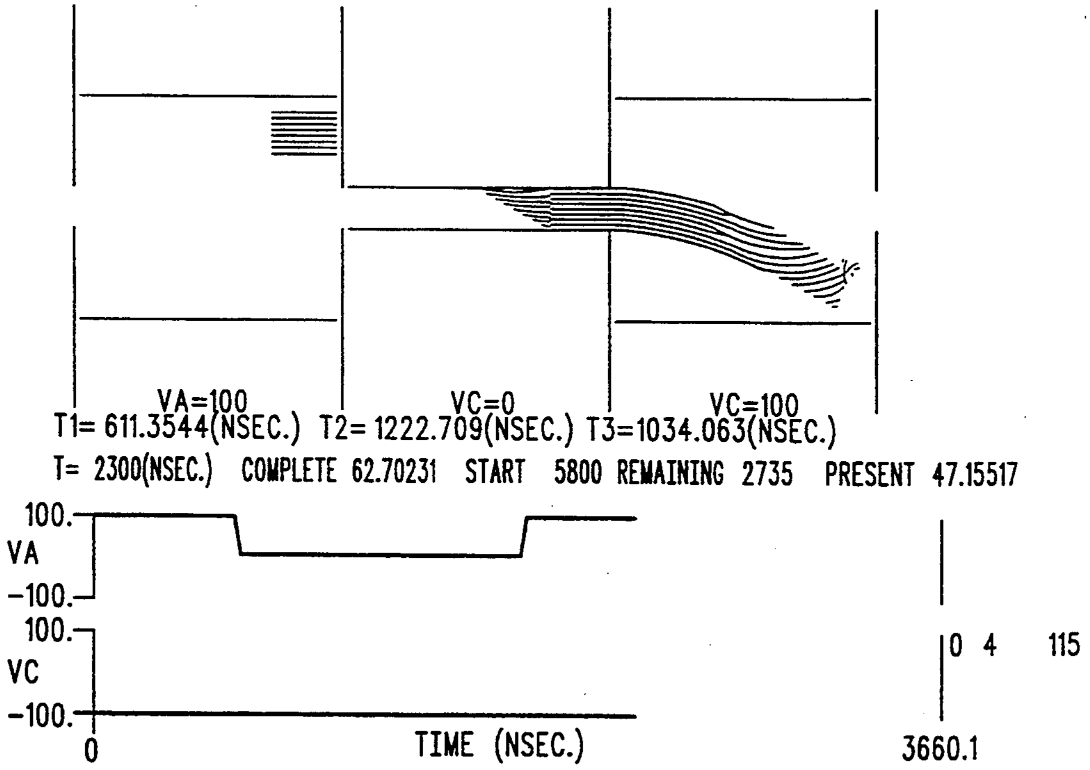

The aperture plate positions are controlled by micrometer drives 38 for reproducibility (see FIG. 1A). The attainable beam current as a function of aperture size is shown in FIG. 1B. Except for the smallest aperture for which lateral alignment becomes critical, the beam current scales closely as the aperture area. At the start of a deflection cycle, the first deflection region 14 has no applied deflection voltage while the second region 18 does, and therefore does not allow the ion beam to pass. At a certain time, a voltage pulse applied to the first set of deflection plates in order terminate the back end of the beam as shown in FIG. 2. Just before the back end of the beam enters the second deflection region, the voltage on the second deflection stage is removed, thereby allowing a short pulse to be transmitted. The timing of the pulses applied to the two stages is calculated by the instrument control computer program (see Appendix); based on the dimensions of the ion beam line, and the ion beam mass, energy and desired pulse length. Increasing the pulse length increases the count rate, but results in decreased mass resolution. One can vary the pulse length "on the fly" over a usable range of approximately $5\times10^{-9}$ to $1.5\times10^{-6}$ seconds. The pulse frequency is independently set by the computer software, based on the ion beam mass and energy; and the mass range anticipated atomic species on the sample surface, to produce the maximum possible pulse rate consistent with clear separation of the data corresponding to each ion pulse 40.

Figure 10:
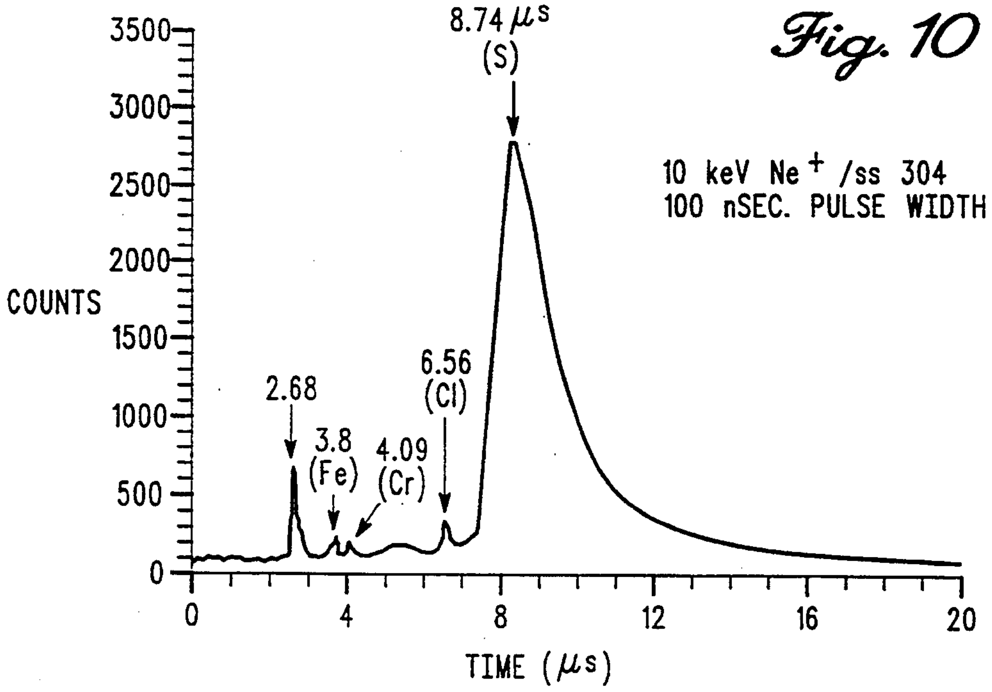
FIG. 10 illustrates a 10 keV Ne+ NSS spectrum of sulfur on stainless steel.
Figure 11A:
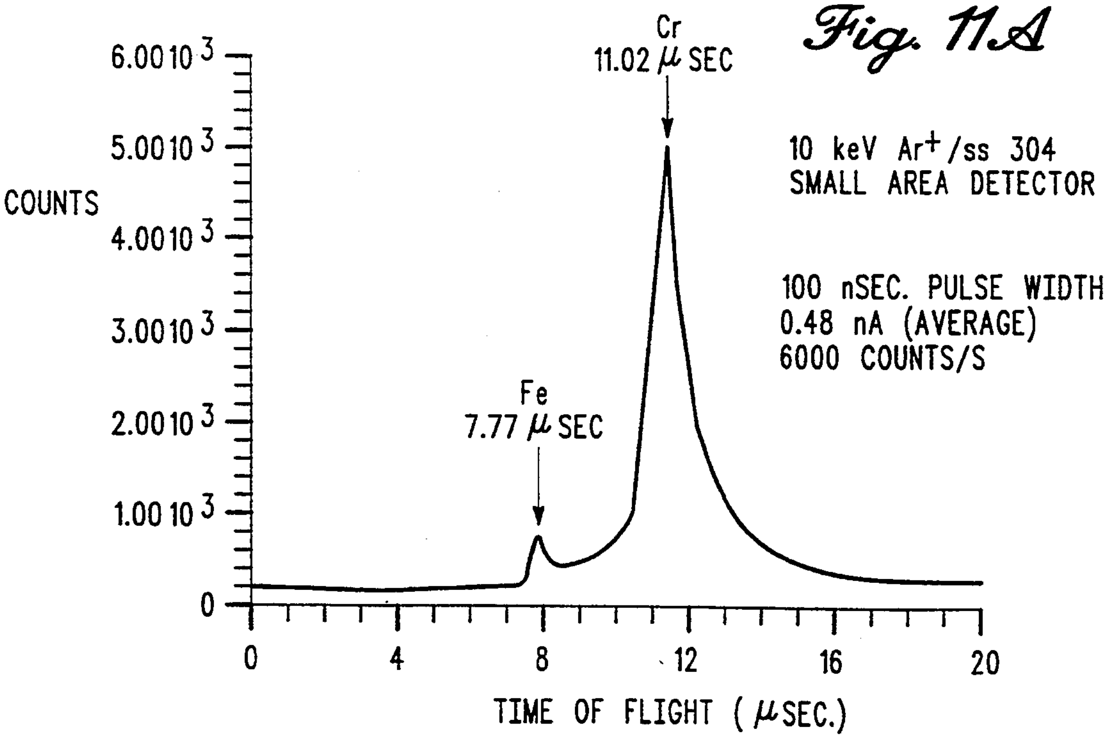
FIG. 11A shows a spectrum from a short ion beam pulse and FIG. 11B illustrates a spectrum from a long ion beam pulse.
Figure 12:
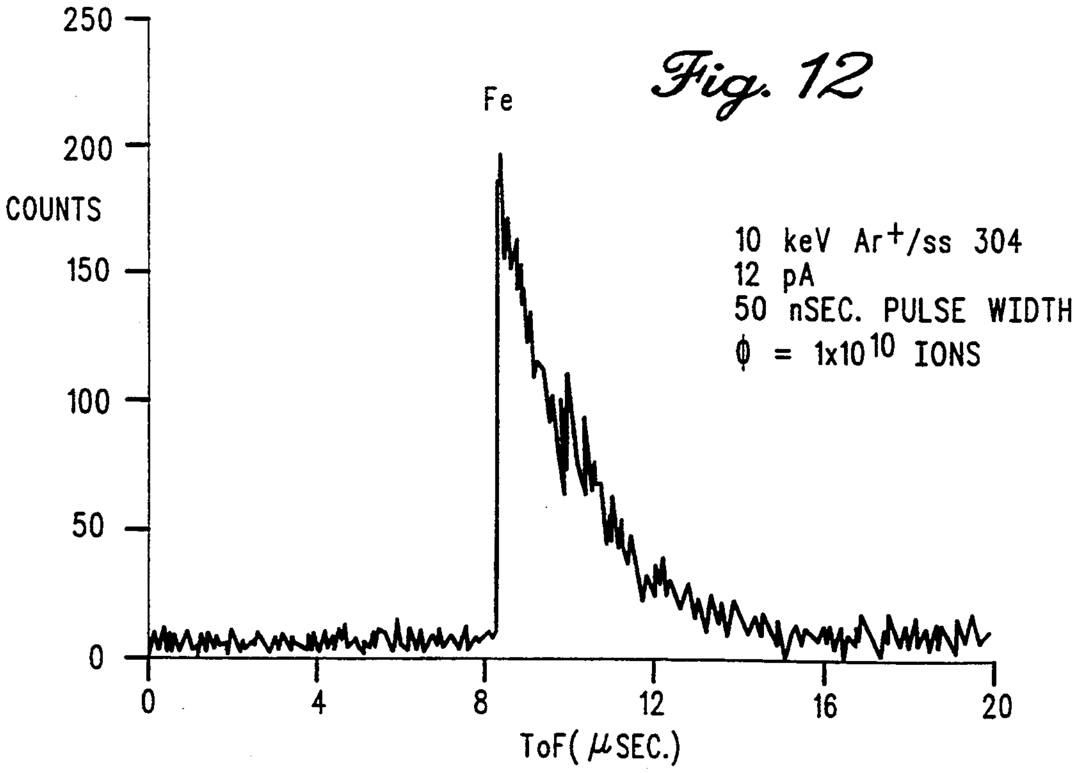
FIG. 12 illustrates a spectrum taken with a 50 nsec pulse at an ion dose of $10^{10}$ ions.

By using a very short pulse with small apertures, excellent time resolution, corresponding to good mass resolution can obtained, at the expense of reduced data acquisition rate shown in FIG. 11A. A short ion beam pulse (50–100 nsec) provides high mass resolution and exhibits a distinctly asymmetric peak as shown in FIGS. 10, 11A and 12. Most existing ToF ISS/NSS instruments have a fixed resolution which is determined by the beam aperture size and the rise time the deflection pulse, and can not be easily varied. The beam line geometry of these instruments is typically fixed at some compromise between resolution and count rate. However, the peak shape contains useful information on the depth distribution of each element. If the interface between film and substrate is not sharp, i.e., if the dominant surface species extends into the substrate, the signal corresponding the backscattered neutral will have an asymmetric lineshape with a long time-of-flight "tail" resulting from scattering from atoms two to three layers below the surface. Since the backscattered ion (ISS) signal is believed to be representative of the composition of the uppermost atomic layer, the formation of a coherent film is therefore indicated by the disappearance of scattered ion signal from the substrate. By comparing the ISS and NSS peak intensities and line shapes, one can detect the formation of islands and pinholes in layers only a few Å thick. Such depth-specific information is of paramount importance in the deposition of HTSCs in conjunction with other materials for device fabrication since the superconducting coherence length may be less than 5 Å, and HTSC devices will therefore require abrupt interfaces between smooth and pinhole-free films only a few Å thick.

Figure 11B:
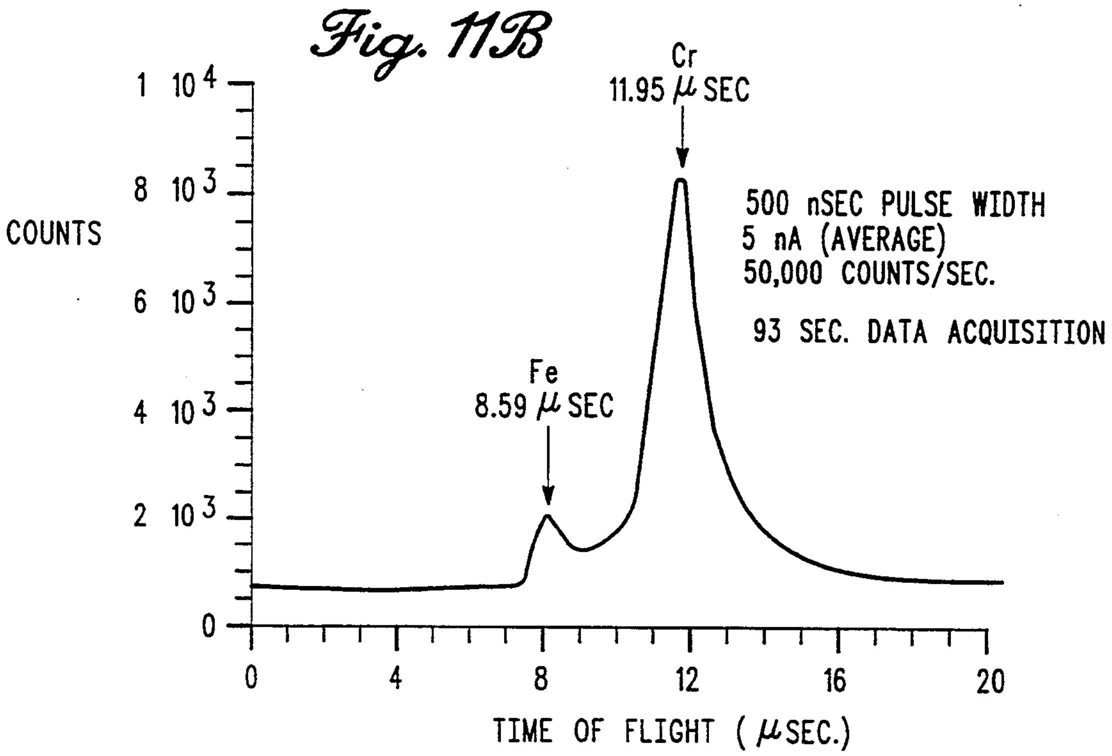

Conversely, in situations where high mass resolution is not as important as rapid data acquisition for e.g., real-time monitoring of surface processes, longer pulses and larger apertures can be used to increase the count rate as shown in FIG. 11B. In the case of stainless steel, a 500 nsec $Ar^+$ ion pulse is able to completely resolve Fe and Cr, with a total data acquisition time of ninety-three seconds. No special care was taken to minimize the beam dose for the spectra shown in FIGS. 11A and B which were both taken using a dose of approximately $3\times10^{12}$ ions. In fact, the signal/noise is much greater than needed for most purposes. FIG. 12 shows a spectrum with a s/n ratio of approximately 20:1, taken using a 50 nsec pulse with a dose of $1\times10^{10}$ ions. Installation of the large area detector and moderate beam rastering is expected to reduce the required dose and data collection time an additional 2–3 orders of magnitude.

Figure 3:
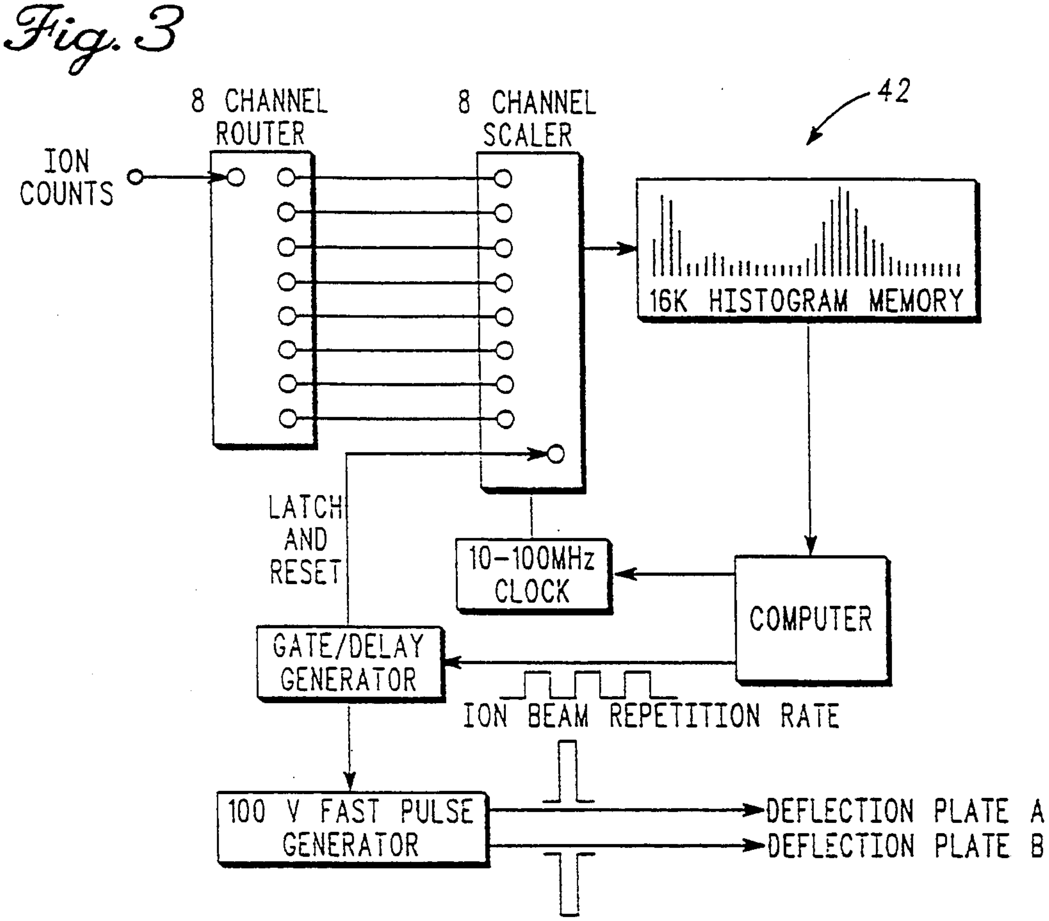
FIG. 3 illustrates a schematic functional block diagram of one form of the data acquisition electronics utilized for a small area, single anode detector.

Typically in ToF experiments, the instrumentation is only able to detect one signal event per ion beam pulse. The preferred embodiment of the invention has a beam line, which when operated with a large aperture with a long pulse is capable of producing several signal counts per ion beam pulse. All signal pulses following the first would be lost in a conventional single-hit data acquisition system, both reducing the data rate and possible severely distorting the data. In the instant invention, a special circuit directs consecutive signal events to separate channels of an eight channel scaler, thereby allowing up to eight signal events per ion beam pulse as shown in system 42 of FIG. 3.

Figure 4A:
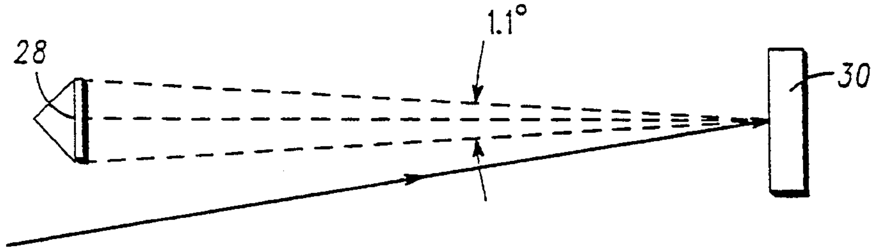
FIGS. 4A–B show a segmented eight channel 4 cm diameter channel plate detector.
Figure 4B:
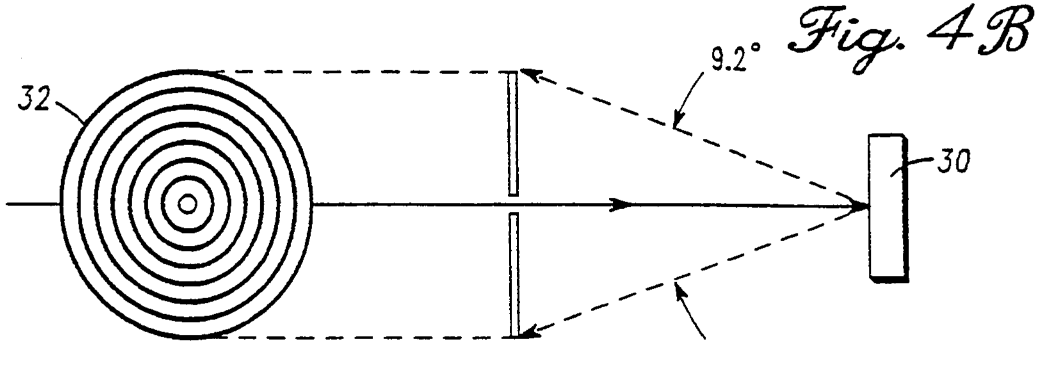
Figure 5:
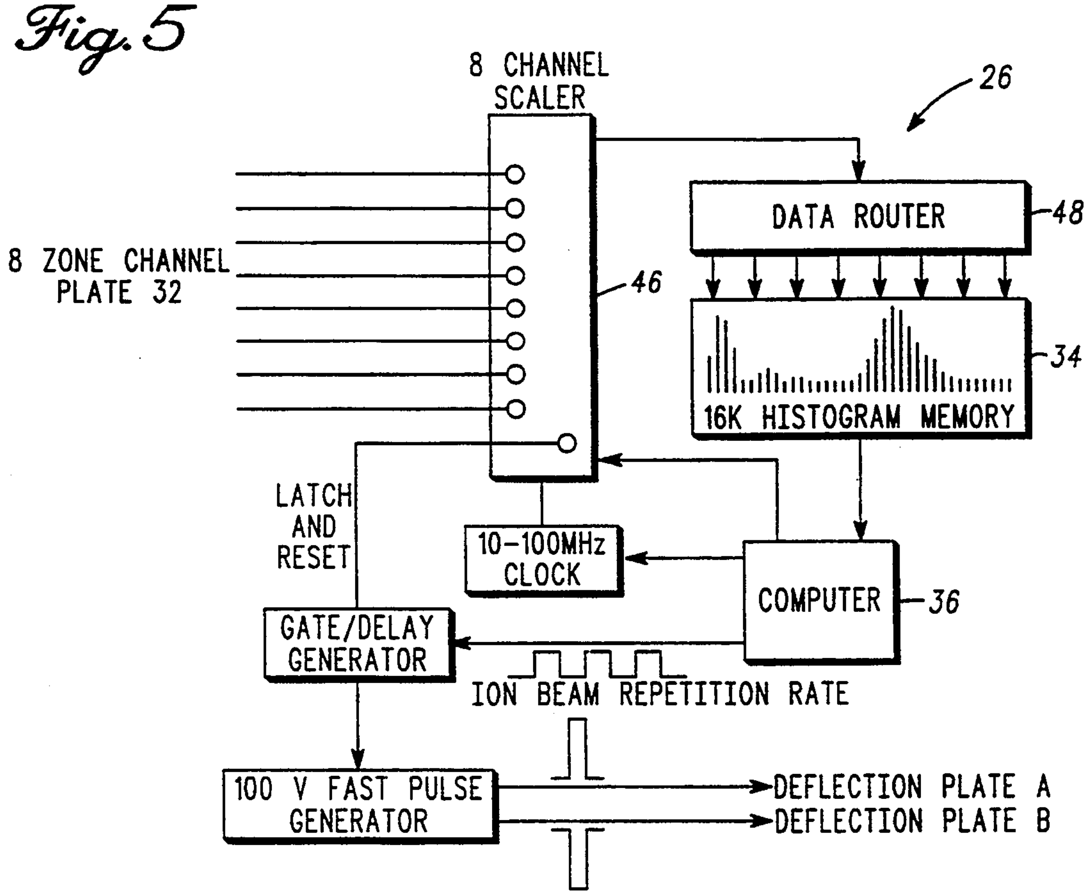
FIG. 5 is a schematic functional block diagram of the system for the data acquisition electronics corresponding to the large area, segmented anode detector of FIG. 4.

Using a 1 cm. diameter electron multiplier 28 at a distance of 50 cm from the sample 30 as the detector, an angular resolution of 1.1 degrees is obtained, with a collection efficiency of $5\times10^{-5}$, as shown in FIG. 4. However, by using the 4 cm. diameter channel plate 32 with a central hole to allow primary beam 44 to impinge on the sample 30 at normal incidence, an eight section segmented anode can be used at a distance of 25 cm while retaining the same angular resolution per segment as the 1 cm. diameter electron multiplier at a distance of 50 cm. The collection angle is now increased to 9.2 degrees, and the detection efficiency is increased by a factor of sixty-four to a value $3.2\times10^{-3}$. In this case, each segment of the collector plate 32 is connected to one input channel of eight channel scaler 46, and eight separate spectra are directed via a custom-designed data router 48 into one of eight designated areas of the histogram memory 34 as shown in FIG. 5. By adjusting the time scale of each spectrum to compensate for the slightly different detection angles, a composite spectrum can be generated by the computer 36 which represents a sixty-four fold increase in detection efficiency and data acquisition rate.

Figure 6:
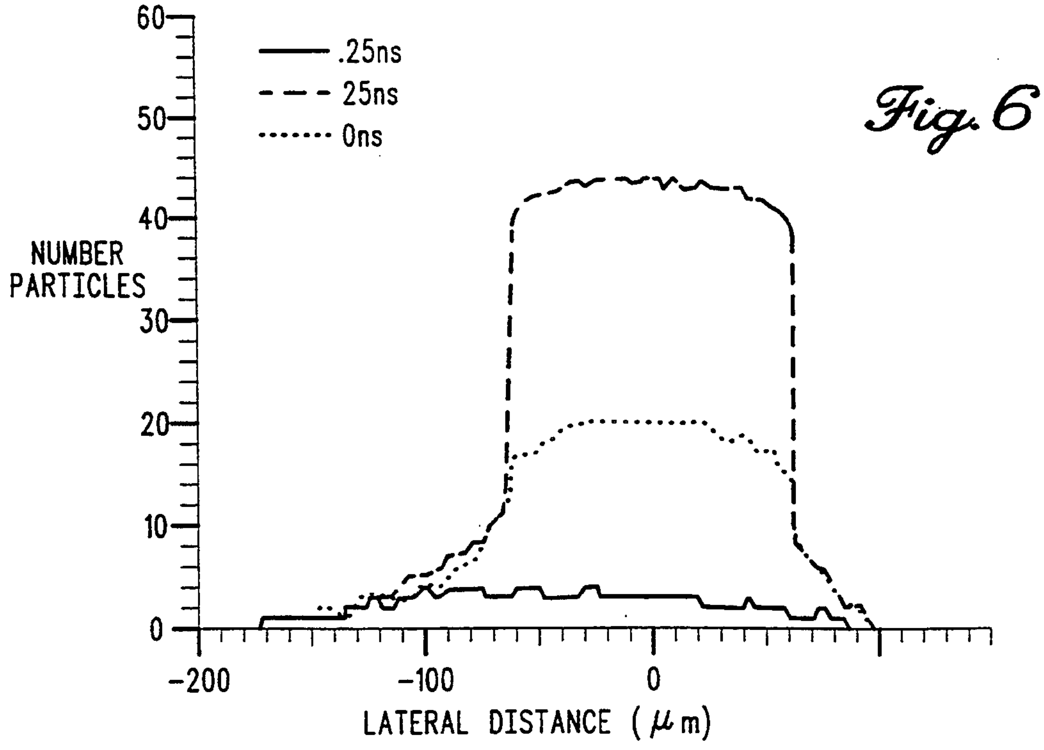
FIG. 6 illustrates beam profiles at the sample taken from scans across a sharp edge.
Figure 7:
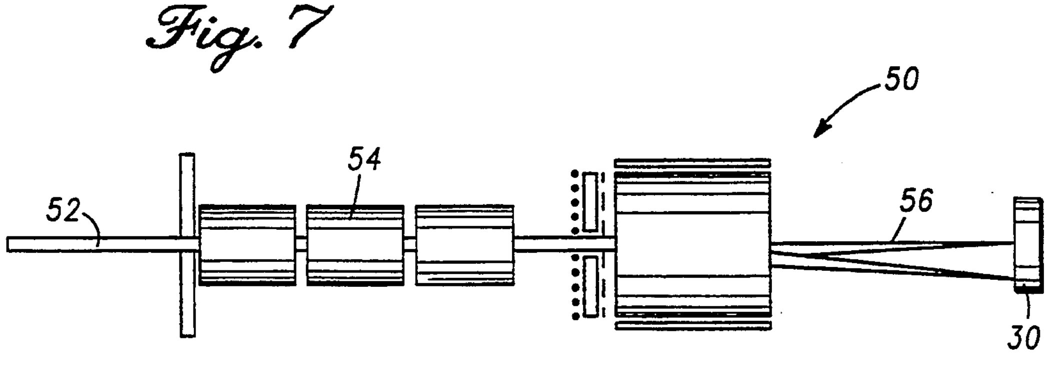
FIG. 7 shows use of the beam pulsing system for an ISS microscope.
Figure 8:
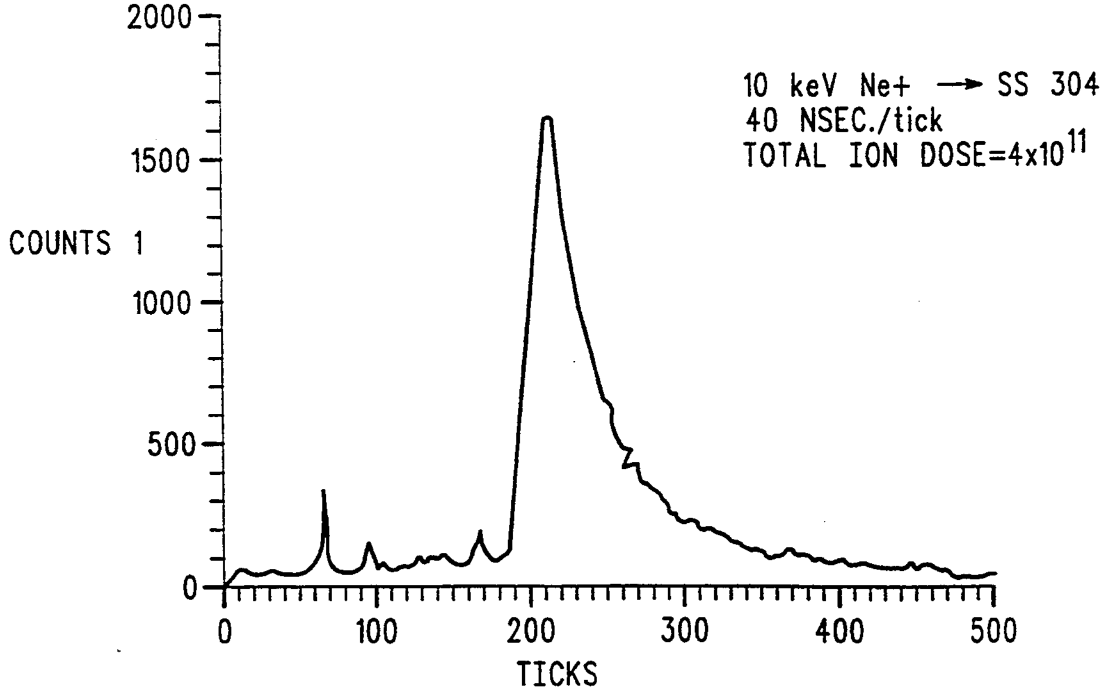
FIG. 8 illustrates an exemplary output spectrum for surface composition analysis of a given sample spot.

The shape of the ion beam is a circular spot whose size is determined primarily by the size of the apertures in the beam line. For a given size aperture, the transmitted ion pulse forms a footprint on the sample surface consisting of a stable central portion with "tails" which typically spread 50-200 microns beyond the central "hot spot". The number of ions in the tails and the degree of lateral spread is determined by the aperture size and the pulse length. For e.g., a 500 micron aperture, pulses shorter than 15 nsec consist entirely of the tail portion. Longer pulses consist primarily of the stationary "hot spot" and provide a high count rate with a high degree of beam stability and focusability, although excessively long pulses also result in a loss of mass resolution. Beam profiles taken by scanning the beam across a sharp edge and measuring the current to the sample for the 500 micron apertures with both DC and pulsed beams are shown in FIG. 6 for collimated operation (unfocused beam). The profiles for both dc and pulsed beams show little beam divergence; i.e. most of the beam is confined within the 500 micron collimation diameter and the beam is therefore expected to be highly focusable. As shown in FIG. 7, the beam pulsing system can also be used as an ISS "microscope" 50, i.e., an ISS instrument with spatially resolved surface analytical capability. Since ion beam 52 is highly collimated, simple ion optics, consisting of a three-tube einzel lens 54 is capable of focusing to a very small spot, in principle, to approximately 100 Å in diameter.

By utilizing the above-described techniques for rapid data acquisition and high detection efficiency, it is possible to focus ion beam 56 down to a spot 5 microns in diameter while obtaining a spectrum of $10^3$-$10^4$ total counts with a beam dose of $10^{13}$ ions/cm$^2$. This dose corresponds to approximately one percent of the number of atoms/cm$^2$ at the surface 24 of the sample 30, and is taken as the criterion for production of insignificant surface damage. Five microns is therefore estimated to be the minimum resolvable diameter which may be analyzed without introducing significant surface damage. If the surface 24 of the sample 30 is not particularly subject to damage, the resolvable area can be reduced still further.

Calibration measurements using the 1 cm diameter single anode detector 28 at a distance of 54 cm from the sample 30 have produced count rates of 80 kHz for a 4.2 nA dc beam. Assuming a calculated value of 0.088 for the ion reflection coefficient, the observed count rate corresponds to a detection efficiency of $3.5\times10^{-5}$, or 70% of the theoretically obtainable value of $5\times10^{-5}$ for this detector configuration.

As shown in FIGS. 13–15, the invention further includes a modification of the detector assembly. The modification primarily involves a change in the detector housing to include a small aperture 60 at the entrance to the detector channel. This geometry allows differential pumping of the detector 28, permitting the detector 28 to operate with the sample chamber at a pressure of several hundred millitorr. The beam line is already differentially pumped and requires no further modification for sample chamber pressures in this range.

The use of differential pumping poses alignment problems which in the past have prevented the practical application of ion beam analysis to samples in an ambient atmosphere in excess of $10^{-6}$ Torr. Another aspect of the instant invention relates to a new beam alignment procedure for use with the differentially pumped detector. This procedure has particular value for analysis of thin films of one or more components which must be deposited in the presence of a chemically active gas such as oxygen or nitrogen. The alignment procedure utilizes a light-emitting filament which casts a bright pinpoint of light on the sample, clearly indicating the sample area being analyzed. A preferred modification includes the filament in a six-way cross in the detector housing with the filament at right angles to two detectors, one detector in a line of sight with the sample, and the other in an off-axis arrangement. The alignment procedure uses a dot of gold or other visually identifiable material at a predetermined location on the sample holder. The sample is positioned so that the spot of light falls on the visual reference sample. The ion beam position and focus are then electrically adjusted to give maximum ISS peak intensity for the reference sample, thereby completing the alignment process without any need for mechanically adjusting ion beam entrance and exit apertures.

The Double Pulse Edge Transmission (DPET) beam line shown in FIGS. 13 and 14 (which we are using as part of the preferred form of the pulsed ion beam spectrometer design) provides differential pumping of the beam line via the four apertures used to provide the pulsed ion beam. These apertures are adjustable from 125 μm to 4 mm and are normally in the range 0.5–1 mm for surface analysis.

In both the ISS and DRS configurations, we can place a "sniffer tube" at a distance A from the sample corresponding to the radius of the inner cylindrical shell (see FIG. 16). We immediately gain the advantage that the work space is considerably opened up. Other equipment such as thin film deposition equipment and other diagnostic instrumentation may reside outside radius A as long as they do not conflict with the sniffers. The aperture at the end of the sniffer defines the scattering/recoil angles and the "illuminated" detecter area. For a 1 mm diameter sniffer aperture, a 1 cm diameter detector will receive full signal if B/A=10 where A is the sample-aperture distance and B is the sample-detector distance. In our system, B=50 cm.

Assuming a 1 mm dia. aperture as shown in FIG. 15 (which provides full illumination of the detector), and a 90 l/sec differential pumping speed (the maximum obtainable through the $2\frac{3}{4}''$ flange fitting we are currently using for the detector housing), the detector differential pumping ratio is $$90/(14.1 * \pi * (0.1/2)^2)=90/0.11=813/1$$

That is, if the sample chamber is at a pressure of one torr, the detector will be at a pressure of $1/813=1.2\times10^{-3}$ torr. This is the approximate upper limit at which a channel electron multiplier may be safely operated.

It should also be noted that at this pressure, the mean free path is nearly the same as the aperture diameter. There is therefore little to be gained by providing a second stage of differential pumping since most of the gas flux will be associated with molecular rather than viscous flow. The degree of differential pressure drop therefore is comparable with prior art designs.

The only alignment criterion is that the axis defined by the aperture and the center of the detector intersects the sample somewhere on its surface. The sample may be moved within the chamber (using a three axis goniometer mount) if this condition is not immediately met. The ion beam must then be directed to that spot by means of the electrostatic deflection plates. This can be done interactively by maximizing the detector signal as the beam is scanned across the surface. The detector aperture, once installed, does not need to be disturbed when changing either the sample or detectors.

Figure 17A:
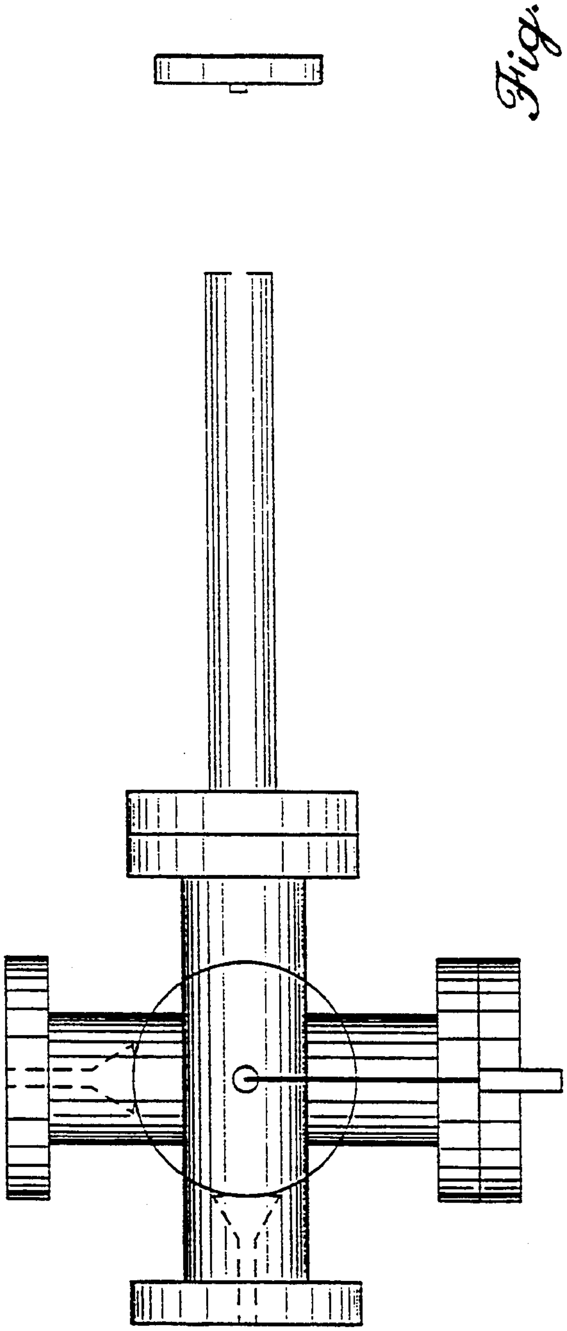
FIGS. 17A–B show a differentially pumped detector assembly and alignment filament geometry.
Figure 17B:
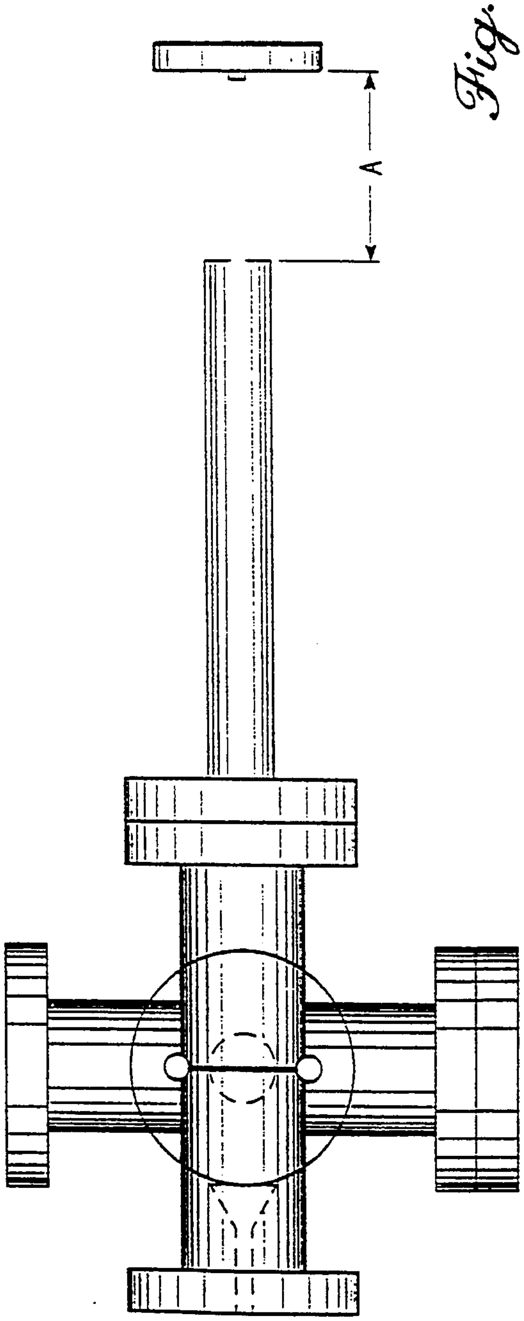

The first step of the alignment process can be simplified even further as follows: We are presently using a 4-way cross for the detector housing. This permits differential pumping and the use of two detectors, one line of sight and the other off-axis for detection of scattered ions which are more surface-specific than the scattered neutrals. By replacing the 4-way cross with a 6-way cross in which a tungsten filament runs at right angles through the intersection of the other two axes, as shown in FIG. 17, several advantages can be gained:

1. Since the filament is equidistant from, and on the axis of both detectors, the detectors may be biased to detect the electrons emitted by the filament (rather than energetic neutral atoms or positive ions). Therefore the performance of the two detectors may be calibrated and amplifier gain and discriminator levels may be unambiguously checked and absolute count rates verified.

2. The filament and aperture will cast a bright pinpoint of light on the sample, clearly indicating the sample area being analyzed.

3. A standard calibration sample (such as a 1 mm dia. dot of gold located a predetermined distance from the center of the sample being analyzed) can be moved into the spot of light, and the ion beam position and focus can then be adjusted to give the maximum goal ISS peak intensity. The position of this peak then unambiguously establishes the ToF calibration for all elements.

While preferred forms of the invention have been described and illustrated, one of ordinary skill in the art will appreciate the invention is not so limited and is defined by the scope of the appended claims and their range of equivalents.

```
REM Program Surface EXPerimenT July 23, 1991
REM A. Krauss
CLEAR
Version = 21.19
REM uses LabDriver 4.1
REM Includes Scrolls2
ToolBox "I"
TrapNo%=&HA862
GOSUB SEXPT
'
GPIB=0:' GPIB functions disabled
  GPIB=1:' GPIB Functions enabled
HIST=0:' Read scalers only - histogram memory disabled
' Hist=1:' Histogram memory enabled
' Acq=0:' Data collection disabled
Acq=1:' DATA collection enabled
' BlockXfer=0:REM Block data transfer disabled
BlockXfer=1:REM Block data transfer enabled
REM HIST=0 provides firebeam under software control before each data acquisition cycle
REM HIST=1 provides fire beam under hardware control at rate determined by RepTime
REM BeamPulse On in DRISS control window pulses at rate determined by RepTime
REM v19.68 does not set DataDone register but does produce histogram display
REM v19.69 sets DataDone register
REM v19.78 puts scroll subroutines in $INCLUDE file
REM incomplete as of v 20.05
' Expt name at top of setup screens (20.06)
' No header on MPX/PRF setup screens (20.06)
' Can't escape from setup screens - put menucheck in Readwindo3,4,5 (20.06)
' Check for machine ID (20.07)
' change DRISS to ISS in file names (20.07)
' ISS mode 1=sequential channels (Detector 1)
' ISS mode 2=parallel channels (segmented anode)
' ISS only allows 1 scan -- modify termination condition (20.16 Nscans only)
' undesired screen clear at end of survey scan (20.11)
' buttons for sequential/cumulative survey not working (20.16)
' file name to accomodate sequential files (e.g. depth profile) (20.16)
' Survey scan limits corect for AES, XPS & UPS (20.20)
' Scan Menu working except for Manual (20.30)
' Glitch in synthesized data fixed (20.30)
' Menu EndScan in survey fixed (20.31)
' Large Points for survey plot & lines for DRISS (20.32)
' Black background for data (20.32)
' Clear data & screen for survey in ... nual reset (20.32)
' Analysis menu & Graphics cursor/baseline added (20.35)
' Data updated at end of scan at largest Ymax-Ymin (20.36)
```

```
' Analysis cursor reads screen coordinates (20.41)
' Set scaling for DAC output (20.42)
' GPIB defaults to zero for Mac IIci (20.42)
' Diagnostic data is generated for DataIn=0 button (20.42)
' Analog input is permitted for survey (20.46)
' Bugs removed from cursor readout (20.47)
' Negative analog input values displayed (20.50)
' Alternate color survey scans & update at end of scan (20.52)
' ScanStart(Xpt%,rgn%), ScanEnd(Xpt%,rgn%) defaults to legal values (20.53)
' Problems noted for DRISS output-goes back many versions (20.53)
' Simplified structure for survey subroutine (20.54)
' improved screen display for survey & DRISS (20.55)
' Problems (20.53) resolved-array allocation/memory bounds (20.56)
' Zero Driss Scans gives continuous collection w/intermediate writes (20.57)
' ClearDisplay for DRISS & Survey working (20.63)
' Survey structure now MPX compatible (20.63)
' DRISS output time stamped to time of last plotted point (20.63)
' Cursor reading ok for both survey & driss (20.63)
' Driss display labels both detector x-axes in microseconds (20.64)
' Bug correction in pulse counting after 20.63 (20.67)
' DRISS data collection speeded ~7x (20.70)
' Camac stations changed to accomodate hardware histogram router (20.71)
' Camac positions defined in Initvars (20.71)
' DRISS setup parameters modified to reality (20.73c)
' FreqA & FreqB forced to 10 MHz as a diagnostic (20.73c)
' Histogram memory enabled (20.79)
' Hardware histogramming working (20.80)
' Hardware histogramming as default (20.81)
' Variable clock restored (20.81)
' Camac initialization at end of ReadWindo7 functional (20.82)
' RepTime set as maximum of TofTime, DataDoneTime and DataAcqTime (20.83)
' Both MinMass (=Mass1+1) and MaxMass used to determine TofTime (20.86)
' XPS scan bug fixed (20.86)
' Reorder sequencing between dataread and data acquisition to avoid contention (20.87)
' Correctly hardware histogram 1-8 channels on 1 or 2 scalers at rate to 40 kHz (20.90)
' Display all relevant times (ToF, DataAcq & DataDone) in DRISS setup window (20.94)
' Data update on screen refresh (20.95)
' Time readout for DRISS cursor (20.96)
' TofTime determined by OutTime only (InTime ignored) (20.96)
' Data cursor available during ToF data acquisition via mouse click (20.98)
' RepTime=.001*Gate+DataDoneTime+DataAcqTime OR TofTime (20.99)
' Plotted TofTime is clock time-pulsewidth to eliminate peak shifts (20.99)
' Peak shift compensation set to 0, 1.2, or 1x pulsewidth (21.01)
' Electron spectroscopy file output provides both kinetic & binding (or offset AES) energies (21.03)
' Correct display of ToF (21.04)
' Cumulative & New (Sequential) Data3 files stored for Repeat3>1 (21.05)
' corrected data retrieval for repeat files (21.07d)
' Block transfer switch selectable (21.07d)
' tighter loop for histogram read (21.09)
' conversion of ISSdata from ASCII to 4 byte integer done in PlotData rather than HistRead (21.10)
' HistRead subroutine accessed directly from DRISS, not from FetchData (21.11)
' LiveTime, DeadTime displayed (21.11)
' Data cursor available during Survey data acquisition via mouse click (21.13)
' Start ROI selection code
' set dac values for beam energy, focus, mass, x & y raster (21.15)
' Version # saved in Header and Index files (21.18)
' default target-det1 dist=66.8, M1=40 (21.19)
' IndexFile type changed to TEXT (for Excel formatting)
' Index file data format simplified for DRISS
' ISS scan termination by time or counts or button
' select display window in survey setup
' define non-collision conditions for display windows
' scan SIMS, IEA survey
' scan MPX, PRF

REM Subroutine Index
' Setup:
'           BeamOff - 6
'           Beamon    6
'           ButtonSelectx -- window x buttons   6 - 18
'           DialogHandler   18
'           DRISStest -- Activate values set in DRISS setup window (#7)   21
'           Energy -- Calculate scattered or recoil energy given Eo, M1 & M2   21
'           ErrMsg (ErrMsg$) -- prints ErrMsg$   21
'           InitWindo1 -- Select Experiments   21
```

```
'            InitWindo2 -- Select AES/XPS/UPS/SIM/IEA Experiment   22
'            InitWindo3 -- Setup survey parameters   22
'            InitWindo4 -- Setup MPX parameters   24
'            InitWindo5 -- Setup Profile parameters   25
'            InitWindo6 -- IEA Parameters
'            InitWindo7 -- ISS Parameters   25
'    InitWindo15   28
'    MenuHandler   29
'    ReadWindox   29 - 36
'    SetDefault7   38
'    UseDefault7   38
'    WindoRefresh   38
' File Handling:************************
'   FileError   39
'   NewData   39
'   OpenFil   39
'   CloseFil   39
'   SavFil   39
'   SavFilAs   42
' Startup Screens*************************
'     SEXPT   42
'     Credits   42
'     ColorChange   43
'      Red, Blue, Green, Yellow, Magenta, Cyan, Black, White   43 - 44
' Software Initialization*********************
'     InitVars   44
'     InitMenus   46
' Hardware Initialization
'     MIO16Setup   46
'     DMA8Setup   47
' Execution Transfer **********************************
'     Go   57
'     Dwell1, Dwell2   50
'     Pause   51
'     LastCycle   51
'     LastScan   51
'     Halt   51
'     Resett   51
'     Abort   51
' Data Acquisition ****************************************
'     ADC   51
'     CamacWrite   51
'     DAC   51
'     DRISS   51
'     FetchData   52
'     FireBeam   55
'     GateSet   55
'     MsgWrite   56
'     PollData   56
'     PlotData   56
'     PlotDeriv   58
'     PulseCount1   59
'     PulseCount2   59
'     CountLoop1   59
'     CountLoop2   59
'     PulseGen   60
'     SetBeamMode   60
'     SetClocks   60
'     SetColor   61
'     SetDataDone   61
'     AesMPX   62
'     AesProfil   62
'     Survey   62
'     SIMMPX
'     SimProfil
'     UPS
'     XPSMPX
'     XPSProfil
'                 ButyWinx -- status of button y in window x
'                 EXpt1$,Expt2$,Expt3$ -- name of experiment in group 1,2,3
' **Data Display Scheme*****************************************
'         Data1&(10,1024), Data2&(10,1024), Data3&(4,8192)  (rgn%,binx%)
'         Start1(10), End1(10), Start2(10), End2(10)
'         CntMin (xpt%, rgn%), CntMax (xpt%, rgn%), xpt%=0-3, rgn%=0-10
```

```
'        DispWindo (xpt%, rgn%) =0-4
'        XpltOld1%(10,1024), XpltOld2%(10,1024), XpltOld3%(4,8192)
'        YpltOld1%(10,1024), YpltOld2%(10,1024), YpltOld3%(4,8192)
' *****************************************************************
  TEXTFONT 0
  REM $IGNORE on
    GOSUB Credits
    TEXTSIZE 12
  REM $IGNORE OFF

   DIM STATIC pt%(1),A!,B!,C!,d!,e!,F!,g!,h!,i!,j!,k!,l!,m!,N!
   DIM  STATIC scr1%(3),scrA1%(3),scrB1%(3),in1%,intop1%,inbot1%
  DIM STATIC bar1%(3),botbar1%(3), topbar1%(3)
   DIM  STATIC scr2%(3),scrA2%(3),scrB2%(3),in2%,intop2%,inbot2%
  DIM STATIC bar2%(3),botbar2%(3), topbar2%(3)
   DIM  STATIC scr3%(3),scrA3%(3),scrB3%(3),in3%,intop3%,inbot3%
  DIM STATIC bar3%(3),botbar3%(3), topbar3%(3)
   DIM  STATIC scr4%(3),scrA4%(3),scrB4%(3),in4%,intop4%,inbot4%
  DIM STATIC bar4%(3),botbar4%(3), topbar4%(3)
   DIM  STATIC scr5%(3),scrA5%(3),scrB5%(3),in5%,intop5%,inbot5%
  DIM STATIC bar5%(3),botbar5%(3), topbar5%(3)
   DIM  STATIC scr6%(3),scrA6%(3),scrB6%(3),in6%,intop6%,inbot6%
  DIM STATIC bar6%(3),botbar6%(3), topbar6%(3)
   DIM  STATIC scr7%(3),scrA7%(3),scrB7%(3),in7%,intop7%,inbot7%
  DIM STATIC bar7%(3),botbar7%(3), topbar7%(3)
   DIM STATIC Data1&(10,4096),Data2&(10,4096),Data3&(4,8192),Data3Cum&(4,8192)
  DIM STATIC Data3ASC$(3,8192)
  '  DIM STATIC Deriv&(10,4096),DerivA&(10,4096),DerivB&(10,4096)
   DIM STATIC Start1(10),End1(10),Start2(10),End2(10),Recs%(15)
   DIM STATIC ScanStart(3,10),ScanEnd(3,10),ScanStart$(3,10),ScanEnd$(3,10)
   DIM STATIC CntMin(10),CntMax(10),DispWindo(3,10),ColorSet(3,10),MaxVal(25),MinVal(25)
   DIM STATIC XpltOld1%(10,4096),XpltOld2%(10,4096),XpltOld3%(6,8192)
   DIM STATIC YpltOld1%(10,4096),YpltOld2%(10,4096),YpltOld3%(6,8192)
   DIM STATIC DataTim1&(10,4096),DataTim2&(10,4096), DataTim3&(8192)
   DIM STATIC Xval1(10,4096),Xval2(10,4096),ToF(4,8192)
  '    DIM STATIC Image1%(200,200),Image2%(200,200),Image3%(200,200),Image4%(200,200)
'
  GOSUB Credits
  TEXTSIZE 12
'
  Eror%=0:Eror&=0
  LIBRARY "NBLabDriverLib"
 GOSUB MIO16Setup
 GOSUB Initvars
 GOSUB InitMenus
 LIBRARY "QuickBASIC488.lib"
 Windo=1
 WINDOW 16,"",(0,32)-(640,480),5
'          *****************************************************
StartHere:
DIALOG ON
But9Win1=0:Leave1=0:Mode1=0
Leave2=0:Leave3=0:Leave4=0:Leave5=0:Leave6=0:Leave7=0:Leave6=0:Leave7=0
REM WINDOW#1:SELECT experiments
CLS
GOSUB InitWindo1
Pause1:IF Leave1=0 THEN GOTO Pause1
WINDOW CLOSE 1
BD2%=2:BD3%=3:BD4%=4
IF SYSTEM(1)=9 THEN: BD2%=4:BD3%=5:REM IIci

ibsta%=0 : iberr%=0 : ibcnt&=0          'initialize variables
IF GPIB=1 THEN CALL ibinit(ibsta%,iberr%,ibcnt&)
GOSUB DMA8Setup
REM ----------------------------------------------------

ModeSet:
IF Expt1$<>"" THEN
  Expt$=Expt1$
  IF  Mode1=0 THEN GOSUB InitWindo2:GOSUB ReadWindo2:REM  Mode Select
  IF Mode1=1 THEN
    GOSUB initwindo3:GOSUB ReadWindo3:REM  Survey
    IF Expt2$="" AND Expt3$="" THEN :WINDOW CLOSE 3: GOSUB Go
  END IF:'   Mode1=1=Survey
```

```
    IF ChangeMode=1 THEN:ChangeMode=0: GOTO ModeSet
    IF Mode1=2 THEN
      GOSUB InitWindo4:GOSUB ReadWindo4:REM  Multiplex
      IF Expt2$="" AND Expt3$="" THEN:WINDOW CLOSE 4: GOSUB Go
    END IF
  END IF
  IF Expt2$<>"" THEN
    Expt$=Expt2$
    IF  Mode2=0 THEN GOSUB InitWindo2:GOSUB ReadWindo2:REM  Mode Select
    IF Mode2=1 THEN
      GOSUB initwindo3:GOSUB ReadWindo3:REM  Survey
      IF Expt3$="" THEN GOSUB Go
    END IF:'   Mode2=1=Survey
    IF ChangeMode=1 THEN:ChangeMode=0: GOTO ModeSet
    IF Mode2=2 THEN
      GOSUB InitWindo4:GOSUB ReadWindo4:REM  Multiplex
      IF Expt3$="" THEN:WINDOW CLOSE 4:GOSUB Go
    END IF
  END IF
  DrissSet:IF Expt3$<>"" THEN GOSUB InitWindo7:GOSUB ReadWindo7
  BEEP
  EndLoop:
    IF MenuSel>0 THEN
      IF MenuSel=11 THEN:MenuSel=0:Leavego=1:GOSUB NewData
      IF MenuSel=12 THEN:MenuSel=0:Leavego=1:GOSUB OpenFil
      IF MenuSel=13 THEN:MenuSel=0:Leavego=1:GOSUB CloseFil
      IF MenuSel=14 THEN:MenuSel=0:Leavego=1:GOSUB SavFil
      IF MenuSel=15 THEN:MenuSel=0:Leavego=1:GOSUB SavFilAs
      IF MenuSel=16 THEN:MenuSel=0:Leavego=1:GOSUB Setup
      IF MenuSel=17 THEN:MenuSel=0:Leavego=1:GOSUB Plot
      IF MenuSel=21 THEN:MenuS[illegible]=0:Leavego=0:GOSUB Go
      IF MenuSel=31 THEN MenuSel=0:Leavego=0:GOTO StartHere
'     IF MenuSel=41 THEN
'       MenuSel=0:Cursor=1

'     IF MOUSE(0)<0 THEN
'       GOSUB cursor
'     ELSE
'     PENMODE 10
'       IF FirstXCrsr=1 THEN  MOVETO mousxOld%,Y0C%:LINETO mousxOld%,Y0C%+400:FirstXCrsr=0:'
Erase old Xcursor if it exists
'       IF FirstYCrsr=1 THEN  MOVETO X0C%,mousyOld%:LINETO X0C%+500,mousyOld%:FirstYCrsr=0:'
Erase old Ycursor if it exists
'       SHOWCURSOR
'     END IF


        IF MOUSE(0) <0 THEN
          WHILE MenuState41=2
            GOSUB Cursor
          WEND
        ELSE
        PENMODE 10
          IF FirstXCrsr=1 THEN  MOVETO mousxOld%,Y0C%:LINETO mousxOld%,Y0C%+400:FirstXCrsr=0:'
Erase old Xcursor if it exists
          IF FirstYCrsr=1 THEN  MOVETO X0C%,mousyOld%:LINETO X0C%+500,mousyOld%:FirstYCrsr=0:'
Erase old Ycursor if it exists
          SHOWCURSOR
        END IF
'     END IF
    END IF
GOTO EndLoop
REM End of Program
REM ---------------------------------------------------------------

BeamOff:
BD3%=3:Ochan%=0:voltage=0
GOSUB Dac2
RETURN
REM ------------------------------------------------------------------------------------------------

BeamOn:
BeamFactor=-5/20
BD3%=3:Ochan%=0:voltage=BeamFactor*keV0
```

```
GOSUB Dac2
RETURN
REM ----------------------------------------------------------------------------------------------

ButtonSelect1:
REM select window 1 buttons
REM Dilog1=DIALOG(1)
IF Dilog1=1 AND But1Win1=1 THEN
    But1Win1=2:But2Win1=1:But3Win1=1
   BUTTON 1,2:BUTTON 2,1:BUTTON 3,1:Expt1$="AES"
   BUTTON 9,1
   Ready1=1
      Ready=Ready1+Ready2+Ready3
      IF But8Win1=2 AND Ready<>1 THEN: BEEP:BUTTON 9,0
   RETURN
END IF:REM Turn Button 1 on
IF Dilog1=1 AND But1Win1=2 THEN
    But1Win1=1:But2Win1=1:But3Win1=1
   BUTTON 1,1:Expt1$=""
   IF Expt1$="" AND Expt2$="" AND Expt3$="" THEN BUTTON 9,0
   Ready1=0
      Ready=Ready1+Ready2+Ready3
      IF But8Win1=2 AND Ready<>1 THEN: BEEP:BUTTON 9,0 ELSE IF But8Win1=2 AND Ready>0 THEN
BUTTON 9,1
   RETURN
END IF:REM Turn Button 1 off
IF Dilog1=2 AND But2Win1=1 THEN
    But1Win1=1:But2Win1=2:But3Win1=1
   BUTTON 1,1:BUTTON 2,2:BUTTON 3,1:Expt1$="XPS"
   BUTTON 9,1
   Ready1=1
      Ready=Ready1+Ready2+Ready3
      IF But8Win1=2 AND Ready<>1 THEN: BEEP:BUTTON 9,0
   RETURN
END IF:REM turn button 2 on
IF Dilog1=2 AND But2Win1 =2 THEN
    But1Win1=1:But2Win1=1:But3Win1=1
   BUTTON 2,1:Expt1$=""
   IF Expt1$="" AND Expt2$="" AND Expt3$="" THEN BUTTON 9,0
   Ready1=0
      Ready=Ready1+Ready2+Ready3
      IF But8Win1=2 AND Ready<>1 THEN: BEEP:BUTTON 9,0 ELSE IF But8Win1=2 AND Ready>0 THEN
BUTTON 9,1
   RETURN
END IF:REM Turn Button 2 off
IF Dilog1=3 AND But3Win1=1 THEN
    But1Win1=1:But2Win1=1:But3Win1=2
   BUTTON 1,1:BUTTON 2,1:BUTTON 3,2:Expt1$="UPS"
   BUTTON 9,1
   Ready1=1
      Ready=Ready1+Ready2+Ready3
      IF But8Win1=2 AND Ready<>1 THEN: BEEP:BUTTON 9,0
   RETURN
END IF:REM Turn Button 3 on
IF Dilog1=3 AND But3Win1=2 THEN
    But1Win1=1:But2Win1=1:But3Win1=1
   BUTTON 3,1:Expt1$=""
   IF Expt1$="" AND Expt2$="" AND Expt3$="" THEN BUTTON 9,0
   Ready1=0
      Ready=Ready1+Ready2+Ready3
      IF But8Win1=2 AND Ready<>1 THEN: BEEP:BUTTON 9,0 ELSE IF But8Win1=2 AND Ready>0 THEN
BUTTON 9,1
   RETURN
END IF:REM Turn Button 3 off

IF Dilog1=4 AND But4Win1=1 THEN
    But4Win1=2:But5Win1=1
   BUTTON 4,2:BUTTON 5,1:Expt2$="SIMS"
   BUTTON 9,1
   Ready2=1
      Ready=Ready1+Ready2+Ready3
      IF But8Win1=2 AND Ready<>1 THEN: BEEP:BUTTON 9,0
   RETURN
END IF:REM Turn Button 4 on
```

```
IF Dilog1=4 AND But4Win1=2 THEN
   But4Win1=1:But5Win1=1
   BUTTON 4,1:Expt2$=""
   IF Expt1$="" AND Expt2$="" AND Expt3$="" THEN BUTTON 9,0
   Ready2=0
     Ready=Ready1+Ready2+Ready3
     IF But8Win1=2 AND Ready<>1 THEN: BEEP:BUTTON 9,0 ELSE IF But8Win1=2 AND Ready>0 THEN
BUTTON 9,1
  RETURN
END IF:REM Turn Button 4 off
IF Dilog1=5 AND But5Win1=1 THEN
   But4Win1=1:But5Win1=2
   BUTTON 4,1:BUTTON 5,2:Expt2$="IEA"
   BUTTON 9,1
   Ready2=1
     Ready=Ready1+Ready2+Ready3
     IF But8Win1=2 AND Ready<>1 THEN: BEEP:BUTTON 9,0
  RETURN
END IF:REM Turn Button 5 on
IF Dilog1=5 AND But5Win1=2 THEN
   But4Win1=1:But5Win1=1
   BUTTON 5,1:Expt2$=""
   IF Expt1$="" AND Expt2$="" AND Expt3$="" THEN BUTTON 9,0
   Ready2=0
     Ready=Ready1+Ready2+Ready3
     IF But8Win1=2 AND Ready<>1 THEN: BEEP:BUTTON 9,0 ELSE IF But8Win1=2 AND Ready>0 THEN
BUTTON 9,1

  RETURN
END IF:REM Turn Button 5 off
IF Dilog1=6 AND But6Win1=1 THEN
   But6Win1=2:But7Win1=1
   BUTTON 6,2:BUTTON 7,1:Expt3$="ISS"
   BUTTON 9,1
   Ready3=1
     Ready=Ready1+Ready2+Ready3
     IF But8Win1=2 AND Ready<>1 THEN: BEEP:BUTTON 9,0
  RETURN
END IF:REM Turn Button 6 on
IF Dilog1=6 AND But6Win1=2 THEN
   But6Win1=1:But7Win1=1
  REM BUTTON 6,1
   Expt3$=""
  IF Expt1$="" AND Expt2$="" AND Expt3$="" THEN BUTTON 9,0
  Ready3=0
     Ready=Ready1+Ready2+Ready3
     IF But8Win1=2 AND Ready<>1 THEN: BEEP:BUTTON 9,0 ELSE IF But8Win1=2 AND Ready>0 THEN
BUTTON 9,1
     Expt2$=""
  RETURN
END IF:REM Turn Button 6 off
IF Dilog1=7 AND GPIBerr<>0 THEN
  BEEP:ErrMsg$="GPIB Error  ":GOSUB ErrMsg
  MOVETO Errx+100,Erry+20:PRINT GPIBerr
END IF
IF Dilog1=7 AND But7Win1=1 THEN
   But6Win1=1:But7Win1=2
  REM BUTTON 6,1
  BUTTON 7,2:Expt3$="ISS"
  BUTTON 9,1
  Ready3=1
     Ready=Ready1+Ready2+Ready3
     IF But8Win1=2 AND Ready<>1 THEN: BEEP:BUTTON 9,0
  RETURN
END IF:REM Turn Button 7 on
IF Dilog1=7 AND But7Win1=2 THEN
   But6Win1=1:But7Win1=1
   BUTTON 7,1:Expt3$=""
  IF Expt1$="" AND Expt2$="" AND Expt3$="" THEN BUTTON 9,0
  Ready3=0
     Ready=Ready1+Ready2+Ready3
     IF But8Win1=2 AND Ready<>1 THEN: BEEP:BUTTON 9,0 ELSE IF But8Win1=2 AND Ready>0 THEN
BUTTON 9,1
     Expt3$=""
```

```
  RETURN
END IF:REM Turn Button 7 off

IF Dilog1=8 AND But8Win1=1 THEN
   But8Win1=2
   BUTTON 8,2:Expt4$="Test"
   Ready=Ready1+Ready2+Ready3
   IF Ready=1 THEN BUTTON 9,1 ELSE:BEEP: BUTTON 9,0
  RETURN
END IF:REM Turn Button 8 on
IF Dilog1=8 AND But8Win1=2 THEN
   But8Win1=1
   BUTTON 8,1:Expt4$=""
   IF Ready>0 THEN BUTTON 9,1
  RETURN
END IF:REM Turn Button 8 off
IF Dilog1=9 THEN Leave1=1
IF Dilog1=10 AND But10Win1=1 THEN
   But10Win1=2
   BUTTON 10,But10Win1
   HIST=1
  RETURN
END IF
IF Dilog1=10 AND But10Win1=2 THEN
   But10Win1=1
   BUTTON 10,But10Win1
   HIST=0
  RETURN
END IF

IF Dilog1=11 AND But11Win1=1 THEN
   But11Win1=2
   BUTTON 11,But11Win1
   GPIB=1
  RETURN
END IF
IF Dilog1=11 AND But11Win1=2 THEN
   But11Win1=1
   BUTTON 11,But11Win1
   GPIB=0
  RETURN
END IF

IF Dilog1=12 AND But12Win1=1 THEN
   But12Win1=2:Datain=1
   BUTTON 12,But12Win1
  RETURN
END IF
IF Dilog1=12 AND But12Win1=2 THEN
   But12Win1=1:Datain=0
   BUTTON 12,But12Win1
  RETURN
END IF

RETURN
REM ----------------------------------------------------------------------------------------------------

ButtonSelect2:
REM select Scan Mode in Window 2
dilog21=DIALOG(1)
   IF dilog21=1 THEN:But1Win2=2:But2Win2=1:But3Win2=1: Mode=1
   IF dilog21=2 THEN:But1Win2=1:But2Win2=2:But3Win2=1: Mode=2
   IF dilog21=3 THEN: But1Win2=1:But2Win2=1:But3Win2=2: Mode=3

'  MOVETO 100,240:PRINT Mode,rgn%

IF dilog21=4 THEN
   IF Expt$=Expt1$ THEN
      voltage=0:Ochan%=0:GOSUB Dac
      IF Expt1$="AES" THEN: SetAmin=1
      IF Expt1$="XPS" THEN: SetXmin=1
      IF Expt1$="UPS" THEN: SetUmin=1
   END IF
```

```
 IF Expt$=Expt2$ THEN
   voltage=0:Ochan%=1:GOSUB Dac
   IF Expt2$="SIM" THEN: SetMMin=1
   IF Expt2$="IEA" THEN: SetEMin=1
 END IF
 But4Win2=2
 But5Win2=1
 Edit2=0
' ScanMin$(Xpt%)=EDIT$(2)
' IF Edit$(2) <>"" THEN Ready4Win2=1 ELSE Ready4Win2=0
   BUTTON 4,But4Win2
   BUTTON 5,But5Win2
 END IF
 IF dilog21=5 THEN
   IF Expt$=Expt1$ THEN
     voltage=10:Ochan%=0:GOSUB Dac
     IF Expt1$="AES" THEN: SetAmax=1
     IF Expt1$="XPS" THEN: SetXmax=1
     IF Expt1$="UPS" THEN: SetUmax=1
   END IF
   IF Expt$=Expt2$ THEN
     voltage=10:Ochan%=1:GOSUB Dac
       IF Expt2$="SIM" THEN: SetMMax=1
       IF Expt2$="IEA" THEN: SetEMax=1
   END IF
   But4Win2=1
   But5Win2=2
   Edit3=0
'  ScanMax$(Xpt%)=EDIT$(3)
'  IF ScanMax$(Xpt%)<>"" THEN Ready5Win2=1 ELSE Ready5Win2=0
   BUTTON 4,But4Win2
   BUTTON 5,But5Win2
END IF
'  ScanMin(Xpt%)=VAL (ScanMin$(Xpt%)):ScanMax(Xpt%)=VAL (ScanMax$(Xpt%))
  IF Expt$=Expt1$ THEN
    Mode1=Mode
     IF Expt1$="AES" THEN: SetMin=SetAmin:SetMax=SetAmax
     IF Expt1$="XPS" THEN: SetMin=SetXmin:SetMax=SetXmax
     IF Expt1$="UPS" THEN: SetMin=SetUmin:SetMax=SetUmax
  END IF
'  MOVETO 100,260:PRINT Mode,rgn%

  IF Expt$=Expt2$ THEN
    Mode2=Mode
     IF Expt2$="SIM" THEN: SetMin=SetMMin:SetMax=SetMMax
     IF Expt2$="IEA" THEN: SetMin=SetEMin:SetMax=SetEMax
  END IF
REM Check setup OK?
  IF ScanMax(Xpt%)<>ScanMin(Xpt%) AND SetMin=1 AND SetMax=1 AND Ready4Win2=1 AND
Ready5Win2=1 THEN
    BUTTON 1,But1Win2:BUTTON 2,But2Win2:BUTTON 3,But3Win2
'    IF dilog21=i . HEN: Leave2=1:Mode1=1:RETURN
'    IF dilog21=2 THEN: Leave2=1:Mode1=2:RETURN
'    IF dilog21=3 THEN: Leave2=1:Mode1=3:RETURN
  ELSE
  REM Illegal Setup
    IF dilog21=1 OR dilog21=2 OR dilog21=3 THEN
       But1Win2=1:But2Win2=1:But3Win2=1
      BEEP:Errx=100:Erry=200
      IF ScanMin$(Xpt%)="" OR SetMin=0 THEN
         ErrMsg$="Set Scan Minimum"
        GOSUB ErrMsg:EDIT FIELD 2:RETURN
      END IF
      IF ScanMax$(Xpt%)="" OR SetMax=0 THEN
         ErrMsg$="Set Scan Maximum"
        GOSUB ErrMsg:EDIT FIELD 3:RETURN
      END IF
      IF ScanMin(Xpt%)=ScanMax(Xpt%) OR ScanMin(Xpt%)<0 OR ScanMax(Xpt%)<0 THEN
         ErrMsg$="Illegal Scan Range"
        GOSUB ErrMsg:EDIT FIELD 2:RETURN
      END IF
    END IF
    END IF

    MOVETO 100,280:PRINT Mode,rgn%
```

```
IF SetMin=1 AND SetMax=1 AND Ready4Win2=1 AND Ready5Win2=1 THEN
   IF dilog21=1 THEN: Leave2=1:REM Mode=1
   IF dilog21=2 THEN: Leave2=1:REM Mode=2
   IF dilog21=3 THEN: Leave2=1:REM Mode=3
END IF

' MOVETO 100,300:PRINT Mode,rgn%

RETURN
REM ------------------------------------------------------------

buttonselect3:
REM select window 3 buttons
ChangeMode=0
Dilog31=DIALOG(1)
IF Dilog31=1 THEN:But1Win3=2:But2Win3=1:But3Win3=1: Mode1=1
IF Dilog31=2 THEN:But1Win3=1:But2Win3=2:But3Win3=1: Mode1=2
IF Dilog31=3 THEN: But1Win3=1:But2Win3=1:But3Win3=2: Mode1=3
BUTTON 1,But1Win3:BUTTON 2,But2Win3:BUTTON 3,But3Win3
IF Dilog31=2 THEN:ChangeMode=1:REM GOSUB InitWindo4:RETURN
IF Dilog31=3 THEN:ChangeMode=1:REM GOSUB InitWindo5:RETURN

IF Expt$="AES" OR Expt$="XPS" THEN
IF Dilog31=4 AND But4Win3=1 THEN
   But4Win3=2:But5Win3=1
     IF Expt$="AES" THEN Deriv=0:REM Integral
     IF Expt$="XPS" THEN Xphoton=MgAnode
END IF
IF Dilog31=5 AND But5Win3=1 THEN
   But4Win3=1:But5Win3=2
     IF Expt$="AES" THEN Deriv=1:REM Derivative
     IF Expt$="XPS" THEN Xphoton=AlAnode
END IF
BUTTON 4,But4Win3:BUTTON 5,But5Win3
END IF

IF Expt$="UPS" THEN
IF Dilog31=4 AND But4Win3=1 THEN
   But4Win3=2:But5Win3=1
   Uphoton=HeI
ELSEIF Dilog31=4 AND But4Win3=2 THEN
   But4Win3=1:But5Win3=1
END IF
IF Dilog31=5 AND But5Win3=1 THEN
   But4Win3=1:But5Win3=2
   Uphoton=HeII
ELSEIF Dilog31=5 AND But5Win3=2 THEN
   But5Win3=1:But5Win3=1
END IF
BUTTON 4,But4Win3:BUTTON 5,But5Win3
IF But4Win3<2 AND But5Win3<2 THEN Uphoton=VAL(PhotonEnergy$)
END IF

IF Dilog31=7 AND But7Win3=1 THEN
   But7Win3=2:But8Win3=1:Accum1=0:REM Sequential acquisition
ELSEIF Dilog31=7 AND But7Win3=2 THEN
   But7Win3=1:But8Win3=2:Accum1=1:REM Cumulative acquisition
BUTTON 7,But7Win3:BUTTON 8,But8Win3
END IF
IF Dilog31=8 AND But8Win3=1 THEN
   But7Win3=1:But8Win3=2:Accum1=1:REM Cumulative acquisition
ELSEIF Dilog31=8 AND But8Win3=2 THEN
   But7Win3=2:But8Win3=1:Accum1=0:REM Sequential acquisition
BUTTON 7,But7Win3:BUTTON 8,But8Win3
END IF

IF Dilog31=10 AND But10Win3=1 THEN
```

```
    But10Win3=2:But11Win3=1:PulseInput=1
    BUTTON 10,But10Win3:BUTTON 11,But11Win3
    IF Expt$=Expt1$ THEN PulseInput1=PulseInput
    IF Expt$=Expt2$ THEN PulseInput2=PulseInput
  END IF
  IF Dilog31=11 AND But11Win3=1 THEN
    But10Win3=1:But11Win3=2:PulseInput=0
    BUTTON 10,But10Win3:BUTTON 11,But11Win3
    IF Expt$=Expt1$ THEN PulseInput1=PulseInput
    IF Expt$=Expt2$ THEN PulseInput2=PulseInput
  END IF

  IF Dilog31=6 THEN Leave3=1
  RETURN

  REM ----------------------------------------------------------------------------------------------------------

  buttonselect4:
  REM select window 4 buttons
  IF Dilog1=1 THEN  But1Win4=2:But2Win4=1
  IF Dilog1=2 THEN But1Win4=1:But2Win4=2
  REM*****************
  IF Dilog1=3 OR Dilog1=4 OR Dilog1=5 OR Dilog1=6 THEN
    IF Dilog1=3 AND But3Win4=1 AND ExptNo(1)<>2 AND ExptNo(1)<>3 THEN
      But3Win4=2
       ColorTop(1)=ColorTop(1)+1:IF ColorTop(1)>6 THEN ColorTop(1)=1
       ColorSet (1,1)=ColorTop(1):ExptNo(1)=1
    ELSE
      But3Win4=1
    END IF
    IF Dilog1=4 AND But4Win4=1 AND ExptNo(2)<>2 AND ExptNo(2)<>3 THEN
      But4Win4=2
       ColorTop(2)=ColorTop(2)+1:IF ColorTop(2)>6 THEN ColorTop(2)=1
       ColorSet (1,1)=ColorTop(2):ExptNo(2)=1
    ELSE
      But4Win4=1
    END IF
    IF Dilog1=5 AND But5Win4=1 THEN But5Win4=2 ELSE But5Win4=1
    IF Dilog1=6 AND But6Win4=1 THEN But6Win4=2 ELSE But6Win4=1
  END IF
  REM*****************
  IF Dilog1=7 OR Dilog1=8 OR Dilog1=9 OR Dilog1=10 THEN
    IF Dilog1=7 AND But7Win4=1 THEN But7Win4=2 ELSE But7Win4=1
    IF Dilog1=8 AND But8Win4=1 THEN But8Win4=2 ELSE But8Win4=1
    IF Dilog1=9 AND But9Win4=1 THEN But9Win4=2 ELSE But9Win4=1
    IF Dilog1=10 AND But10Win4=1 THEN But10Win4=2 ELSE But10Win4=1
  END IF
  REM*****************
  IF Dilog1=11 OR Dilog1=12 OR Dilog1=13 OR Dilog1=14 THEN
    IF Dilog1=11 AND But11Win4=1 THEN But11Win4=2 ELSE But11Win4=1
    IF Dilog1=12 AND But12Win4=1 THEN But12Win4=2 ELSE But12Win4=1
    IF Dilog1=13 AND But13Win4=1 THEN But13Win4=2 ELSE But13Win4=1
    IF Dilog1=14 AND But14Win4=1 THEN But14Win4=2 ELSE But14Win4=1
  END IF
  REM******************
  IF Dilog1=15 OR Dilog1=16 OR Dilog1=17 OR Dilog1=18 THEN
    IF Dilog1=15 AND But15Win4=1 THEN But15Win4=2 ELSE But15Win4=1
    IF Dilog1=16 AND But16Win4=1 THEN But16Win4=2 ELSE But16Win4=1
    IF Dilog1=17 AND But17Win4=1 THEN But17Win4=2 ELSE But17Win4=1
    IF Dilog1=18 AND But18Win4=1 THEN But18Win4=2 ELSE But18Win4=1
  END IF
  REM******************
  IF Dilog1=19 OR Dilog1=20 OR Dilog1=21 OR Dilog1=22 THEN
    IF Dilog1=19 AND But19Win4=1 THEN But19Win4=2 ELSE But19Win4=1
    IF Dilog1=20 AND But20Win4=1 THEN But20Win4=2 ELSE But20Win4=1
    IF Dilog1=21 AND But21Win4=1 THEN But21Win4=2 ELSE But21Win4=1
    IF Dilog1=22 AND But22Win4=1 THEN But22Win4=2 ELSE But22Win4=1
```

```
IF Dilog1=2 AND But2Win7=1 THEN
    But1Win7=1:But2Win7=2:Scatt1=0
'   ELSEIF Dilog1=2 AND But2Win7=2 THEN
'     But1Win7=1:But2Win7=1
END IF
BUTTON 1,But1Win7:BUTTON 2, But2Win7

IF Dilog1=3 AND But3Win7=1 THEN
    But3Win7=2:But4Win7=1:Scatt2=1
'   ELSEIF Dilog1=3 AND But3Win7=2 THEN
'     But3Win7=1:But4Win7=1
END IF
IF Dilog1=4 AND But4Win7=1 THEN
    But3Win7=1:But4Win7=2:Scatt2=0
'   ELSEIF Dilog1=4 AND But4Win7=2 THEN
'     But3Win7=1:But4Win7=1
END IF
BUTTON 3,But3Win7:BUTTON 4, But4Win7

IF Dilog1=5 THEN GOSUB UseDefault7
IF Dilog1=6 THEN GOSUB SetDefault7
IF Dilog1=7 THEN Leave7=1

IF Dilog1=8 AND But8Win7=1 THEN
    But8Win7=2:GOSUB DrissTest
ELSEIF Dilog1=8 AND But8Win7=2 THEN
    But8Win7=1:GOSUB DrissTest
END IF
BUTTON 8,But8Win7

REM Select No. of PointsPerScan
IF Dilog1=9 AND But9Win7=1 THEN
   PtsPerScan=512:ScanStart(Xpt%,rgn%)=0:ScanEnd(Xpt%,rgn%)=500:GOSUB SetDataDone
   But9Win7=2:But10Win7=1:But11Win7=1:But12Win7=1:But13Win7=1
END IF
IF Dilog1=10 AND But10Win7=1 THEN
   PtsPerScan=1024:ScanStart(Xpt%,rgn%)=0:ScanEnd(Xpt%,rgn%)=1000:GOSUB SetDataDone
   But9Win7=1:But10Win7=2:But11Win7=1:But12Win7=1:But13Win7=1
END IF
IF Dilog1=11 AND But11Win7=1 THEN
   PtsPerScan=2048:ScanStart(Xpt%,rgn%)=0:ScanEnd(Xpt%,rgn%)=2000:GOSUB SetDataDone
   But9Win7=1:But10Win7=1:But11Win7=2:But12Win7=1:But13Win7=1
END IF
IF Dilog1=12 AND But12Win7=1 THEN
   PtsPerScan=4096:ScanStart(Xpt%,rgn%)=0:ScanEnd(Xpt%,rgn%)=4000:GOSUB SetDataDone
   But9Win7=1:But10Win7=1:But11Win7=1:But12Win7=2:But13Win7=1
END IF
IF Dilog1=13 AND But13Win7=1 THEN
   PtsPerScan=8192:ScanStart(Xpt%,rgn%)=0:ScanEnd(Xpt%,rgn%)=8000:GOSUB SetDataDone
   But9Win7=1:But10Win7=1:But11Win7=1:But12Win7=1:But13Win7=2
END IF
BUTTON 9,But9Win7:BUTTON 10,But10Win7:BUTTON 11,But11Win7:BUTTON 12,But12Win7:BUTTON
13,But13Win7
REM Calculate DataDone Time
  DataDoneTime=PtsPerScan/FreqDD

REM Select Detector 1 Signal
IF Dilog1=14 AND But14Win7=1 THEN
  D1sig=1
    But14Win7=2:But15Win7=1:But16Win7=1:But17Win7=1
'     IF D2sig>2 THEN:D2sig=0: But18Win7=1:But19Win7=1:But20Win7=1:But21Win7=1
ELSEIF Dilog1=14 AND But14Win7=2 THEN
   But14Win7=1:But15Win7=1:But16Win7=1:But17Win7=1:D1sig=0
END IF
IF Dilog1=15 AND But15Win7=1 THEN
  D1sig=2
    But14Win7=1:But15Win7=2:But16Win7=1:But17Win7=1
```

```
END IF
REM********************
IF Dilog1=23 OR Dilog1=24 OR Dilog1=25 OR Dilog1=26 THEN
   IF Dilog1=23 AND But23Win4=1 THEN But23Win4=2 ELSE But23Win4=1
   IF Dilog1=24 AND But24Win4=1 THEN But24Win4=2 ELSE But24Win4=1
   IF Dilog1=25 AND But25Win4=1 THEN But25Win4=2 ELSE But25Win4=1
   IF Dilog1=26 AND But26Win4=1 THEN But26Win4=2 ELSE But26Win4=1
END IF
REM*********************
IF Dilog1=27 OR Dilog1=28 OR Dilog1=29 OR Dilog1=30 THEN
   IF Dilog1=27 AND But27Win4=1 THEN But27Win4=2 ELSE But27Win4=1
   IF Dilog1=28 AND But28Win4=1 THEN But28Win4=2 ELSE But28Win4=1
   IF Dilog1=29 AND But29Win4=1 THEN But29Win4=2 ELSE But29Win4=1
   IF Dilog1=30 AND But30Win4=1 THEN But30Win4=2 ELSE But30Win4=1
END IF
REM*********************
IF Dilog1=31 OR Dilog1=32 OR Dilog1=33 OR Dilog1=34 THEN
   IF Dilog1=31 AND But31Win4=1 THEN But31Win4=2 ELSE But31Win4=1
   IF Dilog1=32 AND But32Win4=1 THEN But32Win4=2 ELSE But32Win4=1
   IF Dilog1=33 AND But33Win4=1 THEN But33Win4=2 ELSE But33Win4=1
   IF Dilog1=34 AND But34Win4=1 THEN But34Win4=2 ELSE But34Win4=1
END IF
REM*********************
IF Dilog1=35 OR Dilog1=36 OR Dilog1=37 OR Dilog1=38 THEN
   IF Dilog1=35 AND But35Win4=1 THEN But35Win4=2 ELSE But35Win4=1
   IF Dilog1=36 AND But36Win4=1 THEN But36Win4=2 ELSE But36Win4=1
   IF Dilog1=37 AND But37Win4=1 THEN But37Win4=2 ELSE But37Win4=1
   IF Dilog1=38 AND But38Win4=1 THEN But38Win4=2 ELSE But38Win4=1
END IF
REM*********************
IF Dilog1=39 OR Dilog1=40 OR Dilog1=41 OR Dilog1=42 THEN
   IF Dilog1=39 AND But39Win4=1 THEN But39Win4=2 ELSE But39Win4=1
   IF Dilog1=40 AND But40Win4=1 THEN But40Win4=2 ELSE But40Win4=1
   IF Dilog1=41 AND But41Win4=1 THEN But41Win4=2 ELSE But41Win4=1
   IF Dilog1=42 AND But42Win4=1 THEN But42Win4=2 ELSE But42Win4=1
END IF
REM**********************
BUTTON 1, But1Win4:BUTTON 2,But2Win4
BUTTON 3,But3Win4:BUTTON 4,But4Win4:BUTTON 5,But5Win4:BUTTON 6,But6Win4
BUTTON 7,But7Win4:BUTTON 8,But8Win4:BUTTON 9,But9Win4:BUTTON 10,But10Win4
BUTTON 11,But11Win4:BUTTON 12,But12Win4:BUTTON 13,But13Win4:BUTTON 14,But14Win4
BUTTON 15,But15Win4:BUTTON 16,But16Win4:BUTTON 17,But17Win4:BUTTON 18,But18Win4
BUTTON 19,But19Win4:BUTTON 20,But20Win4:BUTTON 21,But21Win4:BUTTON 22,But22Win4
BUTTON 23,But23Win4:BUTTON 24,But24Win4:BUTTON 25,But25Win4:BUTTON 26,But26Win4
BUTTON 27,But27Win4:BUTTON 28,But28Win4:BUTTON 29,But29Win4:BUTTON 30,But30Win4
BUTTON 31,But31Win4:BUTTON 32,But32Win4:BUTTON 33,But33Win4:BUTTON 34,But34Win4
BUTTON 35,But35Win4:BUTTON 36,But36Win4:BUTTON 37,But37Win4:BUTTON 38,But38Win4
BUTTON 39,But39Win4:BUTTON 40,But40Win4:BUTTON 41,But41Win4:BUTTON 42,But42Win4
RETURN
REM ------------------------------------------------------------------------

buttonselect5:
REM select window 5 buttons
RETURN
buttonselect6:
REM button selection for Direct Recoil Analysis
RETURN
REM ------------------------------------------------------------------------

ButtonSelect7:
REM select DRISS window buttons
Xpt%=3
IF Dilog1=1 AND But1Win7=1 THEN
   But1Win7=2:But2Win7=1:Scatt1=1
'  ELSEIF Dilog1=1 AND But1Win7=2 THEN
'     But1Win7=1:But2Win7=1:Scatt1=0
END IF
```

```
    '  IF D2sig>2 THEN:D2sig=0: But18Win7=1:But19Win7=1:But20Win7=1:But21Win7=1
  ELSEIF Dilog1=15 AND But15Win7=2 THEN
    But14Win7=1:But15Win7=1:But16Win7=1:But17Win7=1:D1sig=0
  END IF
  IF Dilog1=16 AND But16Win7=1 THEN
    D1sig=3
    But14Win7=1:But15Win7=1:But16Win7=2:But17Win7=1
    '  But18Win7=1:But19Win7=1:But20Win7=1:But21Win7=1
  ELSEIF Dilog1=16 AND But16Win7=2 THEN
    But14Win7=1:But15Win7=1:But16Win7=1:But17Win7=1:D1sig=0
  END IF
  BUTTON 14,But14Win7:BUTTON 15,But15Win7:BUTTON 16,But16Win7
  '  BUTTON 18,But18Win7:BUTTON 19,But19Win7:BUTTON 20,But20Win7

  REM Select Detector 2 Signal
  IF Dilog1=18 AND But18Win7=1 THEN
    D2sig=1
    '  IF D1sig>2 THEN:D1sig=0: But14Win7=1:But15Win7=1:But16Win7=1:But17Win7=1
    But18Win7=2:But19Win7=1:But20Win7=1:But21Win7=1
  ELSEIF Dilog1=18 AND But18Win7=2 THEN
    But18Win7=1:But19Win7=1:But20Win7=1:But21Win7=1:D2sig=0
  END IF
  IF Dilog1=19 AND But19Win7=1 THEN
    D2sig=2
    '  IF D1sig>2 THEN:D1sig=0: But14Win7=1:But15Win7=1:But16Win7=1:But17Win7=1
    But18Win7=1:But19Win7=2:But20Win7=1:But21Win7=1
  ELSEIF Dilog1=19 AND But19Win7=2 THEN
    But18Win7=1:But19Win7=1:But20Win7=1:But21Win7=1:D2sig=0
  END IF
  IF Dilog1=20 AND But20Win7=1 THEN
    D2sig=3
    '  But14Win7=1:But15Win7=1:But16Win7=1:But17Win7=1
    But18Win7=1:But19Win7=1:But20Win7=2:But21Win7=1
  ELSEIF Dilog1=20 AND But20Win7=2 THEN
    But18Win7=1:But19Win7=1:But20Win7=1:But21Win7=1:D2sig=0
  END IF
  '  BUTTON 14,But14Win7:BUTTON 15,But15Win7:BUTTON 16,But16Win7
  BUTTON 18,But18Win7:BUTTON 19,But19Win7:BUTTON 20,But20Win7

  REM Select Detector 1 Display
  rgn%=D1sig
  IF Dilog1=23 AND But23Win7=1 THEN
    D1IDisp=1
    rgn%=1
    DispWindo(3,1)=1
    '  ScanStart(Xpt%,rgn%)=ScanStart(Xpt%,rgn%):ScanEnd(Xpt%,rgn%)=ScanEnd(Xpt%,rgn%)
'   ColorTop(1)=ColorTop(1)+1:IF ColorTop(1)>6 THEN ColorTop(1)=1
'    ColorSet (3,1)=ColorTop(1):ExptNo(1)=3
'   GOSUB SetColor
'    col%=col&:ForeColor col%
    GOSUB Magenta
    CALL PAINTRECT (VARPTR(rect23%(0))):GOSUB Black
    But23Win7=2:But24Win7=1:But25Win7=1:But26Win7=1
  ELSEIF Dilog1=23 AND But23Win7=2 THEN
    But23Win7=1:But24Win7=1:But25Win7=1:But26Win7=1:D1IDisp=0
    DispWindo(3,1)=0
'   col%=0:ForeColor col%:CALL PAINTRECT (VARPTR(rect23%(0))):GOSUB Black
  END IF
  IF Dilog1=24 AND But24Win7=1 THEN
    D1IDisp=2
    rgn%=1
    DispWindo(3,1)=2
    '  ScanStart(Xpt%,rgn%)=ScanStart(Xpt%,rgn%):ScanEnd(Xpt%,rgn%)=ScanEnd(Xpt%,rgn%)
'   ColorTop(2)=ColorTop(2)+1:IF ColorTop(2)>6 THEN ColorTop(2)=1
'   ColorSet (3,1)=ColorTop(2):ExptNo(2)=3
'   GOSUB SetColor
```

```
'   col%=col&:ForeColor col%
'   CALL PAINTRECT (VARPTR(rect24%(0))):GOSUB Black
    But23Win7=1:But24Win7=2:But25Win7=1:But26Win7=1
  ELSEIF Dilog1=24 AND But24Win7=2 THEN
    But23Win7=1:But24Win7=1:But25Win7=1:But26Win7=1:D1IDisp=0
    DispWindo(3,1)=0
'   col%=0:ForeColor col%:CALL PAINTRECT (VARPTR(rect24%(0))):GOSUB Black
  END IF
  IF Dilog1=25 AND But25Win7=1 THEN
    D1IDisp=3
    rgn%=1
    DispWindo(3,1)=3
'     ScanStart(Xpt%,rgn%)=ScanStart(Xpt%,rgn%):ScanEnd(Xpt%,rgn%)=ScanEnd(Xpt%,rgn%)
'   ColorTop(3)=ColorTop(3)+1:IF ColorTop(3)>6 THEN ColorTop(3)=1
'   ColorSet (3,1)=ColorTop(3):ExptNo(3)=3
'   GOSUB SetColor
'   col%=col&:ForeColor col%
'   CALL PAINTRECT (VARPTR(rect25%(0))):GOSUB Black
    But23Win7=1:But24Win7=1:But25Win7=2:But26Win7=1
  ELSEIF Dilog1=25 AND But25Win7=2 THEN
    But23Win7=1:But24Win7=1:But25Win7=1:But26Win7=1:D1IDisp=0
    DispWindo(3,1)=0
'   col%=0:ForeColor col%:CALL PAINTRECT (VARPTR(rect25%(0))):GOSUB Black
  END IF
  IF Dilog1=26 AND But26Win7=1 THEN
    D1IDisp=4
    rgn%=1
    DispWindo(3,1)=4
'     ScanStart(Xpt%,rgn%)=ScanStart(Xpt%,rgn%):ScanEnd(Xpt%,rgn%)=ScanEnd(Xpt%,rgn%)
'   ColorTop(4)=ColorTop(4)+1:IF ColorTop(4)>6 THEN ColorTop(4)=1
'   ColorSet (3,1)=ColorTop(4):ExptNo(4)=3
'   GOSUB SetColor
'   col%=col&:ForeColor col%
'   CALL PAINTRECT (VARPTR(rect26%(0))):GOSUB Black
    But23Win7=1:But24Win7=1:But25Win7=1:But26Win7=2
  ELSEIF Dilog1=26 AND But26Win7=2 THEN
    But23Win7=1:But24Win7=1:But25Win7=1:But26Win7=1:D1IDisp=0
    DispWindo(3,1)=0
'   col%=0:ForeColor col%:CALL PAINTRECT (VARPTR(rect26%(0))):GOSUB Black
  END IF
  REM turn off inappropriate display options
  IF D1sig=0 THEN
    DispWindo(3,1)=0
    BUTTON 23,0:BUTTON 24,0:BUTTON 25,0:BUTTON 26,0
  ELSE
    DispWindo(3,1)=D1IDisp
    BUTTON 23, But23Win7:BUTTON 24, But24Win7:BUTTON 25, But25Win7:BUTTON 26, But26Win7
  END IF

  REM Select Detector 2 Display
  IF D2sig>0 THEN rgn%=D2sig+3
  IF Dilog1=31 AND But31Win7=1 THEN
    D2IDisp=1
    rgn%=2
    DispWindo(3,2)=1
'   ColorTop(1)=ColorTop(1)+1:IF ColorTop(1)>6 THEN ColorTop(1)=1
'   ColorSet (3,2)=ColorTop(1):ExptNo(1)=3
'   GOSUB SetColor
'   col%=col&:ForeColor col%
'   CALL PAINTRECT (VARPTR(rect31%(0))):GOSUB Black
    But31Win7=2:But32Win7=1:But33Win7=1:But34Win7=1
  ELSEIF Dilog1=31 AND But31Win7=2 THEN
    But31Win7=1:But32Win7=1:But33Win7=1:But34Win7=1:D2IDisp=0
    DispWindo(3,2)=0
'   col%=0:ForeColor col%:CALL PAINTRECT (VARPTR(rect31%(0))):GOSUB Black
  END IF
  IF Dilog1=32 AND But32Win7=1 THEN
```

```
D2IDisp=2
rgn%=2
DispWindo(3,2)=2
' ColorTop(2)=ColorTop(2)+1:IF ColorTop(2)>6 THEN ColorTop(2)=1
' ColorSet (3,2)=ColorTop(2):ExptNo(2)=3
' GOSUB SetColor
' col%=col&:ForeColor col%
' CALL PAINTRECT (VARPTR(rect32%(0))):GOSUB Black
But31Win7=1:But32Win7=2:But33Win7=1:But34Win7=1
ELSEIF Dilog1=32 AND But32Win7=2 THEN
But31Win7=1:But32Win7=1:But33Win7=1:But34Win7=1:D2IDisp=0
DispWindo(3,2)=0
' col%=0:ForeColor col%:CALL PAINTRECT (VARPTR(rect32%(0))):GOSUB Black
END IF
IF Dilog1=33 AND But33Win7=1 THEN
D2IDisp=3
DispWindo(3,2)=3
rgn%=2
' ColorTop(3)=ColorTop(3)+1:IF ColorTop(3)>6 THEN ColorTop(3)=1
' ColorSet (3,2)=ColorTop(3):ExptNo(3)=3
' GOSUB SetColor
' col%=col&:ForeColor col%
' CALL PAINTRECT (VARPTR(rect33%(0))):GOSUB Black
But31Win7=1:But32Win7=1:But33Win7=2:But34Win7=1
ELSEIF Dilog1=33 AND But33Win7=2 THEN
But31Win7=1:But32Win7=1:But33Win7=1:But34Win7=1:D2IDisp=0
DispWindo(3,2)=0
' col%=0:ForeColor col%:CALL PAINTRECT (VARPTR(rect33%(0))):GOSUB Black
END IF
IF Dilog1=34 AND But34Win7=1 THEN
D2IDisp=4
rgn%=2
DispWindo(3,2)=4
' ColorTop(4)=ColorTop(4)+1:IF ColorTop(4)>6 THEN ColorTop(4)=1
' ColorSet (3,2)=ColorTop(4):ExptNo(4)=3
' GOSUB SetColor
' col%=col&:ForeColor col%
' CALL PAINTRECT (VARPTR(rect34%(0))):GOSUB Black
But31Win7=1:But32Win7=1:But33Win7=1:But34Win7=2
ELSEIF Dilog1=34 AND But34Win7=2 THEN
But31Win7=1:But32Win7=1:But33Win7=1:But34Win7=1:D2IDisp=0
DispWindo(3,2)=0
' col%=0:ForeColor col%:CALL PAINTRECT (VARPTR(rect34%(0))):GOSUB Black
END IF
REM turn off inappropriate display options
IF D2sig=0 THEN
DispWindo(3,2)=0
BUTTON 31,0:BUTTON 32,0:BUTTON 33,0:BUTTON 34,0
ELSE
DispWindo(3,2)=D2IDisp
BUTTON 31, But31Win7:BUTTON 32, But32Win7:BUTTON 33, But33Win7:BUTTON 34, But34Win7
END IF

IF Dilog1=40 AND But40Win7=1 THEN
But40Win7=2:But41Win7=1
BUTTON 40, But40Win7:BUTTON 41, But41Win7
GOSUB BeamOn:BeamStatus=1
END IF
IF Dilog1=41 AND But41Win7=1 THEN
But40Win7=1:But41Win7=2
BUTTON 40, But40Win7:BUTTON 41, But41Win7
GOSUB BeamOff:BeamStatus=0
END IF
IF Dilog1=42 OR Dilog1=43 OR Dilog1=44 THEN
REM Beam DC
IF Dilog1=42 AND But42Win7=1 THEN
But42Win7=2:But43Win7=1:But44Win7=1:BeamMode=1
```

```
    ELSEIF Dilog1=42 AND But42Win7=2 THEN
        But42Win7=1:But43Win7=1:But44Win7=1:BeamMode=0
    END IF
  REM Beam continuous pulse
    IF Dilog1=43 AND But43Win7=1 THEN
        But42Win7=1:But43Win7=2:But44Win7=1:BeamMode=2
    ELSEIF Dilog1=43 AND But43Win7=2 THEN
        But42Win7=1:But43Win7=1:But44Win7=1:BeamMode=0
    END IF
  REM Beam single pulse
    IF Dilog1=44 AND But44Win7=1 THEN
        But42Win7=1:But43Win7=1:But44Win7=2:BeamMode=3
    ELSEIF Dilog1=44 AND But44Win7=2 THEN
        But42Win7=1:But43Win7=1:But44Win7=1:BeamMode=0
    END IF
    BUTTON 42, But42Win7:BUTTON 43, But43Win7:BUTTON 44, But44Win7
    GOSUB SetBeamMode
  END IF

  IF Dilog1=45 THEN GOSUB SetScroll1
  IF Dilog1=46 THEN GOSUB SetScroll2
  IF Dilog1=47 THEN GOSUB SetScroll3
  IF Dilog1=48 THEN GOSUB SetScroll4
  IF Dilog1=49 THEN GOSUB SetScroll5
  IF Dilog1=50 THEN GOSUB SetScroll6
  IF Dilog1=51 THEN GOSUB SetScroll7

  REM Scroll Speed Select
    IF Dilog1=52 AND But52Win7=1 THEN
      DeltaScroll=3
       But52Win7=2:But53Win7=1:But54Win7=1
      REM IF ScrollStatus=0 THEN GOSUB MakeScroll
    ELSEIF Dilog1=52 AND But52Win7=2 THEN
       But52Win7=1:But53Win7=1:But54Win7=1
    END IF
    IF Dilog1=53 AND But53Win7=1 THEN
      DeltaScroll=2
       But52Win7=1:But53Win7=2:But54Win7=1
      REM IF ScrollStatus=0 THEN GOSUB MakeScroll
      ELSEIF Dilog1=53 AND But53Win7=2 THEN
         But52Win7=1:But53Win7=1:But54Win7=1
      END IF
      IF Dilog1=54 AND But54Win7=1 THEN
        DeltaScroll=1
         But52Win7=1:But53Win7=1:But54Win7=2
        REM IF ScrollStatus=0 THEN GOSUB MakeScroll
      ELSEIF Dilog1=54 AND But54Win7=2 THEN
         But52Win7=1:But53Win7=1:But54Win7=1
      END IF
  BUTTON 52, But52Win7:BUTTON 53, But53Win7:BUTTON 54, But54Win7
  REM Display Scaler Values (software histogramming only)
  IF Dilog1=55 AND But55Win7 =1 THEN
     But55Win7 =2:But56Win7 =1:But57Win7 =1:But58Win7 =1
     BUTTON 55,But55Win7:BUTTON 56,But56Win7:BUTTON 57,But57Win7:BUTTON 58,But58Win7
     DataScan=1:ChanScan=0:Dilog1=0
    IF But59Win7=2 THEN DataDisplay=DataScan
 'ELSEIF Dilog1=55 AND But55Win7 =2 THEN
 '   But55Win7 =1:But56Win7 =1:But57Win7 =1:But58Win7 =1
 '   BUTTON 55,But55Win7:BUTTON 56,But56Win7:BUTTON 57,But57Win7:BUTTON 58,But58Win7
 '   DataScan=0Dilog1=0
 END IF
 IF Dilog1=56 AND But56Win7 =1 THEN
    But55Win7 =1:But56Win7 =2:But57Win7 =1:But58Win7 =1
    BUTTON 55,But55Win7:BUTTON 56,But56Win7:BUTTON 57,But57Win7:BUTTON 58,But58Win7
    DataScan=2:ChanScan=1:Dilog1=0
   IF But59Win7=2 THEN DataDisplay=DataScan
 'ELSEIF Dilog1=56 AND But56Win7 =2 THEN
```

```
'   But55Win7 =1:But56Win7 =1:But57Win7 =1:But58Win7 =1
'   BUTTON 55,But55Win7:BUTTON 56,But56Win7:BUTTON 57,But57Win7:BUTTON 58,But58Win7
'   DataScan=0:Dilog1=0
  END IF
  IF Dilog1=57 AND But57Win7 =1 THEN
     But55Win7 =1:But56Win7 =1:But57Win7 =2:But58Win7 =1
     BUTTON 55,But55Win7:BUTTON 56,But56Win7:BUTTON 57,But57Win7:BUTTON 58,But58Win7
     DataScan=3:ChanScan=3:Dilog1=0
    IF But59Win7=2 THEN DataDisplay=DataScan
  'ELSEIF Dilog1=57 AND But57Win7 =2 THEN
'    But55Win7 =1:But56Win7 =1:But57Win7 =1:But58Win7 =1
'    BUTTON 55,But55Win7:BUTTON 56,But56Win7:BUTTON 57,But57Win7:BUTTON 58,But58Win7
'    DataScan=0:Dilog1=0
  END IF
  IF Dilog1=58 AND But58Win7 =1 THEN
     But55Win7 =1:But56Win7 =1:But57Win7 =1:But58Win7 =2
     BUTTON 55,But55Win7:BUTTON 56,But56Win7:BUTTON 57,But57Win7:BUTTON 58,But58Win7
     DataScan=4:ChanScan=7:Dilog1=0
    IF But59Win7=2 THEN DataDisplay=DataScan
  'ELSEIF Dilog1=58 AND But58Win7 =2 THEN
'    But55Win7 =1:But56Win7 =1:But57Win7 =1:But58Win7 =1
'    BUTTON 55,But55Win7:BUTTON 56,But56Win7:BUTTON 57,But57Win7:BUTTON 58,But58Win7
'    DataScan=0:Dilog1=0
  END IF
  IF Dilog1=59 AND But59Win7 =1 THEN
     But59Win7 =2
     BUTTON 59,But59Win7
     DataDisplay=DataScan:Dilog1=0
  ELSEIF Dilog1=59 AND But59Win7 =2 THEN
     But59Win7 =1
     BUTTON 59,But59Win7
     DataDisplay=0:Dilog1=0
  END IF

  IF Dilog1=61 AND But61Win7=1 THEN
     PeakShift=0
     But61Win7=2:But62Win7=1:But63Win7=1
    BUTTON 61,But61Win7:BUTTON 62,But62Win7:BUTTON 63,But63Win7
  END IF
  IF Dilog1=62 AND But62Win7=1 THEN
     PeakShift=1
     But61Win7=1:But62Win7=2:But63Win7=1
    BUTTON 61,But61Win7:BUTTON 62,But62Win7:BUTTON 63,But63Win7
  END IF
  IF Dilog1=63 AND But63Win7=1 THEN
     PeakShift=2
     But61Win7=1:But62Win7=1:But63Win7=2
    BUTTON 61,But61Win7:BUTTON 62,But62Win7:BUTTON 63,But63Win7
  END IF

REM Select plot of Cumulative (cum), New or Difference (New-Cum) values
REM Detector 1
IF Dilog1=70 AND But70Win7 =1 THEN
   But70Win7 =2:But71Win7 =1:But72Win7 =1
   Cum3D1=1:New3D1=0:Dif3D1=0
  IF Repeat3Max>1 THEN
     BUTTON 70,But70Win7:BUTTON 71,But71Win7:BUTTON 72,But72Win7
  ELSE
     BUTTON 70,2:BUTTON 71,1:BUTTON 72,1
  END IF
END IF
IF Dilog1=71 AND But71Win7 =1 THEN
   But70Win7 =1:But71Win7 =2:But72Win7 =1
   Cum3D1=0:New3D1=1:Dif3D1=0
  IF Repeat3Max>1 THEN
     BUTTON 70,But70Win7:BUTTON 71,But71Win7:BUTTON 72,But72Win7
  ELSE
```

```
        BUTTON 70,2:BUTTON 71,1:BUTTON 72,1
      END IF
    END IF
    IF Dilog1=72 AND But72Win7 =1 THEN
       But70Win7 =1:But71Win7 =1:But72Win7 =2:
       Cum3D1=0:New3D1=0:Dif3D1=1
      IF Repeat3Max>1 THEN
        BUTTON 70,But70Win7:BUTTON 71,But71Win7:BUTTON 72,But72Win7
      ELSE
        BUTTON 70,2:BUTTON 71,1:BUTTON 72,1
      END IF
    END IF

    REM Detector 2
    IF Dilog1=73 AND But73Win7 =1 THEN
       But73Win7 =2:But74Win7 =1:But75Win7 =1
      Cum3D2=1:New3D2=0:Dif3D2=0
      BUTTON 73,But73Win7:BUTTON 74,But74Win7:BUTTON 75,But75Win7
      IF Repeat3Max>1 THEN
        BUTTON 73,But73Win7:BUTTON 74,But74Win7:BUTTON 75,But75Win7
      ELSE
        BUTTON 73,2:BUTTON 74,1:BUTTON 75,1
      END IF
    END IF
    IF Dilog1=74 AND But74Win7 =1 THEN
       But73Win7 =1:But74Win7 =2:But75Win7 =1
      Cum3D2=0:New3D2=1:Dif3D2=0
      IF Repeat3Max>1 THEN
        BUTTON 73,But73Win7:BUTTON 74,But74Win7:BUTTON 75,But75Win7
      ELSE
        BUTTON 73,2:BUTTON 74,1:BUTTON 75,1
      END IF
    END IF
    IF Dilog1=75 AND But75Win7 =1 THEN
       But73Win7 =1:But74Win7 =1:But75Win7 =2:
      Cum3D2=0:New3D2=0:Dif3D2=1
      IF Repeat3Max>1 THEN
        BUTTON 73,But73Win7:BUTTON 74,But74Win7:BUTTON 75,But75Win7
      ELSE
        BUTTON 73,2:BUTTON 74,1:BUTTON 75,1
      END IF
    END IF

    REM Detector 3
    IF Dilog1=76 AND But76Win7 =1 THEN
       But76Win7 =2:But77Win7 =1:But78Win7 =1
      Cum3D3=1:New3D3=0:Dif3D3=0
      '  BUTTON 76,But76Win7:BUTTON 77,But77Win7:BUTTON 78,But78Win7
      IF Repeat3Max>1 THEN
        BUTTON 73,But73Win7:BUTTON 74,But74Win7:BUTTON 75,But75Win7
      ELSE
        BUTTON 73,2:BUTTON 74,1:BUTTON 75,1
      END IF
    END IF

    IF Dilog1=77 AND But77Win7 =1 THEN
       But76Win7 =1:But77Win7 =2:But78Win7 =1
      Cum3D3=0:New3D3=1:Dif3D3=0
      '  BUTTON 76,But76Win7:BUTTON 77,But77Win7:BUTTON 78,But78Win7
      IF Repeat3Max>1 THEN
        BUTTON 76,But76Win7:BUTTON 77,But77Win7:BUTTON 78,But78Win7
      ELSE
        BUTTON 76,2:BUTTON 77,1:BUTTON 78,1
      END IF
    END IF

    IF Dilog1=78 AND But78Win7 =1 THEN
```

```
 But76Win7 =1:But77Win7 =1:But78Win7 =2:
 Cum3D3=0:New3D3=0:Dif3D3=1
 '   BUTTON 76,But76Win7:BUTTON 77,But77Win7:BUTTON 78,But78Win7
 IF Repeat3Max>1 THEN
    BUTTON 76,But76Win7:BUTTON 77,But77Win7:BUTTON 78,But78Win7
 ELSE
    BUTTON 76,2:BUTTON 77,1:BUTTON 78,1
 END IF
END IF

IF Dilog1=89 THEN
REM ARISS button
  IF But89Win7 =1 THEN
    ARISS=1:But89Win7=2
    BUTTON 89,But89Win7
  ELSE
    ARISS=0:But89Win7=1
    BUTTON 89,But89Win7
  END IF
END IF:REM Dilog1=89

IF Dilog1=90 THEN
REM Raster button
  IF But90Win7 =1 THEN
    Raster=1:But90Win7=2
    Image=0:But91Win7=1
  ELSE
    Raster=0:But90Win7=1
    Image=0:But91Win7=1
  END IF
      BUTTON 90,But90Win7
      BUTTON 91,But91Win7
END IF:REM Dilog1=90

IF Dilog1=91 THEN
REM Image button
  IF But91Win7 =1 THEN
    Image=1:But91Win7=2
    Raster=0:But90Win7=1
  ELSE
    Image=0:But91Win7=1
    Raster=0:But90Win7=1
  END IF
    BUTTON 90,But90Win7
    BUTTON 91,But91Win7
END IF:REM Dilog1=91

Dilog1=0
RETURN
REM --------------------------------------------------------------

ButtonSelect8:
REM select window 8 buttons
RETURN

buttonselect10:
RETURN

buttonselect14:
REM select window 14 buttons
RETURN

buttonselect15:
REM select window 15 buttons
RETURN
REM --------------------------------------------------------------
```

```
DialogHandler:
DIALOG OFF
Retn=0
TabFld=0
OldField=EdField
Dilog=DIALOG(0)
SELECT CASE Windo
  CASE 1: REM Window 1
  SELECT CASE Dilog
    CASE 1: Dilog1=DIALOG(1):GOSUB ButtonSelect1
    CASE 2: EdField=DIALOG(2)
    CASE 3: BEEP:NewWindow=DIALOG(3):WINDOW NewWindow
    CASE 4: closewindow=DIALOG(4)
    CASE 5: updatewindow=DIALOG(5):IF WINDOW(1)=updatewindow THEN:Dilog=0: REM GOSUB InitWindo1
    CASE 6: Retn=1
    CASE 7: TabFld=1
    REM CASE ELSE:RETURN
    CASE ELSE: DIALOG ON:RETURN
  END SELECT
  CASE 2:REM Window 2
  SELECT CASE Dilog
    CASE 1: Dilog1=DIALOG(1):GOSUB ButtonSelect2
    CASE 2: EdField=DIALOG(2)
    CASE 3: NewWindow=DIALOG(3)
    CASE 4: closewindow=DIALOG(4)
    CASE 5: updatewindow=DIALOG(5):IF WINDOW(1)=updatewindow AND Windo=2 THEN:GOSUB
InitWindo2:Dilog=0
    CASE 6: Retn=1
    CASE 7: TabFld=1
    CASE ELSE: DIALOG ON: RETURN
  END SELECT
  CASE 3:REM Window 3
  SELECT CASE Dilog
    CASE 1: Dilog1=DIALOG(1):GOSUB buttonselect3
    CASE 2: EdField=DIALOG(2)
    CASE 3: NewWindow=DIALOG(3)
    CASE 4: closewindow=DIALOG(4)
    CASE 5: updatewindow=DIALOG(5):IF WINDOW(1)=updatewindow AND Windo=3 THEN: GOSUB
initwindo3:Dilog=0
    CASE 6: Retn=1
    CASE 7: TabFld=1
    CASE ELSE: DIALOG ON:RETURN
  END SELECT
  CASE 4:REM Window 4
  SELECT CASE Dilog
    CASE 1: Dilog1=DIALOG(1):GOSUB buttonselect4
    CASE 2: EdField=DIALOG(2)
    CASE 3: NewWindow=DIALOG(3)
    CASE 4: closewindow=DIALOG(4)
    CASE 5: updatewindow=DIALOG(5):IF WINDOW(1)=updatewindow AND Windo=4 THEN:GOSUB
InitWindo4:Dilog=0
    CASE 6: Retn=1
    CASE 7: TabFld=1
    CASE ELSE: DIALOG ON: RETURN
  END SELECT
  CASE 5:REM Window 5
  SELECT CASE Dilog
    CASE 1: Dilog1=DIALOG(1):GOSUB buttonselect5
    CASE 2: EdField=DIALOG(2)
    CASE 3: NewWindow=DIALOG(3)
    CASE 4: closewindow=DIALOG(4)
    CASE 5: updatewindow=DIALOG(5):IF WINDOW(1)=updatewindow AND Windo=5 THEN:GOSUB
InitWindo5:Dilog=0.
    CASE 6: Retn=1
    CASE 7: TabFld=1
    CASE ELSE: DIALOG ON: RETURN
  END SELECT
```

```
CASE 7:REM Window 7
SELECT CASE Dilog
  CASE 1: Dilog1=DIALOG(1):GOSUB ButtonSelect7
  CASE 2: EdField=DIALOG(2)
  CASE 3: NewWindow=DIALOG(3)
  CASE 4: closewindow=DIALOG(4)
  CASE 5: updatewindow=DIALOG(5)
    IF WINDOW(1)=updatewindow AND Windo=7 THEN
      GOSUB InitWindo7:Dilog=0
    END IF
  CASE 6:
    IF EdScroll=0 THEN
      Retn=1:EdField=EdField+1:IF EdField>20 THEN EdField=1
      IF EdField=4 OR EdField=5 OR EdField=6 OR EdField=7 THEN EdField=8
    ELSE
      SELECT CASE EdScroll
        CASE 1:GOSUB ScrollMouse1
        CASE 2:GOSUB ScrollMouse2
        CASE 3:GOSUB ScrollMouse3
        CASE 4:GOSUB ScrollMouse4
        CASE 5:GOSUB ScrollMouse5
        CASE 6:GOSUB ScrollMouse6
        CASE 7:GOSUB ScrollMouse7
        CASE ELSE:RETURN
      END SELECT
    END IF
  CASE 7: TabFld=1:EdField=EdField-1:IF EdField<1 THEN EdField=20
    IF EdField=4 OR EdField=5 OR EdField=6 OR EdField=7 THEN EdField=3
  CASE ELSE: RETURN
END SELECT
CASE 8:REM Window 8
SELECT CASE Dilog
  CASE 1: Dilog1=DIALOG(1):GOSUB ButtonSelect8
  CASE 2: EdField=DIALOG(2)
  CASE 3: NewWindow=DIALOG(3)
  CASE 4: closewindow=DIALOG(4)
  CASE 5: updatewindow=DIALOG(5)
  CASE 6: Retn=1
  CASE 7: TabFld=1
  CASE ELSE: DIALOG ON:RETURN
END SELECT
' CASE 10:REM Window 10
' RETURN
CASE 14:REM Window 14=Set Interleave
SELECT CASE Dilog
  CASE 1: Dilog1=DIALOG(1):GOSUB buttonselect14
  CASE 2: EdField=DIALOG(2)
  CASE 3: NewWindow=DIALOG(3)
  CASE 4: closewindow=DIALOG(4)
  CASE 5: updatewindow=DIALOG(5):IF WINDOW(1)=updatewindow THEN:GOSUB InitWindo14
  CASE 6: Retn=1
  CASE 7: TabFld=1
  CASE ELSE: DIALOG ON: RETURN
END SELECT
CASE 15:REM Window 15=Data Display
SELECT CASE Dilog
  CASE 1: Dilog1=DIALOG(1):GOSUB buttonselect15
  CASE 2: EdField=DIALOG(2)
  CASE 3: NewWindow=DIALOG(3)
  CASE 4: closewindow=DIALOG(4)
  CASE 5
    updatewindow=DIALOG(5)
    IF WINDOW(1)=updatewindow THEN
      GOSUB InitWindo15
      IF Xpt%=3 AND FirstPlot3=1 THEN GOSUB Replot3

        FOR bin3%=1 TO PtsPerScan
```

```
'           FOR rgn%=1 TC ^
'              IF DispWindo (Xpt%,rgn%)>0 and FirstPlot=1 THEN GOSUB RePlotData
'           NEXT
'         NEXT
'       END IF


'           IF Expt$=Expt1$ THEN:Xpt%=1:RegionMax(1)=10:NptsMax=Npts1(rgn%):FirstPlot=FirstPlot1
'           IF Expt$=Expt2$ THEN:Xpt%=2:RegionMax(2)=10:NptsMax=Npts2(rgn%):FirstPlot=FirstPlot2
'           IF Expt$=Expt3$ THEN:Xpt%=3:RegionMax(3)=10:NptsMax=PtsPerScan:FirstPlot=FirstPlot3
'       FOR rgn%=0 TO RegionMax(Xpt%)
'         FOR bin=1 TO NptsMax
'           IF ScanDelt<>0 THEN
'              '  ScanRatio=ABS((Scan-ScanStart(Xpt%,rgn%))/(ScanDelt))
'              ScanRatio=bin/Npts1(rgn%)
'              Scan=ScanRatio*ScanDelt+ScanStart(Xpt%,rgn%)
'              IF FirstPlot=1 THEN GOSUB RePlotData
'           END IF:REM   Scandelt<>0
'         NEXT:REM bin
'       NEXT:REM rgn%
      END IF:REM Update Window
     CASE 6:  Retn=1
     CASE 7:  TabFld=1
     CASE ELSE: DIALOG ON: RETURN
   END SELECT
   CASE ELSE:DIALOG ON:RETURN
 END SELECT
 DIALOG ON
 RETURN
 REM -----------------------------------------------------------

 DrissTest:
   IF But8Win7=2 THEN GOSUB BeamOn
   IF But8Win7=1 THEN GOSUB BeamOff
 RETURN
 REM -----------------------------------------------------------

 Energy:
   REM calculates scattered and recoil energies
   IF (E0>0 AND Mkg2>Mkg1) THEN
 REM    E1Det1=((Mkg2-Mkg1)*(E0*1E+16))/(1E+16*(Mkg2+Mkg1))
 REM    E2=2*Mkg1*(E0*1E+16)/(1E+16*(Mkg2+Mkg1))
     IF Mkg1>0 THEN Alpha=(1E+26*Mkg2)/(1E+26*Mkg1)
     E1Det1=E0 * ( COS(GDAng1) + SQR (Alpha^2 - ( SIN(GDAng1) )^2) )^2 /(1+Alpha)^2
     E2Det1=E0*4*Alpha*(COS(GDAng1))^2/(1+Alpha)^2
     E1Det2=E0* ( COS(GDAng2) + SQR (Alpha^2 - ( SIN(GDAng2) )^2) )^2/(1+Alpha)^2
     E2Det2=E0*4*Alpha*(COS(GDAng2))^2/(1+Alpha)^2
   END IF
 RETURN
 REM -----------------------------------------------------------

 ErrMsg:
 REM Displays Error Messages
 ErrMsgOld$=ErrMsg$
 ErrRect%(0)=Erry+5:ErrRect%(1)=Errx-5:ErrRect%(2)=Erry+25:ErrRect%(3)=Errx+300
 ERASERECT VARPTR(ErrRect%(0))
 FRAMERECT VARPTR(ErrRect%(0))
 MOVETO Errx,Erry+20:PRINT ErrMsg$
 RETURN
 REM -----------------------------------------------------------

 InitWindo1:
 DIALOG OFF
 REM Initialize window 1
 WIN...W CLOSE Windo
 Errx=20:Erry=420
 Windo=1
```

```
But1Win2=1:But2Win2=1:But3Win2=1
IF Windo1=0 THEN WINDOW 1, "SELECT EXPERIMENTS", (0,35)-(640,480),5 ELSE WINDOW 1
REM Turn beam pulsing off
  PulseStatus%=0:GOSUB PulseGen
Nscan1=1:Nscan2=1:Nscan3=1
Nscans1=1:Nscans2=1:Nscans3=1
Gone1=0:Gone2=0:Gone3=0
Windo1=1:Windo2=0
'IF SYSTEM(1)=4 OR SYSTEM(1)=5 THEN
'   Hist=0:But10Win1=1
'  GPIB=1:But11Win1=2
'  DataIn=1:But12Win1=2
'END IF
IF SYSTEM(1)=9 THEN:GPIB=0:But11Win1=1:'  Mac IIci
IF SYSTEM(1)=16 THEN
  Datain=0:But12Win1=1:'  Mac IIsi
  GPIB=0:But11Win1=1
END IF
BUTTON 1,But1Win1, "Auger", (250,50)-(325,75),2
BUTTON 2,But2Win1, "XPS", (250,75)-(325,100),2
BUTTON 3,But3Win1, "UPS", (250,100)-(325,125),2
BUTTON 4,But4Win1, "SIMS", (250,150)-(325,175),2
BUTTON 5,But5Win1, "IEA", (250,175)-(325,200),2
REM BUTTON 6,But6Win1, "DR", (250,225)-(325,250),2
BUTTON 7,But7Win1, "DR/ISS", (250,250)-(325,275),2
BUTTON 8,But8Win1, "Test", (250,300)-(325,325),2
BUTTON 9,But9Win1, "OK", (350,300)-(400,325),1
BUTTON 10,But10Win1, "Hardware Histogram", (100,400)-(260,425),3
BUTTON 11,But11Win1, "GPIB Active", (300,400)-(425,425),3
BUTTON 12,But12Win1, "Data Input Active", (450,400)-(600,425),3

BEEP
DIALOG ON
RETURN
REM ------------------------------------------------------------------------------------------

InitWindo2:
DIALOG OFF
Leave2=0
REM Select Mode
WINDOW CLOSE 1:Windo1=0
WINDOW CLOSE Windo
'  SetAmin=0:SetAmax=0
Windo=2
IF Windo2=0 THEN WINDOW 2,Expt$+ " Mode",(0,35)-(640,400),5 ELSE WINDOW 2
REM Turn beam pulsing off
  PulseStatus%=0:GOSUB PulseGen
CLS
WindoOpen:
Windo2=1
CALL TEXTFONT (3)
CALL TEXTSIZE (12)
REM--Initialize the edit field and buttons
butpress=0
IF Expt1$<>"" THEN
  Xpt%=1
  ScanUnit$="eV"
  IF Expt1$="AES" AND (First11=0 OR Expt1$<>Expt1Old$) THEN
    First11=1:' FIRSTij where i=mode (Survey=1) & j=experiment (AES=1)
    Expt1Old$="AES"
'    ScanMin$(Xpt%)=ScanAMin$
    ScanMin(Xpt%)=VAL(ScanMin$(Xpt%))
'    ScanMax$(Xpt%)=ScanAMax$
    ScanMax(Xpt%)=VAL(ScanMax$(Xpt%))
  END IF
  IF Expt1$="XPS" AND (First12=0 OR Expt1$<>Expt1Old$) THEN
    First12=1:' FIRSTij where i=mode (Survey=1) & j=experiment (XPS=2)
```

```
      Expt1Old$="XPS"
      ScanMin$(Xpt%)=ScanXMin$:ScanMin(Xpt%)=VAL(ScanMin$(Xpt%))
      ScanMax$(Xpt%)=ScanXMax$:ScanMax(Xpt%)=VAL(ScanMax$(Xpt%))
    END IF
    IF Expt1$="UPS" AND (First13=0 OR Expt1$<>Expt1Old$) THEN
      First13=1:' FIRSTij where i=mode (Survey=1) & j=experiment (UPS=3)
      Expt1Old$="UPS"
      ScanMin$(Xpt%)=ScanUMin$:ScanMin(Xpt%)=VAL(ScanMin$(Xpt%))
      ScanMax$(Xpt%)=ScanUMax$:ScanMax(Xpt%)=VAL(ScanMax$(Xpt%))
    END IF

  ELSEIF Expt2$ <> "" THEN
    IF Expt2$="SIM" AND (First14=0 OR Expt2$<>Expt2Old$) THEN
      ScanUnit$="amu"
      First14=1:' FIRSTij where i=mode (Survey=1) & j=experiment (SIM=4)
      Expt2Old$="SIM"
      ScanMin$(Xpt%)=ScanMMin$:ScanMin(Xpt%)=VAL(ScanMin$(Xpt%))
      ScanMax$(Xpt%)=ScanMMax$:ScanMax(Xpt%)=VAL(ScanMax$(Xpt%))
    END IF
    IF Expt2$="IEA" THEN
      ScanUnit$="IEEv"
      First15=1:' FIRSTij where i=mode (Survey=1) & j=experiment (IEA=5)
      Expt2Old$="IEA"
      ScanMin$(Xpt%)=ScanEMin$:ScanMin(Xpt%)=VAL(ScanMin$(Xpt%))
      ScanMax$(Xpt%)=ScanEMax$:ScanMax(Xpt%)=VAL(ScanMax$(Xpt%))
    END IF
  END IF
  MOVETO 10,45: PRINT "Comments"
  EDIT FIELD 1,Comment$,(85,30)-(600,50)
  BUTTON 1,But1Win2,"survey",(125,60)-(200,85),2
  BUTTON 2,But2Win2,"multiplex",(250,60)-(340,85),2
  BUTTON 3,But3Win2,"profile",(365,60)-(440,85),2
  BUTTON 4,But4Win2,"Scan Minimum",(85,125)-(200,140),2

  IF Expt$=Expt1$ THEN
  '  IF Expt1$="AES" THEN
  '    IF ScanMin(Xpt%)>ScanMax(Xpt%) THEN
  '      ScanMin$(Xpt%)=STR$(ScanMax(Xpt%))
  '      ScanMax$(Xpt%)=STR$(ScanMin(Xpt%))
         ScanMin(Xpt%)=VAL(ScanMin$(Xpt%))
         ScanMax(Xpt%)=VAL(ScanMax$(Xpt%))
  '    END IF
  '  END IF
  '  IF Expt1$="XPS" THEN
  '    IF ScanMin(Xpt%)<ScanMax(Xpt%) THEN
  '      ScanMin$(Xpt%)=STR$(ScanMax(Xpt%))
  '      ScanMax$(Xpt%)=STR$(ScanMin(Xpt%))
  '      ScanMin(Xpt%)=VAL(ScanMin$(Xpt%))
  '      ScanMax(Xpt%)=VAL(ScanMax$(Xpt%))
  '    END IF
  '  END IF
  '  IF Expt1$="UPS" THEN
  '    IF ScanMin(Xpt%)<ScanMax(Xpt%) THEN
  '      ScanMin$(Xpt%)=STR$(ScanMax(Xpt%))
  '      ScanMax$(Xpt%)=STR$(ScanMin(Xpt%))
  '      ScanMin(Xpt%)=VAL(ScanMin$(Xpt%))
  '      ScanMax(Xpt%)=VAL(ScanMax$(Xpt%))
  '    END IF
  '  END IF
  END IF

  EDIT FIELD 2, ScanMin$(Xpt%),(210,125)-(260,140)
  BUTTON 5,But5Win2,"Scan Maximum",(315,125)-(430,140),2
  EDIT FIELD 3, ScanMax$(Xpt%),(450,125)-(500,140)
  REM LINE (0,100)-(640,100)
  EDIT FIELD 1
  DIALOG ON
```

```
RETURN
REM ---------------------------------------------------------------

initwindo3:
DIALOG OFF
REM survey mode
WINDOW CLOSE Windo
WINDOW CLOSE 2
NRegionMax1=0:NRegionMax2=0
Leave3=0
Windo=3
rgn%=0
SurvAcqTimOld$=""
But1Win3=But1Win2
But2Win3=But2Win2
But3Win3=But3Win2
IF Expt$=Expt1$ THEN Nscans$=STR$(Nscans1)
IF Expt$=Expt2$ THEN Nscans$=STR$(Nscans2)
'   But4Win3=1:But5Win3=1:But6Win3=0
REM IF Windo3=0 THEN:
WINDOW 3, Expt$+" Survey",(0,35)-(640,480),5 :CLS
CALL TEXTFONT (3)
CALL TEXTSIZE (9)
REM Turn beam pulsing off
  PulseStatus%=0:GOSUB PulseGen
REM--Initialize the edit field and buttons
Leave3=0:Errx=300:Erry=245
MOVETO 10,45: PRINT "Comments"
EDIT FIELD 1,Comment$,(85,30)-(600,50)
BUTTON 1,But1Win3,"Survey",(125,60)-(200,85),2
BUTTON 2,But2Win3,"Multiplex",(250,60)-(340,85),2
BUTTON 3,But3Win3,"Profile",(365,60)-(440,85),2
LINE (0,100)-(640,100)
Windo3=1
MOVETO 10,120:PRINT "Survey"
CALL TEXTFONT (3)
CALL TEXTSIZE (9)
newfieldmax=9

REM Check prior reading of Window 2
  IF Expt$=Expt1$ THEN FirstRead2=FirstRead21:Xpt%=1
  IF Expt$=Expt2$ THEN FirstRead2=FirstRead22:Xpt%=2
 IF FirstRead2=0 THEN
   IF Expt$=Expt1$ THEN
     FirstRead21=1
      ScanStart$(1,rgn%)=ScanMin$(1)
      ScanStart(1,rgn%)=ScanMin(1)
      ScanEnd$(1,rgn%)=ScanMax$(1)
      ScanEnd(1,rgn%)=ScanMax(1)
   END IF
   IF Expt$=Expt2$ THEN
     FirstRead22=1
      ScanStart$(2,rgn%)=ScanMin$(2)
      ScanStart(2,rgn%)=ScanMin(2)
      ScanEnd$(2,rgn%)=ScanMax$(2)
      ScanEnd(2,rgn%)=ScanMax(2)
   END IF
 ELSE
 REM check bounds
   IF ScanMax(Xpt%)>ScanMin(Xpt%) AND ScanStart(Xpt%,rgn%)<ScanMin(Xpt%) THEN
      ScanStart$(Xpt%,rgn%)=ScanMin$(Xpt%):ScanStart(Xpt%,rgn%)=ScanMin(Xpt%)
   END IF
   IF ScanMax(Xpt%)>ScanMin(Xpt%) AND ScanEnd(Xpt%,rgn%)>ScanMax(Xpt%) THEN
      ScanEnd$(Xpt%,rgn%)=ScanMax$(Xpt%):ScanEnd(Xpt%,rgn%)=ScanMax(Xpt%)
   END IF
   IF ScanMax(Xpt%)<ScanMin(Xpt%) AND ScanStart(Xpt%,rgn%)>ScanMin(Xpt%) THEN
      ScanStart$(Xpt%,rgn%)=ScanMin$(Xpt%):ScanStart(Xpt%,rgn%)=ScanMin(Xpt%)
```

```
    END IF
    IF ScanMax(Xpt%)<ScanMin(Xpt%) AND ScanEnd(Xpt%,rgn%)<ScanMax(Xpt%) THEN
      ScanEnd$(Xpt%,rgn%)=ScanMax$(Xpt%):ScanEnd(Xpt%,rgn%)=ScanMax(Xpt%)
    END IF
  END IF

IF Expt$=Expt1$ THEN
  Xpt%=1
  IF Expt1$="AES" THEN
     ScanAStart$=ScanStart$(Xpt%,rgn%):ScanAEnd$=ScanEnd$(Xpt%,rgn%)
    ScanAStart=VAL(ScanAStart$):ScanAEnd=VAL(ScanAEnd$)
  END IF
  IF Expt1$="XPS" THEN
     ScanXstart$=ScanStart$(Xpt%,rgn%):ScanXend$=ScanEnd$(Xpt%,rgn%)
    ScanXstart=VAL(ScanXstart$):ScanXend=VAL(ScanXend$)
  END IF
  IF Expt1$="UPS" THEN
     ScanUStart$=ScanStart$(Xpt%,rgn%):ScanUEnd$=ScanEnd$(Xpt%,rgn%)
    ScanUStart=VAL(ScanUStart$):ScanUEnd=VAL(ScanUEnd$)
  END IF
ELSEIF Expt$=Expt2$ THEN
  Xpt%=2
  IF Expt2$="SIM" THEN
     ScanMStart$=ScanStart$(Xpt%,rgn%):ScanMEnd$=ScanEnd$(Xpt%,rgn%)
    ScanMStart=VAL(ScanMStart$):ScanMEnd=VAL(ScanMEnd$)
  END IF
  IF Expt2$="IEA" THEN
     ScanEStart$=ScanStart$(Xpt%,rgn%):ScanEEnd$=ScanEnd$(Xpt%,rgn%)
    ScanEStart=VAL(ScanEStart$):ScanEEnd=VAL(ScanEEnd$)
  END IF
END IF

'  MOVETO 100,440:PRINT Xpt%,rgn%,ScanStart$(Xpt%,rgn%),ScanEnd$(Xpt%,rgn%)

MOVETO 10,150:PRINT "Scan From:":EDIT FIELD 2,ScanStart$(Xpt%,rgn%),(75,135)-(125,150)
MOVETO 150,150:PRINT "To":EDIT FIELD 3,ScanEnd$(Xpt%,rgn%),(175,135)-(225,150):MOVETO
235,150:PRINT ScanUnit$

'  Disp11$=ScanAStart$:Disp21$=ScanAEnd$
'  MOVETO 10,180: PRINT "Display From:":EDIT FIELD 4,Disp11$,(75,165)-(125,180)
'  MOVETO 150,180:PRINT "To":EDIT FIELD 5,Disp21$,(175,165)-(225,180):MOVETO 235,180:PRINT
ScanUnit$
MOVETO 10,210:PRINT "eV/Step":EDIT FIELD 6,StepSize$(Xpt%),(75,195)-(125,210)
MOVETO 10,240:PRINT "mSec/Step ":EDIT FIELD 7,mSecStep$(Xpt%),(75,225)-(125,240)
MOVETO 10,270:PRINT "Scan Time":CALL FRAMERECT (VARPTR(SurvScanTim%(0)))
  MOVETO 80,266:PRINT USING "#####.#";SurvScanTim
  MOVETO 135,270:PRINT"Seconds/Scan"
IF Expt$=Expt1$ THEN Nscans=Nscans1 ELSE Nscans=Nscans2
Nscans$=STR$(Nscans)
MOVETO 10,300:PRINT "No. of Scans":EDIT FIELD 8,Nscans$,(75,285)-(125,300)
LINE(290,100)-(290,480)
MOVETO 300,150:PRINT "Acquisition Time (Min:Sec)"
  CALL FRAMERECT (VARPTR(AESAcqTim%(0)))
  MOVETO 430,150: PRINT SurvAcqTim$
IF Expt$=Expt1$ THEN
  IF Expt1$="AES" THEN
     MOVETO 300,180:PRINT "Display N(E)":BUTTON 4,But4Win3,"",(400,165)-(425,180),2
     MOVETO 300,210:PRINT "Display dN/dE":BUTTON 5,But5Win3,"",(400,195)-(425,210),2
     MOVETO 300,240:PRINT "N Point Differentiation":EDIT FIELD 9, NptAvg$, (425,225)-(450,240)
     MOVETO 475,180:PRINT "Pulse Input":BUTTON 10,But10Win3,"",(575,165)-(600,180),2
     MOVETO 475,210:PRINT "Analog Input":BUTTON 11,But11Win3,"",(575,195)-(600,210),2

  END IF
  IF Expt1$="XPS" THEN
     MOVETO 300,180:PRINT "Mg Anode":BUTTON 4,But4Win3,"",(425,165)-(450,180),2
     MOVETO 300,210:PRINT "Al Anode":BUTTON 5,But5Win3,"",(425,195)-(450,210),2
  END IF
```

```
IF Expt1$="UPS" THEN
    MOVETO 300,180:PRINT "He I":BUTTON 4,But4Win3,"",(425,165)-(450,180),2
    MOVETO 300,210:PRINT "He II":BUTTON 5,But5Win3,"",(425,195)-(450,210),2
    MOVETO 300,240:PRINT "Other Photon Energy":EDIT FIELD 9, PhotonEnergy$, (425,225)-(450,240)
  END IF
END IF
MOVETO 300,300:PRINT "Sequential":BUTTON 7,But7Win3,"",(425,285)-(450,300),2
MOVETO 300,330:PRINT "Accumulative":BUTTON 8,But8Win3,"",(425,315)-(450,330),2
BUTTON 6,But6Win3,"Next",(300,345)-(350,360)
EDIT FIELD 1:NewField=1:OldField=1
IF MenuSel=31 THEN:MenuSel=0:GOTO StartHere
  MsgWindo=0
DIALOG ON
RETURN
REM -----------------------------------------------------------------------------------------

InitWindo4:
DIALOG OFF
REM multiplex mode
WINDOW CLOSE Windo
WINDOW CLOSE 2:WINDOW CLOSE 3

MPXAcqTim%(0)=5:MPXAcqTim%(1)=525:MPXAcqTim%(2)=25:MPXAcqTim%(3)=595
MpxScanTim%(0)=5 :MpxScanTim%(1)=240 :MpxScanTim%(2)=25 :MpxScanTim%(3)=300

Windo=4
But2Win4=1
IF Windo4=0 THEN  WINDOW 4, Expt$ + "Multiplex",(0,35)-(640,480),3 ELSE WINDOW 4
REM Turn beam pulsing off
  PulseStatus%=0:GOSUB PulseGen
Windo4=1
Leave4=0
CALL TEXTFONT (3)
CALL TEXTSIZE (9)
MOVETO 15,75:PRINT"Region":MOVETO 315,75:PRINT "# Cycles"
MOVETO 0,64:LINETO 640,64
MOVETO 0,80:LINETO 640,80
LINE(290,64)-(290,480)
LINE(400,64)-(400,380)
MOVETO 0,380:LINETO 640,380

FOR rgn%=1 TO 10
  MOVETO 25,70+30*rgn%:PRINT rgn%
  MOVETO 50,70+30*rgn%:PRINT"Scan From":EDIT FIELD (rgn%-
1)*3+1,STR$(ScanStart(Xpt%,rgn%)),(125,55+30*rgn%)-(175,70+30*rgn%)
  MOVETO 185,70+30*rgn%:PRINT "To":EDIT FIELD (rgn%-
1)*3+2,STR$(ScanEnd(Xpt%,rgn%)),(210,55+30*rgn%)-(260,70+30*rgn%)
  MOVETO 270 ,70+30*rgn%:PRINT"eV"
   MOVETO 350,70+30*rgn%:EDIT FIELD (rgn%-1)*3+3,STR$(MPXcycleno(rgn%)),(310,55+30*rgn%)-
(360,70+30*rgn%)
NEXT
REM **************
MOVETO 10,20:PRINT"Multiplex No. of Regions":EDIT FIELD 31,STR$(RegionMax(1)),(140,5)-(170,20)
MOVETO 190,20:PRINT "Scan Time":CALL FRAMERECT (VARPTR(MpxScanTim%(0)))
  MOVETO 250,20:PRINT  USING "#####.#";MpxScanTim
  MOVETO 310,20:PRINT"Seconds/Scan"
MOVETO 475,60:PRINT "Display Windows"
MOVETO 425,75: PRINT "1":MOVETO 475,75:PRINT"2":MOVETO 525,75:PRINT"3":MOVETO
575,75:PRINT"4"

MOVETO 10,400:PRINT"No. of Scans:":EDIT FIELD 32,STR$(NoMpxScans),(85,385)-(110,400)
MOVETO 10,420:PRINT "eV/Step":EDIT FIELD 33,StepSize$(Xpt%),(75,405)-(125,420)
MOVETO 10,440:PRINT "mSec/Step ":EDIT FIELD 34,mSecStep$(Xpt%),(75,425)-(125,440)
MOVETO 400,20:PRINT "Acquisition Time (Min:Sec)"
  CALL FRAMERECT (VARPTR(MPXAcqTim%(0)))
  MOVETO 530,20: PRINT MPXAcqTim$
MOVETO 300,400:BUTTON 1,But1Win4,"Display Integral",(310,385)-(450,400),2
```

```
MOVETO 300,420:BUTTON 2,But2Win4,"Display Derivative",(310,405)-(450,420),2
EDIT FIELD 35, NptAvg$, (310,425)-(335,440):MOVETO 350,435:PRINT "Point Differentiation"
BUTTON 3,But6Win3,"Go",(590,400)-(640,415)
REM **************
MOVETO 420,100:BUTTON 3,But3Win4,"",(420,85)-(435,100),2:MOVETO 470,100:BUTTON 4,But4Win4,"",(470,85)-(485,100),2:MOVETO 520,100:BUTTON 5,But5Win4,"",(520,85)-(535,100),2:MOVETO 570,100:BUTTON 6,But6Win4,"",(570,85)-(585,100),2
MOVETO 420,130:BUTTON 7,But7Win4,"",(420,115)-(435,130),2:MOVETO 470,130:BUTTON 8,But8Win4,"",(470,115)-(485,130),2:MOVETO 520,130:BUTTON 9,But9Win4,"",(520,115)-(535,130),2:MOVETO 570,130:BUTTON 10,But10Win4,"",(570,115)-(585,130),2
MOVETO 420,160:BUTTON 11,But11Win4,"",(420,145)-(435,160),2:MOVETO 470,160:BUTTON 12,But12Win4,"",(470,145)-(485,160),2:MOVETO 520,160:BUTTON 13,But13Win4,"",(520,145)-(535,160),2:MOVETO 570,160:BUTTON 14,But14Win4,"",(570,145)-(585,160),2
MOVETO 420,190:BUTTON 15,But15Win4,"",(420,175)-(435,190),2:MOVETO 470,190:BUTTON 16,But16Win4,"",(470,175)-(485,190),2:MOVETO 520,190:BUTTON 17,But17Win4,"",(520,175)-(535,190),2:MOVETO 570,190:BUTTON 18,But18Win4,"",(570,175)-(585,190),2
MOVETO 420,220:BUTTON 19,But19Win4,"",(420,205)-(435,220),2:MOVETO 470,220:BUTTON 20,But20Win4,"",(470,205)-(485,220),2:MOVETO 520,220:BUTTON 21,But21Win4,"",(520,205)-(535,220),2:MOVETO 570,220:BUTTON 22,But22Win4,"",(570,205)-(585,220),2
MOVETO 420,250:BUTTON 23,But23Win4,"",(420,235)-(435,250),2:MOVETO 470,250:BUTTON 24,But24Win4,"",(470,235)-(485,250),2:MOVETO 520,250:BUTTON 25,But25Win4,"",(520,235)-(535,250),2:MOVETO 570,250:BUTTON 26,But26Win4,"",(570,235)-(585,250),2
MOVETO 420,280:BUTTON 27,But27Win4,"",(420,265)-(435,280),2:MOVETO 470,280:BUTTON 28,But28Win4,"",(470,265)-(485,280),2:MOVETO 520,280:BUTTON 29,But29Win4,"",(520,265)-(535,280),2:MOVETO 570,280:BUTTON 30,But30Win4,"",(570,265)-(585,280),2
MOVETO 420,310:BUTTON 31,But31Win4,"",(420,295)-(435,310),2:MOVETO 470,310:BUTTON 32,But32Win4,"",(470,295)-(485,310),2:MOVETO 520,310:BUTTON 33,But33Win4,"",(520,295)-(535,310),2:MOVETO 570,310:BUTTON 34,But34Win4,"",(570,295)-(585,310),2
MOVETO 420,340:BUTTON 35,But35Win4,"",(420,325)-(435,340),2:MOVETO 470,340:BUTTON 36,But36Win4,"",(470,325)-(485,340),2:MOVETO 520,340:BUTTON 37,But37Win4,"",(520,325)-(535,340),2:MOVETO 570,340:BUTTON 38,But38Win4,"",(570,325)-(585,340),2
MOVETO 420,370:BUTTON 39,But39Win4,"",(420,355)-(435,370),2:MOVETO 470,370:BUTTON 40,But40Win4,"",(470,355)-(485,370),2:MOVETO 520,370:BUTTON 41,But41Win4,"",(520,355)-(535,370),2:MOVETO 570,370:BUTTON 42,But42Win4,"",(570,355)-(585,370),2
EDIT FIELD 1
nfield4max=35:ofield4=2:nfield4=2
IF MenuSel=31 THEN:MenuSel=0:GOTO StartHere
DIALOG ON
RETURN
REM -----------------------------------------------------------------------------------------------

InitWindo5:
DIALOG OFF
REM Profile mode
WINDOW 2
WINDOW CLOSE Windo
Windo=5
IF windo5=1 THEN WINDOW 5, Expt$ + "Profile",(0,55)-(640,480),3 ELSE WINDOW 5
windo5=1
Leave5=0
MOVETO 10,20:PRINT"Profile No. of Regions":EDIT FIELD 1,regions$,(150,5)-(175,20)
DIALOG ON
RETURN
REM -----------------------------------------------------------------------------------------------

InitWindo7:
DIALOG OFF
WINDOW CLOSE 7
WINDOW CLOSE Windo
Windo=7
Gone3=0
WINDOW 7, "DR/ISS  ", (0,35)-(640,480),5
MENU 2,4,0
REM Turn beam pulsing off
  PulseStatus%=0:GOSUB PulseGen
Errx=20:Erry=450
```

```
Windo7=1
Leave7=0
D1IDisp=1
DispWindo(3,1)=1
ColorTop(1)=ColorTop(1)+1:IF ColorTop(1)>6 THEN ColorTop(1)=1
ColorSet(3,1)=ColorTop(1)
TEXTFONT 3
TEXTSIZE 14
MOVETO 0,40:LINETO 640,40
MOVETO 50,30:PRINT "Primary Ions"
MOVETO 260,30:PRINT "System Geometry"
MOVETO 450,30:PRINT "Data Collection"
MOVETO 35,205:PRINT "Detected Particles"
MOVETO 240,242:PRINT "Data Display Windows"
TEXTSIZE 12
MOVETO 210,0:LINETO 210,379
MOVETO 430,0:LINETO 430,379
MOVETO 352,347:LINETO 352,379
MOVETO 210,347:LINETO 430,347
MOVETO 5,55:PRINT "Energy (keV)":EDIT FIELD 1,keV0$, (150,45)-(200,58)
MOVETO 5,75:PRINT "Mass (amu)":EDIT FIELD 2,Mass1$, (150,65)-(200,78)
Mass1=VAL(Mass1$)
MOVETO 5,95: PRINT "Pulse Width (nSec)":EDIT FIELD 3,Pwidth$, (150,85)-(200,98)
MOVETO 5,115:PRINT "Cell A Drift Time (nS)":EDIT FIELD 4, TaD$,(150,105)-(200,118)
MOVETO 5,135:PRINT "Cell B Drift Time (nS)":EDIT FIELD 5, TbD$,(150,125)-(200,138)
MOVETO 5,155:PRINT "Cell C Drift Time (nS)":EDIT FIELD 6, TcD$,(150,145)-(200,158)

MOVETO 5,175:PRINT "Repetition Rate (µS)":EDIT FIELD 101,RepTim$,(150,165)-(200,178)
MOVETO 160,225:PRINT "µS":EDIT FIELD 102,RepTim$,(100,210)-(150,223)
MOVETO 160,245:PRINT "µS":EDIT FIELD 103,RepTim$,(100,230)-(150,243)
MOVETO 160,265:PRINT "µS":EDIT FIELD 104,RepTim$,(100,250)-(150,263)
MOVETO 160,285:PRINT "µS":EDIT FIELD 105,RepTim$,(100,270)-(150,283)

MOVETO 0,185:LINETO 210,185
MOVETO 5,225:PRINT "Scattered 1" :BUTTON 1,But1Win7,"",(180,210)-(195,225),2
MOVETO 5,245:PRINT "Recoil 1" :BUTTON 2,But2Win7,"",(180,230)-(195,245),2
MOVETO 5,265:PRINT "Scattered 2" :BUTTON 3,But3Win7,"",(180,250)-(195,265),2
MOVETO 5,285:PRINT "Recoil 2" :BUTTON 4,But4Win7,"",(180,270)-(195,285),2
MOVETO 0,290:LINETO 210,290
IF MinMass$="" THEN:MinMass=Mass1+1:MinMass$= LEFT$(STR$(MinMass),6)
MOVETO 5,305:PRINT "Min Mass (amu)":EDIT FIELD 7,MinMass$,(150,295)-(200,308)

MOVETO 5,325:PRINT "Max Mass (amu)":EDIT FIELD 8,MaxMass$,(150,315)-(200,328)
MOVETO 0,335:LINETO 210,335
BUTTON 5,1,"Use Default",(10,340)-(90,355)
BUTTON 6,1,"Set Default", (10,360)-(90,375)
BUTTON 7,1,"Show Data",(100,340)-(200,355)
BUTTON 8,1,"Test",(100,360)-(200,375),3
MOVETO 0,379:LINETO 640,379
MOVETO 215,55:PRINT "Gun-Target Dist. (cm)":EDIT FIELD 9,GTDist$,(370,45)-(420,58)
MOVETO 215,75:PRINT "Angle of Incidence":EDIT FIELD 10,GTAng$,(370,65)-(420,78)
MOVETO 215,95:PRINT "Target-Det. 1 Dist. (cm)":EDIT FIELD 11,TDetDist1$,(370,85)-(420,98)
MOVETO 215,115:PRINT "Gun-Det. 1 Angle":EDIT FIELD 12,GDetAng1$,(370,105)-(420,118)
MOVETO 215,135:PRINT "Target-Det. 2 Dist. (cm)":EDIT FIELD 13,TDetDist2$,(370,125)-(420,138)
MOVETO 215,155:PRINT "Gun-Det. 2 Angle":EDIT FIELD 14,GDetAng2$,(370,145)-(420,158)
MOVETO 215,175:PRINT "Cell Drift Length A (cm)":EDIT FIELD 15,LAcm$,(370,165)-(420,178)
MOVETO 215,195:PRINT "Cell Drift Length B (cm)":EDIT FIELD 16,LBcm$,(370,185)-(420,198)
MOVETO 215,215:PRINT "Cell Drift Length C (cm)":EDIT FIELD 17,LCcm$,(370,205)-(420,218)

MOVETO 435,55:PRINT "Total Counts 1":EDIT FIELD 18,Tc1$,(580,45)-(630,58)
MOVETO 435,75:PRINT "Total Counts 2":EDIT FIELD 19,Tc2$,(580,65)-(630,78)
MOVETO 435,95:PRINT "Max Time (sec)":EDIT FIELD 20,MaxTime3$,(580,85)-(630,98)
MOVETO 435,115:PRINT "No. of Scans":EDIT FIELD 28,Nscans3$,(580,105)-(630,118)
REM add line here
MOVETO 430,122:LINETO 640,122
MOVETO 440,137:PRINT "Repeat":EDIT FIELD 29,Repeat3Max$,(580,125)-(630,138)
REM shift down here
```

```
MOVETO 430,142:LINETO 640,142
MOVETO 440,157:PRINT "Pts/Scan:":EDIT FIELD 107,DataDoneTime$,(540,145)-(590,158)
MOVETO 600,160:PRINT "µs"
BUTTON 9,But9Win7,"512",(450,160)-(500,174),2
BUTTON 10,But10Win7,"1024",(450,175)-(500,189),2
BUTTON 11,But11Win7,"2048",(450,190)-(500,204),2
BUTTON 12,But12Win7,"4096",(450,205)-(500,219),2
BUTTON 13,But13Win7,"8192",(450,220)-(500,234),2

MOVETO 430,235:LINETO 640,235
MOVETO 435,250:PRINT "Detector 1:"
BUTTON 14,But14Win7,"Ions",(450,255)-(540,270),2
BUTTON 15,But15Win7,"Neutrals",(450,270)-(540,285),2
BUTTON 16,But16Win7,"Both ",(450,285)-(540,300),2
'    BUTTON 17,But17Win7,"Both (1 det.)",(450,305)-(540,320),2
MOVETO 435,320:PRINT "Detector 2:"
BUTTON 18,But18Win7,"Ions",(450,325)-(540,340),2
BUTTON 19,But19Win7,"Neutrals",(450,340)-(540,355),2
BUTTON 20,But20Win7,"Both ",(450,355)-(540,370),2
MOVETO 535,250:PRINT "Detector 3:"
BUTTON 21,But21Win7,"On",(550,255)-(640,270),2

MOVETO 545,280:LINETO 638,280: LINETO 638,350: LINETO 545,350:LINETO 545,280
BUTTON 89,But89Win7,"ARISS",(550,285)-(640,300),2
BUTTON 90,But90Win7,"Raster",(550,305)-(640,320),2
BUTTON 91,But91Win7,"Image",(550,325)-(640,340),2

MOVETO 210,225:LINETO 430,225
'  MOVETO 355,263:PRINT "Windows"
TEXTSIZE 9
MOVETO 245,258:PRINT "Cum    New    Dif"
MOVETO 345,258:PRINT "1     2     3     4"
Det11$="Det. 1 "
MOVETO 215,273:PRINT Det11$
    BUTTON 70,But70Win7,"",(250,262)-(265,275),3
    BUTTON 71,But71Win7,"",(280,262)-(295,275),3
    BUTTON 72,But72Win7,"",(310,262)-(325,275),3

    BUTTON 23,But23Win7,"",(343,262)-(358,275),2
    BUTTON 24,But24Win7,"",(365,262)-(380,275),2
    BUTTON 25,But25Win7,"",(387,262)-(402,275),2
    BUTTON 26,But26Win7,"",(411,262)-(426,275),2
    rect23%(0)=279:rect23%(1)=341:rect23%(2)=300:rect23%(3)=361
    rect24%(0)=279:rect24%(1)=363:rect24%(2)=300:rect24%(3)=383
    rect25%(0)=279:rect25%(1)=384:rect25%(2)=300:rect25%(3)=404
    rect26%(0)=279:rect26%(1)=407:rect26%(2)=300:rect26%(3)=427
Det12$="Det. 2 "
MOVETO 215,293:PRINT Det12$
    BUTTON 73,But73Win7,"",(250,280)-(265,295),3
    BUTTON 74,But74Win7,"",(280,280)-(295,295),3
    BUTTON 75,But75Win7,"",(310,280)-(325,295),3

    BUTTON 31,But31Win7,"",(343,280)-(358,295),2
    BUTTON 32,But32Win7,"",(365,280)-(380,295),2
    BUTTON 33,But33Win7,"",(387,280)-(402,295),2
    BUTTON 34,But34Win7,"",(411,280)-(426,295),2
    rect31%(0)=314:rect31%(1)=341:rect31%(2)=335:rect31%(3)=361
    rect32%(0)=314:rect32%(1)=363:rect32%(2)=335:rect32%(3)=383
    rect33%(0)=314:rect33%(1)=384:rect33%(2)=335:rect33%(3)=404
    rect34%(0)=314:rect34%(1)=407:rect34%(2)=335:rect34%(3)=427
MOVETO 215,313:PRINT "Det. 3"
    BUTTON 76,But76Win7,"",(250,300)-(265,315),3
    BUTTON 77,But77Win7,"",(280,300)-(295,315),3
    BUTTON 78,But78Win7,"",(310,300)-(325,315),3

    BUTTON 35,But35Win7,"",(343,300)-(358,315),2
```

```
BUTTON 36,But36Win7,"",(365,300)-(380,315),2
BUTTON 37,But37Win7,"",(387,300)-(402,315),2
BUTTON 38,But38Win7,"",(411,300)-(426,315),2
TEXTSIZE 12

REM Test Routine
MOVETO 0,395:PRINT "Beam"
BUTTON 40,But40Win7,"On",(0,410)-(40,425),2
BUTTON 41,But41Win7,"Off",(0,425)-(40,440),2
BUTTON 42,But42Win7,"DC",(45,395)-(100,410),2
BUTTON 43,But43Win7,"Pulse",(45,410)-(100,425),2
BUTTON 44,But44Win7,"Single",(45,425)-(100,440),2

MOVETO 230,360:PRINT "Scan Scalers"
BUTTON 55,But55Win7,"1",(222,363)-(250,378),2
BUTTON 56,But56Win7,"2",(250,363)-(275,378),2
BUTTON 57,But57Win7,"4",(277,363)-(302,378),2
BUTTON 58,But58Win7,"8",(305,363)-(330,378),2
MOVETO 210,325:LINETO 430,325
MOVETO 215,343:PRINT "Display Scalers"
IF HIST=1 THEN But59Win7=0
BUTTON 59,But59Win7,"",(330,330)-(350,343),3
EDIT FIELD 106,DataAcqTim$,(355,330)-(405,343)
MOVETO 410,343:PRINT "µs"
MOVETO 105, 379: LINETO 105,450
MOVETO 570,180:PRINT"Peak Shift"
BUTTON 61,But61Win7,"Left",(570,190)-(640,204),2
BUTTON 62,But62Win7,"Center",(570,205)-(640,219),2
BUTTON 63,But63Win7,"Right",(570,220)-(640,234),2

REM Scrollboxes
'-----Scroll Setup------
GOSUB MakeScroll
REM gosub EdScroll21
REM gosub EdScroll22
REM gosub EdScroll23
REM gosub EdScroll24
REM gosub EdScroll25
REM gosub EdScroll26
REM gosub EdScroll27
'        **************************
BUTTON 52,But52Win7,"Fast", (592,390)-(640,405),3
BUTTON 53,But53Win7,"Med.", (592,410)-(640,425),3
BUTTON 54,But54Win7,"Slow", (592,430)-(640,445),3
EdField=1
EDIT FIELD EdField
DIALOG ON
RETURN

InitWindo13:
DIALOG OFF
Leave13=0
WINDOW CLOSE Windo
Windo=13
WINDOW 13, "  ", (0,55)-(640,480),1
EDIT FIELD 1
IF MenuSel=31 THEN: MenuSel=0: GOTO StartHere
DIALOG ON
RETURN
REM -----------------------------------------------------------

InitWindo14:
RETURN
DIALOG OFF
Leave14=0
WINDOW CLOSE Windo
Windo=14
```

```
WINDOW 14, "  ", (0,55)-(640,480),1
EDIT FIELD 1
IF MenuSel=31 THEN: MenuSel=0: GOTO StartHere
DIALOG ON
RETURN

InitWindo15:
'  BEEP:BEEP
DIALOG OFF
WINDOW CLOSE Windo
Windo=15
Leave15=0
bin=0
Oflo=0
GOSUB White
REM *******Initialize data**********************************
  IF FirstPlot1=0 AND Expt1$<>"" THEN
    FOR rgn%=0 TO 4
      FOR Fetch12%=0 TO 1024
        Data1&(rgn%,Fetch12%)=0
      NEXT
    NEXT
  END IF

  IF FirstPlot2=0 AND Expt2$<>"" THEN
    FOR rgn%=0 TO 4
      FOR Fetch12%=0 TO 1024
        Data2&(rgn%,Fetch12%)=0
      NEXT
    NEXT
  END IF

  IF FirstPlot3=0 AND Expt3$<>"" THEN
    FOR rgn%=0 TO 4
      FOR Fetch3%=0 TO 8192
        Data3&(rgn%,Fetch3%)=0
      NEXT
    NEXT
  END IF
'***************************
WINDOW 15, "Display Data", (0,0)-(1280,940)
TEXTSIZE 9
TEXTFONT 3
REM Turn beam off
  PulseStatus%=0:GOSUB PulseGen
GOSUB Black
Block1:
  X1%=100:Y1%=39
  MOVETO X1%-90,Y1%-5:PRINT "Block 1"
  SetRect Rect1%(0),X1%,Y1%,X1%+501,Y1%+401
  Recs%(0)=Rect1%(0):Recs%(1)=Rect1%(1):Recs%(2)=Rect1%(2):Recs%(3)=Rect1%(3)
  CALL FRAMERECT (VARPTR(Rect1%(0)))
'  CALL PAINTRECT (VARPTR(Rect1%(0)))
  FOR i=0 TO 500 STEP 50
    MOVETO X1%+i,Y1%+401:LINETO X1%+i,Y1%+407
    MOVETO X1%+i,Y1%:LINETO X1%+i,Y1%-7
  NEXT
  FOR  i=0 TO 400 STEP 40
    MOVETO X1%,Y1%+i:LINETO X1%-7,Y1%+i
    MOVETO X1%+501,Y1%+i:LINETO X1%+507,Y1%+i
  NEXT
  IF DataDisplay>0 THEN
    MOVETO X1%-100,Y1%+420:PRINT "Scaler1"
    MOVETO X1%-100,Y1%+430:PRINT "Scaler2"
  END IF
IF DispWindo(Xpt%,rgn%)=1 THEN
      MOVETO X1%-45,Y1%-400:PRINT USING "#####.";CntMax(1)
```

```
            MOVETO X1%-45,Y1%:PRINT USING "#####.";CntMin(1)
            MOVETO X1%,Y1%+20:PRINT ScanStart(Xpt%,rgn%)
            MOVETO X1%+500,Y1%+20:PRINT ScanEnd(Xpt%,rgn%)
    END IF

     Block2:
      X2%=740:Y2%=39
      MOVETO X2%-90,Y2%-5:PRINT "Block 2"
      SetRect Rect2%(0),X2%,Y2%,X2%+501,Y2%+401
      Recs%(4)=Rect2%(0):Recs%(5)=Rect2%(1):Recs%(6)=Rect2%(2):Recs%(7)=Rect2%(3)
      CALL FRAMERECT (VARPTR(Rect2%(0)))
    ' CALL PAINTRECT (VARPTR(Rect2%(0)))
      FOR i=0 TO 500 STEP 50
        MOVETO X2%+i,Y2%+401:LINETO X2%+i,Y2%+407
        MOVETO X2%+i,Y2%:LINETO X2%+i,Y2%-7
      NEXT
      FOR  i=0 TO 400 STEP 40
        MOVETO X2%,Y2%+i:LINETO X2%-7,Y2%+i
        MOVETO X2%+501,Y2%+i:LINETO X2%+507,Y2%+i
      NEXT
    IF DispWindo(Xpt%,rgn%)=2 THEN
            MOVETO X2%-45,Y2%-400:PRINT USING "#####.";CntMax(2)
            MOVETO X2%-45,Y2%:PRINT USING "#####.";CntMin(2)
            MOVETO X2%,Y2%+20:PRINT ScanStart(Xpt%,rgn%)
            MOVETO X2%+500,Y2%+20:PRINT ScanEnd(Xpt%,rgn%)
    END IF

     Block3:
      X3%=100:Y3%=489
      MOVETO X3%-90,Y3%-5:PRINT "Block 3"
      SetRect Rect3%(0),X3%,Y3%,X3%+501,Y3%+401
      Recs%(8)=Rect3%(0):Recs%(9)=Rect3%(1):Recs%(10)=Rect3%(2):Recs%(11)=Rect3%(3)
      CALL FRAMERECT (VARPTR(Rect3%(0)))
    ' CALL PAINTRECT (VARPTR(Rect3%(0)))
    . FOR i=0 TO 500 STEP 50
        MOVETO X3%+i,Y3%+401:LINETO X3%+i,Y3%+407
        MOVETO X3%+i,Y3%:LINETO X3%+i,Y3%-7
      NEXT
      FOR  i=0 TO 400 STEP 40
        MOVETO X3%,Y3%+i:LINETO X3%-7,Y3%+i
        MOVETO X3%+501,Y3%+i:LINETO X3%+507,Y3%+i
      NEXT
    IF DispWindo(Xpt%,rgn%)=3 THEN
            MOVETO X3%-45,Y3%-400:PRINT USING "#####.";CntMax(3)
            MOVETO X3%-45,Y3%:PRINT USING "#####.";CntMin(3)
            MOVETO X3%,Y3%+20:PRINT ScanStart(Xpt%,rgn%)
            MOVETO X3%+500,Y3%+20:PRINT ScanEnd(Xpt%,rgn%)
    END IF

     Block4:
      X4%=740:Y4%=489
      MOVETO X4%-90,Y4%-5:PRINT "Block 4"
      SetRect Rect4%(0),X4%,Y4%,X4%+501,Y4%+401
      Recs%(12)=Rect4%(0):Recs%(13)=Rect4%(1):Recs%(14)=Rect4%(2):Recs%(15)=Rect4%(3)
      CALL FRAMERECT (VARPTR(Rect4%(0)))
    ' CALL PAINTRECT (VARPTR(Rect4%(0)))
      FOR i=0 TO 500 STEP 50
        MOVETO X4%+i,Y4%+401:LINETO X4%+i,Y4%+407
        MOVETO X4%+i,Y4%:LINETO X4%+i,Y4%-7
      NEXT
      FOR  i=0 TO 400 STEP 40
        MOVETO X4%,Y4%+i:LINETO X4%-7,Y4%+i
        MOVETO X4%+501,Y4%+i:LINETO X4%+507,Y4%+i
      NEXT
    IF DispWindo(Xpt%,rgn%)=4 THEN
            MOVETO X4%-45,Y4%-400:PRINT USING "#####.";CntMax(4)
            MOVETO X4%-45,Y4%:PRINT USING "#####.";CntMin(4)
```

```
            MOVETO X4%,Y4%+20:PRINT ScanStart(Xpt%,rgn%)
            MOVETO X4%+500,Y4%+20:PRINT ScanEnd(Xpt%,rgn%)
    END IF
      MOVETO 300,35
      IF HeaderFil$="" THEN
        BEEP
        PRINT "Data File Not Saved"
      ELSE
        PRINT IndexFil$
      END IF

     IF MenuSel=31 THEN: MenuSel=0: GOTO StartHere
    DIALOG ON
    RETURN
    REM ------------------------------------------------------------

    MenuCheck:
        IF MenuSel=11 THEN:MenuSel=0:Leave15=1:GOSUB NewData
        IF MenuSel=12 THEN:MenuSel=0:Leave15=1:GOSUB OpenFil
        IF MenuSel=13 THEN:MenuSel=0:Leave15=1:GOSUB CloseFil
        IF MenuSel=14 THEN:MenuSel=0:Leave15=1:GOSUB SavFil
        IF MenuSel=15 THEN:MenuSel=0:Leave15=1:GOSUB SavFilAs
        IF MenuSel=16 THEN:MenuSel=0:Leave15=1:GOSUB Setup
        IF MenuSel=17 THEN:MenuSel=0:Leave15=1:GOSUB Plot
        IF MenuSel=18 THEN:MenuSel=0:Leave15=1:GOSUB Xfer
        IF MenuSel=21 THEN
          DIALOG OFF
             MenuSel=0:Leave15=1:WINDOW CLOSE Windo:GOSUB Go
          DIALOG ON
        END IF
        IF MenuSel=31 THEN:MenuSel=0:Leavego=0:Leave15=0: GOTO StartHere
        IF MenuSel=316 THEN:MenuSel=0:Leavego=0:Leave15=0:GOTO DrissSet
        IF MenuSel=41 THEN GOSUB GraphCursor
    RETURN
    REM ------------------------------------------------------------

    MenuDo3:
        IF MenuSel=22 THEN:MenuSel=0:REM Manual
        IF MenuSel=23 THEN
          MenuSel=0
          IF Pause3=0 THEN
             Pause3=1:MENU 2,3,2
            MOVETO 5,340:PRINT "              "
             MOVETO 5,340:PRINT "Pause":REM Pause
          ELSEIF Pause3=1 THEN
             Pause3=0:MENU 2,3,1
            MOVETO 5,340:PRINT "              "
             MOVETO 5,340:PRINT "Scanning":REM Pause Off
          END IF
          END IF

          IF MenuSel=24 THEN
            MenuSel=0
            IF Continue3=0 THEN
               Continue3=1:MENU 2,4,2
              MOVETO 5,340:PRINT "              "
               MOVETO 5,340:PRINT "Continuous":REM Continuous
            ELSEIF Continue3=1 THEN
               Continue3=0:MENU 2,4,1
              MOVETO 5,340:PRINT "              "
               MOVETO 5,340:PRINT "Scanning":REM Pause Off
            END IF
        END IF

        IF MenuSel=25 THEN
          MenuSel=0
          IF LastScan3=0 THEN
```

```
        Nscan3Old=Nscan3:Nscan3=Nscans3:REM Last Scan
        MOVETO 5,420:PRINT "Scan ";Nscan3
        LastScan3=1:MENU 2,5,2
      ELSEIF LastScan3=1 THEN
        MOVETO 5,420:PRINT "Scan ";Nscan3
        Nscan3=Nscan3Old
        MOVETO 5,420:PRINT "Scan ";Nscan3
        LastScan3=0:MENU 2,5,1:REM original scan no.
      END IF
    END IF
    IF MenuSel=26 THEN:MenuSel=0:Reset3=1:REM Reset Scan
    IF MenuSel=27 THEN:MenuSel=0:End3=1:GOTO Data3Write:REM End Scan
    IF MenuSel=28 THEN:MenuSel=0:Abort3=1:GOTO Scan3End:REM Abort (lose data)
    IF MenuSel=31 THEN MenuSel=0:Leave15=1:GOTO StartHere
    IF MenuSel=316 THEN:MenuSel=0: Leavego=1:GOTO DrissSet
RETURN
REM -----------------------------------------------------------

MenuHandler:
  MENU STOP:MOUSE STOP:DIALOG STOP
  MenuNo=MENU(0)
  MenuItem=MENU(1)
  IF MenuNo=1 AND MenuItem=1 THEN:MenuSel=11:REM GOSUB NewData
  IF MenuNo=1 AND MenuItem=2 THEN:MenuSel=12:REM GOSUB OpenFil
  IF MenuNo=1 AND MenuItem=3 THEN:MenuSel=13:REM GOSUB CloseFil
  IF MenuNo=1 AND MenuItem=4 THEN:MenuSel=14:REM GOSUB SavFil
  IF MenuNo=1 AND MenuItem=5 THEN:MenuSel=15:REM GOSUB SavFilAs
  IF MenuNo=1 AND MenuItem=6 THEN:MenuSel=16:REM GOSUB Setup
  IF MenuNo=1 AND MenuItem=7 THEN:MenuSel=17:REM GOSUB Plot
  IF MenuNo=1 AND MenuItem=8 THEN:MenuSel=18:REM GOSUB Xfer
  IF MenuNo=1 AND MenuItem=9 THEN GOSUB Quit
  IF MenuNo=2 AND MenuItem=1 THEN:MenuSel=21: REM GOTO Go
  IF MenuNo=2 AND MenuItem=2 THEN:MenuSel=22:REM GOSUB Manual
  IF MenuNo=2 AND MenuItem=3 THEN:MenuSel=23:REM GOSUB Pause
  IF MenuNo=2 AND MenuItem=4 THEN:MenuSel=24:REM GOSUB LastCycle
  IF MenuNo=2 AND MenuItem=5 THEN:MenuSel=25:REM GOSUB LastScan
  IF MenuNo=2 AND MenuItem=6 THEN:MenuSel=26:REM GOSUB Halt
  IF MenuNo=2 AND MenuItem=7 THEN:MenuSel=27:REM GOSUB Resett
  IF MenuNo=2 AND MenuItem=8 THEN:MenuSel=28:REM gosub Abort
  IF MenuNo=3 AND MenuItem=1 THEN:MenuSel=31:REM goto StartHere
  IF MenuNo=3 AND MenuItem=2 THEN:MenuSel=31:REM goto StartHere
  IF MenuNo=3 AND MenuItem=3 THEN:MenuSel=33:REM gosub InitWindo3
  IF MenuNo=3 AND MenuItem=4 THEN:MenuSel=31:REM goto StartHere
  IF MenuNo=3 AND MenuItem=5 THEN:MenuSel=31:REM goto StartHere
  IF MenuNo=3 AND MenuItem=6 THEN:MenuSel=31:REM goto StartHere
  IF MenuNo=3 AND MenuItem=7 THEN:MenuSel=31:REM goto StartHere
  IF MenuNo=3 AND MenuItem=8 THEN:MenuSel=31:REM goto StartHere
  IF MenuNo=3 AND MenuItem=9 THEN:MenuSel=31:REM goto StartHere
  IF MenuNo=3 AND MenuItem=10 THEN:MenuSel=31:REM goto StartHere
  IF MenuNo=3 AND MenuItem=11 THEN:MenuSel=31:REM goto StartHere
  IF MenuNo=3 AND MenuItem=12 THEN:MenuSel=31:REM goto StartHere
  IF MenuNo=3 AND MenuItem=13 THEN:MenuSel=31:REM goto StartHere
  IF MenuNo=3 AND MenuItem=14 THEN:MenuSel=31:REM goto StartHere
  IF MenuNo=3 AND MenuItem=15 THEN:MenuSel=31:REM goto StartHere
  IF MenuNo=3 AND MenuItem=16 THEN:MenuSel=316:REM goto DrissSet
  IF MenuNo=4 AND MenuItem=1 THEN
    MenuSel=0
    IF MenuState41=1 THEN MenuState41=2 ELSE MenuState41=1
    MENU 4,1,MenuState41
    ROIS=0
  END IF
  IF MenuNo=4 AND MenuItem=2 THEN
    MenuSel=0
    IF MenuState42=1 THEN MenuState42=2 ELSE MenuState42=1
    MENU 4,2,MenuState42
    ROIS=1
  END IF
```

```
    IF MenuNo=4 AND MenuItem=3 THEN
      MenuSel=0
      IF MenuState43=1 THEN MenuState43=2 ELSE MenuState43=1
      MENU 4,3,MenuState43
      ROIS=2
    END IF
    IF MenuNo=4 AND MenuItem=4 THEN
      MenuSel=0
      IF MenuState44=1 THEN MenuState44=2 ELSE MenuState44=1
      MENU 4,4,MenuState44
      ROIS=3
    END IF

    MENU
    MENU ON:MOUSE ON:DIALOG ON
  RETURN
  REM -----------------------------------------------------------

  ReadWindo2:
  REM ScanSetup
    IF MenuSel>0 THEN
      IF MenuSel=11 THEN:MenuSel=0:Leave2=1:GOSUB NewData
      IF MenuSel=12 THEN:MenuSel=0:Leave2=1:GOSUB OpenFil
      IF MenuSel=13 THEN:MenuSel=0:Leave2=1:GOSUB CloseFil
      IF MenuSel=14 THEN:MenuSel=0:Leave2=1:GOSUB SavFil
      IF MenuSel=15 THEN:MenuSel=0:Leave2=1:GOSUB SavFilAs
      IF MenuSel=16 THEN:MenuSel=0:Leave2=1:GOSUB Setup
      IF MenuSel=17 THEN:MenuSel=0:Leave2=1:GOSUB Plot
      IF MenuSel=18 THEN:MenuSel=0:Leave2=1:GOSUB Xfer
      IF MenuSel=21 THEN:MenuSel=0:Leave2=1:GOSUB Go
      IF MenuSel=31 THEN MenuSel=0:GOTO StartHere
    END IF
    IF ChangeMode=1 THEN RETURN
    IF Mode=1 THEN rgn%=0 ELSE rgn%=1

  ' MOVETO 100,260:PRINT Mode,rgn%

    IF Expt$=Expt1$ THEN FirstRead2=FirstRead21:Xpt%=1:Mode1=Mode
    IF Expt$=Expt2$ THEN FirstRead2=FirstRead22:Xpt%=2:Mode2=Mode
    REM EDIT FIELD 1,Comment$,(85,30)-(600,50)
    IF But4Win2=2 THEN
      IF Edit2=0 THEN: EDIT FIELD 2: Edit2=1
    END IF
    IF But5Win2=2 THEN
      IF Edit3=0 THEN: EDIT FIELD 3: Edit3=1
    END IF

    ScanMin$(Xpt%)=EDIT$(2):ScanMin(Xpt%)=VAL(ScanMin$(Xpt%))
    ScanMax$(Xpt%)=EDIT$(3):ScanMax(Xpt%)=VAL(ScanMax$(Xpt%))
    NewField=1:OldField=1
    Comment$=EDIT$(1)
    IF ScanMin$(Xpt%)<>"" AND ScanMin$(Xpt%)<>ScanMax$(Xpt%) THEN Ready4Win2=1 ELSE
Ready4Win2=0
    IF ScanMax$(Xpt%)<>"" AND ScanMin$(Xpt%)<>ScanMax$(Xpt%) THEN Ready5Win2=1 ELSE
Ready5Win2=0
  IF Leave2=0 THEN GOTO ReadWindo2
  Leave2=0

  REM check bounds
  REM Check first reading of Window 2
    IF Expt$=Expt1$ THEN FirstRead2=FirstRead21:Xpt%=1
    IF Expt$=Expt2$ THEN FirstRead2=FirstRead22:Xpt%=2
    IF FirstRead2=0 THEN
      IF Expt$=Expt1$ THEN
        FirstRead21=1
        ScanStart$(1,rgn%)=ScanMin$(1)
        ScanStart(1,rgn%)=ScanMin(1)
```

```
        ScanEnd$(1,rgn%)=ScanMax$(1)
        ScanEnd(1,rgn%)=ScanMax(1)
    END IF
    IF Expt$=Expt2$ THEN
        FirstRead22=1
        ScanStart$(2,rgn%)=ScanMin$(2)
        ScanStart(2,rgn%)=ScanMin(2)
        ScanEnd$(2,rgn%)=ScanMax$(2)
        ScanEnd(2,rgn%)=ScanMax(2)
    END IF
' ************
'MOVETO 40,240:PRINT Xpt%,rgn%
' ***********
  ELSE
    IF ScanMax(Xpt%)>ScanMin(Xpt%) AND ScanStart(Xpt%,rgn%)<ScanMin(Xpt%) THEN
        ScanStart$(Xpt%,rgn%)=ScanMin$(Xpt%):ScanStart(Xpt%,rgn%)=ScanMin(Xpt%)
    END IF
    IF ScanMax(Xpt%)>ScanMin(Xpt%) AND ScanEnd(Xpt%,rgn%)>ScanMax(Xpt%) THEN
        ScanEnd$(Xpt%,rgn%)=ScanMax$(Xpt%):ScanEnd(Xpt%,rgn%)=ScanMax(Xpt%)
    END IF
    IF ScanMax(Xpt%)<ScanMin(Xpt%) AND ScanStart(Xpt%,rgn%)>ScanMin(Xpt%) THEN
        ScanStart$(Xpt%,rgn%)=ScanMin$(Xpt%):ScanStart(Xpt%,rgn%)=ScanMin(Xpt%)
    END IF
    IF ScanMax(Xpt%)<ScanMin(Xpt%) AND ScanEnd(Xpt%,rgn%)<ScanMax(Xpt%) THEN
        ScanEnd$(Xpt%,rgn%)=ScanMax$(Xpt%):ScanEnd(Xpt%,rgn%)=ScanMax(Xpt%)
    END IF
  END IF
REM

  IF Expt$="AES" THEN
    ScanAMin$=ScanMin$(Xpt%):ScanAMin=VAL(ScanAMin$):SetMin=SetAmin
    ScanAMax$=ScanMax$(Xpt%):ScanAMax=VAL(ScanAMax$):SetMax=SetAmax
  END IF
  IF Expt$="XPS" THEN
    ScanXMin$=ScanMin$(Xpt%):ScanXMin=VAL(ScanXMin$):SetMin=SetXmin
    ScanXMax$=ScanMax$(Xpt%):ScanXMax=VAL(ScanXMax$):SetMax=SetXmax
  END IF
  IF Expt$="UPS" THEN
    ScanUMin$=ScanMin$(Xpt%):ScanUMin=VAL(ScanUMin$):SetMin=SetUmin
    ScanUMax$=ScanMax$(Xpt%):ScanUMax=VAL(ScanUMax$):SetMax=SetUmax
  END IF
REM
  IF Expt$="SIM" THEN
    ScanMMin$=ScanMin$(Xpt%):ScanMMin=VAL(ScanMMin$):SetMin=SetMMin
    ScanMMax$=ScanMax$(Xpt%):ScanMMax=VAL(ScanMMax$):SetMax=SetMMax
  END IF
  IF Expt$="IEA" THEN
    ScanEMin$=ScanMin$(Xpt%):ScanEMin=VAL(ScanEMin$):SetMin=SetEMin
    ScanEMax$=ScanMax$(Xpt%):ScanEMax=VAL(ScanEMax$):SetMax=SetEMax
  END IF

'  MOVETO 100,360:PRINT ScanMin$(Xpt%),ScanMax$(Xpt%)
'  FOR i=1 TO 20000:NEXT

WINDOW CLOSE 2:RETURN
REM ------------------------------------------------------------------------

ReadWindo3:
REM Survey
  IF ChangeMode=1 THEN RETURN
  IF Windo<>3 THEN RETURN
  CALL TEXTFONT (3)
  CALL TEXTSIZE (9)
  rgn%=0
  IF MsgWindo=0 THEN
    MsgWindo=1
    ErrMsg$=""
    GOSUB ErrMsg
  END IF
```

```
NewField=1:OldField=1
Comment$=EDIT$(1)
ScanStart$(Xpt%,rgn%)=EDIT$(2):ScanEnd$(Xpt%,rgn%)=EDIT$(3)
ScanStart(Xpt%,rgn%)=VAL(ScanStart$(Xpt%,rgn%)):ScanEnd(Xpt%,rgn%)=VAL(ScanEnd$(Xpt%,rgn%))

IF Expt$=Expt1$ THEN
  IF Expt1$="AES" THEN
    ScanAStart$=ScanStart$(Xpt%,rgn%): ScanAStart=VAL(ScanStart$(Xpt%,rgn%))
    ScanAEnd$=ScanEnd$(Xpt%,rgn%): ScanAEnd=VAL(ScanEnd$(Xpt%,rgn%))
  END IF
  IF Expt1$="XPS" THEN
    ScanXstart$=ScanStart$(Xpt%,rgn%): ScanXstart=VAL(ScanStart$(Xpt%,rgn%))
    ScanXend$=ScanEnd$(Xpt%,rgn%): ScanXend=VAL(ScanEnd$(Xpt%,rgn%))
  END IF
  IF Expt1$="UPS" THEN
    ScanUStart$=ScanStart$(Xpt%,rgn%): ScanUStart=VAL(ScanStart$(Xpt%,rgn%))
    ScanUEnd$=ScanEnd$(Xpt%,rgn%): ScanUEnd=VAL(ScanEnd$(Xpt%,rgn%))
  END IF
END IF

IF Expt$=Expt2$ THEN
  IF Expt2$="SIM" THEN
    ScanMStart$=ScanStart$(Xpt%,rgn%): ScanMStart=VAL(ScanStart$(Xpt%,rgn%))
    ScanMEnd$=ScanEnd$(Xpt%,rgn%): ScanMEnd=VAL(ScanEnd$(Xpt%,rgn%))
  END IF
  IF Expt2$="IEA" THEN
    ScanEStart$=ScanStart$(Xpt%,rgn%): ScanEStart=VAL(ScanStart$(Xpt%,rgn%))
    ScanEEnd$=ScanEnd$(Xpt%,rgn%): ScanEEnd=VAL(ScanEnd$(Xpt%,rgn%))
  END IF
END IF

  IF ScanStart$(Xpt%,rgn%)="" THEN
    Ready2=0: ErrMsg$="Set Scan Start"
      IF ErrMsg$<>ErrMsgOld$ THEN GOSUB ErrMsg
  ELSE
    Ready2=1
  END IF

  IF ScanEnd$(Xpt%,rgn%)="" THEN
    Ready3=0: ErrMsg$="Set Scan End"
      IF ErrMsg$<>ErrMsgOld$ THEN GOSUB ErrMsg
  ELSE
    Ready3=1
  END IF

IF ScanMin(Xpt%) < ScanMax(Xpt%) THEN
    IF ScanStart(Xpt%,rgn%)<ScanMin(Xpt%) THEN
      Ready2=0: ErrMsg$="Set Scan Start"
        IF ErrMsg$<>ErrMsgOld$ THEN
          GOSUB ErrMsg:
          IF Editing=0 THEN
            EDIT FIELD 2:Editing=1
          END IF
        END IF
    ELSE
      Ready2=1
      Editing=0
    END IF

    IF ScanEnd(Xpt%,rgn%)>ScanMax(Xpt%) THEN
      Ready3=0:ErrMsg$="Set Scan End"
        IF ErrMsg$<>ErrMsgOld$ THEN
          GOSUB ErrMsg
          IF Editing=0 THEN
            EDIT FIELD 3:Editing=1
          END IF
        END IF
```

```
        ELSE
          Ready3=1
          Editing=0
        END IF
    END IF

    IF ScanMin(Xpt%) > ScanMax(Xpt%) THEN
        IF ScanStart(Xpt%,rgn%)>ScanMin(Xpt%) THEN
          Ready2=0: ErrMsg$="Set Scan Start"
            IF ErrMsg$<>ErrMsgOld$ THEN
              GOSUB ErrMsg
              IF Editing=0 THEN
                EDIT FIELD 2:Editing=1
              END IF
            END IF
        ELSE
          Ready2=1
          Editing=0
        END IF
        IF ScanEnd(Xpt%,rgn%)<ScanMax(Xpt%) THEN
        Ready3=0:ErrMsg$="Set Scan End"
            IF ErrMsg$<>ErrMsgOld$ THEN
              GOSUB ErrMsg
              IF Editing=0 THEN
                EDIT FIELD 3:Editing=1
              END IF
            END IF
      ELSE
        Ready3=1
        Editing=0
      END IF
      END IF
      Ready4=1:Ready5=1

        IF ScanMin(Xpt%)<ScanMax(Xpt%) THEN
          StepDir=1
          IF ScanStart(Xpt%,rgn%)>=ScanEnd(Xpt%,rgn%) THEN
              Ready23=0:ErrMsg$="Illegal Scan Range"
            IF ErrMsg$<>ErrMsgOld$ THEN GOSUB ErrMsg
          ELSE
            Ready23=1
          END IF
        END IF:'   Min<Max
        Ready45=1

        IF ScanMin(Xpt%)>ScanMax(Xpt%) THEN
          StepDir=-1
          IF ScanStart(Xpt%,rgn%)<=ScanEnd(Xpt%,rgn%) THEN
            Ready23=0:ErrMsg$="Illegal Scan Range"
          IF ErrMsg$<>ErrMsgOld$ THEN GOSUB ErrMsg
        ELSE
          Ready23=1
        END IF:'   ScanStart(Xpt%,rgn%)<ScanEnd(Xpt%,rgn%)
      END IF:' Min>Max

    StepSize$(Xpt%)=EDIT$(6):StepSize(Xpt%)=VAL(StepSize$(Xpt%))
      IF StepSize$(Xpt%)="" THEN
          Ready6=0:ErrMsg$="Set StepSize(Xpt%)"
            IF ErrMsg$<>ErrMsgOld$ THEN GOSUB ErrMsg
      ELSE
        Ready6=1
      END IF:'   StepSize(Xpt%)


mSecStep$(Xpt%)=EDIT$(7):mSecStep(Xpt%)=VAL(mSecStep$(Xpt%)):SecStep(Xpt%)=mSecStep(Xpt%)/1000
    mSecStepSet=mSecStep(Xpt%):SecStepSet=SecStep(Xpt%)
      IF mSecStep$(Xpt%)="" THEN
          Ready7=0:ErrMsg$="Set mSec/Step"
            IF ErrMsg$<>ErrMsgOld$ THEN GOSUB ErrMsg
```

```
      ELSE
         Ready7=1
      END IF:'  mSecStep
    IF StepSize(Xpt%)>0 THEN
       SurvScanTim=ABS(ScanEnd-ScanStart)*SecStep(Xpt%)/StepSize(Xpt%)
       MOVETO 80,266:PRINT  USING "#####.#";SurvScanTim
    END IF

    Nscans$=EDIT$(8):Nscans=VAL(Nscans$)
      IF Nscans>1 THEN
         BUTTON 7, But7Win3:BUTTON 8, But8Win3
         IF But8Win3=2 THEN Accum=1 ELSE Accum=0
      END IF
      IF Nscans<=1 THEN BUTTON 7,1:BUTTON 8,1:Accum=0
      IF Expt$=Expt1$ THEN: Nscans1=Nscans:Accum1=Accum
      IF Expt$=Expt2$ THEN: Nscans2=Nscans:Accum2=Accum

      IF Nscans$="" THEN
         Ready8=0:ErrMsg$="Set No. of Scans"
           IF ErrMsg$<>ErrMsgOld$ THEN GOSUB ErrMsg
    ELSE
       Ready8=1
    END IF

  SurvAcqTim=SurvScanTim*Nscans
  SurvMin=INT(SurvAcqTim/60)
  SurvSec=INT (SurvAcqTim-60*SurvMin)
  SurvAcqTim$=STR$(SurvMin)+":"+STR$(SurvSec)
  IF SurvAcqTimOld$<>SurvAcqTim$ THEN
     MOVETO 300,150:PRINT "Acquisition Time (Min:Sec)"
     MOVETO 430,150:PRINT "            "
     CALL FRAMERECT (VARPTR(SurvAcqTim%(0)))
     MOVETO 430,150: PRINT SurvAcqTim$
  END IF
  SurvAcqTimOld$=SurvAcqTim$

  IF Expt$=Expt1$ THEN

    IF Expt1$="AES" THEN
      NptAvg$=EDIT$(9):NptAvg=VAL(NptAvg$)
      IF NptAvg$="" THEN
         Ready9=0:ErrMsg$="Set N Point Differentiation"
           IF ErrMsg$<>ErrMsgOld$ THEN GOSUB ErrMsg
      ELSE
         Ready9=1
      END IF
    END IF:' AES

    IF Expt1$="XPS" THEN
      IF  But4Win3 = 2  THEN Xphoton=MgAnode
      IF  But5Win3 = 2  THEN Xphoton=AlAnode
      Ready9=1
    ELSE
      Xphoton=0
    END IF:' XPS

    IF Expt1$="UPS" THEN
       PhotonEnergy$=EDIT$(9):PhotonEnergy=VAL(PhotonEnergy$)
      IF PhotonEnergy$<>"" AND But4Win3<>2 AND But5Win3<>2 THEN Uphoton=PhotonEnergy
      IF PhotonEnergy$="" AND But4Win3<>2 AND But5Win3<>2 THEN
         Ready9=0:ErrMsg$="Select Photon Energy"
           IF ErrMsg$<>ErrMsgOld$ THEN GOSUB ErrMsg
      ELSE
         Ready9=1
      END IF
    END IF:' UPS

END IF:' Expt1$
```

```
Ready=Ready2+Ready3+Ready23+Ready4+Ready5+Ready45+Ready6+Ready7+Ready8+Ready9
MOVETO 100,380:PRINT "Ready=";Ready

IF Ready=10 THEN
   But6Win3=1:BUTTON 6,But6Win3
   ErrMsg$="Data Complete"
   MENU 2,1,1
     IF ErrMsg$<>ErrMsgOld$ THEN GOSUB ErrMsg
ELSE
   But6Win3=0:BUTTON 6,But6Win3
   MENU 2,1,0
END IF

IF (MenuSel=21 OR But6Win3=2) AND Ready=10 THEN

   mSecStep(Xpt%)=VAL(mSecStep$(Xpt%)):SecStep(Xpt%)=mSecStep(Xpt%)/1000
   Ndwl=mSecStep(Xpt%)\500
   Dwl=mSecStep(Xpt%)-Ndwl*500

  IF Expt$=Expt1$ THEN
    eVStep$=StepSize$(Xpt%):EmSecStep$=mSecStep$(Xpt%):ENscans$=Nscans$
    eVStep=VAL(eVStep$):EmSecStep=VAL(EmSecStep$):ENscans=VAL(ENscans$):NptAvg=VAL(NptAvg$)
     Ndwl1=Ndwl:Dwl1=Dwl
     mSecStep1=mSecStep(Xpt%)
      SecStep1=mSecStep1/1000
     Nscans1=Nscans
      Npts1(rgn%)=ABS((ScanEnd(Xpt%,rgn%)-ScanStart(Xpt%,rgn%))/eVStep)
     IF Npts1(rgn%)>4000 THEN
        BEEP:Npts1(rgn%)=4000:StepSize(Xpt%)=ABS(ScanEnd(Xpt%,rgn%)-
ScanStart(Xpt%,rgn%))/Npts1(rgn%)
        StepSize$(Xpt%)=STR$(StepSize(Xpt%))
        EDIT FIELD 6,StepSize$(Xpt%), (75,195)-(125,210)
       GOTO ReadWindo3
     END IF
  END IF:'   Expt1$

  IF Expt$=Expt2$ THEN
     IF Expt2$="SIM" THEN
        amuStep$=StepSize$(Xpt%):MmSecStep$=MmSecStep$:MNscans$=Nscans$

amuStep=VAL(amuStep$):MmSecStep=VAL(MmSecStep$):MNscans=VAL(MNscans$):NptAvg=VAL(NptAvg$)
         ScanMStart$=ScanStart$(Xpt%,rgn%):ScanMEnd$=Scan2$:MDisp1$=Disp1$:MDisp2$=Disp2$

ScanMStart=VAL(ScanMStart$):ScanMEnd=VAL(ScanMEnd$):MDisp1=VAL(MDisp1$):MDisp2=VAL(MDisp2$
)
        Npts2(rgn%)=ABS((ScanMEnd-ScanMStart)/amuStep)
        IF Npts2(rgn%)>4000 THEN
          BEEP:Npts2(rgn%)=4000:StepSize(Xpt%)=ABS(ScanMEnd-ScanMStart)/Npts2(rgn%)
         StepSize$(Xpt%)=STR$(StepSize(Xpt%))
          EDIT FIELD 6,StepSize$(Xpt%), (75,195)-(125,210)
        GOTO ReadWindo3
       END IF
     END IF:'   SIM
     IF Expt2$="IEA" THEN
        IEevStep$=StepSize$(Xpt%):IEmSecStep$=IEmSecStep$:IENscans$=Nscans$
       IEevStep=VAL(IEevStep$):IEmSecStep=VAL(IEmSecStep$):IENscans=VAL(IENscans$)

ScanEStart$(i)=ScanStart$(Xpt%,rgn%):ScanEEnd$(i)=Scan2$(i):IEDisp1$(i)=Disp1$(i):IEDisp2$(i)=Disp2$(i)

ScanEStart(i)=VAL(ScanEStart$(i)):ScanEEnd(i)=VAL(ScanEEnd$(i)):IEDisp1(i)=VAL(EDisp1$(i)):IEDisp2(i)=V
AL(IEDisp2$(i))
REM  ******temporary***********

        ScanEStart$=ScanAStart$:ScanEEnd$=ScanAEnd$:IEDisp1$=Disp11$:IEDisp2$=Disp21$

ScanEStart=VAL(ScanEStart$):ScanEEnd=VAL(ScanEEnd$):IEDisp1=VAL(EDisp1$):IEDisp2=VAL(IEDisp2$)
      DispWindo(Xpt%,rgn%)=1
REM  ******temporary***********
```

```
      Npts2(rgn%)=ABS(ScanEEnd-ScanEStart)/IEevStep
      IF Npts2(rgn%)>4000 THEN
        BEEP:Npts2(rgn%)=4000:StepSize(Xpt%)=ABS(ScanEEnd-ScanEStart)/Npts2(rgn%)
        StepSize$(Xpt%)=STR$(StepSize(Xpt%))
        GOTO ReadWindo3
      END IF
    END IF:'  IEA
 '**********
    Ndwl2=Ndwl:Dwl2=Dwl
    mSecStep2=mSecStep(Xpt%)
    SecStep2=mSecStep2/1000
    Nscans2=Nscans
  END IF:'  Expt2$

  MenuSel=0:Leave3=1:But6Win3=1
  IF Expt$=Expt1$ THEN FirstPlot1=0
    IF Expt$=Expt2$ THEN FirstPlot2=0
  END IF:'
   IF MenuSel>0 THEN
     IF MenuSel=11 THEN:MenuSel=0:Leavego=1:GOSUB NewData
     IF MenuSel=12 THEN:MenuSel=0:Leavego=1:GOSUB OpenFil
     IF MenuSel=13 THEN:MenuSel=0:Leavego=1:GOSUB CloseFil
     IF MenuSel=14 THEN:MenuSel=0:Leavego=1:GOSUB SavFil
     IF MenuSel=15 THEN:MenuSel=0:Leavego=1:GOSUB SavFilAs
     IF MenuSel=16 THEN:MenuSel=0:Leavego=1:GOSUB Setup
     IF MenuSel=17 THEN:MenuSel=0:Leavego=1:GOSUB Plot
'    IF MenuSel=18 THEN:MenuSel=0:Leavego=1:GOSUB Xfer
     IF MenuSel=21 THEN:MenuSel=0:Leavego=0:GOSUB Go
     IF MenuSel=31 THEN MenuSel=0:Leavego=0:GOTO StartHere
   END IF

   IF Leave3=0 THEN GOTO ReadWindo3
   Dwindo%=DispWindo(Xpt%,rgn%)
   '  ScanStart(Xpt%,rgn%)=ScanStart(Xpt%,rgn%)
   '  ScanEnd(Xpt%,rgn%)=ScanEnd(Xpt%,rgn%)
   Leave3=0
   Ncycles(1,1)=1
   RegionMax(1)=1
 ' WINDOW CLOSE 2
 WINDOW CLOSE 3
 RETURN
 REM -------------------------------------------------------------

 ReadWindo4:
 REM Multiplex
   IF ChangeMode=1 THEN RETURN
   IF Leave4=0 THEN GOTO ReadWindo4
   IF Windo<>4 THEN RETURN
   TEXTFONT 3
   TEXTSIZE 9
   Windo4=1
   IF MsgWindo=0 THEN
     MsgWindo=1
     ErrMsg$=""
     GOSUB ErrMsg
   END IF

   NewField=1:OldField=1
 FOR rgn%=1 TO 10
   ScanStart$(Xpt%,rgn%)=EDIT$ (rgn%+1):ScanStart(Xpt%,rgn%)=VAL (ScanStart$(Xpt%,rgn%))
   ScanEnd$(Xpt%,rgn%)=EDIT$ (rgn%+2):ScanEnd(Xpt%,rgn%)=VAL (ScanEnd$(Xpt%,rgn%))
   Cycle$(rgn%)=EDIT$ (rgn%+3):Cycle(rgn%)=VAL (Cycle$(rgn%))
 NEXT

 IF Expt$=Expt1$ THEN
   IF Expt1$="AES" THEN
   FOR rgn%=1 TO 10
```

```
ScanAStart$(rgn%)=ScanStart$(Xpt%,rgn%)
ScanAStart(rgn%)=VAL(ScanAStart$(rgn%))
ScanAEnd$(rgn%)=ScanEnd$(Xpt%,rgn%)
ScanAEnd(rgn%)=VAL(ScanAEnd$(rgn%))
CycleA$(rgn%)=Cycle$(rgn%)
CycleA(rgn%)=VAL(CycleA$(rgn%))
NEXT
END IF:REM AES
REM **********To Here**************
END IF
REM - ### from Initwindo4 -- must rem out ##########################

' MPXAcqTim%(0)=5:MPXAcqTim%(1)=525:MPXAcqTim%(2)=25:MPXAcqTim%(3)=595
' MpxScanTim%(0)=5 :MpxScanTim%(1)=240 :MpxScanTim%(2)=25 :MpxScanTim%(3)=300

' Windo=4
' But2Win4=1
' IF Windo4=0 THEN   WINDOW 4, Expt$ + "Multiplex",(0,35)-(640,480),3 ELSE WINDOW 4
' Windo4=1
' Leave4=0
' CALL TEXTFONT (3)
' CALL TEXTSIZE (9)
' MOVETO 15,75:PRINT"Region":MOVETO 315,75:PRINT "# Cycles"
' MOVETO 0,64:LINETO 640,64
' MOVETO 0,80:LINETO 640,80
' LINE(290,64)-(290,480)
' LINE(400,64)-(400,380)
' MOVETO 0,380:LINETO 640,380

' FOR rgn%=1 TO 10
'   MOVETO 25,70+30*rgn%:PRINT rgn%
'   MOVETO 50,70+30*rgn%:PRINT"Scan From":EDIT FIELD (rgn%-
1)*3+1,STR$(ScanStart(Xpt%,rgn%)(rgn%)),(125,55+30*rgn%)-(175,70+30*rgn%)
'   MOVETO 185,70+30*rgn%:PRINT "To":EDIT FIELD (rgn%-
1)*3+2,STR$(ScanEnd(Xpt%,rgn%)(rgn%)),(210,55+30*rgn%)-(260,70+30*rgn%)
'   MOVETO 270 ,70+30*rgn%:PRINT"eV"
'   MOVETO 350,70+30*rgn%:EDIT FIELD (rgn%-1)*3+3,STR$(MPXcycleno(rgn%)),(310,55+30*rgn%)-
(360,70+30*rgn%)
' NEXT
' REM **************
' MOVETO 10,20:PRINT"Multiplex No. of Regions":EDIT FIELD 31,STR$(RegionMax(Xpt%)),(140,5)-(170,20)
' MOVETO 190,20:PRINT "Scan Time":CALL FRAMERECT (VARPTR(MpxScanTim%(0)))
'   MOVETO 250,20:PRINT USING "#####.#";MpxScanTim
'   MOVETO 310,20:PRINT"Seconds/Scan"
' MOVETO 475,60:PRINT "Display Windows"
' MOVETO 425,75: PRINT "1":MOVETO 475,75:PRINT"2":MOVETO 525,75:PRINT"3":MOVETO
575,75:PRINT"4"

' MOVETO 10,400:PRINT"No. of Scans:":EDIT FIELD 32,STR$(NoMpxScans),(85,385)-(110,400)
' MOVETO 10,420:PRINT "eV/Step":EDIT FIELD 33,eVStep$,(75,405)-(125,420)
' MOVETO 10,440:PRINT "mSec/Step ":EDIT FIELD 34,mSecStep$(Xpt%),(75,425)-(125,440)
' MOVETO 400,20:PRINT "Acquisition Time (Min:Sec)"
'   CALL FRAMERECT (VARPTR(MPXAcqTim%(0)))
'   MOVETO 530,20: PRINT MPXAcqTim$
' MOVETO 300,400:BUTTON 1,But1Win4,"Display Integral",(310,385)-(450,400),2
' MOVETO 300,420:BUTTON 2,But2Win4,"Display Derivative",(310,405)-(450,420),2
' EDIT FIELD 35, NptAvg$, (310,425)-(335,440):MOVETO 350,435:PRINT "Point Differentiation"
' BUTTON 3,But6Win3,"Go",(590,400)-(640,415)
' REM **************
' MOVETO 420,100:BUTTON 3,But3Win4,"",(420,85)-(435,100),2:MOVETO 470,100:BUTTON
4,But4Win4,"",(470,85)-(485,100),2:MOVETO 520,100:BUTTON 5,But5Win4,"",(520,85)-
(535,100),2:MOVETO 570,100:BUTTON 6,But6Win4,"",(570,85)-(585,100),2
' MOVETO 420,130:BUTTON 7,But7Win4,"",(420,115)-(435,130),2:MOVETO 470,130:BUTTON
8,But8Win4,"",(470,115)-(485,130),2:MOVETO 520,130:BUTTON 9,But9Win4,"",(520,115)-
(535,130),2:MOVETO 570,130:BUTTON 10,But10Win4,"",(570,115)-(585,130),2
' MOVETO 420,160:BUTTON 11,But11Win4,"",(420,145)-(435,160),2:MOVETO 470,160:BUTTON
12,But12Win4,"",(470,145)-(485,160),2:MOVETO 520,160:BUTTON 13,But13Win4,"",(520,145)-
```

```
(535,160),2:MOVETO 570,160:BUTTON 14,But14Win4,"",(570,145)-(585,160),2
' MOVETO 420,190:BUTTON 15,But15Win4,"",(420,175)-(435,190),2:MOVETO 470,190:BUTTON 16,But16Win4,"",(470,175)-(485,190),2:MOVETO 520,190:BUTTON 17,But17Win4,"",(520,175)-(535,190),2:MOVETO 570,190:BUTTON 18,But18Win4,"",(570,175)-(585,190),2
' MOVETO 420,220:BUTTON 19,But19Win4,"",(420,205)-(435,220),2:MOVETO 470,220:BUTTON 20,But20Win4,"",(470,205)-(485,220),2:MOVETO 520,220:BUTTON 21,But21Win4,"",(520,205)-(535,220),2:MOVETO 570,220:BUTTON 22,But22Win4,"",(570,205)-(585,220),2
' MOVETO 420,250:BUTTON 23,But23Win4,"",(420,235)-(435,250),2:MOVETO 470,250:BUTTON 24,But24Win4,"",(470,235)-(485,250),2:MOVETO 520,250:BUTTON 25,But25Win4,"",(520,235)-(535,250),2:MOVETO 570,250:BUTTON 26,But26Win4,"",(570,235)-(585,250),2
' MOVETO 420,280:BUTTON 27,But27Win4,"",(420,265)-(435,280),2:MOVETO 470,280:BUTTON 28,But28Win4,"",(470,265)-(485,280),2:MOVETO 520,280:BUTTON 29,But29Win4,"",(520,265)-(535,280),2:MOVETO 570,280:BUTTON 30,But30Win4,"",(570,265)-(585,280),2
' MOVETO 420,310:BUTTON 31,But31Win4,"",(420,295)-(435,310),2:MOVETO 470,310:BUTTON 32,But32Win4,"",(470,295)-(485,310),2:MOVETO 520,310:BUTTON 33,But33Win4,"",(520,295)-(535,310),2:MOVETO 570,310:BUTTON 34,But34Win4,"",(570,295)-(585,310),2
' MOVETO 420,340:BUTTON 35,But35Win4,"",(420,325)-(435,340),2:MOVETO 470,340:BUTTON 36,But36Win4,"",(470,325)-(485,340),2:MOVETO 520,340:BUTTON 37,But37Win4,"",(520,325)-(535,340),2:MOVETO 570,340:BUTTON 38,But38Win4,"",(570,325)-(585,340),2
' MOVETO 420,370:BUTTON 39,But39Win4,"",(420,355)-(435,370),2:MOVETO 470,370:BUTTON 40,But40Win4,"",(470,355)-(485,370),2:MOVETO 520,370:BUTTON 41,But41Win4,"",(520,355)-(535,370),2:MOVETO 570,370:BUTTON 42,But42Win4,"",(570,355)-(585,370),2
'EDIT FIELD 1
' nfield4max=35:ofield4=2:nfield4=2
' IF MenuSel=31 THEN:MenuSel=0:GOTO StartHere

REM ######End Init Code -- begin Read#################################################
REM Multiplex
  IF ChangeMode=1 THEN RETURN
  IF Windo<>4 THEN RETURN
  CALL TEXTFONT (3)
  CALL TEXTSIZE (9)

  IF MsgWindo=0 THEN
    MsgWindo=1
    ErrMsg$=""
    GOSUB ErrMsg
  END IF

  NewField=1:OldField=1
  Comment$=EDIT$(1)
  ScanStart$(Xpt%,rgn%)=EDIT$(2):ScanEnd$(Xpt%,rgn%)=EDIT$(3)
  ScanStart(Xpt%,rgn%)=VAL(ScanStart$(Xpt%,rgn%)):ScanEnd(Xpt%,rgn%)=VAL(ScanEnd$(Xpt%,rgn%))

 IF Expt$=Expt1$ THEN
   IF Expt1$="AES" THEN
      ScanAStart$=ScanStart$(Xpt%,rgn%): ScanAStart=VAL(ScanStart$(Xpt%,rgn%))
     ScanAEnd$=ScanEnd$(Xpt%,rgn%): ScanAEnd=VAL(ScanEnd$(Xpt%,rgn%))
   END IF
   IF Expt1$="XPS" THEN
      ScanXstart$=ScanStart$(Xpt%,rgn%): ScanXstart=VAL(ScanStart$(Xpt%,rgn%))
     ScanXend$=ScanEnd$(Xpt%,rgn%): ScanXend=VAL(ScanEnd$(Xpt%,rgn%))
   END IF
   IF Expt1$="UPS" THEN
      ScanUStart$=ScanStart$(Xpt%,rgn%): ScanUStart=VAL(ScanStart$(Xpt%,rgn%))
     ScanUEnd$=ScanEnd$(Xpt%,rgn%): ScanUEnd=VAL(ScanEnd$(Xpt%,rgn%))
   END IF
 END IF

 IF Expt$=Expt2$ THEN
   IF Expt2$="SIM" THEN
      ScanMStart$=ScanStart$(Xpt%,rgn%): ScanMStart=VAL(ScanStart$(Xpt%,rgn%))
     ScanMEnd$=ScanEnd$(Xpt%,rgn%): ScanMEnd=VAL(ScanEnd$(Xpt%,rgn%))
   END IF
   IF Expt2$="IEA" THEN
      ScanEStart$=ScanStart$(Xpt%,rgn%): ScanEStart=VAL(ScanStart$(Xpt%,rgn%))
     ScanEEnd$=ScanEnd$(Xpt%,rgn%): ScanEEnd=VAL(ScanEnd$(Xpt%,rgn%))
   END IF
 END IF
```

```
IF ScanStart$(Xpt%,rgn%)="" THEN
   Ready2=0: ErrMsg$="Set Scan Start"
     IF ErrMsg$<>ErrMsgOld$ THEN GOSUB ErrMsg
ELSE
   Ready2=1
END IF

IF ScanEnd$(Xpt%,rgn%)="" THEN
   Ready3=0: ErrMsg$="Set Scan End"
     IF ErrMsg$<>ErrMsgOld$ THEN GOSUB ErrMsg
ELSE
   Ready3=1
END IF

IF ScanMin(Xpt%) < ScanMax(Xpt%) THEN
    IF ScanStart(Xpt%,rgn%)<ScanMin(Xpt%) THEN
       Ready2=0: ErrMsg$="Set Scan Start"
         IF ErrMsg$<>ErrMsgOld$ THEN
           GOSUB ErrMsg:
           IF Editing=0 THEN
              EDIT FIELD 2:Editing=1
           END IF
         END IF
    ELSE
       Ready2=1
       Editing=0
    END IF

    IF ScanEnd(Xpt%,rgn%)>ScanMax(Xpt%) THEN
       Ready3=0:ErrMsg$="Set Scan End"
         IF ErrMsg$<>ErrMsgOld$ THEN
           GOSUB ErrMsg
           IF Editing=0 THEN
              EDIT FIELD 3:Editing=1
           END IF
         END IF
    ELSE
       Ready3=1
       Editing=0
    END IF
END IF

IF ScanMin(Xpt%) > ScanMax(Xpt%) THEN
    IF ScanStart(Xpt%,rgn%)>ScanMin(Xpt%) THEN
       Ready2=0: ErrMsg$="Set Scan Start"
         IF ErrMsg$<>ErrMsgOld$ THEN
           GOSUB ErrMsg
           IF Editing=0 THEN
              EDIT FIELD 2:Editing=1
           END IF
         END IF
    ELSE
       Ready2=1
       Editing=0
    END IF
    IF ScanEnd(Xpt%,rgn%)<ScanMax(Xpt%) THEN
    Ready3=0:ErrMsg$="Set Scan End"
         IF ErrMsg$<>ErrMsgOld$ THEN
           GOSUB ErrMsg
           IF Editing=0 THEN
              EDIT FIELD 3:Editing=1
           END IF
         END IF
    ELSE
       Ready3=1
       Editing=0
    END IF
END IF
```

```
Ready4=1:Ready5=1

  IF ScanMin(Xpt%)<ScanMax(Xpt%) THEN
    StepDir=1
    IF ScanStart(Xpt%,rgn%)>=ScanEnd(Xpt%,rgn%) THEN
       Ready23=0:ErrMsg$="Illegal Scan Range"
      IF ErrMsg$<>ErrMsgOld$ THEN GOSUB ErrMsg
    ELSE
      Ready23=1
    END IF
  END IF:'  Min<Max
  Ready45=1

  IF ScanMin(Xpt%)>ScanMax(Xpt%) THEN
    StepDir=-1
    IF ScanStart(Xpt%,rgn%)<=ScanEnd(Xpt%,rgn%) THEN
       Ready23=0:ErrMsg$="Illegal Scan Range"
      IF ErrMsg$<>ErrMsgOld$ THEN GOSUB ErrMsg
    ELSE
      Ready23=1
    END IF:'  ScanStart(Xpt%,rgn%)<ScanEnd(Xpt%,rgn%)
  END IF:' Min>Max

 StepSize$(Xpt%)=EDIT$(6):StepSize(Xpt%)=VAL(StepSize$(Xpt%))
  IF StepSize$(Xpt%)="" THEN
    Ready6=0:ErrMsg$="Set StepSize(Xpt%)"
     IF ErrMsg$<>ErrMsgOld$ THEN GOSUB ErrMsg
  ELSE
    Ready6=1
  END IF:'  StepSize(Xpt%)


mSecStep$(Xpt%)=EDIT$(7):mSecStep(Xpt%)=VAL(mSecStep$(Xpt%)):SecStep(Xpt%)=mSecStep(Xpt%)/1000
  IF mSecStep$(Xpt%)="" THEN
    Ready7=0:ErrMsg$="Set mSec/Step"
     IF ErrMsg$<>ErrMsgOld$ THEN GOSUB ErrMsg
  ELSE
    Ready7=1
  END IF:'  mSecStep

 IF StepSize(Xpt%)>0 THEN
   SurvScanTim=ABS(ScanAEnd-ScanAStart)*SecStep(Xpt%)/StepSize(Xpt%)
   MOVETO 80,266:PRINT USING "#####.#";SurvScanTim
 END IF

 Nscans$=EDIT$(8):Nscans=VAL(Nscans$)
  IF Nscans>1 THEN
    BUTTON 7, But7Win3:BUTTON 8, But8Win3
    IF But8Win3=2 THEN Accum=1 ELSE Accum=0
  END IF
  IF Nscans<=1 THEN BUTTON 7,1:BUTTON 8,1:Accum=0
  IF Expt$=Expt1$ THEN: Nscans1=Nscans:Accum1=Accum
  IF Expt$=Expt2$ THEN: Nscans2=Nscans:Accum2=Accum

  IF Nscans$="" THEN
    Ready8=0:ErrMsg$="Set No. of Scans"
     IF ErrMsg$<>ErrMsgOld$ THEN GOSUB ErrMsg
  ELSE
    Ready8=1
  END IF

SurvAcqTim=SurvScanTim*Nscans
SurvMin=INT(SurvAcqTim/60)
```

```
SurvSec=INT (SurvAcqTim-60*SurvMin)
SurvAcqTim$=STR$(SurvMin)+":"+STR$(SurvSec)
IF SurvAcqTimOld$<>SurvAcqTim$ THEN
   MOVETO 300,150:PRINT "Acquisition Time (Min:Sec)"
   MOVETO 430,150:PRINT "            "
   CALL FRAMERECT (VARPTR(SurvAcqTim%(0)))
   MOVETO 430,150: PRINT SurvAcqTim$
END IF
SurvAcqTimOld$=SurvAcqTim$

IF Expt$=Expt1$ THEN

  IF Expt1$="AES" THEN
    NptAvg$=EDIT$(9):NptAvg=VAL(NptAvg$)
    IF NptAvg$="" THEN
       Ready9=0:ErrMsg$="Set N Point Differentiation"
        IF ErrMsg$<>ErrMsgOld$ THEN GOSUB ErrMsg
   ELSE
      Ready9=1
   END IF
  END IF:' AES

  IF Expt1$="XPS" THEN
    IF But4Win3 = 2 THEN Xphoton=MgAnode
    IF But5Win3 = 2 THEN Xphoton=AlAnode
    Ready9=1
  END IF:' XPS

  IF Expt1$="UPS" THEN
     PhotonEnergy$=EDIT$(9):PhotonEnergy=VAL(PhotonEnergy$)
     IF PhotonEnergy$<>"" AND But4Win3<>2 AND But5Win3<>2 THEN Uphoton=PhotonEnergy
     IF PhotonEnergy$="" AND But4Win3<>2 AND But5Win3<>2 THEN
        Ready9=0:ErrMsg$="Select Photon Energy"
         IF ErrMsg$<>ErrMsgOld$ THEN GOSUB ErrMsg
    ELSE
       Ready9=1
    END IF
  END IF:' UPS

END IF:' Expt1$

Ready=Ready2+Ready3+Ready23+Ready4+Ready5+Ready45+Ready6+Ready7+Ready8+Ready9
MOVETO 100,380:PRINT "Ready=";Ready

IF Ready=10 THEN
   But6Win3=1:BUTTON 6,But6Win3
   ErrMsg$="Data Complete"
   MENU 2,1,1
     IF ErrMsg$<>ErrMsgOld$ THEN GOSUB ErrMsg
ELSE
   But6Win3=0:BUTTON 6,But6Win3
   MENU 2,1,0
END IF

IF (MenuSel=21 OR But6Win3=2) AND Ready=10 THEN

    mSecStep(Xpt%)=VAL(mSecStep$(Xpt%)):SecStep(Xpt%)=mSecStep(Xpt%)/1000
    Ndwl=mSecStep(Xpt%)\500
    Dwl=mSecStep(Xpt%)-Ndwl*500

  IF Expt$=Expt1$ THEN
     eVStep$=StepSize$(Xpt%):EmSecStep$=mSecStep$(Xpt%):ENscans$=Nscans$
    eVStep=VAL(eVStep$):EmSecStep=VAL(EmSecStep$):ENscans=VAL(ENscans$):NptAvg=VAL(NptAvg$)
```

```
        Ndwl1=Ndwl:Dwl1=Dwl
        mSecStep1=mSecStep(Xpt%)
        Nscans1=Nscans
        Npts1(rgn%)=ABS((ScanEnd(Xpt%,rgn%)-ScanStart(Xpt%,rgn%))/eVStep)
        IF Npts1(rgn%)>4000 THEN
           BEEP:Npts1(rgn%)=4000:StepSize(Xpt%)=ABS(ScanEnd(Xpt%,rgn%)-
ScanStart(Xpt%,rgn%))/Npts1(rgn%)
           StepSize$(Xpt%)=STR$(StepSize(Xpt%))
           EDIT FIELD 6,StepSize$(Xpt%), (75,195)-(125,210)
          GOTO ReadWindo3
        END IF
   END IF:'   Expt1$

   IF Expt$=Expt2$ THEN
        IF Expt2$="SIM" THEN
            amuStep$=StepSize$(Xpt%):MmSecStep$=MmSecStep$:MNscans$=Nscans$

amuStep=VAL(amuStep$):MmSecStep=VAL(MmSecStep$):MNscans=VAL(MNscans$):NptAvg=VAL(NptAvg$)
             ScanMStart$=ScanStart$(Xpt%,rgn%):ScanMEnd$=Scan2$:MDisp1$=Disp1$:MDisp2$=Disp2$

ScanMStart=VAL(ScanMStart$):ScanMEnd=VAL(ScanMEnd$):MDisp1=VAL(MDisp1$):MDisp2=VAL(MDisp2$
)

           Npts2(rgn%)=ABS((ScanMEnd-ScanMStart)/amuStep)
           IF Npts2(rgn%)>4000 THEN
              BEEP:Npts2(rgn%)=4000:StepSize(Xpt%)=ABS(ScanMEnd-ScanMStart)/Npts2(rgn%)
             StepSize$(Xpt%)=STR$(StepSize(Xpt%))
              EDIT FIELD 6,StepSize$(Xpt%), (75,195)-(125,210)
            GOTO ReadWindo3
          END IF
        END IF:'   SIM
        IF Expt2$="IEA" THEN
            IEevStep$=StepSize$(Xpt%):IEmSecStep$=IEmSecStep$:IENscans$=Nscans$
           IEevStep=VAL(IEevStep$):IEmSecStep=VAL(IEmSecStep$):IENscans=VAL(IENscans$)

ScanEStart$(i)=ScanStart$(Xpt%,rgn%):ScanEEnd$(i)=Scan2$(i):IEDisp1$(i)=Disp1$(i):IEDisp2$(i)=Disp2$(i)

ScanEStart(i)=VAL(ScanEStart$(i)):ScanEEnd(i)=VAL(ScanEEnd$(i)):IEDisp1(i)=VAL(EDisp1$(i)):IEDisp2(i)=V
AL(IEDisp2$(i))
REM  ******temporary***********

             ScanEStart$=ScanAStart$:ScanEEnd$=ScanAEnd$:IEDisp1$=Disp11$:IEDisp2$=Disp21$

ScanEStart=VAL(ScanEStart$):ScanEEnd=VAL(ScanEEnd$):IEDisp1=VAL(EDisp1$):IEDisp2=VAL(IEDisp2$)
REM  ******temporary***********

           Npts2(rgn%)=ABS(ScanEEnd-ScanEStart)/IEevStep
           IF Npts2(rgn%)>4000 THEN
              BEEP:Npts2(rgn%)=4000:StepSize(Xpt%)=ABS(ScanEEnd-ScanEStart)/Npts2(rgn%)
             StepSize$(Xpt%)=STR$(StepSize(Xpt%))
            GOTO ReadWindo3
          END IF
        END IF:'   IEA
    '**********
        Ndwl2=Ndwl:Dwl2=Dwl
        mSecStep2=mSecStep(Xpt%)
        Nscans2=Nscans
   END IF:'   Expt2$

   MenuSel=0:Leave3=1:But6Win3=1
   IF Expt$=Expt1$ THEN FirstPlot1=0
   IF Expt$=Expt2$ THEN FirstPlot2=0
END IF:'
   IF MenuSel>0 THEN
```

```
   IF MenuSel=11 THEN:MenuSel=0:Leavego=1:GOSUB NewData
   IF MenuSel=12 THEN:MenuSel=0:Leavego=1:GOSUB OpenFil
   IF MenuSel=13 THEN:MenuSel=0:Leavego=1:GOSUB CloseFil
   IF MenuSel=14 THEN:MenuSel=0:Leavego=1:GOSUB SavFil
   IF MenuSel=15 THEN:MenuSel=0:Leavego=1:GOSUB SavFilAs
   IF MenuSel=16 THEN:MenuSel=0:Leavego=1:GOSUB Setup
   IF MenuSel=17 THEN:MenuSel=0:Leavego=1:GOSUB Plot
'  IF MenuSel=18 THEN:MenuSel=0:Leavego=1:GOSUB Xfer
   IF MenuSel=21 THEN:MenuSel=0:Leavego=0:GOSUB Go
   IF MenuSel=31 THEN MenuSel=0:Leavego=0:GOTO StartHere
 END IF

 IF Leave4=0 THEN GOTO ReadWindo4
 Leave4=0
WINDOW CLOSE 4

REM ######end ReadWindo3 patch################################################

   eVStep=VAL(eVStep$)

   mSecStep(Xpt%)=VAL(mSecStep$(Xpt%)):SecStep(Xpt%)=mSecStep(Xpt%)/1000
   NptAvg=VAL(NptAvg$)
   Ndwl=mSecStep(Xpt%)\500
   Dwl=mSecStep(Xpt%)-Ndwl*500
   IF But4Win4=2 THEN:NptAvg%=0:Xpt%=1:rgn%=0:DispWindo(Xpt%,rgn%)=1
 IF MenuSel>0 THEN
   IF MenuSel=11 THEN:MenuSel=0:Leave4=0:GOSUB NewData
   IF MenuSel=12 THEN:MenuSel=0:Leave4=0:GOSUB OpenFil
   IF MenuSel=13 THEN:MenuSel=0:Leave4=0:GOSUB CloseFil
   IF MenuSel=14 THEN:MenuSel=0:Leave4=0:GOSUB SavFil
   IF MenuSel=15 THEN:MenuSel=0:Leave4=0:GOSUB SavFilAs
   IF MenuSel=16 THEN:MenuSel=0:Leave4=0:GOSUB Setup
   IF MenuSel=17 THEN:MenuSel=0:Leave4=0:GOSUB Plot
'  IF MenuSel=18 THEN:MenuSel=0:Leave4=0:GOSUB Xfer
   ' IF MenuSel=21 THEN:MenuSel=0:Leave4=1:GOSUB Go
   ' IF MenuSel=31 THEN MenuSel=0:Leave4=1:GOTO StartHere
 END IF

WINDOW CLOSE 4
RETURN
REM -------------------------------------------------------------

ReadWindo5:
REM DepthProfile
  IF MenuSel=31 THEN MenuSel=0:GOTO StartHere
  IF Leave5=0 THEN GOTO ReadWindo5
    ScanAStart=VAL(ScanAStart$)
    ScanAEnd=VAL(ScanAEnd$)
    ADisp1=VAL(ADisp1$)
    ADisp2=VAL(ADisp2$)
    eVStep=VAL(eVStep$)
    ' mSecStep%=VAL(mSecStep$(Xpt%))
    NptAvg%=VAL(NptAvg$)
    Ndwl=mSecStep%\500
    Dwl=mSecStep%-Ndwl*500
    IF But4Win3=2 THEN:NptAvg%=0:Xpt%=1:rgn%=0:DispWindo(Xpt%,rgn%)=1

  IF MenuSel>0 THEN
    IF MenuSel=11 THEN:MenuSel=0:Leave5=0:GOSUB NewData
    IF MenuSel=12 THEN:MenuSel=0:Leave5=0:GOSUB OpenFil
    IF MenuSel=13 THEN:MenuSel=0:Leave5=0:GOSUB CloseFil
    IF MenuSel=14 THEN:MenuSel=0:Leave5=0:GOSUB SavFil
    IF MenuSel=15 THEN:MenuSel=0:Leave5=0:GOSUB SavFilAs
    IF MenuSel=16 THEN:MenuSel=0:Leave5=0:GOSUB Setup
```

```
    IF MenuSel=17 THEN:MenuSel=0:Leave5=0:GOSUB Plot
'   IF MenuSel=18 THEN:MenuSel=0:Leave5=0:GOSUB Xfer
    IF MenuSel=21 THEN:MenuSel=0:Leave5=1:GOSUB Go
    IF MenuSel=31 THEN MenuSel=0:Leave5=1:GOTO StartHere
  END IF

WINDOW CLOSE 5
RETURN
REM -----------------------------------------------------------

ReadWindo7:
REM Read DRISS parameters
REM initialize GPIB
IF GPIB<>0 THEN CALL ibcac(BD4%,0)
  Windo7=1
  FirstPlot3=0
  keV0$=EDIT$(1):keV0=VAL(keV0$):IF keV0>0 THEN Ready701=1 ELSE Ready701=0
  REM Set Beam Energy if Beam button is on
    IF BeamStatus=1 AND keV0>0 THEN voltage=-keV0/2  ELSE voltage=0
    '  voltage=-3
    Ochan%=0
    GOSUB Dac2
  Mass1$=EDIT$(2):Mass1=VAL(Mass1$):IF Mass1>0 THEN Ready702=1 ELSE Ready702=0
  Pwidth$=EDIT$(3):Pwidth=VAL(Pwidth$)+PWidthOffset:PwidthMicroSec=.001*VAL(Pwidth$)
  IF Pwidth$<>"" THEN Ready703=1 ELSE Ready703=0
  Kej0=1.6E-16*keV0:E0=Kej0:REM incident beam energy in joules
  E0=Kej0
REM E0,E1 and E2 are energies of incident & scattered primary and direct recoil, respectively
REM m1, m2 are masses of primary &sputtered particles respectively
REM Vx0=incident primary velocity, Vx1=scattered primary & Vx2=sputtered velocity
   Mg1=Mass1/6.02E+23:Mkg1=Mg1/1000
  IF (Mkg1>0 AND E0>0) THEN Vx0=SQR(2*E0/Mkg1)
  LAcm$=EDIT$(15):LAcm=VAL(LAcm$):IF LAcm>0 THEN Ready15=1 ELSE Ready15=0
  LBcm$=EDIT$(16):LBcm=VAL(LBcm$):IF LBcm>0 THEN Ready16=1 ELSE Ready16=0
  LCcm$=EDIT$(17):LCcm=VAL(LCcm$):IF LCcm>0 THEN Ready17=1 ELSE Ready17=0
  L1=.01*(LAcm+LBcm+LCcm):REM Length of Beam Line in meters
  IF (Vx0>0 ) THEN
TaD=.01*LAcm/Vx0:TaD$=STR$(TaD):TADns=1E+09*TaD:TADns$=LEFT$(STR$(TADns),6)
  IF TADns$<>EDIT$(4) THEN EDIT FIELD 4,TADns$,(150,105)-(200,118):EDIT FIELD EdField
  IF (Vx0>0 ) THEN
TbD=.01*LBcm/Vx0:TbD$=STR$(TbD):TBDns=1E+09*TbD:TBDns$=LEFT$(STR$(TBDns),6)
  IF TBDns$<>EDIT$(5) THEN EDIT FIELD 5, TBDns$,(150,125)-(200,138):EDIT FIELD EdField
  IF (Vx0>0 ) THEN
TcD=.01*LCcm/Vx0:TcD$=STR$(TcD):TCDns=1E+09*TcD:TCDns$=LEFT$(STR$(TCDns),6)
  IF TCDns$<>EDIT$(6) THEN EDIT FIELD 6, TCDns$,(150,145)-(200,158):EDIT FIELD EdField

  MinMass$=EDIT$(7):MinMass=VAL(MinMass$)
  IF MinMass<=Mass1 THEN MinMass=Mass1+1:BEEP
'   IF MinMass$<>EDIT$(7) THEN: EDIT FIELD 7,MinMass$,(150,295)-(200,308):EDIT FIELD EdField

  MaxMass$=EDIT$(8):MaxMass=VAL(MaxMass$):IF MaxMass>0 THEN Ready708=1 ELSE Ready708=0
  GTDist$=EDIT$(9):GTDist=.01*VAL(GTDist$):InDist=L1+GTDist
  IF Vx0>0 THEN InTime=InDist/Vx0
  GTAng$=EDIT$(10):GTAng=(3.14159/180)*VAL(GTAng$):IF GTAng>0 THEN Readay710=1 ELSE
Ready710=0
  DetDist1$=EDIT$(11):DetDist1=.01*VAL(DetDist1$):IF DetDist1>0 THEN Ready711=1 ELSE Ready711=0
'   GDAng1$=EDIT$(12):GDAng1=3.14159-(3.14159/180)*VAL(GDAng1$):IF GDAng1>0 THEN Ready712=1
ELSE Ready712=0
  GDAng1$=EDIT$(12):GDAng1=(3.14159/180)*VAL(GDAng1$):IF GDAng1>0 THEN Ready712=1 ELSE
Ready712=0

  DetDist2$=EDIT$(13):DetDist2=.01*VAL(DetDist2$):IF DetDist2>0 THEN Ready713=1 ELSE Ready713=0
'   GDAng2$=EDIT$(14):GDAng2=3.14159-(3.14159/180)*VAL(GDAng2$):IF GDAng2>0 THEN Ready714=1
ELSE Ready714=0
```

```
GDAng2$=EDIT$(14):GDAng2=(3.14159/180)*VAL(GDAng2$):IF GDAng2>0 THEN Ready714=1 ELSE
Ready714=0
  IF (But1Win7=2 OR But2Win7=2) THEN theta=GDAng1
  IF (But3Win7=2 OR  But4Win7=2)THEN theta=GDAng2

REM Determine maximum ToFTime
 REM Primary Scattering TofTime
   Mg2=MinMass/6.02E+23:Mkg2=Mg2/1000
  IF (Mkg1>0 AND Mkg2>0) THEN GOSUB Energy

  IF (Mkg1>0  AND E1Det1>0) THEN Vx1Det1=SQR(2*E1Det1/Mkg1):REM Det1 scatter
  '  IF (Mkg2>0 AND E2Det1>0) THEN Vx2Det1=SQR(2*E2Det1/Mkg2):REM Det1 recoil
  IF (Mkg1>0  AND E1Det2>0) THEN VX1Det2=SQR(2*E1Det2/Mkg1):REM Det2 scatter
  '  IF (Mkg2>0 AND E2Det2>0) THEN Vx2Det2=SQR(2*E2Det2/Mkg2):REM Det2 recoil

  IF (Vx1Det1>0 AND But1Win7=2) THEN
    OutTime1Scatt=DetDist1/Vx1Det1
    '  TofTime1Scatt=1000000!*(InTime+OutTime1Scatt)
    TofTime1Scatt=1000000!*(OutTime1Scatt)
   TofTime1=TofTime1Scatt
  END IF:REM scattering into detector 1
  '  IF (Vx2Det1>0 AND But2Win7=2) THEN OutTime1Scatt=DetDist1/Vx2Det1:REM direct recoil into detector
1
  IF (But1Win7=1 AND But2Win7=1) THEN OutTime1Scatt=0
  IF (VX1Det2>0 AND But3Win7=2) THEN
    OutTime2Scatt=DetDist2/VX1Det2
    '  TofTime2Scatt=1000000!*(InTime+OutTime2Scatt)
    TofTime2Scatt=1000000!*(OutTime2Scatt)
   TofTime2=TofTime2Scatt
  END IF:REM scattering into detector 2
  '  IF (Vx2Det2>0 AND But4Win7=2) THEN OutTime2Scatt=DetDist2/Vx2Det2:REM direct recoil into detector
2
  IF (But3Win7=1 AND But4Win7=1) THEN OutTime2Scatt=0
  IF OutTime1Scatt>OutTime2Scatt THEN OutTimeScatt=OutTime1Scatt ELSE OutTimeScatt=OutTime2Scatt

 REM Direct Recoil TofTime
   Mg2=MaxMass/6.02E+23:Mkg2=Mg2/1000
  IF (Mkg1>0 AND Mkg2>0) THEN GOSUB Energy
  '  IF (Mkg1>0  AND E1Det1>0) THEN Vx1Det1=SQR(2*E1Det1/Mkg1)
  IF (Mkg2>0 AND E2Det1>0) THEN Vx2Det1=SQR(2*E2Det1/Mkg2)
  '  IF (Mkg1>0  AND E1Det2>0) THEN VX1Det2=SQR(2*E1Det2/Mkg1)
  IF (Mkg2>0 AND E2Det2>0) THEN Vx2Det2=SQR(2*E2Det2/Mkg2)

  '  IF (Vx1Det1>0 AND But1Win7=2) THEN OutTime1Rec=DetDist1/Vx1Det1:REM scattering into detector 1
  IF (Vx2Det1>0 AND But2Win7=2) THEN
    OutTime1Rec=DetDist1/Vx2Det1
    '  TofTime1Rec=1000000!*(InTime+OutTime1Rec)
    TofTime1Rec=1000000!*(OutTime1Rec)
   TofTime1=TofTime1Rec
  END IF:REM direct recoil into detector 1
  IF (But1Win7=1 AND But2Win7=1) THEN OutTime1Rec=0
  '  IF (VX1Det2>0 AND But3Win7=2) THEN OutTime2Rec=DetDist2/VX1Det2:REM scattering into detector 2
  IF (Vx2Det2>0 AND But4Win7=2) THEN
    OutTime2Rec=DetDist2/Vx2Det2
    '  TofTime2Rec=1000000!*(InTime+OutTime2Rec)
    TofTime2Rec=1000000!*(OutTime2Rec)
   TofTime2=TofTime2Rec
  END IF:REM direct recoil into detector 2
  IF (But3Win7=1 AND But4Win7=1) THEN OutTime2Rec=0

 REM Determine Maximum Relevant ToFTime
  IF Scatt1=0 THEN TofTime1=TofTime1Rec ELSE TofTime1=TofTime1Scatt
  IF Scatt2=0 THEN TofTime2=TofTime2Rec ELSE TofTime2=TofTime2Scatt
  IF D1sig=0 THEN TofTime=TofTime2
```

```
IF D2sig=0 THEN TofTime=TofTime1
IF TofTime2>TofTime1 THEN TofTimeMax=TofTime2 ELSE TofTimeMax=TofTime1
IF D1sig<>0 AND D2sig<>0 THEN TofTime=TofTimeMax
TofTime$=STR$(TofTime)

' IF OutTime1Rec>OutTime2Rec THEN OutTimeRec=OutTime1Rec ELSE OutTimeRec=OutTime2Rec
' IF OutTimeScatt>OutTimeRec THEN OutTime=OutTimeScatt ELSE OutTime=OutTimeRec
' TofTime=1000000&*(InTime+OutTime)

REM Determine DataAcqTime
Nscalers=1:IF D2sig>0 THEN Nscalers=2:IF D3Sig>0 THEN Nscalers=3
DataAcqTime=2*Nscalers*(ChanScan+1):DataAcqTime$=STR$(DataAcqTime)

REM Determine RepTime
IF FreqDD<>0 THEN DataDoneTime=PtsPerScan/FreqDD

RepTime=.001*Gate+DataDoneTime+DataAcqTime
IF TofTime>RepTime THEN RepTime=TofTime
' IF DataAcqTime>RepTime THEN RepTime=DataAcqTime
RepTime$=LEFT$(STR$(RepTime),6)
TofTime1Scatt$=LEFT$(STR$(TofTime1Scatt),6)
TofTime1Rec$=LEFT$(STR$(TofTime1Rec),6)
TofTime2Scatt$=LEFT$(STR$(TofTime2Scatt),6)
TofTime2Rec$=LEFT$(STR$(TofTime2Rec),6)
DataAcqTime$=LEFT$(STR$(DataAcqTime),6)
DataDoneTime$=LEFT$(STR$(DataDoneTime),6)

IF RepTime$<>EDIT$(101) THEN :EDIT FIELD 101, RepTime$, (150,165)-(200,178):EDIT FIELD EdField
IF TofTime1Scatt$<>EDIT$(102) THEN :EDIT FIELD 102, TofTime1Scatt$, (100,210)-(150,223):EDIT FIELD
EdField
IF TofTime1Rec$<>EDIT$(103) THEN :EDIT FIELD 103, TofTime1Rec$, (100,230)-(150,243):EDIT FIELD
EdField
IF TofTime2Scatt$<>EDIT$(104) THEN :EDIT FIELD 104, TofTime2Scatt$, (100,250)-(150,263):EDIT FIELD
EdField
IF TofTime2Rec$<>EDIT$(105) THEN :EDIT FIELD 105, TofTime2Rec$, (100,270)-(150,283):EDIT FIELD
EdField
IF DataAcqTime$<>EDIT$(106) THEN :EDIT FIELD 106, DataAcqTime$, (355,330)-(405,343):EDIT FIELD
EdField
IF DataDoneTime$<>EDIT$(107) THEN :EDIT FIELD 107, DataDoneTime$, (540,145)-(590,158):EDIT FIELD
EdField

GOSUB SetClocks
GOSUB GateSet
IF GPIB=1 THEN
    GOSUB SetDataDone
    IF BeamMode=2 THEN PulseStatus%=1 ELSE PulseStatus%=0
    GOSUB PulseGen
      ScanStart(3,1)=0:ScanStart(3,2)=0:ScanStart(3,3)=0
      ScanEnd(3,1)=PtsPerScan/FreqA:ScanEnd(3,2)=PtsPerScan/FreqA:ScanEnd(3,3)=PtsPerScan/FreqA
    IF But8Win7=2 THEN GOSUB DrissTest
ELSE
    GOSUB MsgWrite
      ScanStart(3,1)=0:ScanStart(3,2)=0:ScanStart(3,3)=0
      ScanEnd(3,1)=PtsPerScan:ScanEnd(3,2)=PtsPerScan:ScanEnd(3,3)=PtsPerScan
END IF
Freq(1)=FreqA
Freq(2)=FreqB
Freq(3)=FreqA
 DeltaBin3(1)=PwidthMicroSec*Freq(1)*PeakShift/2
 DeltaBin3(2)=PwidthMicroSec*Freq(2)*PeakShift/2
 DeltaBin3(3)=PwidthMicroSec*Freq(3)*PeakShift/2
 PointWidth=512/PtsPerScan

Tc1$=EDIT$(18):Tc1=VAL(Tc1$)
```

```
Tc2$=EDIT$(19):Tc2=VAL(Tc2$)
MaxTime3$=EDIT$(20):MaxTime3=VAL(MaxTime3$)
Nscans3$=EDIT$(28):Nscans3=VAL(Nscans3$)
Repeat3Max$=EDIT$(29):Repeat3Max=VAL (Repeat3Max$)

IF Repeat3Max>1 THEN
  BUTTON 70,But70Win7:BUTTON 71,But71Win7:BUTTON 72,But72Win7:REM detector 1
   Cum3D1=But70Win7-1:New3D1=But71Win7-1:Dif3D1=But72Win7-1
  BUTTON 73,But73Win7:BUTTON 74,But74Win7:BUTTON 75,But75Win7:REM detector 2
   Cum3D2=But73Win7-1:New3D2=But74Win7-1:Dif3D2=But75Win7-1
  BUTTON 76,But76Win7:BUTTON 77,But77Win7:BUTTON 78,But78Win7:REM detector 3
   Cum3D3=But76Win7-1:New3D3=But77Win7-1:Dif3D3=But78Win7-1
ELSE
  BUTTON 70,2:BUTTON 71,1:BUTTON 72,1:REM detector 1
  Cum3D1=1:New3D1=0:Dif3D1=0
  BUTTON 73,2:BUTTON 74,1:BUTTON 75,1:REM detector 2
  Cum3D2=1:New3D2=0:Dif3D2=0
  BUTTON 76,2:BUTTON 77,1:BUTTON 78,1:REM detector 3
  Cum3D3=1:New3D3=0:Dif3D3=0
END IF

IF But52Win7+But53Win7+But54Win7>3 THEN
    GOSUB ScrollCheck1:REM MOVETO 250,360:PRINT Index1, Index1Set
    GOSUB ScrollCheck2
    GOSUB ScrollCheck3
    GOSUB ScrollCheck4
    GOSUB ScrollCheck5
    GOSUB ScrollCheck6
    GOSUB ScrollCheck7
END IF
REM Set Scroll DAC Values
     REM Set Wien filter:voltage=0-500, -5 volts programming
       voltage=-Index1/100
      Ochan%=1
      GOSUB Dac2
     REM Set X position, ±1000 volts=±10 v
       voltage=Index2/100
      Ochan%=2
      GOSUB Dac2
     REM Set Y position, ±1000 volts=±10 v
       voltage=Index3/100
      Ochan%=3
      GOSUB Dac2

  IF EdScroll=0 THEN
      IF EdField <> EdOldField THEN EDIT FIELD EdField
      EdOldField=EdField
    ELSE
      SELECT CASE EdScroll
        CASE 1
            REM SetWien - Ochan%=1,voltage=? - gosub Dac2
          EDIT FIELD 21
           Index1=VAL(EDIT$(21)):Index1Set=Index1
           MOVETO 5+xsc1%,20+ysc1%:PRINT Index1
        CASE 2
           REM X position
          EDIT FIELD 22
           Index2=VAL(EDIT$(22)):Index2Set=Index2
           MOVETO 5+xsc2%,20+ysc2%:PRINT Index2
        CASE 3
           REM Y position
          EDIT FIELD 23
           Index3=VAL(EDIT$(23)):Index3Set=Index3
           MOVETO 5+xsc3%,20+ysc3%:PRINT Index3
```

```
CASE 4
  REM X range
  EDIT FIELD 24
   Index4=VAL(EDIT$(24)):Index4Set=Index4
   MOVETO 5+xsc4%,20+ysc4%:PRINT Index4
CASE 5
  REM Y Range
  EDIT FIELD 25
   Index5=VAL(EDIT$(25)):Index5Set=Index5
   MOVETO 5+xsc5%,20+ysc5%:PRINT Index5
CASE 6
  REM Raster Size
  EDIT FIELD 26
   Index6=VAL(EDIT$(26)):Index6Set=Index6
   MOVETO 5+xsc6%,20+ysc6%:PRINT Index6
CASE 7
  REM Dwell Time (msec/pt)
  EDIT FIELD 27
   Index7=VAL(EDIT$(27)):Index7Set=Index7
   MOVETO 5+xsc7%,20+ysc7%:PRINT Index7
CASE ELSE:
END SELECT
END IF
IF EdField <> EdOldField THEN EDIT FIELD EdField
EdOldField=EdField
' IF MenuSel>0 THEN GOSUB MenuCheck
IF MenuSel=31 THEN
  MenuSel=0: WINDOW CLOSE 7:Windo7=0: GOTO StartHere
END IF
IF MenuSel=21 THEN
  MenuSel=0:Leave7=1: FirstPlot3=0
END IF
IF Leave7=0 THEN GOTO ReadWindo7
Leave7=0

REM Setup hardware histogrammer - A=Scaler 1, B=Scaler 2, C=Scaler 3: D=Scaler 4
IF HIST=1 THEN
' BEEP:BEEP:BEEP
REM Set No. of channels/scaler to be transferred
REM Set Scaler #1
  N%=SC1%:N$=CHR$(N%)
  A%=0:A$=CHR$(A%)
  F%=18:F$=CHR$(F%)
  W1%=0:W1$=CHR$(W1%)
  W2%=0:W2$=CHR$(W2%)
  W3%=DataScan-1:W3$=CHR$(W3%)
  GOSUB CamacWrite
REM Set Scaler #2
  N%=SC2%:N$=CHR$(N%)
  GOSUB CamacWrite

REM Set Scaler A segment location in hist memory
  N%=DR%:N$=CHR$(N%)
' IF D1sig>0 THEN
    A%=0:A$=CHR$(A%):REM Scaler order in connector string
    F%=16:F$=CHR$(F%):REM load scaler segment registers
    REM PtsPerScan<8192 // A at 0, B at 4096, otherwise A at 0 & B at 8192
   Astart%=0
    IF PtsPerScan=8192 THEN:Bstart%=8192: W3%=0:W3$=CHR$(W3%):REM Scaler A in lower 8k of block 1
    IF PtsPerScan<8192 THEN:Bstart%=4096:W3%=1:W3$=CHR$(W3%):REM Scaler A in lower 4k of block 1
   W1%=0:W1$=CHR$(W1%)
   W2%=0:W2$=CHR$(W2%)
   GOSUB CamacWrite
' END IF
```

```
'  IF D2sig>0 THEN
     A%=1:A$=CHR$(A%):REM Scaler order in connector string
     F%=16:F$=CHR$(F%):REM load scaler segment registers
     REM PtsPerScan<8192 // A at 0, B at 4096, otherwise A at 0 & B at 8192
     IF PtsPerScan=8192 THEN:Bstart%=8192: W3%=128:W3$=CHR$(W3%):REM Scaler B in upper 8k (block
2)
     IF PtsPerScan<8192 THEN:Bstart%=4096:W3%=9:W3$=CHR$(W3%):REM Scaler B in upper 4k of block 1
    W1%=0:W1$=CHR$(W1%)
    W2%=0:W2$=CHR$(W2%)
    GOSUB CamacWrite
'  END IF

REM Load number of scalers to be set by data router (0-4)
   W1%=0:W1$=CHR$(W1%)
   W2%=0:W2$=CHR$(W2%)
   N%=DR%:N$=CHR$(N%)
   A%=0:A$=CHR$(A%)
   F%=17:F$=CHR$(F%)
   IF D1sig=0 THEN W3%=0:W3$=CHR$(W3%)
   IF D1sig>0 THEN W3%=1:W3$=CHR$(W3%)
   IF D2sig>0 THEN W3%=2:W3$=CHR$(W3%)
   '  W1%=W3%:W1$=CHR$(W1%):REM high byte=low byte
   GOSUB CamacWrite
REM Clear LAM (Emergency procedure)
   F%=18:F$=CHR$(F%)
   GOSUB CamacWrite

REM Initialize Histogram Memory
   N%=Hgram%:N$=CHR$(N%)
   A%=0:A$=CHR$(A%)
   F%=9:F$=CHR$(F%)
   GOSUB CamacWrite
REM Disable address auto increment mode
   F%=17:F$=CHR$(F%)
   GOSUB CamacWrite
END IF

WINDOW CLOSE 7:Windo7=0
GOSUB Go
RETURN
REM -----------------------------------------------------------

SetDefault7:
   Kev0Def$=kev0$
   Mass1Def$=Mass1$
   PWidthDef$=Pwidth$
   MaxMassDef$=MaxMass$
   GtDistDef$=GTDist$
   GTAngDef$=GTAng$
   TDetDist1Def$=TDetDist1$
   GDetAng1Def$=GDetAng1$
   TDetDist2Def$=TDetDist2$
   GDetAng2Def$=GDetAng2$
   LacmDef$=LAcm$
   LbcmDef$=LBcm$
   LccmDef$=LCcm$
   TC1Def$=Tc1$
   TC2Def$=Tc2$
   MaxTime3Def$=MaxTime3$
RETURN
REM -----------------------------------------------------------

UseDefault7:
```

```
keV0$=Kev0Def$
Mass1$=Mass1Def$
Pwidth$=PWidthDef$
MaxMass$=MaxMassDef$
GTDist$=GtDistDef$
GTAng$=GTAngDef$
TDetDist1$=TDetDist1Def$
GDetAng1$=GDetAng1Def$
TDetDist2$=TDetDist2Def$
GDetAng2$=GDetAng2Def$
LAcm$=LacmDef$
LBcm$=LbcmDef$
LCcm$=LccmDef$
Tc1$=TC1Def$
Tc2$=TC2Def$
MaxTime3$=MaxTime3Def$
RETURN
REM ------------------------------------------------------------

WindoRefresh:
SELECT CASE DIALOG(5)
  CASE 1 :RETURN:REM GOSUB InitWindo1
  CASE 2: BEEP:RETURN
  CASE 3: RETURN
  CASE 4: RETURN
  CASE 5: RETURN
  CASE 6: RETURN
  CASE 7: RETURN
  CASE 8: RETURN
  CASE 9: RETURN
  CASE 10: RETURN
  CASE 11 :RETURN
  CASE 12: BEEP:RETURN
  CASE 13: RETURN
  CASE 14: RETURN
  CASE 15: RETURN
  CASE ELSE: BEEP
END SELECT
RETURN
REM ------------------------------------------------------------

REM ******************File Handling**************************

FileError:
'  IF MenuFil=14 OR MenuFil=15 THEN
  Eror=ERR
  IF Eror<>53 THEN
    DIALOG STOP
    MOVETO 300,440
    BEEP
    PRINT "File Error ";Eror
    FOR i=1 TO 10000:NEXT
    DIALOG ON
'    ON ERROR GOTO 0
  END IF
' END IF
RESUME NEXT
REM ------------------------------------------------------------

NewData:
REM Initialize data in memory
RETURN
REM ------------------------------------------------------------
```

```
OpenFil:
BEEP
REM open previous output file
  OpenFil$=FILES$ (1," Open DataFile Name")
  OPEN OpenFil$ FOR INPUT AS #6
   INPUT #6,A$,B$,C$,NptsIn
  FOR i=0 TO NptsIn
      INPUT #6, DataTim1&(1,i),Xval1(1,i),Data1&(1,i)
  NEXT
  CLOSE #6
RETURN
REM ------------------------------------------------------------

CloseFil:
REM close data file
RETURN
REM ------------------------------------------------------------

SavFil:
TEXTFONT 3
TEXTSIZE 9
REM create new output file
IF HeaderFil$="" OR HdrLong=1 THEN
  HeaderFil$=FILES$ (0," New HeaderFile Name")
  IF HeaderFil$<>"" THEN
    OPEN HeaderFil$ FOR OUTPUT AS #1
    NAME HeaderFil$ AS HeaderFil$, "HEDR"
     PRINT #1, "Version=";Version
    CLOSE #1
  END IF
END IF
IF HeaderFil$="" THEN
'  BEEP
'  MOVETO 300,35
'  PRINT "Data File Not Saved"
  RETURN
END IF
NamIndex=0:Length=LEN (HeaderFil$):Hedr$=""
BuildHedr:'   Extract name of header file from HFS path
   Nam$=MID$(HeaderFil$,Length-NamIndex,1):'    check character for ":"
  IF ASC(Nam$)<>58 THEN:NamIndex=NamIndex+1:Hedr$=Nam$+Hedr$:GOTO BuildHedr
  IF LEN(Hedr$)>8 THEN:BEEP:MOVETO 300,440:PRINT "Header File Name Too Long (8 char
max)":HdrLong=1:GOTO SavFil
  HdrLong=0
  DayMo$=MID$(DATE$,1,6)
  yr$=MID$(DATE$,9,2)
  Tim$=STR$(TIMER):Dat$=DayMo$+yr$

FileSuffix$=Tim$+" "+Dat$
  IndexFil$=HeaderFil$+FileSuffix$
 '  DIALOG STOP
  REM File name overwritten by screen refresh
'  MOVETO 300,35:PRINT IndexFil$

ON ERROR GOTO FileError
OPEN IndexFil$ FOR OUTPUT AS #2
'  NAME IndexFil$ AS IndexFil$, "INDX"
PRINT #2,IndexFil$ , "Version=",Version
PRINT #2,"Comment1:";T$;Comment1$
PRINT #2, "Expt1";T$;"Mode";T$;"ScanMin(Xpt%)";T$;"ScanMax(Xpt%)"
PRINT #2, Expt1$;T$;Mode1;T$;ScanMin$(Xpt%);T$;ScanMax$(Xpt%):PRINT #2,""

IF Expt$=Expt1$ THEN
  IF Expt1$="AES" THEN
```

```
        IF Model=1 THEN
          PRINT
#2,"Start";T$;"End";T$;"eV/Step";T$;"mS/Step";T$;"NoScans";T$;"Deriv";T$;"NptAvg";T$;"Display";T$;"
Accumulation"
          PRINT #2,
ScanAStart;T$;ScanAEnd;T$;eVStep;T$;mSecStep(Xpt%);T$;Nscans;T$;Deriv;T$;NptAvg;T$;DispWindo(1,1);T
$;Accum1:PRINT #2,""
        ELSEIF Model=2 OR Model=3 THEN
          PRINT
#2,"No.Mpx";T$;"eV/Step";T$;"mS/Step";T$;"NoCycles";T$;"Deriv";T$;"NptAvg";T$;"Accumulation"
          PRINT #2,
RegionMax(1);T$;eVStep;T$;mSecStep(Xpt%);T$;Ncycles;T$;Deriv;T$;NptAvg;T$;Accum1:PRINT #2,""
            PRINT #2, "Start";T$;"End";T$;"NoScans";T$;"Display"
          FOR i=1 TO RegionMax(1)
              PRINT #2, ScanAStart(i);T$;ScanAEnd(i);T$;EScanno(i);T$;DispWindo(1,i)
          NEXT
          PRINT #2,""
        END IF:'  Model
      END IF
      IF Expt1$="XPS" THEN
        IF Model=1 THEN
          PRINT
#2,"Start";T$;"End";T$;"eV/Step";T$;"mS/Step";T$;"NoScans";T$;"Xphoton";T$;"NptAvg";T$;"Display";T$;"
Accumulation"
          PRINT #2,
ScanAStart;T$;ScanAEnd;T$;eVStep;T$;mSecStep(Xpt%);T$;Nscans;T$;Xphoton;T$;NptAvg;T$;DispWindo(1,
1);T$;Accum1:PRINT #2,""
        ELSEIF Model=2 OR Model=3 THEN
          PRINT
#2,"No.Mpx";T$;"eV/Step";T$;"mS/Step";T$;"NoCycles";T$;"Xphoton";T$;"NptAvg";T$;"Accumulation"
          PRINT #2,
RegionMax(1);T$;eVStep;T$;mSecStep(Xpt%);T$;Ncycles;T$;Xphoton;T$;NptAvg;T;Accum1:PRINT #2,""
            PRINT #2, "Start";T$;"End";T$;"NoScans";T$;"Display"
          FOR i=1 TO RegionMax(1)
              PRINT #2, ScanAStart(i);T$;ScanAEnd(i);T$;EScanno(i);T$;DispWindo(1,i)
          NEXT
          PRINT #2,""
        END IF:'  Model
      END IF
      IF Expt1$="UPS" THEN
        IF Model=1 THEN
          PRINT
#2,"Start";T$;"End";T$;"eV/Step";T$;"mS/Step";T$;"NoScans";T$;"Uphoton";T$;"NptAvg";T$;"Display";T$;"
Accumulation"
          PRINT #2,
ScanAStart$;T$;ScanAEnd$;T$;eVStep$;T$;mSecStep$(Xpt%);T$;Nscans$;T$;Uphoton;T$;NptAvg;T$;DispWi
ndo(1,1);T$;Accum1:PRINT #2,""
        ELSEIF Model=2 OR Model=3 THEN
          PRINT
#2,"No.Mpx";T$;"eV/Step";T$;"mS/Step";T$;"NoCycles";T$;"Uphoton";T$;"NptAvg";T$;"Accumulation"
          PRINT #2,
RegionMax(1);T$;eVStep$;T$;mSecStep$(Xpt%);T$;Ncycles$;T$;Uphoton;T$;NptAvg$;T$;Accum1:PRINT
#2,""
            PRINT #2, "Start";T$;"End";T$;"NoScans";T$;"Display"
          FOR i=1 TO RegionMax(1)
              PRINT #2, ScanAStart(i);T$;ScanAEnd(i);T$;EScanno(i);T$;DispWindo(1,i)
          NEXT
          PRINT #2,""
        END IF:'  Model
      END IF
    END IF

    PRINT #2,"Comment2:";T$;Comment2$
    PRINT #2, "Expt2";T$;"SimMode";T$;"ScanMin(Xpt%)";T$;"ScanMax(Xpt%)"
```

```
PRINT #2,Expt2$;T$;SimMode;T$;SScanMin$(Xpt%);T$;SScanMax$(Xpt%):PRINT #2,""

IF Expt2$<>"" THEN
  IF Mode2=1 THEN
    PRINT
#2,"SimScanStart(Xpt%,rgn%)";T$;"SimScanEnd(Xpt%,rgn%)";T$;"SimDisplayStart";T$;"SimDisplayEnd";T$;
"amu/Step";T$;"mSec/StepSIM";T$;"No.ScansSIM";T$;"NptAvg";T$;"Display Window"
    PRINT #2,
Sscan1$;T$;Sscan2$;T$;SDisp1$;T$;SDisp2$;T$;amuStepSIM$;T$;mSecStepSim$;T$;NscansSim$;T$;DispWi
ndo(2,1):PRINT #2,""
  ELSEIF Mode2=2 OR Mode2=3 THEN
      PRINT #2,"No.Mpx RegionsSim";T$;"amu/Step";T$;"mSec/StepSim";T$;"No. Cycles"
      PRINT #2, RegionMax(2);T$;amuStep$;T$;mSecStepSim$;T$;NCyclesSim$:PRINT #2,""
     PRINT #2, "Scan Start";T$;"Scan End";T$;"No. Scans";T$;"Display Window"
    FOR i=1 TO RegionMax(2)
        PRINT #2, Sscan1(i);T$;Sscan2(i);T$;SScanno(i);T$;DispWindo(2,i)
    NEXT
     PRINT #2,""
  END IF
END IF

PRINT #2,"Comment3:";T$;Comment3$
PRINT #2,
"Expt3";T$;"D1Sig";T$;"D2Sig";T$;"D3Sig";T$;"NoChannels";T$;"FreqA";T$;"FreqB";T$;"RepTime"
PRINT #2,Expt3$;T$;D1sig;T$;D2sig;T$;D3Sig;T$;PtsPerScan;T$;FreqA;T$;FreqB;T$;RepTime:PRINT #2,""
IF Expt3$<>"" THEN

  PRINT
#2,"KeV0";T$;"Mass1";T$;"PulseWidth";T$;"Offset";T$;"TaDrift";T$;"TbDrift";T$;"TcDrift";T$;"Scatt1";T$;"S
catt2";T$;"MaxMass"
  PRINT
#2,keV0;T$;Mass1;T$;VAL(Pwidth$);T$;PWidthOffset;T$;TaD;T$;TbD;T$;TcD;T$;Scatt1;T$;Scatt2;T$;
MaxMass:PRINT #2,""
  GTAng=VAL(GTAng$):GDAng1=VAL(GDAng1$):GDAng2=VAL(GDAng2$)
  PRINT
#2,"GunTgtDist";T$;"AngIncidence";T$;"TgtDet1Dist";T$;"GunDet1Ang";T$;"TgtDet2Dist";T$;"GunDet2Ang"
   PRINT #2,GTDist;T$;GTAng;T$;DetDist1;T$;GDAng1;T$;DetDist2;T$;GDAng2:PRINT #2,""

  PRINT
#2,"TotlCnts1";T$;"TotlCnts2";T$;"MaxTime3";T$;"Nscans3";T$;"Nrepeats";T$;"DriftA";T$;"DriftB";T$;"Drif
tC"
   PRINT #2,Tc1;T$;Tc2;T$;MaxTime3;T$;Nscans3;T$;Repeat3Max;T$;LAcm;T$;LBcm;T$;LCcm:PRINT #2,""

   PRINT #2,"WienMass";T$;"Focus";T$;"Xpos";T$;"Ypos";T$;"Xrange";T$;"Yrange";T$;"DwellTime"
   PRINT #2,"WienMass";T$;"Focus";T$;"Xpos";T$;"Ypos";T$;"Xrange";T$;"Yrange";T$;"DwellTime"
  PRINT #2,""
END IF
CLOSE #2
ON ERROR GOTO 0
  MOVETO 300,35:PRINT IndexFil$
RETURN
REM ------------------------------------------------------------

SavFilAs:
REM rename output file
  HeaderFil$=FILES$ (0," New HeaderFile Name")
  OPEN HeaderFil$ FOR OUTPUT AS #1
  NAME HeaderFil$ AS HeaderFil$, "HEDR"
  CLOSE #1
IF HeaderFil$="" THEN
  BEEP
  MOVETO 300,440
  PRINT "File Not Saved"
  FOR i=1 TO 1000:NEXT
```

```
  RETURN
 END IF
 GOSUB SavFil
 RETURN

 Setup:
 RETURN

 Plot:
 RETURN


 REM ******************Startup Screens************************

 SEXPT:
   Title$="S u r f E x p t"
    WINDOW 1, "",(0,0)-(640,480)
   CALL TEXTMODE (1)
   REM CALL TEXTFONT (20)
   CALL TEXTFONT (21)
   REM CALL TEXTFONT (22)
   colr=0
   FOR Size%=6 TO 117 STEP 4
     CALL TEXTSIZE (Size%)
      MOVETO 10,340-2*Size%
      GOSUB ColorChange
     '  PRINT Title$
      DrawText Title$:PRINT
  NEXT
' WINDOW CLOSE 1
RETURN
REM ------------------------------------------------------------

Credits:
'  WINDOW 1, "",(0,0)-(640,480)
  CLS
  CALL TEXTFONT (21)
  CALL TEXTSIZE (64)
  REM CALL TEXTMODE(1)
  GOSUB Blue
  MOVETO 20, 110:DrawText "S u r f a c e":PRINT
  MOVETO 80,190:DrawText "EXPerimenTs":PRINT
  CALL TEXTSIZE(36)
  MOVETO 130,240
  DrawText "By A. Krauss":PRINT
    MOVETO 170,285:DrawText "G. Lamich":PRINT
  MOVETO 210,330:DrawText "B. Gady":PRINT
  MOVETO 250,375:DrawText "M. Rangaswamy":PRINT
  MOVETO 40,420:DrawText "Argonne National Laboratory":PRINT
  MOVETO 240, 460:PRINT "1990";
' WINDOW CLOSE 1
RETURN
REM ------------------------------------------------------------

ColorChange:
colr=colr+1
SELECT CASE colr
   CASE 1:GOSUB Red
   CASE 2:GOSUB Blue
   CASE 3:GOSUB Green
   CASE 4:GOSUB Yellow
   CASE 5:GOSUB Magenta
   CASE 6:GOSUB Cyan
   CASE ELSE:colr=1:GOSUB Red
```

```
END SELECT
RETURN
REM ---------------------------------------------------------------

Red:
col%=205:CALL ForeColor (col%)
col&=205
'   ToolBox "P",TrapNo%,(col&)
RETURN

Blue:
col%=409:CALL ForeColor (col%)
col&=409
'   ToolBox "P",TrapNo%,(col&)
RETURN

Green:
col%=341:CALL ForeColor (col%)
col&=341
'   ToolBox "P",TrapNo%,(col&)
RETURN

Yellow:
col%=69:CALL ForeColor (col%)
col&=69
'   ToolBox "P",TrapNo%,(col&)
RETURN

Magenta:
col%=137:CALL ForeColor (col%)
col&=137
'   ToolBox "P",TrapNo%,(col&)
RETURN

Cyan:
col%=273:CALL ForeColor (col%)
col&=273
'   ToolBox "P",TrapNo%,(col&)
RETURN

Black:
col%=33:CALL ForeColor (col%)
col&=33
'   ToolBox "P",TrapNo%,(col&)
RETURN

White:
col%=30:CALL ForeColor (col%)
col&=30
'   ToolBox "P",TrapNo%,(col&)
RETURN

REM ****************Software Initialization ******************

Initvars:
REM Establish color codes
  Black%=33
  White%=30
  Red%=205
  Green%=341
  Blue%=409
  Cyan%=273
  Magenta%=137
  Yellow%=69
```

```
ROIS=0:REM regions of interest off
REM Define Camac configuration
DGG%=1:REM Dual gate generator
SCU%=4:REM Scaler control unit
SC1%=5:REM Scaler 1
SC2%=7:REM Scaler 2
SC3%=9:REM Scaler 3
SC4%=11:REM Scaler 4
DR%=14:REM Data router
Hgram%=15:REM Histogram memory
REM Initialize variables
FirstRead21=0:FirstRead22=0
First11=0:First12=0:First13=0:First14=0:First15=0:'   define scan ranges for different expts
pat%(0)=32767:pat%(1)=32767:pat%(2)=32767:pat%(3)=32767
pab%(0)=0:pab%(1)=0:pab%(2)=0:pab%(3)=0
Index1Set=150:Index2Set=0:Index3Set=0:Index4Set=100
Index5Set=100:Index6Set=100:Index7Set=200:EdScroll=0
WienVoltDef=Index1Set:'         0-300  volts
FocusVoltDef=Index2Set:'        0-10 keV
XPosDef=Index3Set:'   -1000 to + 1000 volts
YPosDef=Index4Set:'   -1000 to + 1000 volts
XRangeDef=Index5Set:'           0-1024  points
YRangeDef=Index6Set:'           0-1024  points
msptDef=Index7Set:'   Dwell Time (mSec/point)
T$=CHR$(9)
AlAnode=1486.6:MgAnode=1253.6:HeI=21.2:HeII=40.2

AlAnode=1479:REM empirical

D1sig=1:D2sig=0
DataDisplay=0
New3D1=0:New3D2=0
Cum3D1=1:Cum3D2=1
DataScan=1:ChanScan=0
DeltaScroll=1
Gain%=1:Gain=Gain%
Vconv=4096
InputRange=10
VoltConv=InputRange/(Vconv*Gain)
PulseInput1=1:PulseInput2=1
IF (SYSTEM(1)=4 OR SYSTEM(1)=5) THEN:
HIST=1:GPIB=1:Datain=1:But10Win1=2:But11Win1=2:But12Win1=2:REM Mac IIx
IF SYSTEM(1)=9 THEN: HIST=0:GPIB=0:Datain=1:But10Win1=1:But11Win1=1:But12Win1=2:REM Mac
IIci
IF SYSTEM(1)=16 THEN: HIST=0:GPIB=0:Datain=0:But10Win1=1:But11Win1=1:But12Win1=1:REM Mac
IIsi
MenuState41=1
ColorTop(1)=0
PlotRect1%(0)=297:PlotRect1%(1)=320:PlotRect1%(0)=310:PlotRect1%(0)=340
PlotRect2%(0)=317:PlotRect2%(1)=320:PlotRect2%(0)=330:PlotRect2%(0)=340
PlotRect3%(0)=337:PlotRect3%(1)=320:PlotRect3%(0)=350:PlotRect3%(0)=340
PlotRect4%(0)=357:PlotRect4%(1)=320:PlotRect4%(0)=370:PlotRect4%(0)=340

MaxVal(0)=0:MaxVal(1)=10:MaxVal(2)=20:MaxVal(3)=50:MaxVal(4)=100:MaxVal(5)=200
MaxVal(6)=500:MaxVal(7)=1000:MaxVal(8)=2000:MaxVal(9)=5000:MaxVal(10)=10000!
MaxVal(11)=20000!:MaxVal(12)=50000!:MaxVal(13)=100000!:MaxVal(14)=200000!:MaxVal(15)=500000!
MaxVal(16)=1000000!:MaxVal(17)=2000000!:MaxVal(18)=5000000!:MaxVal(19)=1E+07:MaxVal(20)=2E+07
MaxVal(21)=5E+07:MaxVal(22)=1E+08
FOR i=0 TO 22:MinVal(i)=-MaxVal(i):NEXT
FOR i=0 TO 4:MaxIndex(i)=1:NEXT
Grp1Expt=0:Grp2Expt=0:Grp3Expt6=0:Grp3Expt7=0:Grp4Expt=0
But1Win1=1:But2Win1=1:But3Win1=1:But4Win1=1:But5Win1=1:But6Win1=1:But7Win1=1:But8Win1=1
But9Win1=0
But1Win2=1:But2Win2=1:But3Win2=1:But4Win2=1:But5Win2=1
```

```
But1Win3=1:But2Win3=1:But3Win3=1:But4Win3=1:But5Win3=2:But6Win3=1:But7Win3=1
But8Win3=2:But10Win3=2:But11Win3=1

But1Win4=2:But2Win4=1:But3Win4=1:But4Win4=1:But5Win4=1:But6Win4=1:But7Win4=1:But8Win4=1:But
9Win4=1:But10Win4=1:But11Win4=1
But12Win4=1:But13Win4=1:But14Win4=1:But15Win4=1:But16Win4=1:But17Win4=1:But18Win4=1:But19W
in4=1:But20Win4=1:But21Win4=1:But22Win4=1
But23Win4=1:But24Win4=1:But25Win4=1:But26Win4=1:But27Win4=1:But28Win4=1:But29Win4=1:But30W
in4=1:But31Win4=1:But32Win4=1:But33Win4=1
But34Win4=1:But35Win4=1:But36Win4=1:But37Win4=1:But38Win4=1:But39Win4=1:But40Win4=1:But41W
in4=1:But42Win4=1

But1Win7=2:But2Win7=1:But3Win7=1:But4Win7=2:But5Win7=1:But6Win7=1:But7Win7=1:But8Win7=1:But
9Win7=2
But10Win7=1:But11Win7=1:But12Win7=1:But13Win7=1:But14Win7=2:But15Win7=1:But16Win7=1:But17W
in7=1:But18Win7=1
But19Win7=1:But20Win7=1:But21Win7=1:But22Win7=1:But23Win7=2:But24Win7=1:But25Win7=1:But26W
in7=1:But27Win7=1
But28Win7=1:But29Win7=1:But30Win7=1:But31Win7=1:But32Win7=1:But33Win7=1:But34Win7=1:But35W
in7=1:But36Win7=1
But37Win7=1:But38Win7=1:But39Win7=1:But40Win7=1:But41Win7=1:But42Win7=1:But43Win7=1:But44W
in7=1:But45Win7=1:But46Win7=1
But52Win7=1:But53Win7=1:But54Win7=2:But55Win7=2:But56Win7=1:But57Win7=1:But58Win7=1
But59Win7=1:Scatt1=1:Scatt2=0
But70Win7=2:But71Win7=1:But72Win7=1:Cum3D1=1:New3D1=1:Dif3D1=1
But73Win7=2:But74Win7=1:But75Win7=1:Cum3D2=1:New3D2=1:Dif3D2=1
But76Win7=2:But77Win7=1:But78Win7=1:Cum3D3=1:New3D3=1:Dif3D3=1
But89Win7=1:But90Win7=1:But91Win7=1

Ready5Win2=0
Windo=1
Windo1=0:Windo2=0:Windo3=0:Windo4=0:windo5=0:Windo6=0:Windo7=0
MenuSel=0
Leave1=0:Leave2=0:Leave3=0:Leave4=0:Leave5=0:Leave6=0:Leave7=0:Leave8=0:Leave7=0:Leave10=0:
SurvAcqTim%(0)=135:SurvAcqTim%(1)=425:SurvAcqTim%(2)=155:SurvAcqTim%(3)=475
SurvScanTim%(0)=255 :SurvScanTim%(1)=75 :SurvScanTim%(2)=270 :SurvScanTim%(3)=125
REM Scan setup Window 2
   Comment$="":REM Comment$=comment field
   ScanMin$(1)="0":ScanMin(1)=0:REM lowest scanable value
   ScanMax$(1)="1000":ScanMax(1)=1000: REM highest scanable value
   ScanMin$(2)="0":ScanMin(2)=0:REM lowest scanable value
   ScanMax$(2)="150":ScanMax(2)=150: REM highest scanable value

REM Survey Window 3
'  Scan1$="0":Scan1=0:REM Start of Survey Scan
'  Scan2$="1000":Scan2=1000:REM End of Survey Scan
'  Disp1$="0":Disp1=0:REM Start of displayed region of survey scan
'  Disp2$="1000":Disp2=1000:REM End of displayed region of survey scan
   SetAmin=0:SetXmin=0:SetUmin=0:SetMMin=0:SetEMin=0
   SetAmax=0:SetXmax=0:SetUmax=0:SetMMax=0:SetEMax=0
   ScanAMin$="0":ScanXMin$="1000":ScanUMin$="100":ScanMMin$="0":ScanEMin$="0"
   ScanAMax$="1000":ScanXMax$="0":ScanUMax$="0":ScanMMax$="150":ScanEMax$="150"
   ScanAStart$="0":ScanXstart$="1000":ScanUStart$="100":ScanMStart$="0":ScanEStart$="0"
   ScanAEnd$="1000":ScanXend$="0":ScanUEnd$="0":ScanMEnd$="150":ScanEEnd$="150"
   Scan1=VAL(Scan1$):Scan2=VAL(Scan2$)
FOR i=1 TO 2
   mSecStep$(i)="500":REM Dwell time/step
   mSecStep(i)=VAL(mSecStep$(i)):SecStep(i)=mSecStep(i)/1000
   StepSize$(i)="0.5":REM eV/step  Survey energy resolution
   StepSize(i)=VAL(eVStepSize$(i))
   IF StepSize(i)>0 THEN SurvScanTim=(Scan2-Scan1)*SecStep(i)/StepSize(i):REM Seconds/Scan
NEXT
   Nscans$="1":Nscans=VAL(Nscans$):REM No. of scans
   NoAesScans=1
```

```
Nscans3$="1":Nscans3=1
SurvAcqTim=SurvScanTim*Nscans:REM Data Acquisition time
SurvMin=INT(SurvAcqTim/60):SurvSec=INT (SurvAcqTim-60*SurvMin)
SurvAcqTim$=STR$(SurvMin)+":"+STR$(SurvSec):REM acquisition in min:sec
NptAvg$="7":REM n point differentiation
REM AES Multiplex Window 4
RegionMax(1)=1
SecScan=0
FOR rgn%=1 TO 10
ScanAStart(rgn%)=(rgn%-1)*100:ScanAEnd(rgn%)=rgn%*100
Acycleno(rgn%)=0
NEXT
Acycleno(1)=1
NoMpxScans=1
AESAcqTim=0
REM AES Depth Profile Window 5

REM DRISS Window 7
PWidthOffset=300:REM adjustment to pulse width in nanoseconds
Dely%=0
PtsPerScan=512
Nscans3=1
Kev0Def$="10"
Mass1Def$="40"
PWidthDef$="50"
MaxMassDef$="150"
GtDistDef$="143.3"
GTAngDef$="0"
TDetDist1Def$="66.8"
GDetAng1Def$="165"
TDetDist2Def$="50"
GDetAng2Def$="22"
LacmDef$="16.797"
LbcmDef$="18.215"
LccmDef$="16.797"
TC1Def$=""
TC2Def$=""
MaxTime3Def$=""
Repeat3Max$="1"
PeakShift=0:But61Win7=2:But62Win7=1:But63Win7=1
GOSUB UseDefault7

REM Data Window 15
FOR rgn%= 0 TO 10
End1(rgn%)=1000
End2(rgn%)=1000
FOR i=1 TO 4
CntMax(i)=10
CntMin(i)=0
NEXT
NEXT
Xpt%=0
RETURN
REM -----------------------------------------------------------

InitMenus:
ON DIALOG GOSUB DialogHandler:DIALOG ON
MENU 1,0,1,"File"
MENU 1,1,1,"New Data" :cmdkey 1,1,"N"
MENU 1,2,1,"Open..." :cmdkey 1,2,"O"
MENU 1,3,1,"Close" :cmdkey 1,3,"W"
MENU 1,4,1,"Save" :cmdkey 1,4,"S"
MENU 1,5,1,"Save As..."
MENU 1,6,1,"Print"
```

```
MENU 1,7,1,"Plot"
MENU 1,8,1,"Transfer..." :cmdkey 1,8,"T"
MENU 1,9,1,"Quit" :cmdkey 1,9,"Q"
MENU 2,0,1,"Scan"
MENU 2,1,1,"Go" :cmdkey 2,1,"G"
MENU 2,2,1,"Manual" :cmdkey 2,2,"M"
MENU 2,3,1,"Pause" :cmdkey 2,3,"P"
MENU 2,4,1,"Continuous" :cmdkey 2,4,"K"
MENU 2,5,1,"Last Scan" :cmdkey 2,5,"L"
MENU 2,6,1,"Reset Scan" :cmdkey 2,6,"R"
MENU 2,7,1,"End & Save" :cmdkey 2,7,"E"
MENU 2,8,1,"Abort Scan" :cmdkey 2,8,"A"
MENU 3,0,1,"Windows"
MENU 3,1,1,"Select Experiments"
MENU 3,2,1,"Auger Mode Select"
MENU 3,3,1,"Auger Survey"
MENU 3,4,1,"Auger MPX"
MENU 3,5,1,"Auger Profile"
'
MENU 3,6,1,"XPS Mode Select"
MENU 3,7,1,"XPS Survey"
MENU 3,8,1,"XPS MPX"
MENU 3,9,1,"XPS Profile"
'
MENU 3,10,1,"UPS Survey"
MENU 3,11,1,"UPS Profile"
MENU 3,12,1,"SIMS Mode Select"
MENU 3,13,1,"SIMS Survey"
MENU 3,14,1,"SIMS MPX"
MENU 3,15,1,"SIMS Profile"
MENU 3,16,1,"DRISS"
MENU 4,0,1,"Analysis"
MenuState41=1
MENU 4,1,MenuState41,"Cursor" :REM cmdkey 4,1,"K"
MenuState42=1
MENU 4,2,MenuState42,"View ROI" :REM cmdkey 4,2,"K"
MenuState43=1
MENU 4,3,MenuState43,"Add ROI" :REM cmdkey 4,3,"K"
MenuState44=1
MENU 4,4,MenuState44,"Alter ROI" :REM cmdkey 4,2,"K"

ON MENU GOSUB MenuHandler:MENU ON
RETURN

REM ****************Hardware Initialization Routines**************
MIO16Setup:
AICONFIG%=&H20
AIREAD%=&H21
AOCONFIG%=&H10
AoWrite%=&H11
AOUPDATE%=&H112
AOVSCALE%=&H13
DigOutPort%=&H30
DigOutLine%=&H31
DigPrtConfig%=&H34
DAQCLEAR% =&H43
DAQSCALE% =&H44
SCANSETUP% =&H45
ScanStart%(Xpt%,rgn%) = &H46
SCANCHECK% =&H47
BD2%=2
BD3%=3
IF SYSTEM(1)=9 THEN:BD2%=4:BD3%=5:'  Mac IIci
DacScale11=4095
```

```
 DacScale101=DacScale11/10
 DacScale21=2048
 DacScale12=2047
 DacScale102=DacScale12/10
 DacScale22=0
 inputmode%=0:REM  input single ended/differential
 InputRange%=10:REM 10V or 20 V range
 Polarity%=1: REM input unipolar or bipolar
 Eror%=0:Eror&=0
 'Set up counter
 ctr1%=1
 ctr2%=2
 ctr5%=5
 overflow%=0
 TimeBase1%=6
 TimeBase2%=6
 TimeBase5%=4
 Count&=0
 Counts&=0
 cnt%=0
 edge.mode%=0
 gate.mode%=0
 out.type%=0
 out.polarity%=0
   Iderror&=0
     CALL CTR.Config (BD2%,Iderror&,ctr1%,edge.mode%,gate.mode%,out.type%,out.polarity%)
   Iderror&=0
     CALL CTR.Config (BD2%,Iderror&,ctr2%,edge.mode%,gate.mode%,out.type%,out.polarity%)
   Iderror&=0
     CALL CTR.Config (BD2%,Iderror&,ctr5%,edge.mode%,gate.mode%,out.type%,out.polarity%)
RETURN
REM -----------------------------------------------------------------

DMA8Setup:
  IF GPIB=0 THEN RETURN
  REM initialize GPIB
  CALL ibcac(BD4%,0)
  GPIBerr=0
  '  BEEP
  MOVETO 20,430:PRINT "Testing GPIB"
REM DMA8 Code Here*************************
  DevName$="dev16"
  Camac%=0
  CALL IBFIND%(DevName$,Camac%)
  IF ibsta%<0 THEN:BEEP:MOVETO 20,430:PRINT "Device Find Err: ";ibsta%,iberr%,Camac%:GPIBerr=iberr%
  CALL  IBCLR%(Camac%):REM clear Device
  IF ibsta%<0 THEN:BEEP:MOVETO 20,430:PRINT "Device Clear Err: ";ibsta%,iberr%:GPIBerr=iberr%

REM Exercise DMA8 to check operation
REM clear all gpib devices
CMD$=CHR$(&H14)

REM Read CSR
REM first send NAF to  CSR
  N%=30
  A%=0
  F%=1
  N$=CHR$(N%)
  A$=CHR$(A%)
  F$=CHR$(F%)
  NAF$=N$+A$+F$
  Wrt$=NAF$
  CALL IBWRT(Camac%,Wrt$):REM lights listen LED
```

```
  IF ibsta%<0 THEN:BEEP:MOVETO 20,430:PRINT "Write CSR ready error:
";HEX$(ibsta%),iberr%:GPIBerr=iberr%
  FOR i=1 TO 2000:NEXT
  RD$=SPACE$(3)
  CALL IBRD(Camac%,RD$)
  IF ibsta%<0 THEN:BEEP:MOVETO 20,430:PRINT "Read CSR error: ";HEX$(ibsta%),iberr%:GPIBerr=iberr%
  REM PRINT "CSR1= ";ASC(LEFT$(RD$,1)),LEN(RD$)
  REM PRINT "CSR2= ";ASC(MID$(RD$,2,1))
  REM PRINT "CSR3= ";ASC(RIGHT$(RD$,1)):REM=56 if on, subt 32 to turn off

ClearCSRLoop:
REM Now clear CSR inhibit (bit 6)
  N%=30
  A%=0
  F%=17
  N$=CHR$(N%)
  A$=CHR$(A%)
  F$=CHR$(F%)
  NAF$=N$+A$+F$
  W1%=0
  W2%=0
  '  W3%=56-32:rem turn bit 6 off only
  W3%=0:REM turn off all bits gives desired status
  W1$=CHR$(W1%)
  W2$=CHR$(W2%)
  W3$=CHR$(W3%)
  W$=W1$+W2$+W3$
  Wrt$=NAF$+W$
  REM Wrt$=N$+A$+F$+W1$+W2$+W3$
  CALL IBWRT(Camac%,Wrt$)
  IF ibsta%<0 THEN:BEEP:MOVETO 20,430:PRINT "Write CSR ready error:
";HEX$(ibsta%),iberr%:GPIBerr=iberr%

REM Read LAM Register
REM first send NAF to  LAM reg
'  N%=30
'  A%=12
'  F%=1
'  N$=CHR$(N%)
'  A$=CHR$(A%)
'  F$=CHR$(F%)
'  NAF$=N$+A$+F$
'  Wrt$=NAF$
'  CALL IBWRT(Camac%,Wrt$):REM lights listen LED
'  IF ibsta%<0 THEN:BEEP:MOVETO 20,430:PRINT "Write LAM ready error:
";HEX$(ibsta%),iberr%:GPIBerr=iberr%
'  REM FOR i=1 TO 2000:NEXT
'  RD$=SPACE$(3)
'  CALL IBRD(Camac%,RD$)
'  IF ibsta%<0 THEN:BEEP:MOVETO 20,430:PRINT "Read CSR error: ";HEX$(ibsta%),iberr%:GPIBerr=iberr%
'  REM PRINT "LAM1= ";ASC(LEFT$(RD$,1)),LEN(RD$)
'  REM PRINT "LAM2= ";ASC(MID$(RD$,2,1))
'  REM PRINT "LAM3= ";ASC(RIGHT$(RD$,1)):REM=56 if on, subt 32 to turn off

HistLoop:
  N%=Hgram%
  A%=0
  F%=11
  N$=CHR$(N%)
  A$=CHR$(A%)
  F$=CHR$(F%)
  NAF$=N$+A$+F$
  Wrt$=NAF$
  '  CALL IBWRT(Camac%,Wrt$)
```

```
  IF ibsta%<0 THEN:BEEP:MOVETO 20,430:PRINT "Write HistSet error:
";HEX$(ibsta%),iberr%:GPIBerr=iberr%
REM diagnostic ****
  REM Disable front panel histogram port
    F%=19:F$=CHR$(F%)
    GOSUB CamacWrite
REM diagnostic ****

' GOTO EndDMA8Setup

'genloop:
  REM set Pulse Generator off
  REM A=3, F=26=pulse gen on
  REM A=3, F=24=pulse gen off
  REM A=2 F=24 sets beam dc
  REM A=2 F=26 sets beam deflect
  N%=SCU%
  A%=3
  F%=24
  N$=CHR$(N%)
  A$=CHR$(A%)
  F$=CHR$(F%)
  NAF$=N$+A$+F$
  Wrt$=NAF$
  CALL IBWRT(Camac%,Wrt$)
  IF ibsta%<0 THEN:BEEP:MOVETO 20,430:PRINT "Write CSR ready error:
";HEX$(ibsta%),iberr%:GPIBerr=iberr%
'  REM FOR i=1 TO 20000:NEXT
'EndDMA8Setup:
  IF GPIBerr=0 THEN
    REM Msg$="GPIB OK":GOSUB ErrMsg
    MOVETO 20,450:PRINT "                              "
    MOVETO 500,430:PRINT "GPIB OK                     "
  ELSE
    MOVETO 500,430:PRINT "GPIB Error ";GPIBerr
  END IF
RETURN

REM $include "Scrolls2"

REM *********** Execution Transfer Subroutines ******************

Go:
  IF Expt1$="" AND Expt2$="" AND Expt3$="" THEN RETURN
  DIALOG OFF
  WINDOW CLOSE Windo
  Windo=15
  GOSUB SavFil
  GOSUB InitWindo15

'  MOVETO 300,35
'  IF HeaderFil$="" THEN
'    BEEP
'    PRINT "Data File Not Saved"
'    ELSE PRINT IndexFil$
'  END IF

  ' GOSUB SavFil
  DIALOG ON
  Nscan1=1:Nscan2=1:Nscan3=1
GoAgain:
  ' Menusel=0
  IF Expt1$<>"" THEN
```

```
      IF HeaderFil$<>"" THEN:Mode1$=RIGHT$(STR$(Mode1),1):
Data1$=HeaderFil$+Expt1$+Mode1$+FileSuffix$

       IF Mode1=1 THEN: GOSUB Survey
       IF Mode1=2 THEN GOSUB MPX
       IF Mode1=3 THEN GOSUB Profil

   END IF
   IF Expt2$<>"" AND Nscan2<=Nscans2 THEN
      IF HeaderFil$<>"" THEN:Mode2$=RIGHT$(STR$(Mode2),1):
Data2$=HeaderFil$+Expt2$+Mode2$+FileSuffix$
      IF Expt2$="SIM" THEN
        IF Mode2=1 THEN GOSUB Survey
        IF Mode2=2 THEN GOSUB SIMMPX
        IF Mode2=3 THEN GOSUB SIMProfil
      END IF
      IF Expt2$="IEA" THEN
        IF Mode2=1 THEN GOSUB Survey
        IF Mode2=2 THEN GOSUB IEAMPX
        IF Mode2=3 THEN GOSUB IEAProfil
      END IF
   END IF
   '  MOVETO 5,360:PRINT Nscan3,Nscans3:BEEP
   '  IF Expt3$<>"" AND Nscan3<=Nscans3 THEN
      IF Expt3$<>"" THEN
      IF HeaderFil$<>"" THEN
        Mode3$=RIGHT$(STR$(Mode3),1)
         Data3$=HeaderFil$+Expt3$+Mode3$+FileSuffix$
      END IF
      GOSUB Driss
   END IF
'     WHILE MenuState41=2
'     GOSUB Cursor
'     WEND
   IF MenuSel=31 OR Leavego=1 THEN: MenuSel=0: Leavego=0:GOTO StartHere
   IF MenuSel>0 THEN GOSUB MenuCheck
   'IF NScan1>=NScans1 AND NScan2>=NScans2 AND Nscan3>=Nscans3 THEN:BEEP:RETURN
   IF Expt1$="" OR  Nscan1>Nscans1 THEN Gone1=1
   IF Expt2$="" OR  Nscan2>Nscans2 THEN Gone2=1
   IF Expt3$="" OR  Nscan3>Nscans3 THEN Gone3=1
   Gone=Gone1+Gone2+Gone3
REM ***temporary
   GoLoop:
      IF MenuSel>0 THEN GOSUB MenuCheck

        IF  MenuState41=2 OR ROIS>0 THEN
          WHILE MOUSE(0) <0
            GOSUB Cursor
          WEND
        ELSE
        PENMODE 10
          IF ROIS=0 THEN
            IF FirstXCrsr=1 THEN  MOVETO mousxOld%,Y0C%:LINETO mousxOld%,Y0C%+400:FirstXCrsr=0:'
Erase old Xcursor if it exists
            IF FirstYCrsr=1 THEN  MOVETO X0C%,mousyOld%:LINETO X0C%+500,mousyOld%:FirstYCrsr=0:'
Erase old Ycursor if it exists
          END IF
          SHOWCURSOR
        END IF


      'IF MOUSE(0)<>0 THEN
'        WHILE MenuState41=2
        'Mous0=MOUSE(0)
```

```
      IF MOUSE(0)<>0 THEN GOSUB cursor
'     WEND
    'END IF
  GOTO GoLoop
  IF Gone>=3 THEN:Gone1=0:Gone2=0:Gone3=0:RETURN
  IF Leavego=0 THEN GOTO GoAgain
  Leavego=0
'  BEEP:BEEP
RETURN

REM *******************Data Acquisition Routines ****************

ADC:
Reading%=0:Eror%=0
CALL AI.Read(BD2%,Eror&,Ichan%,Gain%,Reading%)
'   InVoltage=Reading%*VoltConv
RETURN
REM -------------------------------------------------------------

CamacWrite:
NAF$=N$+A$+F$
Wrt$=NAF$+W1$+W2$+W3$
IF GPIB<>0 THEN CALL IBWRT(Camac%,Wrt$)
  IF ibsta%<0 THEN
    BEEP:MOVETO 20,450
     PRINT " Camac Write Error:  count= ";ibcnt&,"Status ";HEX$(ibsta%),"Error No. ";iberr%
    GPIBerr=iberr%
  END IF
RETURN
REM -------------------------------------------------------------

Dac:
REM subroutine to provide analog output on channel 0 or 1 (Ochan%) of MIO-16 board
REM Ochan%=output channel: voltage=output value
IF voltage>10! THEN: BEEP:BEEP:voltage=10!
IF voltage<0 THEN:BEEP:BEEP:voltage=0
DacVal1=voltage*DacScale101-DacScale21:DacVal1%=DacVal1
CALL Ao.Write (BD2%,Eror&,Ochan%,DacVal1%)
RETURN
REM -------------------------------------------------------------

Dac2:
REM subroutine to provide analog output on NB-AO6 board
REM Ochan%=output channel: voltage=output value
IF voltage>10! THEN: BEEP:BEEP:voltage=10!
IF voltage<-10 THEN:BEEP:BEEP:voltage=-10
dacval2=voltage*DacScale102-DacScale22:dacval2%=dacval2
'   dacval2%=1024
CALL Ao.Write (BD3%,Eror&,Ochan%,dacval2%)
RETURN
REM -------------------------------------------------------------

DelayScaler:
REM Diagnostic delay loop for reading 5891 scalers
ScalerDelay=10
FOR i=1 TO ScalerDelay:NEXT
RETURN
REM -------------------------------------------------------------

Driss:
  Xpt%=3
  WINDOW CLOSE 7
REM initialize histogram if used
REM Reset module, zero all memory contents & set auto increment mode
```

```
IF HIST=1 THEN
   REM Disable front panel histogram port
     N%=Hgram%:N$=CHR$(N%)
     A%=0:A$=CHR$(A%)
     F%=19:F$=CHR$(F%)
     GOSUB CamacWrite
    REM Reset histogram & set auto increment mode
     N%=Hgram%:N$=CHR$(N%)
     A%=0:A$=CHR$(A%)
     F%=9:F$=CHR$(F%)
     GOSUB CamacWrite
   REM Enable LAM (F=25)
     F%=25:F$=CHR$(F%)
     GOSUB CamacWrite
END IF

REM initialize data arrays
  FOR rgn%=1 TO 4
     Dwindo%=DispWindo(Xpt%,rgn%)
     Xpt(Dwindo%)=Xpt%
     rgn(Dwindo%)=rgn%
     CntMax(Dwindo%)=10
     CntMin(Dwindo%)=0
     FOR bin=0 TO 8192
        Data3&(rgn%,bin)=0
        Data3Cum&(rgn%,bin)=0
    NEXT
  NEXT

IF HIST=1 THEN
   REM reset LAM (F=10)
     N%=Hgram%:N$=CHR$(N%)
     A%=0:A$=CHR$(A%)
     F%=10:F$=CHR$(F%)
     GOSUB CamacWrite
   REM Disable auto increment
     N%=Hgram%:N$=CHR$(N%)
     A%=0:A$=CHR$(A%)
     F%=17:F$=CHR$(F%)
     GOSUB CamacWrite
   REM Enable front panel histogram port
     N%=Hgram%:N$=CHR$(N%)
     A%=0:A$=CHR$(A%)
     F%=11:F$=CHR$(F%)
     GOSUB CamacWrite
END IF
' ****************
    Data3$=HeaderFil$+Expt3$+"00"+FileSuffix$
    Manual3=0:MENU 2,2,0
    Pause3=0:MENU 2,3,1
    Continue3=0:MENU 2,4,1
    LastScan3=0:MENU 2,5,1
    Reset3=0:MENU 2,6,1
    EndScan3=0:MENU 2,7,1
    Abort3=0:MENU 2,8,1
    FirstPlot3=0
    Setup3=0
    Leave15=0
    Repeat3=1
    Fetch3=0
' ****************
     ScanStart(3,1)=0:ScanStart(3,2)=0:ScanStart(3,3)=0
     ScanEnd(3,1)=PtsPerScan:ScanEnd(3,2)=PtsPerScan:ScanEnd(3,3)=PtsPerScan
```

```
DrissRepeat:
REM initialize histogram if used
REM Reset module, zero all memory contents & set auto increment mode
IF HIST=1 THEN
   REM Disable front panel histogram port
     N%=Hgram%:N$=CHR$(N%)
     A%=0:A$=CHR$(A%)
     F%=19:F$=CHR$(F%)
     GOSUB CamacWrite
   REM Reset histogram & set auto increment mode
     N%=Hgram%:N$=CHR$(N%)
     A%=0:A$=CHR$(A%)
     F%=9:F$=CHR$(F%)
     GOSUB CamacWrite
   REM Enable LAM (F=25)
     F%=25:F$=CHR$(F%)
     GOSUB CamacWrite
END IF
REM initialize data arrays
  FOR rgn%=1 TO 4
'     Dwindo%=DispWindo(Xpt%,rgn%)
'     Xpt(Dwindo%)=Xpt%
'     rgn(Dwindo%)=rgn%
'     CntMax(Dwindo%)=10
'     CntMin(Dwindo%)=0
     FOR bin=0 TO 8192
        Data3&(rgn%,bin)=0
     NEXT
     Data3Max&(rgn%)=10
  NEXT
IF HIST=1 THEN
   REM reset LAM (F=10)
     N%=Hgram%:N$=CHR$(N%)
     A%=0:A$=CHR$(A%)
     F%=10:F$=CHR$(F%)
     GOSUB CamacWrite
   REM Disable auto increment
     N%=Hgram%:N$=CHR$(N%)
     A%=0:A$=CHR$(A%)
     F%=17:F$=CHR$(F%)
     GOSUB CamacWrite
   REM Enable front panel histogram port
     N%=Hgram%:N$=CHR$(N%)
     A%=0:A$=CHR$(A%)
     F%=11:F$=CHR$(F%)
     GOSUB CamacWrite
END IF

   REM Beam pulsing initially on/off
  IF HIST=0 THEN PulseStatus%=0 ELSE PulseStatus%=1
  GOSUB PulseGen
'  Data3Max&(rgn%)=10

  IF Repeat3Max>1 THEN
     SeqData3$=HeaderFil$+Expt3$+RIGHT$(STR$(Repeat3),1)+FileSuffix$
  ELSE
     SeqData3$=HeaderFil$+Expt3$+"00"+FileSuffix$
  END IF

  Nscan3=1
  MENU 4,0,0
  MOVETO 5,340:PRINT "Scanning"
  MOVETO 5,360:PRINT "Scan ";Nscan3
  MOVETO 5,380 :PRINT "LastScan=";Nscans3
```

```
  IF Repeat3Max>1 THEN
     MOVETO 5,400:PRINT "Cycle#";Repeat3
     MOVETO 5,420:PRINT"Last Cycle";Repeat3Max
  END IF
  StartTimer!=TIMER
  TEXTSIZE 9

DrissStep:
PENMODE 8
SHOWCURSOR
REM Redraw Block1:
  X1%=100:Y1%=39
   SetRect Rect1%(0),X1%,Y1%,X1%+501,Y1%+401
   Recs%(0)=Rect1%(0):Recs%(1)=Rect1%(1):Recs%(2)=Rect1%(2):Recs%(3)=Rect1%(3)
  CALL FRAMERECT (VARPTR(Rect1%(0)))
'IF DispWindo(Xpt%,rgn%)=1 THEN
'   MOVETO X1%-45,Y1%-400:PRINT USING "#####.";CntMax(1)
'   MOVETO X1%-45,Y1%:PRINT USING "#####.";CntMin(1)
'   MOVETO X1%,Y1%+20:PRINT ScanStart(Xpt%,rgn%)
'   MOVETO X1%+500,Y1%+20:PRINT ScanEnd(Xpt%,rgn%)
'END IF

REM Redraw Block2:
  X2%=740:Y2%=39
   SetRect Rect2%(0),X2%,Y2%,X2%+501,Y2%+401
   Recs%(4)=Rect2%(0):Recs%(5)=Rect2%(1):Recs%(6)=Rect2%(2):Recs%(7)=Rect2%(3)
  CALL FRAMERECT (VARPTR(Rect2%(0)))

REM Redraw Block3:
  X3%=100:Y3%=489
   SetRect Rect3%(0),X3%,Y3%,X3%+501,Y3%+401
   Recs%(8)=Rect3%(0):Recs%(9)=Rect3%(1):Recs%(10)=Rect3%(2):Recs%(11)=Rect3%(3)
  CALL FRAMERECT (VARPTR(Rect3%(0)))

REM Redraw Block4:
  X4%=740:Y4%=489
   SetRect Rect4%(0),X4%,Y4%,X4%+501,Y4%+401
   Recs%(12)=Rect4%(0):Recs%(13)=Rect4%(1):Recs%(14)=Rect4%(2):Recs%(15)=Rect4%(3)
  CALL FRAMERECT (VARPTR(Rect4%(0)))

  IF HIST=1 THEN
'    REM Beam pulsing off
'      PulseStatus%=0: GOSUB PulseGen
     REM Disable front panel histogram port
       N%=Hgram%:N$=CHR$(N%)
       A%=0:A$=CHR$(A%)
       F%=19:F$=CHR$(F%)
       GOSUB CamacWrite
    IF BlockXfer=1 THEN
    REM Block transfer
    REM Enable auto increment
       N%=Hgram%:N$=CHR$(N%)
       A%=0:A$=CHR$(A%)
       F%=25:F$=CHR$(F%)
       GOSUB CamacWrite
     REM Specify starting address for block transfer
      N%=Hgram%:N$=CHR$(N%)
      A%=1:A$=CHR$(A%)
      F%=18:F$=CHR$(F%)
     REM Build W1$,W2$,W3$ corresponding to bin3% address
       bin3%=1
       W1%=0:REM High byte of address
       W2%=(bin3%+Offset%)\256
       W3%=bin3%+Offset%-256*W2%
```

```
      W1$=CHR$(W1%):W2$=CHR$(W2%):W3$=CHR$(W3%)
      ibsta%=0
      GOSUB CamacWrite
    END IF
  END IF
  SHOWCURSOR
  DataTime3=TIMER

  REM Acquire data from scalers or histogram memory
  IF Fetch3>0 THEN
    IF HIST=1 THEN
      DataDisplay=0
      IF D1sig>0 THEN: rgn%=1:Offset%=Astart%:GOSUB HistRead
      IF D2sig>0 THEN: rgn%=2:Offset%=Bstart%:GOSUB HistRead
    ELSE
      GOSUB FetchData
    END IF
  END IF
  Fetch3=Fetch3+1

  IF HIST=1 THEN
    IF BlockXfer=1 THEN
      REM Disable auto increment
      N%=Hgram%:N$=CHR$(N%)
      A%=0:A$=CHR$(A%)
      F%=17:F$=CHR$(F%)
      GOSUB CamacWrite
    END IF
     REM Enable front panel histogram port
      N%=Hgram%:N$=CHR$(N%)
      A%=0:A$=CHR$(A%)
      F%=11:F$=CHR$(F%)
      GOSUB CamacWrite
  END IF

  REM Plot data
  FOR bin3%=1 TO PtsPerScan
    FOR rgn%=1 TO 2
      ToF(rgn%,bin3%)=bin3%/Freq(rgn%)
       ToF(rgn%,Bin3%)=Bin3%/Freq(rgn%)-PwidthMicroSec
      IF DispWindo (Xpt%,rgn%)>0 THEN GOSUB PlotData
    NEXT

  REM Check user requests
  REM data cursor during scan
    IF MOUSE(0)<0 AND ROIS=0 THEN
      GOSUB Cursor
    ELSE
    PENMODE 10
      IF FirstXCrsr=1 THEN  MOVETO mousxOld%,Y0C%:LINETO mousxOld%,Y0C%+400:FirstXCrsr=0:'
Erase old Xcursor if it exists
      IF FirstYCrsr=1 THEN  MOVETO X0C%,mousyOld%:LINETO X0C%+500,mousyOld%:FirstYCrsr=0:'
Erase old Ycursor if it exists
      SHOWCURSOR
    END IF

    IF MenuSel>0 THEN GOSUB MenuDo3
    Pause3Here: IF Pause3=1 AND MenuSel=0 THEN: MOVETO 5,360:PRINT "Scan ";Nscan3: GOTO Pause3Here

    IF Reset3=1 THEN
      Reset3=0:Nscan3=1
      BEEP:MOVETO 5,340:PRINT "Scan Reset"
      FOR i=1 TO 5000:NEXT
      MOVETO 5,340:PRINT "                "
```

```
beep:GOSUB ClearDisplay
GOTO Driss
END IF

IF End3=1 THEN
MENU 4,0,1
BEEP:MOVETO 5,340:PRINT "Scan End"
IF HIST=1 THEN: PulseStatus%=0: GOSUB PulseGen
bin3%=PtsPerScan
Nscan3=Nscans3
LastScan3=1
' End3=0
END IF

IF Abort3=1 THEN
DrissBin=PtsPerScan
LastScan3=1
IF HIST=1 THEN PulseStatus%=0: GOSUB PulseGen
MOVETO 5,340
PRINT "Scan Abort"
GOTO Scan3End
END IF
' ****************
NEXT
EndTimer!=TIMER
REM Beam pulsing off
IF HIST=1 THEN: PulseStatus%=0: GOSUB PulseGen
Scan3Time=EndTimer!-StartTimer!
IF Scan3Time<0 THEN Scan3Time=Scan3Time+86400&
MOVETO 0,130:PRINT "          "
MOVETO 0,130:PRINT "Live";LiveTime
MOVETO 0,145:PRINT "          "
MOVETO 0,145:PRINT "Dead";DeadTime
MOVETO 0,160:PRINT "          "
MOVETO 0,160:PRINT "Totl";Scan3Time
MOVETO 0,175:PRINT "          "
MOVETO 0,175:PRINT "Liv%"
MOVETO 25,175:PRINT USING "###.#";LivePercent
Data3Write:
BEEP
MOVETO 200,35:PRINT "Writing Data"
REM Write data to file
IF HeaderFil$<>"" THEN
OPEN SeqData3$ FOR OUTPUT AS #5
PRINT #5, "Time";T$;
"Ticks";T$;"ToF1";T$;"Counts1";T$;"ToF2";T$;"Counts2";T$;"ToF3";T$;"Counts3";T$;PtsPerScan;T$;FreqA;
T$;FreqB;T$;IndexFil$
FOR bin3%=1 TO PtsPerScan
PRINT #5, DataTime3;T$;bin3%;T$;ToF(1,bin3%);T$; Data3&(1,bin3%);T$;
ToF(2,bin3%);T$;Data3&(2,bin3%);T$;ToF(3,bin3%);T$;Data3&(3,bin3%)
NEXT
CLOSE #5
END IF

MOVETO 200,35:PRINT "              "
IF End3=1 THEN:End3=0: GOTO Scan3End
IF Abort3=1 THEN
Nscan3=Nscans3
LastScan3=1
Continue3=0
END IF
FirstPlot3=1
IF Fetch3>1 THEN: Nscan3=Nscan3+1:Nscan3Old=Nscan3Old+1
MOVETO 5,380 :PRINT "LastScan=";Nscans3
```

```
   DrissBin=0
   bin3%=0
   IF LastScan3=0 THEN
      IF Continue3=1 THEN:MOVETO 5,360:PRINT "Scan ";Nscan3: GOTO DrissStep
      IF Nscans3$="" AND MaxTime3$="" AND Tc1$="" AND Tc2$="" THEN:MOVETO 5,360:PRINT "Scan
";Nscan3: GOTO DrissStep
      IF Nscans3$<>"" AND (Nscan3<=Nscans3 OR Nscans3=0) THEN:MOVETO 5,360:PRINT "Scan ";Nscan3:
GOTO DrissStep
      IF MaxTime3$<>"" AND Scan3Timer!<MaxTime3 THEN:MOVETO 5,360:PRINT "Scan ";Nscan3: GOTO
DrissStep
      IF Tc1$<>"" AND Data3Max&(1)<Tc1 THEN:MOVETO 5,360:PRINT "Scan ";Nscan3: GOTO DrissStep
      IF Tc2$<>"" AND Data3Max&(2)<Tc2 THEN:MOVETO 5,360:PRINT "Scan ";Nscan3: GOTO DrissStep
   END IF

   REM end of Repeat Cycle
   IF Repeat3Max>1 THEN
      FOR bin3%=1 TO PtsPerScan
         Data3Cum&(1,bin3%)=Data3Cum&(1,bin3%) + Data3&(1,bin3%)
         Data3Cum&(2,bin3%)=Data3Cum&(2,bin3%) + Data3&(2,bin3%)
         Data3Cum&(3,bin3%)=Data3Cum&(3,bin3%) + Data3&(3,bin3%)
      NEXT

      REM Write data to Cum file
      IF HeaderFil$<>"" THEN
         MOVETO 200,35:PRINT "Writing Cum Data"
         OPEN Data3$ FOR OUTPUT AS #5
            PRINT #5, "Time";T$;
"Ticks";T$;"ToF1";T$;"Counts1";T$;"ToF2";T$;"Counts2";T$;"ToF3";T$;"Counts3";T$;PtsPerScan;T$;FreqA;
T$;FreqB;T$;IndexFil$
         FOR bin3%=1 TO PtsPerScan
            PRINT #5, DataTime3;T$;bin3%;T$;ToF(1,bin3%);T$; Data3Cum&(1,bin3%);T$;
ToF(2,bin3%);T$;Data3Cum&(2,bin3%);T$;ToF(3,bin3%);T$;Data3Cum&(3,bin3%)
         NEXT
         CLOSE #5
         MOVETO 200,35:PRINT "                    "
      END IF
'     GOSUB Replot3
   END IF

   Repeat3=Repeat3+1:IF Repeat3<=Repeat3Max THEN GOTO DrissRepeat

   Scan3End:
      GOSUB Replot3
      BEEP:'   End of Scan
      MOVETO 5,340:PRINT "                    "
      MOVETO 5,340
      IF Abort3=0 THEN PRINT "End of scan" ELSE PRINT "Scan Aborted"
      MENU 4,0,1
      Abort3=0
      Nscans3=Nscan3
'     Nscan3=Nscan3+1
      FirstPlot3=1
   CALL FRAMERECT (VARPTR(Rect1%(0)))
   CALL FRAMERECT (VARPTR(Rect2%(0)))
   CALL FRAMERECT (VARPTR(Rect3%(0)))
   CALL FRAMERECT (VARPTR(Rect4%(0)))
'  IF Leave15=0 THEN:DrissBin=0: GOTO DrissStep
 MENU 2,2,1:REM manual enabled
 RETURN
 REM -------------------------------------------------------------

FetchData:
GOSUB FireBeam
REM Define DRISS data array
```

```
REM *******Data Acquisition**********************************
IF D1sig>0 THEN
REM ******Scaler 1**********************
ScalerRead=1
'  IF HIST=0 THEN
    FOR bin3%=1 TO PtsPerScan
     REM Load latches 1
       N%=SC1%:N$=CHR$(N%)
       F%=0:F$=CHR$(F%)
       FOR i=0 TO ChanScan
         A%=i:A$=CHR$(A%)
         NAF$=N$+A$+F$
         Wrt$=NAF$
         CALL IBWRT(Camac%,Wrt$)
         IF ibsta%<0 THEN
           BEEP:MOVETO 20,450
            PRINT " Camac Write Error: count= ";ibcnt&,"Status ";HEX$(ibsta%),"Error No. ";iberr%
           GPIBerr=iberr%
         END IF
       REM Read Camac
         RD$=SPACE$(3)
         CALL IBRD(Camac%,RD$)
         IF ibsta%<0 THEN
           BEEP:MOVETO 20,450
            PRINT " Camac Read Error: count= ";ibcnt&,"Status ";HEX$(ibsta%),"Error No. ";iberr%
           GPIBerr=iberr%
         END IF
         HB1%=ASC(MID$(RD$,2,1))
         LB1%=ASC(RIGHT$(RD$,1))
         Scalr1%(i)=256*HB1%+LB1%
         IF Scalr1%(i)>PtsPerScan OR Scalr1%(i)<0 THEN Scalr1%(i)=PtsPerScan
           IF Datain=0 THEN Scalr1%(i)=i*PtsPerScan/8:REM ********Diagnostic *******
          Data3&(1,Scalr1%(i))=Data3&(1,Scalr1%(i)) + 1
       NEXT:REM Chanscan
     NEXT:REM bin3%

    IF DataDisplay>0  THEN
      SELECT CASE DataDisplay
        CASE 0:GOTO EndScaler1
        CASE 1:
           MOVETO X1%,Y1%+420:PRINT USING "####."; Scalr1%(0)
        CASE 2:
           MOVETO X1%,Y1%+420:PRINT USING "####."; Scalr1%(0)
           MOVETO X1%+75,Y1%+420:PRINT USING "####."; Scalr1%(1)
        CASE 3:
           MOVETO X1%,Y1%+420:PRINT USING "####."; Scalr1%(0)
           MOVETO X1%+75,Y1%+420:PRINT USING "####."; Scalr1%(1)
           MOVETO X1%+150,Y1%+420:PRINT USING "####."; Scalr1%(2)
           MOVETO X1%+225,Y1%+420:PRINT USING "####."; Scalr1%(3)
        CASE 4:
           MOVETO X1%,Y1%+420:PRINT USING "####."; Scalr1%(0)
           MOVETO X1%+75,Y1%+420:PRINT USING "####."; Scalr1%(1)
           MOVETO X1%+150,Y1%+420:PRINT USING "####."; Scalr1%(2)
           MOVETO X1%+225,Y1%+420:PRINT USING "####."; Scalr1%(3)
           MOVETO X1%+300,Y1%+420:PRINT USING "####."; Scalr1%(4)
           MOVETO X1%+375,Y1%+420:PRINT USING "####."; Scalr1%(5)
           MOVETO X1%+450,Y1%+420:PRINT USING "####."; Scalr1%(6)
           MOVETO X1%+525,Y1%+420:PRINT USING "####."; Scalr1%(7)
      END SELECT
    END IF:REM DataDisplay>0
'  END IF:REM HIST=0
 '  IF HIST=1 THEN: Offset%=Astart%:DataDisplay=0:GOSUB HistRead
END IF:REM D1Sig>0
EndScaler1:
```

```
REM ******Scaler 1************************

IF D2sig>0 THEN
REM ******Scaler 2************************
ScalerRead=2
' IF HIST=0 THEN
   FOR bin3%=1 TO PtsPerScan
    REM Load Latches 2
      N%=SC2%:N$=CHR$(N%)
      F%=0:F$=CHR$(F%)
      FOR i=0 TO ChanScan
        A%=i:A$=CHR$(A%)
          NAF$=N$+A$+F$
          Wrt$=NAF$
          CALL IBWRT(Camac%,Wrt$)
          IF ibsta%<0 THEN
            BEEP:MOVETO 20,450
             PRINT " Camac Write Error:  count= ";ibcnt&,"Status ";HEX$(ibsta%),"Error No. ";iberr%
            GPIBerr=iberr%
          END IF
        REM Read Camac
          RD$=SPACE$(3)
          CALL IBRD(Camac%,RD$)
          IF ibsta%<0 THEN
            BEEP:MOVETO 20,450
             PRINT " Camac Read Error:  count= ";ibcnt&,"Status ";HEX$(ibsta%),"Error No. ";iberr%
            GPIBerr=iberr%
          END IF
      HB2%=ASC(MID$(RD$,2,1))
      LB2%=ASC(RIGHT$(RD$,1))
      Scalr2%(i)=256*HB2%+LB2%
      IF Scalr2%(i)>PtsPerScan OR Scalr2%(i)<0 THEN Scalr2%(i)=PtsPerScan
        IF Datain=0 THEN Scalr2%(i)=i*PtsPerScan/9:REM ********Diagnostic********
      Data3&(2,Scalr2%(i))=Data3&(2,Scalr2%(i)) + 1
   NEXT:REM Chanscan
  NEXT:REM bin3%

 IF DataDisplay>0  THEN
   SELECT CASE DataDisplay
     CASE 0:GOTO EndScaler2
     CASE 1:
        MOVETO X1%,Y1%+430:PRINT USING "####."; Scalr2%(0)
     CASE 2:
        MOVETO X1%,Y1%+430:PRINT USING "####."; Scalr2%(0)
        MOVETO X1%+75,Y1%+430:PRINT USING "####."; Scalr2%(1)
     CASE 3:
        MOVETO X1%,Y1%+430:PRINT USING "####."; Scalr2%(0)
        MOVETO X1%+75,Y1%+430:PRINT USING "####."; Scalr2%(1)
        MOVETO X1%+150,Y1%+430:PRINT USING "####."; Scalr2%(2)
        MOVETO X1%+225,Y1%+430:PRINT USING "####."; Scalr2%(3)
     CASE 4:
        MOVETO X1%,Y1%+430:PRINT USING "####."; Scalr2%(0)
        MOVETO X1%+75,Y1%+430:PRINT USING "####."; Scalr2%(1)
        MOVETO X1%+150,Y1%+430:PRINT USING "####."; Scalr2%(2)
        MOVETO X1%+225,Y1%+430:PRINT USING "####."; Scalr2%(3)
        MOVETO X1%+300,Y1%+430:PRINT USING "####."; Scalr2%(4)
        MOVETO X1%+375,Y1%+430:PRINT USING "####."; Scalr2%(5)
        MOVETO X1%+450,Y1%+430:PRINT USING "####."; Scalr2%(6)
        MOVETO X1%+525,Y1%+430:PRINT USING "####."; Scalr2%(7)
   END SELECT
 END IF:REM DataDisplay>0
' END IF: REM HIST=0
' IF HIST=1 THEN:Offset%=Bstart%:DataDisplay=0:GOSUB HistRead
```

```
END IF:REM D2Sig>0
EndScaler2:
REM ******Scaler 2***********************
RETURN
REM --------------------------------------------------------------

FireBeam:
'    N%=DGG%:N$=CHR$(N%):'  fire Gate A single pulse
'    A%=0:A$=CHR$(A%)
'    F%=25:F$=CHR$(F%)
'   GOSUB CamacWrite
REM * CNTR% - the counter that will be producing the square wave
LDErr& = 0
CNTR% = 5:REM counter 0-2
TimeBase%=1:REM 1 MHz clock
delay&=10:REM Delay before pulse is fired in units of Timebase% - range=3-65,536
Pulse.Width&=1
CALL CTR.Pulse(BD2%,LDErr&,CNTR%,TimeBase%,delay&,Pulse.Width&)
RETURN
REM --------------------------------------------------------------

GateSet:
  oneshot=1700:'  oneshot pulse length in nsec (fixed hardware value)
  TAD9=TaD*1E+09:TBD9=TbD*1E+09
  REM mukunds mod begin
'   DelayTemp=OneShot-TAD9-TBD9
'   IF DelayTemp < 0 THEN DelayTemp=0
'   Gate=DelayTemp+OneShot+TBD9-PWidth
    p11cm=1.7035
    a13cm=2.5415
    tp11=p11cm*.01/Vx0
    ta13=a13cm*.01/Vx0
    tp119=tp11*1E+09
    ta139=ta13*1E+09
    Gate=oneshot+TBD9+tp119+ta139-Pwidth
    REM Note:oneshot must be greater than or equal to TAD9-ta119 (=ta139)-tp119+Pwidth
 REM mukunds mod ends
 REM Gate=OneShot+TBD9-Pwidth
 IF Gate<=0 THEN
   Gate=1
'    Pwidth=oneshot+TBD9-Gate:rem Mukund change
    Pwidth=oneshot+TBD9+tp119+ta139-Gate
   Pwidth$=STR$(Pwidth)
   BEEP
    EDIT FIELD 3,Pwidth$, (150,85)-(250,98)
END IF
 Agate=1000*(Gate\1000)
 Bgate=Gate-1000*(Gate\1000)
 IF Bgate<100 AND Agate>200 THEN:Agate=Agate-100:Bgate=Bgate+100
   IF Agate>0 THEN LogAgate=LOG(Agate)/LOG(10#) ELSE LogAgate=0
   Ca=INT(LogAgate)
   Ma=LogAgate-Ca
   Ca2=Ca-2
   Ga10=Agate/10^Ca2
    N%=DGG%:N$=CHR$(N%)
    A%=0:A$=CHR$(A%)
    F%=17:F$=CHR$(F%)
    W1%=0:W1$=CHR$(W1%)
     REM W2%=(1000*Ma)\256+4*Ca+128:W2$=CHR$(W2%)
     REM W3%=1000*Ma-(1000*Ma\256)*256:W3$=CHR$(W3%)
    W2%=128+Ca2*4+Ga10\256:W2$=CHR$(W2%)
    W3%=Ga10-256*(Ga10\256):W3$=CHR$(W3%)
  IF GPIB=1 AND Agate<>AgateOld THEN GOSUB CamacWrite
  AgateOld=Agate
```

```
        LogBgate=LOG(Bgate)/LOG(10#)
        Cb=INT(LogBgate)
        Mb=LogBgate-Cb
        Cb2=Cb-2
        Gb10=Bgate/10^Cb2
          N%=DGG%:N$=CHR$(N%)
          A%=1:A$=CHR$(A%)
          F%=17:F$=CHR$(F%)
          W1%=0:W1$=CHR$(W1%)
           REM W2%=(1000*Mb)\256+4*Cb+128:W2$=CHR$(W2%)
           REM W3%=1000*Mb-(1000*Mb\256)*256:W3$=CHR$(W3%)
           W2%=128+Cb2*4+Gb10\256:W2$=CHR$(W2%)
           W3%=Gb10-256*(Gb10\256):W3$=CHR$(W3%)
       IF GPIB=1 AND Bgate<>BgateOld THEN GOSUB CamacWrite
       BgateOld=Bgate
          Msg1$="Ca=":Msg1=Ca
          Msg2$="Ma=":Msg2=Ma
          Msg3$="Cb=":Msg3=Cb
          Msg4$="Mb=":Msg4=Mb
         GOSUB MsgWrite
  RETURN
  REM -------------------------------------------------------------

  HistRead:
  REM ****Histogram memory enabled
  'IF ScalerRead=1 THEN Offset%=Astart%
  'IF ScalerRead=2 THEN Offset%=Bstart%
  REM build transfer command
      N%=Hgram%:N$=CHR$(N%)
      A%=0:A$=CHR$(A%)
      F%=2:F$=CHR$(F%)
      NAF$=N$+A$+F$
      Xfer$=NAF$

    IF Datain=0 AND HIST<>0 THEN
     REM diagnostic histogram memory write
        REM specify address to be written to
          N%=Hgram%:N$=CHR$(N%)
          A%=0:A$=CHR$(A%)
       FOR bin3%=1 TO PtsPerScan
          F%=18:F$=CHR$(F%)
        REM Build W1$,W2$,W3$ corresponding to bin3% address
          W1%=0:REM High byte of address
          W2%=(bin3%+Offset%)\256
          W3%=bin3%+Offset%-256*W2%
          W1$=CHR$(W1%):W2$=CHR$(W2%):W3$=CHR$(W3%)
          GOSUB CamacWrite
       REM now  write data to this address
         '  N%=Hgram%:N$=CHR$(N%)
         '  A%=0:A$=CHR$(A%)
         F%=16:F$=CHR$(F%)
       REM Build W1$,W2$,W3$ corresponding to bin3% data
         W1%=0:REM High byte of data
         W2%=bin3%\256
         W3%=bin3%-256*W2%
         W1$=CHR$(W1%):W2$=CHR$(W2%):W3$=CHR$(W3%)
        GOSUB CamacWrite
      NEXT:REM bin3%
    REM end diagnostic histogram memory write
   END IF:REM Datain=0
LiveTimeEnd=TIMER
REM Beam pulsing off
   PulseStatus%=0
  GOSUB PulseGen
```

```
REM Retrieve Data
DeadTimeStart=TIMER
IF BlockXfer=1 THEN
  FOR bin3%=1 TO PtsPerScan
    REM Transfer histogram contents to Camac MDR
      CALL IBWRT(Camac%,Xfer$)
    REM Read Histogram MDR Segment
      RD$=SPACE$(3)
      CALL IBRD(Camac%,RD$)
      Data3ASC$(rgn%,bin3%)=RD$
  NEXT:REM bin3%
ELSE
  FOR bin3%=1 TO PtsPerScan
      REM Specify address to be read in Segment 1***********************
      N%=Hgram%:N$=CHR$(N%)
      A%=1:A$=CHR$(A%)
      F%=18:F$=CHR$(F%)
      REM Build W1$,W2$,W3$ corresponding to bin3% address
        W1%=0:REM High byte of address
        W2%=(bin3%+Offset%)\256
        W3%=bin3%+Offset%-256*W2%
        W1$=CHR$(W1%):W2$=CHR$(W2%):W3$=CHR$(W3%)
        ibsta%=0
        GOSUB CamacWrite
    REM Transfer contents to Camac MDR
      CALL IBWRT(Camac%,Xfer$)
    REM Read Histogram MDR Segment
      RD$=SPACE$(3)
      CALL IBRD(Camac%,RD$)
      Data3ASC$(rgn%,bin3%)=RD$
  NEXT:REM bin3%
END IF

DeadTimeEnd=TIMER
DeadTime=DeadTimeEnd-DeadTimeStart
IF DeadTime<0 THEN DeadTime=DeadTime+86400&
REM Beam pulsing on
  PulseStatus%=1
  GOSUB PulseGen
REM LiveTime
  LiveTime=LiveTimeEnd-LiveTimeStart
  IF LiveTime<0 THEN LiveTime=LiveTime+86400&
  LiveTimeStart=TIMER
  IF DeadTime>0 THEN LivePercent=100*LiveTime/(LiveTime+DeadTime) ELSE LivePercent=100
REM convert string data values to integer
  FOR bin3%=1 TO PtsPerScan
    HB1%=ASC(LEFT$(Data3ASC$(rgn%,bin3%),1))
    MB1%=ASC(MID$(Data3ASC$(rgn%,bin3%),2,1))
    LB1%=ASC(RIGHT$(Data3ASC$(rgn%,bin3%),1))
    Data3&(rgn%,bin3%)=65536&*HB1%+256*MB1%+LB1%
  REM diagnostic only -- must remove
'  Data3&(rgn%,bin3%)=bin3%
  NEXT
RETURN
REM -----------------------------------------------------------

MsgWrite:
  MOVETO 210,347:LINETO 430,347
'    MOVETO 212,360:PRINT Msg1$;Msg1
'    MOVETO 257,360:PRINT Msg2$;Msg2
'    MOVETO 212,375:PRINT Msg3$;Msg3
'    MOVETO 257,375:PRINT Msg4$;Msg4
    MOVETO 354,360:PRINT Msg5$;Msg5
```

```
    MOVETO 354,375:PRINT Msg6$;Msg6
RETURN
REM ----------------------------------------------------------------

PollData:
DataReady=bin-3*INT(bin/3)
DataReady=1
RETURN
REM ----------------------------------------------------------------

PlotData:
PENMODE 8
  Dwindo%=DispWindo(Xpt%,rgn%)
  SELECT CASE DispWindo(Xpt%,rgn%)
    CASE 1
      X0P%=X1%:Y0P%=Y1%+400
    CASE 2
      X0P%=X2%:Y0P%=Y2%+400
    CASE 3
      X0P%=X3%:Y0P%=Y3%+400
    CASE 4
      X0P%=X4%:Y0P%=Y4%+400
    CASE ELSE
      RETURN
  END SELECT
  SELECT CASE Xpt%
    CASE 1
      IF Expt1$="" THEN RETURN
      ' IF NptAvg>0 THEN GOSUB PlotDeriv
      bin1%=bin
      Xplt%=500*(bin1%/Npts1(rgn%))+X0P%
      IF FirstPlot1=0 THEN
        IF PulseInput1=1 THEN CntMin(Dwindo%)=0 ELSE CntMin(Dwindo%)=-1*CntMax(Dwindo%)
        MOVETO X0P%-45,Y0P%-400:PRINT USING "#####.";CntMax(Dwindo%)
        MOVETO X0P%-45,Y0P%:PRINT USING "#####.";CntMin(Dwindo%)
        MOVETO X0P%-5,Y0P%+20:PRINT ScanStart(Xpt%,rgn%)
        MOVETO X0P%+495,Y0P%+20:PRINT ScanEnd(Xpt%,rgn%)
      END IF
      IF Data1&(rgn%,bin1%)>CntMax(Dwindo%) AND bin1%<Npts1(rgn%) THEN
        DataVal&=Data1&(rgn%,bin1%)
        GOSUB SetNewMax
        CntMax(Dwindo%) =Max:NewMax=1
        IF CntMin(Dwindo%)<0 THEN CntMin(Dwindo%)=-1*CntMax(Dwindo%)
        MOVETO X0P%-45,Y0P%-400:PRINT USING "#####.";CntMax(Dwindo%)
        MOVETO X0P%-45,Y0P%:PRINT USING "#####.";CntMin(Dwindo%)
        MOVETO X0P%-5,Y0P%+20:PRINT ScanStart(Xpt%,rgn%)
        MOVETO X0P%+495,Y0P%+20:PRINT ScanEnd(Xpt%,rgn%)
      END IF

      IF CntMin(Dwindo%)=0 THEN Yorigin=0 ELSE Yorigin=200
      IF Data1&(rgn%,bin1%)<CntMin(Dwindo%) AND Data1&(rgn%,bin1%)<0 THEN
        IF ABS(Data1&(rgn%,bin1%))<CntMax(Dwindo%) THEN CntMin(Dwindo%) =-1*CntMax(Dwindo%)
        IF ABS(Data1&(rgn%,bin1%))>CntMax(Dwindo%) THEN
          DataVal&=-1*Data1&(rgn%,bin1%)
          GOSUB SetNewMax
          CntMax(Dwindo%) =Max:NewMax=1
          CntMin(Dwindo%)=-1*CntMax(Dwindo%)
          Yorigin=200
        END IF
        MOVETO X0P%-45,Y0P%-400:PRINT USING "#####.";CntMax(Dwindo%)
        MOVETO X0P%-45,Y0P%:PRINT USING "#####.";CntMin(Dwindo%)
        MOVETO X0P%-5,Y0P%+20:PRINT ScanStart(Xpt%,rgn%)
        MOVETO X0P%+495,Y0P%+20:PRINT ScanEnd(Xpt%,rgn%)
      END IF
```

```
IF CntMax (Dwindo%)-CntMin (Dwindo%)>=10 THEN
    Yplt%=Y0P%-Yorigin-400*(Data1&(rgn%,bin1%)/(CntMax (Dwindo%)-CntMin (Dwindo%)))
ELSE
'   BEEP:BEEP
END IF

IF Xplt%-X0P%<500 THEN
'-----------
    REM Plot Line
'     IF FirstPlot1>0 THEN
'        GOSUB White: MOVETO XpltOld1%(rgn%,bin1%-1),YpltOld1%(rgn%,bin1%-1)
'        LINETO XpltOld1%(rgn%,bin1%),YpltOld1%(rgn%,bin1%)
'     END IF
'     GOSUB Red: MOVETO XpltOld1%(rgn%,bin1%-1),YpltOld1%(rgn%,bin1%-1)
'     IF bin1%>0 THEN LINETO xplt%,yplt%
    REM Plot Small Point
'     IF FirstPlot1>0 THEN PSET (XpltOld1%(rgn%,bin1%),YpltOld1%(rgn%,bin1%)), 0
'     GOSUB Red:PSET (xplt%,yplt%), col&
'     GOSUB SetColor: MOVETO xplt%,yplt%:LINETO xplt%,yplt%:GOSUB Black
    REM Plot Large Point
     REM Erase Old Point
     IF FirstPlot1>0 THEN
        GOSUB White:REM for white bkgnd
'       GOSUB Black:REM for blk bkgnd
        MOVETO XpltOld1%(rgn%,bin1%),YpltOld1%(rgn%,bin1%)
        LINETO XpltOld1%(rgn%,bin1%),YpltOld1%(rgn%,bin1%)
'         PSET (XpltOld1%(rgn%,bin1%),YpltOld1%(rgn%,bin1%)):REM small point
'         SetRect ErasePt% (0), XpltOld1%(rgn%,bin1%)-1,YpltOld1%(rgn%,bin1%)-
1,XpltOld1%(rgn%,bin1%)+1,YpltOld1%(rgn%,bin1%)+1:REM large point
'       CALL PAINTRECT (VARPTR(ErasePt%(0))):REM large point
     END IF
     REM New Point
     IF LastScan1=0 THEN DummyScan1=Nscan1 ELSE DummyScan1=Nscan1Old
     IF 2*INT(DummyScan1/2)=DummyScan1 THEN GOSUB Green ELSE GOSUB Red
'      PSET (Xplt%,Yplt%), col&:REM small point
     MOVETO Xplt%,Yplt%:LINETO Xplt%,Yplt%
'       SetRect PlotPt% (0), xplt%-1,yplt%-1,xplt%+1,yplt%+1:REM large point
'     CALL PAINTRECT (VARPTR(PlotPt%(0))):REM large point
'     GOSUB SetColor: MOVETO xplt%,yplt%:LINETO xplt%,yplt%:GOSUB Black
'-----------
        GOSUB Black
   END IF
   XpltOld1%(rgn%,bin1%)=Xplt%
   YpltOld1%(rgn%,bin1%)=Yplt%
 CASE 2
   IF Expt2$="" THEN RETURN
     bin2%=bin-Oflo*1023:IF bin2%>1023 THEN:Oflo=Oflo+1: bin2%=bin-Oflo*1023
   Xplt%=500*(bin2%/1000)+X0P%
   IF Data2&(rgn%,bin2%)>CntMax(Dwindo%) THEN CntMax(Dwindo%) =2*Data2&(rgn%,bin2%)
   IF Data2&(rgn%,bin2%)<CntMin(Dwindo%) THEN CntMin(Dwindo%) =.5*Data2&(rgn%,bin2%)
   Yplt%=Y0P%-400*(Data2&(rgn%,bin2%)/(CntMax (Dwindo%)-CntMin (Dwindo%)))
    IF Xplt%-X0P%<500 THEN
       GOSUB White: MOVETO XpltOld2%(rgn%,bin2%),YpltOld2%(rgn%,bin2%):LINETO
XpltOld2%(rgn%,bin2%),YpltOld2%(rgn%,bin2%)
       GOSUB SetColor: MOVETO Xplt%,Yplt%:LINETO Xplt%,Yplt%:GOSUB Black
   END IF
   XpltOld2%(rgn%,bin2%)=Xplt%
   YpltOld2%(rgn%,bin2%)=Yplt%
 CASE 3
  IF Expt3$="" THEN RETURN
  IF rgn%=1 AND D1sig=0 THEN RETURN
  IF rgn%=2 AND D2sig=0 THEN RETURN
  IF FirstPlot3=0 THEN
```

```
Data3Max&(rgn%)=10:Data3Min&(rgn%)=0
MOVETO X0P%-45,Y0P%-400:PRINT USING "#####.";CntMax(Dwindo%)
MOVETO X0P%-45,Y0P%:PRINT USING "#####.";CntMin(Dwindo%)
MOVETO X0P%,Y0P%+15:PRINT "0"
IF PtsPerScan=512 THEN
  Xmax3=500
ELSE
  Xmax3=1000*INT(PtsPerScan/1000)
END IF
Xmin3=0

Xmax3Plot=Xmax3/FreqDD
Xscale(1)=FreqDD/FreqA
Xscale(2)=FreqDD/FreqB
Xmin3Plot=0
CursorScale=(Xmax3Plot-Xmin3Plot)/(Xmax3-Xmin3)
GOSUB Black:MOVETO X0P%+490,Y0P%+20:PRINT Xmax3Plot;"µsec"
MOVETO X0P%-95,Y0P%+30:PRINT "FreqDD=";FreqDD
FirstPlot3=1
END IF:REM FitstPlot3=0
Xplt%=bin3%*PointWidth-DeltaBin3(rgn%)
IF Xplt%<0 THEN Xplt%=0

' REM Calculate Y value
'   HB1%=ASC(LEFT$(Data3ASC$(rgn%,bin3%),1))
'   MB1%=ASC(MID$(Data3ASC$(rgn%,bin3%),2,1))
'   LB1%=ASC(RIGHT$(Data3ASC$(rgn%,bin3%),1))
'   Data3&(rgn%,bin3%)=65536&*HB1%+256*MB1%+LB1%

  IF Datain=0 AND GPIB=0 THEN Data3&(1,bin3%)=bin3%*PtsPerScan/8:REM ********Diagnostic
*******

  IF rgn%=1 THEN
    IF Cum3D1=1 THEN YDataVal1&=Data3Cum&(rgn%,bin3%)+Data3&(rgn%,bin3%)
    IF New3D1=1 THEN YDataVal1&=Data3&(rgn%,bin3%)
  ELSEIF rgn%=2 THEN
    IF Cum3D2=1 THEN YDataVal2&=Data3Cum&(rgn%,bin3%)+Data3&(rgn%,bin3%)
    IF New3D2=1 THEN YDataVal2&=Data3&(rgn%,bin3%)
  END IF
  IF YDataVal1&>YDataVal2& THEN YDataVal&=YDataVal1& ELSE YDataVal&=YDataVal2&


  IF YDataVal&>Data3Max&(rgn%) THEN Data3Max&(rgn%)=YDataVal&
  IF YDataVal&>CntMax(Dwindo%) AND  bin3%<PtsPerScan AND bin3%>1 THEN
    DataVal&=YDataVal&
    GOSUB SetNewMax
    CntMax(Dwindo%) =Max:NewMax=1
    MOVETO X0P%-45,Y0P%-400:PRINT USING "##.#^^^^";CntMax(Dwindo%)
    MOVETO X0P%-45,Y0P%:PRINT USING "#####.";CntMin(Dwindo%)
  END IF

  IF CntMax (Dwindo%)-CntMin (Dwindo%)>=10 AND bin3%<PtsPerScan THEN
    IF (rgn%=1 AND New3D1=1) OR (rgn%=2 AND New3D2=1) THEN
      Yplt=Y0P%-400*(Data3&(rgn%,bin3%)/(CntMax (Dwindo%)-CntMin (Dwindo%)))
    END IF
    IF (rgn%=1 AND Cum3D1=1) OR (rgn%=2 AND Cum3D2=1) THEN
      Yplt=Y0P%-400*( (Data3&(rgn%,bin3%) + Data3Cum&(rgn%,bin3%)) / (CntMax (Dwindo%)-CntMin
(Dwindo%)) )
    END IF
    IF Yplt<0 THEN Yplt=0
    Yplt%=Yplt
  END IF

IF bin3%<Xmax3 THEN
```

```
' IF Xplt%<500 THEN
 REM Erase Old Point
  IF FirstPlot3>0 THEN
'     GOSUB Black:REM Black bkgnd
      GOSUB White:REM White bkgnd
'      MOVETO XpltOld3%(rgn%,bin3%-1),YpltOld3%(rgn%,bin3%-1):REM lineplot
'      LINETO XpltOld3%(rgn%,bin3%),YpltOld3%(rgn%,bin3%):REM lineplot
     Xold3%=(XpltOld3%(rgn%,bin3%))*Xscale(rgn%)+X0P%
      SetRect ErasePt% (0), Xold3%-1,YpltOld3%(rgn%,bin3%)-
1,Xold3%+1,YpltOld3%(rgn%,bin3%)+1:REM large point
'      SetRect ErasePt% (0), XpltOld3%(rgn%,bin3%)-1,YpltOld3%(rgn%,bin3%)-
1,XpltOld3%(rgn%,bin3%)+1,YpltOld3%(rgn%,bin3%)+1:REM large point
    IF (Xold3%-X0P%)<500 THEN CALL PAINTRECT (VARPTR(ErasePt%(0))):REM large point
   END IF

 REM Plot New Point
    IF LastScan3=0 THEN Dummyscan3=Nscan3 ELSE Dummyscan3=Nscan3Old
   IF rgn%=1 THEN
     IF 2 *INT (Dummyscan3/2)=Dummyscan3 THEN GOSUB Red ELSE GOSUB Magenta
   END IF
   IF rgn%=2 THEN
     IF 2 *INT (Dummyscan3/2)=Dummyscan3 THEN GOSUB Blue ELSE GOSUB Cyan
   END IF
   IF rgn%=3 THEN
     IF 2 *INT (Dummyscan3/2)=Dummyscan3 THEN GOSUB Yellow ELSE GOSUB Green
   END IF
   Xnew3%=(Xplt%)*Xscale(rgn%)+X0P%
    SetRect PlotPt% (0), Xnew3%-1,Yplt%-1,Xnew3%+1,Yplt%+1:REM large point
   IF (Xnew3%-X0P%)<500 THEN CALL PAINTRECT (VARPTR(PlotPt%(0))):REM large point

  ' GOSUB SetColor
  '  PSET (xplt%,yplt%), col&
  ' MOVETO xplt%,yplt%:LINETO xplt%,yplt%
'    MOVETO XpltOld3%(rgn%,bin3%-1),YpltOld3%(rgn%,bin3%-1)
'   IF bin3%>0 THEN LINETO xplt%,yplt%
REM ***
   GOSUB Black
  END IF:REM xplt%-X0P%<500
  XpltOld3%(rgn%,bin3%)=Xplt%
  YpltOld3%(rgn%,bin3%)=Yplt%
 END SELECT
RETURN
REM ----------------------------------------------------------------

Replot3:
REM Replot Data on single scale
 MOVETO 200,35:PRINT "Updating Display"
  FOR bin3%=1 TO PtsPerScan
   FOR rgn%=1 TO 2
    IF DispWindo (Xpt%,rgn%)>0 THEN GOSUB RePlotData
   NEXT
  NEXT
 MOVETO 200,35:PRINT "                "
RETURN
REM ----------------------------------------------------------------

RePlotData:
PENMODE 8
 Dwindo%=DispWindo(Xpt%,rgn%)
 SELECT CASE DispWindo(Xpt%,rgn%)
  CASE 1
   X0P%=X1%:Y0P%=Y1%+400
  CASE 2
   X0P%=X2%:Y0P%=Y2%+400
  CASE 3
   X0P%=X3%:Y0P%=Y3%+400
```

```
      CASE 4
        X0P%=X4%:Y0P%=Y4%+400
      CASE ELSE
        RETURN
    END SELECT

    SELECT CASE Xpt%
      CASE 1
        IF Expt1$="" THEN RETURN
        bin1%=rebin
         Xplt%=500*(bin1%/Npts1(rgn%))+X0P%

        IF CntMin(Dwindo%)=0 THEN Yorigin=0 ELSE Yorigin=200
        IF CntMax (Dwindo%)-CntMin (Dwindo%)>=10 THEN
           Yplt%=Y0P%-Yorigin-400*(Data1&(rgn%,bin1%)/(CntMax (Dwindo%)-CntMin (Dwindo%)))
'       ELSE
'         BEEP
        END IF

        IF Xplt%-X0P%<500  THEN
'-----------
          REM Plot Line
'            GOSUB White: MOVETO XpltOld1%(rgn%,bin1%-1),YpltOld1%(rgn%,bin1%-1)
'            LINETO XpltOld1%(rgn%,bin1%),YpltOld1%(rgn%,bin1%)
'            GOSUB Red: MOVETO XpltOld1%(rgn%,bin1%-1),YpltOld1%(rgn%,bin1%-1)
'            IF bin1%>0 THEN LINETO xplt%,yplt%
          REM Plot Small Point
            REM Erase old point
            GOSUB White
              MOVETO XpltOld1%(rgn%,bin1%),YpltOld1%(rgn%,bin1%)
              LINETO XpltOld1%(rgn%,bin1%),YpltOld1%(rgn%,bin1%)
            REM Plot new point
             GOSUB Red
              MOVETO Xplt%,Yplt%:LINETO Xplt%,Yplt%
'            GOSUB SetColor: MOVETO xplt%,yplt%:LINETO xplt%,yplt%:GOSUB Black
'         REM Plot Large Point
'         REM Erase Old Point
'           GOSUB White
'           GOSUB Black
'             SetRect ErasePt% (0), XpltOld1%(rgn%,bin1%)-1,YpltOld1%(rgn%,bin1%)-
1,XpltOld1%(rgn%,bin1%)+1,YpltOld1%(rgn%,bin1%)+1
'           CALL PAINTRECT (VARPTR(ErasePt%(0)))
'         Plot NEW POINT
'           GOSUB Red
'             SetRect PlotPt% (0), xplt%-1,yplt%-1,xplt%+1,yplt%+1
'           CALL PAINTRECT (VARPTR(PlotPt%(0))):REM MOVETO 450,100:PRINT Xplt%,Yplt%
'           GOSUB SetColor: MOVETO xplt%,yplt%:LINETO xplt%,yplt%:GOSUB Black
'-----------
            GOSUB Black
      END IF
       XpltOld1%(rgn%,bin1%)=Xplt%
       YpltOld1%(rgn%,bin1%)=Yplt%
    CASE 2
      IF Expt2$="" THEN RETURN
        bin2%=rebin-Oflo*1023:IF bin2%>1023 THEN:Oflo=Oflo+1: bin2%=bin-Oflo*1023
       Xplt%=500*(bin2%/1000)+X0P%
       IF Data2&(rgn%,bin2%)>CntMax(Dwindo%) THEN CntMax(Dwindo%) =2*Data2&(rgn%,bin2%)
       IF Data2&(rgn%,bin2%)<CntMin(Dwindo%) THEN CntMin(Dwindo%) =.5*Data2&(rgn%,bin2%)
       Yplt%=Y0P%-400*(Data2&(rgn%,bin2%)/(CntMax (Dwindo%)-CntMin (Dwindo%)))
        IF Xplt%-X0P%<500  THEN
          GOSUB White: MOVETO XpltOld2%(rgn%,bin2%),YpltOld2%(rgn%,bin2%):LINETO
XpltOld2%(rgn%,bin2%),YpltOld2%(rgn%,bin2%)

          GOSUB SetColor: MOVETO Xplt%,Yplt%:LINETO Xplt%,Yplt%:GOSUB Black
        END IF
      XpltOld2%(rgn%,bin2%)=Xplt%
      YpltOld2%(rgn%,bin2%)=Yplt%
```

```
CASE 3
  IF Expt3$="" THEN RETURN
  Dwindo%=DispWindo(Xpt%,rgn%)
   '  bin3%=rebin-Oflo*PtsPerScan
   '  bin3%=rebin
   IF bin3%=1 THEN
      MOVETO X0P%-45,Y0P%-400:PRINT USING "##.#^^^^";CntMax(Dwindo%)
      MOVETO X0P%-45,Y0P%:PRINT USING "#####.";CntMin(Dwindo%)
      MOVETO X0P%,Y0P%+15:PRINT "0"
      IF PtsPerScan=512 THEN
        Xmax3=500
    ELSE
        Xmax3=1000*INT(PtsPerScan/1000)
    END IF
    Xmin3=0
    Xmax3Plot=Xmax3/FreqDD
    Xscale(1)=FreqDD/FreqA
    Xscale(2)=FreqDD/FreqB
    Xmin3Plot=0
     CursorScale=(Xmax3Plot-Xmin3Plot)/(Xmax3-Xmin3)
    GOSUB Black:MOVETO X0P%+490,Y0P%+15:PRINT Xmax3Plot;"µsec"
    MOVETO X0P%-95,Y0P%+30:PRINT "FreqDD=";FreqDD
  END IF
' Xplt%=512*(Bin3%/PtsPerScan)
  Xplt%=bin3%*PointWidth-DeltaBin3(rgn%)
  IF Xplt%<0 THEN Xplt%=0
  IF CntMax (Dwindo%)-CntMin (Dwindo%)>=10 AND bin3%<PtsPerScan THEN

 IF Repeat3Max>1 THEN
REM this code block doe not work **********
      IF (rgn%=1 AND New3D1=1) OR (rgn%=2 AND New3D2=1) THEN
         Yplt=Y0P%-400*(Data3&(rgn%,bin3%)/(CntMax (Dwindo%)-CntMin (Dwindo%)))
      END IF
      IF (rgn%=1 AND Cum3D1=1) OR (rgn%=2 AND Cum3D2=1) THEN
'        Yplt=Y0P%-400*( (Data3&(rgn%,bin3%) + Data3Cum&(rgn%,bin3%)) / (CntMax (Dwindo%)-
CntMin (Dwindo%)) )
         Yplt=Y0P%-400*(Data3Cum&(rgn%,bin3%) / (CntMax (Dwindo%)-CntMin (Dwindo%)) )
      END IF
REM end code block **************
 ELSE
    Yplt=Y0P%-400*(Data3&(rgn%,bin3%)/(CntMax (Dwindo%)-CntMin (Dwindo%)))
 END IF
   IF Yplt<0 THEN Yplt=0
   Yplt%=Yplt
 END IF

 ' IF Xplt%<500 THEN
 IF bin3%<Xmax3 THEN
 REM Erase Old Point
'   GOSUB Black:REM Black bkgnd
    GOSUB White:REM White bkgnd
'    MOVETO XpltOld3%(rgn%,bin3%-1),YpltOld3%(rgn%,bin3%-1):REM lineplot
'    LINETO XpltOld3%(rgn%,bin3%),YpltOld3%(rgn%,bin3%):REM lineplot
    Xold3%=(XpltOld3%(rgn%,bin3%))*Xscale(rgn%)+X0P%
     SetRect ErasePt% (0), Xold3%-1,YpltOld3%(rgn%,bin3%)-1,Xold3%+1,YpltOld3%(rgn%,bin3%)+1:REM
large point
   IF (Xold3%-X0P%)<500 THEN CALL PAINTRECT (VARPTR(ErasePt%(0))):REM large point
 REM Plot New Point
   IF rgn%=1 THEN GOSUB Red
   IF rgn%=2 THEN GOSUB Blue
   IF rgn%=3 THEN GOSUB Green
   Xnew3%=Xplt%*Xscale(rgn%)+X0P%
    SetRect PlotPt% (0), Xnew3%-1,Yplt%-1,Xnew3%+1,Yplt%+1:REM large point
   IF (Xnew3%-X0P%)<500 THEN CALL PAINTRECT (VARPTR(PlotPt%(0))):REM large point

   '  PRESET (XpltOld3%(rgn%,bin3%),YpltOld3%(rgn%,bin3%))
   '  GOSUB White: MOVETO XpltOld3%(rgn%,bin3%),YpltOld3%(rgn%,bin3%):LINETO
```

```
XpltOld3%(rgn%,bin3%),YpltOld3%(rgn%,bin3%)
          'GOSUB white: MOVETO XpltOld3%(rgn%,bin3%-1),YpltOld3%(rgn%,bin3%-1):LINETO
XpltOld3%(rgn%,bin3%),YpltOld3%(rgn%,bin3%)
          'GOSUB SetColor
          '  PSET (xplt%,yplt%), col&
          '  MOVETO xplt%,yplt%:LINETO xplt%,yplt%
          'MOVETO XpltOld3%(rgn%,bin3%-1),YpltOld3%(rgn%,bin3%-1)
          'IF bin3%>0 THEN LINETO xplt%,yplt%

REM ***
      GOSUB Black
    END IF
      XpltOld3%(rgn%,bin3%)=Xplt%
      YpltOld3%(rgn%,bin3%)=Yplt%
  END SELECT
RETURN
REM -------------------------------------------------------------------


PlotDeriv:
         bin1%=bin-Oflo*1023:IF bin1%>1023 THEN: Oflo=Oflo+1:bin1%=bin-Oflo*1023
        Xplt%=500*(bin1%/1000)+X0P%
       NDiffA%=0:NDiffB%=0
       DerivA&(rgn%,bin1%)=0
       DerivB%(rgn%,bin1%)=0
       FOR i=1 TO NptAvg%
         IF bin1%-i>0 THEN
             DerivA&(rgn%,bin1%)=DerivA&(rgn%,bin1%)+Data1&(rgn%,bin1%-i)
           NDiffA%=NDiffA%+1
         ELSEIF i=1 THEN
            NDiffA%=1:DerivA&(rgn%,bin1%)=Data1&(rgn%,bin1%)
         END IF
         IF bin1%+i<=1023 THEN
            DerivB&(rgn%,bin1%)=DerivB&(rgn%,bin1%)+Data1&(rgn%,bin1%+i)
          NDiffB%=NDiffB%+1
        ELSEIF i=1023 THEN
           NDiffB%=1:DerivB&(rgn%,bin1%)=Data1&(rgn%,bin1%)
        END IF
      NEXT
       Deriv&(rgn%,bin1%)=DerivB&(rgn%,bin1%)/NDiffB%-DerivA&(rgn%,bin1%)/NDiffA%
       IF Deriv&(rgn%,bin1%)>CntMax(Dwindo%) THEN CntMax(Dwindo%) =2*Data1&(rgn%,bin1%)
       IF Deriv&(rgn%,bin1%)<CntMin(Dwindo%) THEN CntMin(Dwindo%) =.5*Data1&(rgn%,bin1%)
       Yplt%=Y0P%-400*(Deriv&(rgn%,bin1%)/(CntMax (Dwindo%)-CntMin (Dwindo%)))
         IF Xplt%-X0P%<500 THEN
           GOSUB White: MOVETO XpltOld1%(rgn%,bin1%),YpltOld1%(rgn%,bin1%):LINETO
XpltOld1%(rgn%,bin1%),YpltOld1%(rgn%,bin1%)
           GOSUB SetColor: MOVETO Xplt%,Yplt%:LINETO Xplt%,Yplt%:GOSUB Black
        END IF
      XpltOld1%(rgn%,bin1%)=Xplt%
      YpltOld1%(rgn%,bin1%)=Yplt%
RETURN
REM -------------------------------------------------------------------

PulseCount1:
  Counts1&=0
  TimeMax!=500
  IF mSecStep1>=500 THEN
    FOR i=1 TO Ndwl1:GOSUB CountLoop1:NEXT
  END IF
    TimeMax!=mSecStep1-Ndwl1*500
    IF TimeMax!>0 THEN GOSUB CountLoop1
RETURN
CountLoop1:
  REM **Start event counter 1
    Iderror&=0:cnt%=0
    CALL CTR.EvCount(BD2%,Iderror&,ctr1%,TimeBase1%,cnt%)
  REM **Start event counter 2
```

```
'     Iderror&=0:cnt%=0
'     CALL CTR.EvCount(Bd2%,Iderror&,ctr2%,TimeBase2%,cnt%)
   REM ** Start delay counter
    Iderror&=0:cnt%=0
    CALL CTR.EvCount(BD2%,Iderror&,ctr5%,TimeBase5%,cnt%)
   REM Delay until next event readout
    delay1:
      Iderror&=0:overflow1%=0
      CALL CTR.EvRead(BD2%,Iderror&,ctr1%,overflow1%,Count1&)
      Iderror&=0:overflow5%=0
      CALL CTR.EvRead(BD2%,Iderror&,ctr5%,overflow5%,Count5&)
    IF Count5&<TimeMax! THEN GOTO delay1
   REM Increment the current event count
'       Iderror&=0:overflow%=0
'       CALL CTR.EvRead(Bd2%,Iderror&,ctr1%,overflow%,Count&)
        Counts1&=Counts1&+Count1&+65535&*overflow1%
RETURN
REM -------------------------------------------------------------

PulseCount2:
   Counts2&=0
   TimeMax!=500
   IF mSecStep2>=500 THEN
     FOR i=1 TO Ndwl2:GOSUB CountLoop2:NEXT
   END IF
     TimeMax!=mSecStep2-Ndwl2*500
     IF TimeMax!>0 THEN GOSUB CountLoop2
RETURN
CountLoop2:
   REM **Start event counter 1
'     Iderror&=0:cnt%=0
'     CALL CTR.EvCount(Bd2%,Iderror&,ctr1%,TimeBase1%,cnt%)
   REM **Start event counter 2
    Iderror&=0:cnt%=0
    CALL CTR.EvCount(BD2%,Iderror&,ctr2%,TimeBase2%,cnt%)
   REM ** Start delay counter
    Iderror&=0:cnt%=0
    CALL CTR.EvCount(BD2%,Iderror&,ctr5%,TimeBase5%,cnt%)
   REM Delay until next event readout
    delay2:
      Iderror&=0:overflow2%=0
      CALL CTR.EvRead(BD2%,Iderror&,ctr2%,overflow2%,Count2&)
      Iderror&=0:overflow5%=0
      CALL CTR.EvRead(BD2%,Iderror&,ctr5%,overflow5%,Count5&)
    IF Count5&<TimeMax! THEN GOTO delay2
   REM Increment the current event count
'       Iderror&=0:overflow%=0
'       CALL CTR.EvRead(Bd2%,Iderror&,ctr1%,overflow%,Count&)
        Counts2&=Counts2&+Count2&+65535&*overflow2%
RETURN
REM -------------------------------------------------------------

PulseGen:
     REM * This section uses the clock on the MIO16X to generate pulses.
     REM *  It will generate a square wave of desired frequency with
     REM * specified duty cycle. It  calls
     REM * Ctr.Square and Ctr.Stop
     REM * Parameters :
       REM * LDErr&-the error returned from the driver routine
       REM * LDProc$ - the name of the routine that gave the error
       REM * comchar$ - LCV
       REM * CNTR% - the counter that will be producing the square wave
      LDErr& = 0
      CNTR% = 5 :REM counter 0-2
      TimBase0%=1 :REM 1 MHz clock
       REM RepTime=1000000&*(InTime+OutTime)
       Pulse.Width& = CINT(RepTime+.499999)
```

```
Period1&=1
Period2&=Pulse.Width&-Period1&
IF Pulse.Width&<65535& THEN
  IF PulseStatus%=1 THEN
    CALL CTR.Square(BD2%,LDErr&,CNTR%,TimBase0%,Period1&,Period2&)
    REM turn BeamLight on
      IF BeamStatus=1 THEN GOSUB Red ELSE GOSUB Green
        XB1%=0:YB1%=0:IF Windo=15 THEN YB1%=40
         SetRect BeamRect1%(0),XB1%,YB1%,XB1%+15,YB1%+15
        CALL PAINTRECT (VARPTR(BeamRect1%(0)))
         MOVETO XB1%+20,YB1%+15:PRINT "Beam Pulsing      "
      IF DispWindo(Xpt%,rgn%)=1 THEN
        XB1%=0:YB1%=0:IF Windo=15 THEN YB1%=40
         SetRect BeamRect1%(0),XB1%,YB1%,XB1%+15,YB1%+15
        CALL PAINTRECT (VARPTR(BeamRect1%(0)))
         MOVETO XB1%+20,YB1%+15:PRINT "Beam Pulsing      "
     END IF
      IF DispWindo(Xpt%,rgn%)=2 THEN
        XB2%=640:YB2%=0:IF Windo=15 THEN YB2%=40
         SetRect BeamRect2%(0),XB2%,YB2%,XB2%+15,YB2%+15
        CALL PAINTRECT (VARPTR(BeamRect2%(0)))
         MOVETO XB2%+20,YB2%+15:PRINT "Beam Pulsing      "
     END IF
      IF DispWindo(Xpt%,rgn%)=3 THEN
        XB3%=0:YB3%=450:IF Windo=15 THEN YB3%=490
         SetRect BeamRect3%(0),XB3%,YB3%,XB3%+15,YB3%+15
        CALL PAINTRECT (VARPTR(BeamRect3%(0)))
         MOVETO XB3%+20,YB3%+15:PRINT "Beam Pulsing      "
     END IF
      IF DispWindo(Xpt%,rgn%)=4 THEN
        XB4%=640:YB4%=450:IF Windo=15 THEN YB4%=490
         SetRect BeamRect4%(0),XB4%,YB4%,XB4%+15,YB4%+15
        CALL PAINTRECT (VARPTR(BeamRect4%(0)))
         MOVETO XB4%+20,YB4%+15:PRINT "Beam Pulsing      "
     END IF
ELSE
 REM PulseStatus%=0
   CALL CTR.Stop(BD2%,LDErr&,CNTR%)
    REM turn BeamPulsing Light off
      XB1%=0:YB1%=0:IF Windo=15 THEN YB1%=40
       SetRect BeamRect1%(0),XB1%,YB1%,XB1%+15,YB1%+15
      MOVETO XB1%+20,YB1%+15
      IF BeamStatus=0 THEN
      REM Voltage off
        GOSUB Black:PRINT "Beam Off        "
     ELSE
      REM Voltage on
        IF BeamMode=1 THEN
          GOSUB Red:PRINT "Beam DC         "
        ELSE
          GOSUB Black:PRINT "Beam Deflected     "
          END IF:REM BeamMode=1
        END IF:REM BeamStatus
        CALL PAINTRECT (VARPTR(BeamRect1%(0)))

    IF DispWindo(Xpt%,rgn%)=1 THEN
      XB1%=0:YB1%=0:IF Windo=15 THEN YB1%=40
       SetRect BeamRect1%(0),XB1%,YB1%,XB1%+15,YB1%+15
    MOVETO XB1%+20,YB1%+15
      IF BeamStatus=0 THEN
        GOSUB Black:PRINT "Beam Off        "
      ELSE
       REM Voltage on
        IF BeamMode=1 THEN
          GOSUB Red:PRINT "Beam DC         "
        ELSE
          GOSUB Black:PRINT "Beam Deflected     "
```

```
      END IF:REM BeamMode=1
     END IF:REM BeamStatus
     CALL PAINTRECT (VARPTR(BeamRect1%(0)))
   END IF

    IF DispWindo(Xpt%,rgn%)=2 THEN
      XB2%=640:YB2%=0:IF Windo=15 THEN YB2%=40
       SetRect BeamRect2%(0),XB2%,YB2%,XB2%+15,YB2%+15
    MOVETO XB2%+20,YB2%+15
      IF BeamStatus=0 THEN
        GOSUB Black:PRINT "Beam Off         "
     ELSE
      REM Voltage on
        IF BeamMode=1 THEN
          GOSUB Red:PRINT "Beam DC          "
        ELSE
          GOSUB Black:PRINT "Beam Deflected     "
        END IF:REM BeamMode=1
      END IF:REM BeamStatus
    CALL PAINTRECT (VARPTR(BeamRect2%(0)))
   END IF

    IF DispWindo(Xpt%,rgn%)=3 THEN
      XB3%=0:YB3%=450:IF Windo=15 THEN YB3%=490
       SetRect BeamRect3%(0),XB3%,YB3%,XB3%+15,YB3%+15
    MOVETO XB3%+20,YB3%+15
      IF BeamStatus=0 THEN
        GOSUB Black:PRINT "Beam Off         "
     ELSE
      REM Voltage on
        IF BeamMode=1 THEN
          GOSUB Red:PRINT "Beam DC          "
        ELSE
          GOSUB Black:PRINT "Beam Deflected     "
        END IF:REM BeamMode=1
      END IF:REM BeamStatus
    CALL PAINTRECT (VARPTR(BeamRect3%(0)))
   END IF

    IF DispWindo(Xpt%,rgn%)=4 THEN
      XB4%=640:YB4%=450:IF Windo=15 THEN YB4%=490
       SetRect BeamRect4%(0),XB4%,YB4%,XB4%+15,YB4%+15
    MOVETO XB4%+20,YB4%+15
      IF BeamStatus=0 THEN
        GOSUB Black:PRINT "Beam Off         "
     ELSE
      REM Voltage on
        IF BeamMode=1 THEN
            GOSUB Red:PRINT "Beam DC          "
          ELSE
            GOSUB Black:PRINT "Beam Deflected     "
          END IF:REM BeamMode=1
        END IF:REM BeamStatus
      CALL PAINTRECT (VARPTR(BeamRect4%(0)))
      END IF:REM DispWindo
     END IF:REM PulseStatus%
    END IF:REM PulseWidth&
    GOSUB Black
RETURN
REM ---------------------------------------------------------------

SetBeamMode:
SELECT CASE BeamMode
  CASE 0:'  Beam Deflected
    N%=SCU%:N$=CHR$(N%)
    A%=2:A$=CHR$(A%)
    F%=24:F$=CHR$(F%)
```

```
  GOSUB CamacWrite
 CASE 1:'   Beam DC
'  BEEP:BEEP:BEEP
   N%=SCU%:N$=CHR$(N%)
   A%=2:A$=CHR$(A%)
   F%=26:F$=CHR$(F%)
  GOSUB CamacWrite
 CASE 2:'   Beam Pulsed
'  BEEP:BEEP
   N%=SCU%:N$=CHR$(N%):'   set beam deflected
   A%=2:A$=CHR$(A%)
   F%=24:F$=CHR$(F%)
  GOSUB CamacWrite
 CASE 3:'   Beam Single Shot
   N%=SCU%:N$=CHR$(N%):'   set beam deflected
   A%=2:A$=CHR$(A%)
   F%=24:F$=CHR$(F%)
  GOSUB CamacWrite
 REM Fire Single pulse & turn button 44 off
  GOSUB FireBeam
  BEEP
   But44Win7=1:BUTTON 44,But44Win7
END SELECT
RETURN
REM ------------------------------------------------------------------

SetClocks:
    IF TofTime1<>0 THEN FreqAmax=PtsPerScan/TofTime1:ELSE FreqAmax=10:'   MHz
    IF TofTime2<>0 THEN FreqBmax=PtsPerScan/TofTime2:ELSE FreqBmax=10:'   MHz
 REM  Set Clock A
     N%=SCU%:N$=CHR$(N%)
     A%=1:A$=CHR$(A%)
     F%=16:F$=CHR$(F%)
     W1%=0:W1$=CHR$(W1%)
     W2%=0:W2$=CHR$(W2%)

    IF FreqAmax>100 THEN
      FreqA=100:W3%=3
     ELSEIF FreqAmax>50 THEN
       FreqA=50:W3%=2
     ELSEIF FreqAmax>25 THEN
       FreqA=25:W3%=1
     ELSE
       FreqA=10:W3%=0
    END IF
    REM  Diagnostic*****************
    '        FreqA=10:W3%=0
    REM  Diagnostic*****************

      W3$=CHR$(W3%)
        Msg5$="ClkA=":Msg5=FreqA
      IF GPIB=1 THEN GOSUB CamacWrite
     REM  Set Clock B
        N%=SCU%:N$=CHR$(N%)
        A%=2:A$=CHR$(A%)
        F%=16:F$=CHR$(F%)
        W1%=0:W1$=CHR$(W1%)
        W2%=0:W2$=CHR$(W2%)

       IF FreqBmax>100 THEN
         FreqB=100:W3%=3
        ELSEIF FreqBmax>50 THEN
          FreqB=50:W3%=2
        ELSEIF FreqBmax>25 THEN
          FreqB=25:W3%=1
        ELSE
          FreqB=10:W3%=0
```

```
END IF
REM Diagnostic****************
'       FreqB=10:W3%=0
REM Diagnostic****************

 W3$=CHR$(W3%)
   Msg6$="ClkB=":Msg6=FreqB
 IF GPIB=1 THEN GOSUB CamacWrite
REM Set DataDone counter to slow clock
 N%=SCU%:N$=CHR$(N%)
 A%=0:A$=CHR$(A%)

 IF FreqA>FreqB THEN: F%=10:FreqDD=FreqB
 IF D1sig=0 THEN: F%=10:FreqDD=FreqB
 IF FreqA<FreqB THEN: F%=8:FreqDD=FreqA
 IF D2sig=0 THEN: F%=8:FreqDD=FreqA

 F$=CHR$(F%)
 IF GPIB=1 THEN GOSUB CamacWrite
REM Calculate DataDone Time
 DataDoneTime=PtsPerScan/FreqDD
RETURN
REM ----------------------------------------------------------------

SetColor:
  SELECT CASE ColorSet(Xpt%,rgn%)
    CASE 0:GOSUB White
    CASE 1:GOSUB Red
    CASE 2:GOSUB Blue
    CASE 3:GOSUB Green
    CASE 4:GOSUB Magenta
    CASE 5:GOSUB Cyan
    CASE 5: GOSUB Yellow
    CASE ELSE: GOSUB White
  END SELECT
RETURN
REM ----------------------------------------------------------------

SetDataDone:
 '  MOVETO 550,200:PRINT USING "####."; PtsPerScan
 N%=SCU%:N$=CHR$(N%)
 A%=0:A$=CHR$(A%)
 F%=16:F$=CHR$(F%)
 W1%=0:W2%=0
   IF PtsPerScan=512 THEN W3%=0
   IF PtsPerScan=1024 THEN W3%=1
   IF PtsPerScan=2048 THEN W3%=3
   IF PtsPerScan=4096 THEN W3%=7
   IF PtsPerScan=8192 THEN W3%=15
 W1$=CHR$(W1%)
 W2$=CHR$(W2%)
 W3$=CHR$(W3%)
 GOSUB CamacWrite
RETURN
REM ----------------------------------------------------------------

SetNewMax:
MaxDex=MaxIndex(DispWindo(Xpt%,tgn%))
MaxLoop:
 MaxDex=MaxDex+1
 IF MaxDex>22 THEN MaxDex=1
 IF DataVal&>MaxVal(22) THEN:BEEP:BEEP:MaxDex=22
 IF DataVal&>MaxVal (MaxDex) AND MaxDex<22 THEN GOTO MaxLoop
 Max=MaxVal(MaxDex)
 MaxIndex (DispWindo (Xpt%,rgn%))=MaxDex
RETURN
```

```
REM *****Scanned Experiments*****************

ClearDisplay:
PENMODE 8
FOR rg%=0 TO 4
IF DispWindo(Xpt%,rg%)=1 THEN
  X1%=100:Y1%=39
  SetRect Rect1%(0),X1%,Y1%,X1%+501,Y1%+401
  GOSUB White
  CALL PAINTRECT (VARPTR(Rect1%(0)))
  GOSUB Black
  CALL FRAMERECT (VARPTR(Rect1%(0)))
END IF
IF DispWindo(Xpt%,rg%)=2 THEN
  X2%=740:Y2%=39
  SetRect Rect2%(0),X2%,Y2%,X2%+501,Y2%+401
  GOSUB White
  CALL PAINTRECT (VARPTR(Rect2%(0)))
  GOSUB Black
  CALL FRAMERECT (VARPTR(Rect2%(0)))
END IF
IF DispWindo(Xpt%,rg%)=3 THEN
  X3%=100:Y1%=489
  SetRect Rect3%(0),X3%,Y3%,X3%+501,Y3%+401
  GOSUB White
  CALL PAINTRECT (VARPTR(Rect3%(0)))
  GOSUB Black
  CALL FRAMERECT (VARPTR(Rect3%(0)))
END IF
IF DispWindo(Xpt%,rg%)=4 THEN
  X4%=740:Y1%=489
  SetRect Rect4%(0),X4%,Y4%,X4%+501,Y4%+401
  GOSUB White
  CALL PAINTRECT (VARPTR(Rect4%(0)))
  GOSUB Black
  CALL FRAMERECT (VARPTR(Rect4%(0)))
END IF
NEXT
RETURN
REM -----------------------------------------------------------------

Dwell1:
  TimeMax!=500
  IF mSecStep1>=500 THEN
    FOR i=1 TO Ndwl1:GOSUB DwellLoop1:NEXT
  END IF
    TimeMax!=mSecStep1-Ndwl1*500
    IF TimeMax!>0 THEN GOSUB DwellLoop1
RETURN
DwellLoop1:
  REM ** Start delay counter
    Iderror&=0:cnt%=0
    CALL CTR.EvCount(BD2%,Iderror&,ctr5%,TimeBase5%,cnt%)
  REM Delay until next event readout
    Wait1:
      Iderror&=0:overflo5%=0
      CALL CTR.EvRead(BD2%,Iderror&,ctr5%,overflo5%,Count5&)
    IF Count5&<TimeMax! THEN GOTO Wait1
RETURN
REM -----------------------------------------------------------------

Dwell2:
  TimeMax!=500
  IF mSecStep2>=500 THEN
    FOR i=1 TO Ndwl2:GOSUB DwellLoop2:NEXT
  END IF
    TimeMax!=mSecStep2-Ndwl2*500
```

```
    IF TimeMax!>0 THEN GOSUB DwellLoop2
RETURN
DwellLoop2:
  REM ** Start delay counter
    Iderror&=0:cnt%=0
    CALL CTR.EvCount(BD2%,Iderror&,ctr5%,TimeBase5%,cnt%)
  REM Delay until next event readout
    Wait2:
      Iderror&=0:overflo5%=0
      CALL CTR.EvRead(BD2%,Iderror&,ctr5%,overflo5%,Count5&)
    IF Count5&<TimeMax! THEN GOTO Wait2
RETURN
REM ------------------------------------------------------------


Manual:
    IF Expt$=Expt1$ AND FirstManual1=0 THEN
      FirstManual1=1:Continue1=1
      StepDirOld=StepDir
      ScanStartOld(Xpt%,rgn%)=ScanStart(Xpt%,rgn%)
      ScanEndOld(Xpt%,rgn%)=ScanEnd(Xpt%,rgn%)
      ScanDeltOld=ScanDelt
    END IF
    IF Expt$=Expt2$ AND FirstManual2=0 THEN
      FirstManual1=1:Continue1=1
      StepDirOld=StepDir
      ScanStartOld(Xpt%,rgn%)=ScanStart(Xpt%,rgn%)
      ScanEndOld(Xpt%,rgn%)=ScanEnd(Xpt%,rgn%)
      ScanDeltOld=ScanDelt
    END IF

    KeyCheck:
    A$=INKEY$
    FOR i = 1 TO 29:B$=INKEY$:NEXT
    IF A$="" THEN StepDir=0
    '  IF A$="" THEN GOTO KeyCheck
    IF ASC(A$)=28 THEN StepDir=-1*StepDirOld:RETURN:REM Left arrow
    IF ASC(A$)=29 THEN StepDir=StepDirOld:RETURN:REM Right arrow
    IF ASC(A$)=30 THEN StepDir=3*StepDirOld:RETURN:REM Up arrow
    IF ASC(A$)=31 THEN StepDir=-3*StepDirOld:RETURN:REM Down arrow
    '  IF ASC(A$)=1 THEN ScanStart(Xpt%,rgn%)=Scan:return:REM Home key
    '  IF ASC(A$)=4 THEN ScanEnd(Xpt%,rgn%)=Scan:return:REM End key
    '  IF ASC(A$)=12 THEN ScanStart(Xpt%,rgn%)=ScanStartOld(Xpt%,rgn%):return:REM Page down key
    '  IF ASC(A$)=11 THEN ScanEnd(Xpt%,rgn%)=ScanEndOld(Xpt%,rgn%):return:REM Page up key
    IF ASC(A$)=27 THEN:BEEP: GOSUB ClearDisplay:REM Clear key
    '  MOVETO 5, 340:PRINT StepDir
    IF A$="." THEN mSecStep(Xpt%)=mSecStep(Xpt%)/2:SecStep(Xpt%)=mSecStep(Xpt%)/1000:REM faster
    IF A$="," THEN mSecStep(Xpt%)=mSecStep(Xpt%)*2:SecStep(Xpt%)=mSecStep(Xpt%)/1000:REM Slower
RETURN
REM ------------------------------------------------------------


MPX:
REM  Multiplex Spectrum
TEXTSIZE(9)
TEXTFONT 3
Leave15=0
IF Expt$="AES" THEN MOVETO 5,45:PRINT "AES MPX":MOVETO 5,65:PRINT "eV"
IF Expt$="XPS" THEN MOVETO 5,45:PRINT "XPS MPX":MOVETO 5,65:PRINT "eV"
IF Expt$="UPS" THEN MOVETO 5,45:PRINT "UPS MPX":MOVETO 5,65:PRINT "eV"
IF Expt$="SIM" THEN MOVETO 5,45:PRINT "SIMS MPX":MOVETO 5,65:PRINT "amu"
IF Expt$="IEA" THEN MOVETO 5,45:PRINT "IEA MPX":MOVETO 5,65:PRINT "eV"
MOVETO 5,95:PRINT "Cps"
' ***temporary****
IF Expt$=Expt1$ THEN Xpt%=1
IF Expt$=Expt2$ THEN Xpt%=2
```

```
rgn%=1
' ***temporary****
DispWindo(Xpt%,rgn%)=1
REM set analyzer energy
REM initialize analyzer
RETURN
REM --------------------------------------------------------------


Profil:
MOVETO 5,40:PRINT "Profile"
MOVETO 5,50:PRINT "eV"
MOVETO 5,70:PRINT "Cps"
REM Depth Profile
RETURN
REM --------------------------------------------------------------

Survey:
REM  Survey Spectrum
CALL TEXTSIZE(9)
TEXTFONT 3
Leave15=0
GOSUB Black
GOSUB ClearDisplay
IF Expt$=Expt1$ THEN GOSUB Survey1
IF Expt$=Expt2$ THEN GOSUB Survey2
RETURN

Survey1:
  IF Expt$="AES" THEN MOVETO 5,45:PRINT "AES "+Mode1$:MOVETO 5,65:PRINT "eV"
  IF Expt$="XPS" THEN MOVETO 5,45:PRINT "XPS "+Mode1$:MOVETO 5,65:PRINT "eV"
  IF Expt$="UPS" THEN MOVETO 5,45:PRINT "UPS "+Mode1$:MOVETO 5,65:PRINT "eV"
  MOVETO 5,95:PRINT "Cps"
'  FOR rgn%=1 TO RegionMax(1)
'  FOR Cycle=1 TO Ncycles(Xpt%,rgn%)
   ' ***temporary****
'  Xpt%=1
  rgn%=0
  DispWindo(Xpt%,rgn%)=1
   ' ***temporary****
  Dwindo%=DispWindo(Xpt%,rgn%)
  Xpt(Dwindo%)=Xpt%
  rgn(Dwindo%)=rgn%
  REM set analyzer energy
     ScanDelt=ScanEnd(Xpt%,rgn%)-ScanStart(Xpt%,rgn%)
'  MOVETO 100,460:PRINT ScanStart(Xpt%,rgn%),ScanEnd(Xpt%,rgn%),ScanDelt

    IF ScanMax(Xpt%)<>ScanMin(Xpt%) THEN ScanFactor=10/(ScanMax(Xpt%)-ScanMin(Xpt%))
'     ScanStart(Xpt%,rgn%)(Dwindo%)=ScanStart(Xpt%,rgn%)
'    ScanEnd(Xpt%,rgn%)(Dwindo%)=ScanEnd(Xpt%,rgn%)
    Nsteps%(Xpt%,rgn%)=ABS(ScanDelt/StepSize(Xpt%))
   Oflo=0
   Nstep%=0
 MaxIndex(DispWindo(Xpt%,rgn%))=1
 CntMax(Dwindo%)=10
 StartTimer!=TIMER
   REM *******Initialize data***********************************
 InitData1:
   bin=0
   Manual1=0:MENU 2,2,1
    mSecStep1=mSecStep(Xpt%):SecStep1=mSecStep1/1000
   Pause1=0:MENU 2,3,1
   Continue1=0:MENU 2,4,1
   LastScan1=0:MENU 2,5,1
   Reset1=0:MENU 2,6,1
   EndScan1=0:MENU 2,7,1
```

```
 Abort1=0:MENU 2,8,1
 FirstPlot1=0
Xpt%=1
 IF Reset1=1 THEN: Reset1=0:Nscan1=1
 IF PulseInput1=1 THEN
   MOVETO 100,35:PRINT "Pulse Input    "
 ELSE
   MOVETO 100,35:PRINT "Analog Input   "
 END IF
' *****************
'  FOR rgn%=1 TO 4
     FOR i=0 TO 1024
         Data1&(rgn%,i)=0
    NEXT
'   NEXT

InitDac1:
  REM initialize analyzer
  TEXTFONT 3:TEXTSIZE 9
  eV=ScanStart(Xpt%,rgn%):Scan=eV
  IF Nscans1>1 THEN
    MOVETO 5,380
    IF Accum1=1 THEN PRINT "Accumulative"
    IF Accum1=0 THEN PRINT "Sequential"
  END IF
  MOVETO 5,420:PRINT "Scan";Nscan1
  MOVETO 5,440:PRINT"End ";Nscans1
  MOVETO 5,340:PRINT "              "
  MOVETO 5,340:PRINT "Scanning"
SetDac1:
    IF ScanDelt<>0 THEN
      ScanRatio=ABS((Scan-ScanStart(Xpt%,rgn%))/(ScanDelt))
       bin=Npts1(rgn%)*ScanRatio:bin%=bin
      '  bin=bin+1:bin%=bin
      voltage=(Scan-ScanMin(Xpt%))*ScanFactor
     Ochan%=0
     GOSUB Dac
    END IF

REM read data
  MOVETO 5,200:PRINT "mSecStep=";mSecStep(Xpt%)
  IF Datain<>0 THEN
    IF PulseInput1=1 THEN
      ctr%=1:GOSUB PulseCount1
    ELSE
      GOSUB Dwell1
      Ichan%=0:GOSUB ADC
       Counts1&=.7*Reading%
    END IF
  ELSE
     IF PulseInput1=0 THEN Counts1&=2*ABS(bin-100*INT(bin/100))-100
     IF PulseInput1=1 THEN Counts1&=ABS(bin-100*INT(bin/100))
  END IF
  IF Manual1=1 THEN Data1&(rgn%,bin%)=0
   Data1&(rgn%,bin%)=Counts1& + Data1&(rgn%,bin%)
  DataTim1&(rgn%,bin%)=TIMER
   Xval1(rgn%,bin%)=Scan
  GOSUB PlotData
' ELSEIF PulseInput=1 AND Deriv=1 THEN
'   GOSUB PlotDeriv
' END IF
  REM *********diagnostic*******************
IF MOUSE(0)=0 OR in%=0 THEN
REM Print values
  Blank$="          "
  MOVETO 10,75:PRINT USING "####.##"; Scan:REM ,xplt%
   MOVETO 10,110:PRINT USING "#######."; Counts1&:REM ,yplt%
```

```
END IF
REM Check user requests
REM data cursor during scan
  IF MOUSE(0)<0 AND ROIS=0 THEN
    GOSUB Cursor
  ELSE
  PENMODE 10
    IF FirstXCrsr=1 THEN  MOVETO mousxOld%,Y0C%:LINETO mousxOld%,Y0C%+400:FirstXCrsr=0:'
Erase old Xcursor if it exists
    IF FirstYCrsr=1 THEN  MOVETO X0C%,mousyOld%:LINETO X0C%+500,mousyOld%:FirstYCrsr=0:'
Erase old Ycursor if it exists
    SHOWCURSOR
  END IF
REM Check menu selection
  IF MenuSel>0 THEN GOSUB MenuCheck:GOSUB SurvMenu1
    IF EndScan1=1 THEN:EndScan1=0: GOTO DataSurveyWrite1:REM Save Data & End Scan
    IF MenuSel=28 THEN:MenuSel=0:GOTO Scan1End:REM Abort (lose data)
    IF MenuSel=31 THEN MenuSel=0:Leave15=1:GOTO StartHere
    IF MenuSel=316 THEN:MenuSel=0: Leavego=1:GOTO DrissSet

Pause1Here: IF Pause1=1 AND MenuSel=0 THEN: MOVETO 5,360:PRINT "Scan ";Nscan1: GOTO Pause1Here
  IF Reset1=1 THEN: Reset1=0: Nscan1=1:GOTO Survey
  IF Manual1=1 THEN GOSUB Manual

REM step analyzer
  eV=eV+eVStep*StepDir
   IF (ScanDelt>0 AND eV<ScanStart(Xpt%,rgn%)) OR (ScanDelt<0 AND eV>ScanStart(Xpt%,rgn%)) THEN
     eV=ScanStart(Xpt%,rgn%)
  END IF
  Scan=eV
  IF eV<=ScanEnd(Xpt%,rgn%) AND ScanDelt>0 THEN GOTO SetDac1
  IF eV>=ScanEnd(Xpt%,rgn%) AND ScanDelt<0 THEN GOTO SetDac1
  bin=0

DataSurveyWrite1:
  EndTimer!=TIMER:MOVETO 610,440:PRINT EndTimer!-StartTimer!
  REM Write data to file
   IF HeaderFil$<>"" THEN
     MOVETO 200,35:PRINT "Writing Data"
     Nscan1$=STR$(Nscan1)
     IF LEN (Nscan1$) <3 THEN Nscan1$="0"+RIGHT$(Nscan1$,1)
    IF Accum1=0 THEN
       Data1$=HeaderFil$+Expt1$+Mode1$+Tim$+" "+Nscan1$+" "+Dat$
    ELSEIF Accum1=1 THEN
       Data1$=HeaderFil$+Expt1$+Mode1$+Tim$+" 00 "+Dat$
    END IF:REM Accum1=0
    IF Npts1(rgn%)>1 THEN
      IF Expt1$="AES" THEN OffsetVolt=0
      IF Expt1$="XPS" THEN OffsetVolt=Xphoton
      IF Expt1$="UPS" THEN OffsetVolt=Uphoton
     IF Nscans1=1 THEN Data1$=HeaderFil$+Expt1$+Mode1$+Tim$+" 00 "+Dat$
    OPEN Data1$ FOR OUTPUT AS #3
      IF Expt1$="AES" THEN
          PRINT #3,"Time";T$;"eVkinetic";T$;"eVOffset";T$;"Counts";T$;Npts1(rgn%);T$;IndexFil$
        FOR bin%=0 TO Npts1(rgn%)
           PRINT #3, DataTim1&(rgn%,bin%);T$; Xval1(rgn%,bin%);T$; ABS(Xval1(rgn%,bin%)-
OffsetVolt);T$;Data1&(rgn%,bin%)
        NEXT
      END IF

      IF Expt1$="XPS" AND ScanXstart<ScanXend THEN
          PRINT #3,"Time";T$;"eVbinding";T$;"eVkinetic";T$;"Counts";T$;Npts1(rgn%);T$;IndexFil$
        FOR bin%=0 TO Npts1(rgn%)
          PRINT #3, DataTim1&(rgn%,bin%);T$; ABS(Xval1(rgn%,bin%)-
OffsetVolt);T$;Xval1(rgn%,bin%);T$;Data1&(rgn%,bin%)
        NEXT
      END IF
```

```
        IF Expt1$="XPS" AND ScanXstart>ScanXend THEN
            PRINT #3,"Time";T$;"eVbinding";T$;"eVkinetic";T$;"Counts";T$;Npts1(rgn%);T$;IndexFil$
          FOR bin%=0 TO Npts1(rgn%)
             PRINT #3, DataTim1&(rgn%,bin%);T$; Xval1(rgn%,bin%);T$; ABS(Xval1(rgn%,bin%)-
OffsetVolt);T$;Data1&(rgn%,bin%)
          NEXT
        END IF

        CLOSE #3
      END IF
      MOVETO 200,35:PRINT "                "
    END IF:REM HeaderFil$

  Scan1End:
    '  BEEP:'  End of Scan
    MOVETO 5,360:PRINT "Scan";Nscan1
    MOVETO 5,380:PRINT "End";Nscans1
    Nscan1=Nscan1+1
    FirstPlot1=1

    IF Manual1=1 THEN GOTO InitDac1
    IF (Nscan1<=Nscans1 OR Continue1=1) AND Accum1 =0 THEN GOTO InitData1
    IF (Nscan1<=Nscans1 OR Continue1=1) AND Accum1 =1 THEN GOTO InitDac1
    MOVETO 5,340:PRINT "              "
    MOVETO 5,340:PRINT "End of Scan"
REM Refresh Plot
MOVETO 200,35:PRINT "Updating"
  FOR rgn%=0 TO NRegionMax1
    FOR rebin=1 TO Npts1(rgn%)
      IF ScanDelt<>0 THEN
          ScanRatio=rebin/Npts1(rgn%)
          Scan=ScanRatio*ScanDelt+ScanStart(Xpt%,rgn%)
        GOSUB RePlotData
      END IF
    NEXT
  NEXT
MOVETO 200,35:PRINT "                "
BEEP
'  NEXT:'  Ncycles(Xpt%,rgn%)
'  NEXT:'  rgn%
RETURN
REM ------------------------------------------------------------

SurvMenu1:
    IF MenuSel=22 THEN
      MenuSel=0
      IF Manual1=0 THEN
        Manual1=1:MENU 2,2,2
        GOSUB ClearDisplay
        MOVETO 5,340:PRINT "              "
        MOVETO 5,340:PRINT "Manual":REM Manual Mode On
      ELSEIF Manual1=1 THEN
        Manual1=0:MENU 2,2,1
        GOSUB ClearDisplay
        Reset1=1
        FirstManual1=0
        StepDir=StepDirOld
      END IF
    END IF

    IF MenuSel=23 THEN
      MenuSel=0
      IF Pause1=0 THEN
        Pause1=1:MENU 2,3,2
        MOVETO 5,340:PRINT "              "
        MOVETO 5,340:PRINT "Pause":REM Pause
      ELSEIF Pause1=1 THEN
```

```
  Pause1=0:MENU 2,3,1
  MOVETO 5,340:PRINT "                    "
  MOVETO 5,340:PRINT "Scanning":REM Pause Off
 END IF
END IF

IF MenuSel=24 THEN
  MenuSel=0
  IF Continue1=0 THEN
   Continue1=1:MENU 2,4,2
   MOVETO 5,340:PRINT "                    "
   MOVETO 5,340:PRINT "Continuous":REM Continuous
  ELSEIF Continue1=1 THEN
   Continue1=0:MENU 2,4,1
   MOVETO 5,340:PRINT "                    "
   MOVETO 5,340:PRINT "Scanning":REM Pause Off
  END IF
END IF
   IF MenuSel=25 THEN
     MenuSel=0
     IF LastScan1=0 THEN
       Nscan1Old=Nscan1:Nscan1=Nscans1:REM Last Scan
       MOVETO 5,360:PRINT "Scan ";Nscan1
       LastScan1=1:MENU 2,5,2
     ELSEIF LastScan1=1 THEN
       MOVETO 5,360:PRINT "Scan ";Nscan1
       Nscan1=Nscan1Old
       MOVETO 5,360:PRINT "Scan ";Nscan1
        LastScan1=0:MENU 2,5,1:REM original scan no.
     END IF
   END IF

   IF MenuSel=26 THEN:MenuSel=0:Reset1=1:REM Reset Scan
   IF MenuSel=27 THEN
     MenuSel=0
      Nscan1=Nscans1:Continue1=0:EndScan1=1
     ' GOTO DataSurveyWrite1:REM Save Data & End Scan
   END IF
RETURN
REM ----------------------------------------------------------------

Survey2:
  IF Expt$="SIM" THEN MOVETO 5,45:PRINT "SIMS survey":MOVETO 5,65:PRINT "amu"
  IF Expt$="IEA" THEN MOVETO 5,45:PRINT "IEA survey":MOVETO 5,65:PRINT "eV"
  MOVETO 5,95:PRINT "Cps"
  ' ***temporary****
'  Xpt%=2
  rgn%=0
  DispWindo(Xpt%,rgn%)=1
  ' ***temporary****
  Dwindo%=DispWindo(Xpt%,rgn%)
  Xpt(Dwindo%)=Xpt%
  rgn(Dwindo%)=rgn%
  REM set analyzer energy
    ScanDelt=ScanEnd(Xpt%,rgn%)-ScanStart(Xpt%,rgn%)
    IF ScanMax(Xpt%)<>ScanMin(Xpt%) THEN ScanFactor=10/(ScanMax(Xpt%)-ScanMin(Xpt%))
'    ScanStart(Xpt%,rgn%)(Dwindo%)=ScanStart(Xpt%,rgn%)
'    ScanEnd(Xpt%,rgn%)(Dwindo%)=ScanEnd(Xpt%,rgn%)
    Nsteps%(Xpt%,rgn%)=ABS(ScanDelt/StepSize(Xpt%))
   Oflo=0
   Nstep%=0
    MaxIndex(DispWindo(Xpt%,rgn%))=1
   CntMax(Dwindo%)=10
  StartTimer!=TIMER
   REM *******Initialize data**********************************
  InitData2:
   bin=0
```

```
Manual2=0:MENU 2,2,1
mSecStep2=mSecStep(Xpt%):SecStep2=mSecStep2/1000
Pause2=0:MENU 2,3,1
Continue2=0:MENU 2,4,1
LastScan2=0:MENU 2,5,1
Reset2=0:MENU 2,6,1
EndScan2=0:MENU 2,7,1
Abort2=0:MENU 2,8,1
FirstPlot2=0
Xpt%=2
IF Reset2=1 THEN: Reset2=0:Nscan2=1
IF PulseInput2=1 THEN
   MOVETO 100,35:PRINT "Pulse Input    "
ELSE
   MOVETO 100,35:PRINT "Analog Input   "
END IF
' ****************
'  FOR rgn%=1 TO 4
     FOR i=0 TO 1024
        Data2&(rgn%,i)=0
     NEXT
'  NEXT

InitDac2:
REM initialize analyzer
  TEXTFONT 3:TEXTSIZE 9
  IF Expt$="SIM" THEN amu=ScanMStart:Scan=amu ELSE IEeV=ScanEStart:Scan=IEeV
    IF Nscans2>1 THEN
      MOVETO 5,380
      IF Accum2=1 THEN PRINT "Accumulative"
      IF Accum2=0 THEN PRINT "Sequential"
    END IF
    MOVETO 5,420:PRINT "Scan";Nscan2
    MOVETO 5,440:PRINT "End ";Nscans2
  MOVETO 5,340:PRINT "              "
  MOVETO 5,340:PRINT "Scanning"

SetDac2:
  IF ScanDelt<>0 THEN
     ScanRatio=ABS((Scan-ScanStart(Xpt%,rgn%))/(ScanDelt))
     bin=Npts2(rgn%)*ScanRatio:bin%=bin
     '  bin=bin+1:bin%=bin
     voltage=(Scan-ScanMin(Xpt%))*ScanFactor
    Ochan%=1
    GOSUB Dac
  END IF

REM read data
  MOVETO 5,200:PRINT "mSecStep=";mSecStep(Xpt%)
  IF Datain<>0 THEN
    IF PulseInput2=1 THEN
      ctr%=2:GOSUB PulseCount2
    ELSE
      GOSUB Dwell2
      Ichan%=1:GOSUB ADC
       Counts2&=.7*Reading%
    END IF
  ELSE
     IF PulseInput2=0 THEN Counts2&=2*ABS(bin-100*INT(bin/100))-100
     IF PulseInput2=1 THEN Counts2&=ABS(bin-100*INT(bin/100))
  END IF
  IF Manual2=1  THEN Data2&(rgn%,bin)=0
   Data2&(rgn%,bin)=Counts2& + Data2&(rgn%,bin)
  DataTim2&(rgn%,bin)=TIMER
   Xval2(rgn%,bin)=Scan
  GOSUB PlotData
  ELSEIF PulseInput=1 AND Deriv=1 THEN
```

```
'      GOSUB PlotDeriv
'    END IF
    REM *********diagnostic*******************
  REM Print values
    Blank$="                  "
     MOVETO 10,75:PRINT USING "####.##"; Scan:REM ,xplt%
     MOVETO 10,110:PRINT USING "#######."; Counts2&:REM ,yplt%
    IF MenuSel>0 THEN GOSUB MenuCheck:GOSUB SurvMenu2
       IF End2=1 THEN:End2=0: GOTO DataSurveyWrite2:REM Save Data & End Scan
       IF MenuSel=28 THEN:MenuSel=0:GOTO Scan2End:REM Abort (lose data)
       IF MenuSel=31 THEN MenuSel=0:Leave15=1:GOTO StartHere
       IF MenuSel=316 THEN:MenuSel=0: Leavego=1:GOTO DrissSet
       Pause2Here:
          IF Pause2=1 AND MenuSel=0 THEN: MOVETO 5,360:PRINT "Scan ";Nscan2: GOTO Pause2Here
       IF Reset2=1 THEN: Reset2=0: Nscan2=1:GOTO Survey
       IF Manual2=1 THEN GOSUB Manual

    REM step analyzer
      IF Expt$="SIM" THEN
         amu=amu+amuStep*StepDir
         IF (ScanDelt>0 AND amu<ScanStart(Xpt%,rgn%)) OR (ScanDelt<0 AND amu>ScanStart(Xpt%,rgn%)) THEN
            amu=ScanStart(Xpt%,rgn%)
        END IF
        Scan=amu
        IF amu<=ScanMEnd THEN GOTO SetDac2
         bin=0
     ELSEIF Expt$="IEA" THEN
        IEeV=IEeV+IEevStep*StepDir
        IF (ScanDelt>0 AND IEeV<ScanStart(Xpt%,rgn%)) OR (ScanDelt<0 AND IEeV>ScanStart(Xpt%,rgn%))
THEN
           IEeV=ScanStart(Xpt%,rgn%)
        END IF
        Scan=IEeV
        IF IEeV<=ScanEEnd THEN GOTO SetDac2
     END IF

DataSurveyWrite2:
   EndTimer!=TIMER:MOVETO 610,440:PRINT EndTimer!-StartTimer!
REM Write data to file
     IF HeaderFil$<>"" THEN
        Nscan2$=STR$(Nscan2)
        IF LEN (Nscan2$) <3 THEN Nscan2$="0"+RIGHT$(Nscan2$,1)
       IF Accum1=0 THEN
           Data2$=HeaderFil$+Expt2$+Mode2$+Tim$+" "+Nscan2$+" "+Dat$
       ELSEIF Accum2=1 THEN
           Data2$=HeaderFil$+Expt2$+Mode2$+Tim$+" 00 "+Dat$
       END IF:REM Accum2=0

       IF Npts2(rgn%)>1 THEN
          IF Nscans2=1 THEN Data2$=HeaderFil$+Expt2$+Mode2$+Tim$+" 00 "+Dat$
         OPEN Data2$ FOR OUTPUT AS #4
         IF Expt$="SIM" THEN
              PRINT #4,"Time";T$;"amu";T$;"Counts";T$;Npts2(rgn%);T$;Data2$
         ELSE
              PRINT #4,"Time";T$;"eV";T$;"Counts";T$;Npts2(rgn%);T$;IndexFil$
         END IF
         FOR bin%=0 TO Npts2(rgn%)
              PRINT #4, DataTim2&(rgn%,bin%);T$; Xval2(rgn%,bin%);T$; Data2&(rgn%,bin%)
         NEXT
         CLOSE #4
       END IF
    END IF:REM HeaderFil$<>""

  Scan2End:
   '  BEEP:'   End of Scan
    MOVETO 5,360:PRINT "Scan";Nscan2
    MOVETO 5,340:PRINT "End of Scan";Nscans2
```

```
Nscan2=Nscan2+1
FirstPlot2=1

IF Manual2=1 THEN GOTO InitDac2
IF (Nscan2<=Nscans2 OR Continue1=1) AND Accum2 =0 THEN GOTO InitData2
IF (Nscan2<=Nscans2 OR Continue2=1) AND Accum2 =1 THEN GOTO InitDac2
MOVETO 5,340:PRINT "                "
MOVETO 5,340:PRINT "End of Scan"
REM Refresh Plot
MOVETO 200,35:PRINT "Updating"
  FOR rgn%=0 TO NRegionMax2
    FOR rebin=1 TO Npts2(rgn%)
      IF ScanDelt<>0 THEN
        ScanRatio=rebin/Npts2(rgn%)
        Scan=ScanRatio*ScanDelt+ScanStart(Xpt%,rgn%)
       GOSUB RePlotData
      END IF
    NEXT
  NEXT
MOVETO 200,35:PRINT "                "
BEEP
RETURN
REM ------------------------------------------------------------

SurvMenu2:
      IF MenuSel=22 THEN
        MenuSel=0
        IF Manual2=0 THEN
          Manual2=1:MENU 2,2,2
          GOSUB ClearDisplay
          MOVETO 5,340:PRINT "                "
          MOVETO 5,340:PRINT "Manual":REM Manual Mode On
        ELSEIF Manual2=1 THEN
          Manual2=0:MENU 2,2,1
           mSecStep(Xpt%)=mSecStepSet:SecStep(Xpt%)=mSecStep(Xpt%)/1000
          GOSUB ClearDisplay
          Reset2=1
          FirstManual2=0
          StepDir=StepDirOld
        END IF
      END IF

      IF MenuSel=23 THEN
        MenuSel=0
        IF Pause2=0 THEN
          Pause2=1:MENU 2,3,2
          MOVETO 5,340:PRINT "                "
          MOVETO 5,340:PRINT "Pause":REM Pause
        ELSEIF Pause2=1 THEN
          Pause2=0:MENU 2,3,1
          MOVETO 5,340:PRINT "                "
          MOVETO 5,340:PRINT "Scanning":REM Pause Off
        END IF
      END IF

      IF MenuSel=24 THEN
        MenuSel=0
        IF Continue2=0 THEN
          Continue2=1:MENU 2,3,2
          MOVETO 5,340:PRINT "                "
          MOVETO 5,340:PRINT "Continuous":REM Continuous
        ELSEIF Continue2=1 THEN
          Continue2=0:MENU 2,3,1
          MOVETO 5,340:PRINT "                "
          MOVETO 5,340:PRINT "Scanning":REM Pause Off
        END IF
      END IF
```

```
IF MenuSel=25 THEN
  MenuSel=0
  IF LastScan2=0 THEN
     Nscan2Old=Nscan2:Nscan2=Nscans2:REM Last Scan
     MOVETO 5,360:PRINT "Scan ";Nscan2
     MOVETO 5,380:PRINT "Last Scan= ";Nscans2
     LastScan2=1:MENU 2,5,2
  ELSEIF LastScan2=1 THEN
     Nscan2=Nscan2Old
     MOVETO 5,360:PRINT "Scan ";Nscan2
     MOVETO 5,380:PRINT "Last Scan= ";Nscans2
     LastScan2=0:MENU 2,5,1:REM original scan no.
  END IF
END IF

IF MenuSel=26 THEN:MenuSel=0:Reset2=1:REM Reset Scan
IF MenuSel=27 THEN
  MenuSel=0
  Nscan2=Nscans2:Continue2=0:End2=1
  '  GOTO DataSurveyWrite2:REM Save Data & End Scan
END IF
RETURN
REM ------------------------------------------------------------

IEAMPX:
REM IEA Multiplex Spectrum
MOVETO 5,40:PRINT "SIM IEA MPX"
MOVETO 5,50:PRINT "eV"
MOVETO 5,70:PRINT "Cps"
RETURN

IEAProfil:
REM IEA Profile
MOVETO 5,40:PRINT "IEA Profile"
MOVETO 5,50:PRINT "eV"
MOVETO 5,70:PRINT "Cps"
RETURN

SIMMPX:
REM SIMS Multiplex Spectrum
MOVETO 5,40:PRINT "SIM MPX"
MOVETO 5,50:PRINT "eV"
MOVETO 5,70:PRINT "Cps"
RETURN

SIMProfil:
REM SIMS Profile
MOVETO 5,40:PRINT "SIM Profile"
MOVETO 5,50:PRINT "eV"
MOVETO 5,70:PRINT "Cps"
RETURN

UPSMPX:
REM UPS Multiplex Spectrum
MOVETO 5,40:PRINT "UPS MPX"
MOVETO 5,50:PRINT "eV"
MOVETO 5,70:PRINT "Cps"

RETURN

UPSProfil:
REM UPS Profile
MOVETO 5,40:PRINT "UPS Profile"
MOVETO 5,50:PRINT "eV"
MOVETO 5,70:PRINT "Cps"
RETURN
```

```
XPSMPX:

 REM XPS Multiplex Spectrum
 MOVETO 5,40:PRINT "XPS MPX"
 MOVETO 5,50:PRINT "eV"
 MOVETO 5,70:PRINT "Cps"

 RETURN

 XPSProfil:
 REM XPS Profile
 MOVETO 5,40:PRINT "XPS Profile"
 MOVETO 5,50:PRINT "eV"
 MOVETO 5,70:PRINT "Cps"
 RETURN
 REM -------------------------------------------------------------

Quit:
   REM Beam pulsing off
     PulseStatus%=0: GOSUB PulseGen
   REM reclaim heap space
     FOR Windo=1 TO 16:WINDOW CLOSE Windo:NEXT
     CLEAR
     PICTURE ON:PICTURE OFF
  END

REM **********Data Analysis Routines*******************************

GraphCursor:
  PENMODE 10
  mousxOld%=0:mousyOld%=0
  set1=0:Set2=0
  Cursor=1
'  IF Expt$<>Expt3$ THEN BinRange=500 ELSE BinRange=512

CursorDraw:
  GOSUB MenuCheck
  IF MenuSel=41 THEN
     MenuSel=0:Cursor=0
     MenuState41=1
     MENU 4,1,MenuState41
'    MOVETO mousxOld%,Y0C%:LINETO mousxOld%,Y0C%+400:'   Erase old Xcursor
'    MOVETO X0C%,mousyOld%:LINETO X0C%+500,mousyOld%:'   Erase old Ycursor
    SHOWCURSOR:RETURN
  END IF:REM MenuSel=41

  GetMouse pt%(0)
  PtInRects pt%(0),Recs%(0),4,in%:     REM in% is DispWindo in which cursor is located
  IF in%<>0 THEN
    HIDECURSOR
    Xpt%=Xpt(in%)
    IF Xpt%=3 THEN BinRange=512 ELSE BinRange=500
    rgn%=rgn(in%)
    mousx%=MOUSE(1)
    mousy%=MOUSE(2)
    REM calculate cursor values
    SELECT CASE in%
      CASE 1
         Xrange=(ScanEnd(Xpt%,rgn%)-ScanStart(Xpt%,rgn%))/BinRange
        Xcursor=Xrange*(mousx%-X1%)+ScanStart(Xpt%,rgn%)

'     MOVETO 100,440:PRINT Xpt%,rgn%,ScanStart(1,0),ScanEnd(1,0)
'     MOVETO 100,460:PRINT Xpt%,rgn%,ScanStart(Xpt%,rgn%),ScanEnd(Xpt%,rgn%)

        X0C%=X1%:Y0C%=Y1%
         Yrange=(CntMax(in%)-CntMin(in%))/400
```

```
        Ycursor=CntMax(in%)-Yrange*(mousy%-Y1%)
      CASE 2
        Xrange=(ScanEnd(Xpt%,rgn%)-ScanStart(Xpt%,rgn%))/BinRange
        Xcursor=Xrange*(mousx%-X2%)+ScanStart(Xpt%,rgn%)
        X0C%=X2%:Y0C%=Y2%
        Yrange=(CntMax(in%)-CntMin(in%))/400
        Ycursor=CntMax(in%)-Yrange*(mousy%-Y2%)
      CASE 3
        Xrange=(ScanEnd(Xpt%,rgn%)-ScanStart(Xpt%,rgn%))/BinRange
        Xcursor=Xrange*(mousx%-X3%)+ScanStart(Xpt%,rgn%)
        X0C%=X3%:Y0C%=Y3%
        Yrange=(CntMax(in%)-CntMin(in%))/400
        Ycursor=CntMax(in%)-Yrange*(mousy%-Y3%)
      CASE 4
        Xrange=(ScanEnd(Xpt%,rgn%)-ScanStart(Xpt%,rgn%))/BinRange
        Xcursor=Xrange*(mousx%-X4%)+ScanStart(Xpt%,rgn%)
        X0C%=X4%:Y0C%=Y4%
        Yrange=(CntMax(in%)-CntMin(in%))/400
        Ycursor=CntMax(in%)-Yrange*(mousy%-Y4%)
      CASE ELSE
        SHOWCURSOR
        IF Mous0=0 THEN GOTO CursorDraw
        '  GOSUB BaseLine
        '  GOTO CursorDraw
    END SELECT

    IF mousx%<>mousxOld% OR FirstXCrsr=0 THEN
      IF FirstPlt=0 THEN
        MOVETO mousx%,Y0C%:LINETO mousx%,Y0C%+400:'  Draw new Xcursor
      END IF
      IF FirstPt=0 THEN
        MOVETO mousxOld%,Y0C%:LINETO mousxOld%,Y0C%+400:'  Erase old Xcursor if it exists
      END IF
      FirstXCrsr=1
    END IF:REM mousx%<>mousxOld% OR FirstXCrsr=0

    IF mousy%<>mousyOld%  OR FirstYCrsr=0 THEN
      IF FirstPlt=0 THEN
        MOVETO X0C%,mousy%:LINETO X0C%+500,mousy%:'  Draw new Ycursor
      END IF
      IF FirstPt=0 THEN
        MOVETO X0C%,mousyOld%:LINETO X0C%+500,mousyOld%:'  Erase old Ycursor if it exists
      END IF
      FirstYCrsr=1
    END IF:REM mousy%<>mousyOld%  OR FirstYCrsr=0
    FirstPt=0
    mousxOld%=mousx%
    mousyOld%=mousy%
    Mous0=MOUSE(0)
    '--- Print Cursor Values
'   MOVETO 5,75:PRINT Blank$:MOVETO 5,110:PRINT Blank$
'   MOVETO 10,75:PRINT USING "####.##"; Xcursor
    MOVETO 10,75:PRINT USING "####.##"; Xmin3Plot+(Xcursor-Xmin3)*CursorScale
    MOVETO 10,110:PRINT USING "#######."; Ycursor:REM ,yplt%
  ELSE
    SHOWCURSOR
    FirstXCrsr=0:FirstYCrsr=0
    IF FirstPt=0 THEN
      MOVETO mousxOld%,Y0C%:LINETO mousxOld%,Y0C%+400:'  Erase old Xcursor if it exists
      MOVETO X0C%,mousyOld%:LINETO X0C%+500,mousyOld%:'  Erase old Ycursor if it exists
      FirstPt=1
    END IF
  END IF:REM in%<>0
' IF Mous0=0 THEN GOTO CursorDraw
```

```
IF Mous0<>0 THEN GOSUB BaseLine
GOTO CursorDraw
RETURN
REM ------------------------------------------------------------

BaseLine:
  FirstXCrsr=0
  FirstYCrsr=0
  MOVETO X0C%,mousyOld%:LINETO X0C%+500,mousyOld%:'  Erase old Y cursor
  MOVETO mousxOld%,Y0C%:LINETO mousxOld%,Y0C%+400:'  Erase old X cursor
  IF MOUSE(0)=0 THEN RETURN
  X1=MOUSE(3)
  Y1=MOUSE(4)
  MOVETO X1,Y1
  WHILE MOUSE(0)=-1
    MOVETO X1,Y1
    IF FirstPt=1 THEN LINETO X2,Y2
     FirstPt=1
    X2=MOUSE(5)
    Y2=MOUSE(6)
    MOVETO X1,Y1
    LINETO X2,Y2
  WEND
  IF X1<>X2 THEN MOVETO mousxOld%,Y0C%:LINETO mousxOld%,Y0C%+400:'  Erase old Xcursor
  IF Y1<>Y2 THEN MOVETO X0C%,mousyOld%:LINETO X0C%+500,mousyOld%:'  Erase old Ycursor
RETURN

Cursor:
  GetMouse pt%(0)
  PtInRects pt%(0),Recs%(0),4,in%:   REM in% is DispWindo in which cursor is located
  IF in%<>0 THEN
    HIDECURSOR
    PENMODE 10
    Xpt%=Xpt(in%)
    IF Xpt%=3 THEN BinRange=512 ELSE BinRange=500
    rgn%=rgn(in%)
    mousx%=MOUSE(1)
    mousy%=MOUSE(2)
    REM calculate cursor values
    SELECT CASE in%
      CASE 1
          Xrange=(ScanEnd(Xpt%,rgn%)-ScanStart(Xpt%,rgn%))/BinRange
         Xcursor=Xrange*(mousx%-X1%)+ScanStart(Xpt%,rgn%)
        X0C%=X1%:Y0C%=Y1%
          Yrange=(CntMax(in%)-CntMin(in%))/400
         Ycursor=CntMax(in%)-Yrange*(mousy%-Y1%)
      CASE 2
          Xrange=(ScanEnd(Xpt%,rgn%)-ScanStart(Xpt%,rgn%))/BinRange
         Xcursor=Xrange*(mousx%-X2%)+ScanStart(Xpt%,rgn%)
        X0C%=X2%:Y0C%=Y2%
          Yrange=(CntMax(in%)-CntMin(in%))/400
         Ycursor=CntMax(in%)-Yrange*(mousy%-Y2%)
      CASE 3
          Xrange=(ScanEnd(Xpt%,rgn%)-ScanStart(Xpt%,rgn%))/BinRange
         Xcursor=Xrange*(mousx%-X3%)+ScanStart(Xpt%,rgn%)
        X0C%=X3%:Y0C%=Y3%
          Yrange=(CntMax(in%)-CntMin(in%))/400
         Ycursor=CntMax(in%)-Yrange*(mousy%-Y3%)
      CASE 4
          Xrange=(ScanEnd(Xpt%,rgn%)-ScanStart(Xpt%,rgn%))/BinRange
         Xcursor=Xrange*(mousx%-X4%)+ScanStart(Xpt%,rgn%)
        X0C%=X4%:Y0C%=Y4%
          Yrange=(CntMax(in%)-CntMin(in%))/400
         Ycursor=CntMax(in%)-Yrange*(mousy%-Y4%)
```

```
      CASE ELSE
        SHOWCURSOR
    END SELECT
     REM ***trial***
    SHOWCURSOR
    IF mousx%<>mousxOld% OR FirstXCrsr=0 THEN
      IF ROIS=0 THEN
        MOVETO mousx%,Y0C%:LINETO mousx%,Y0C%+400:'   Draw new Xcursor
        IF FirstXCrsr=1 THEN: MOVETO mousxOld%,Y0C%:LINETO mousxOld%,Y0C%+400:'   Erase old
Xcursor if it exists
      END IF
       FirstXCrsr=1
       mousxOld%=mousx%
    END IF:REM mousx%<>mousxOld% OR FirstXCrsr=0

    IF mousy%<>mousyOld%  OR FirstYCrsr=0 THEN
      IF ROIS=0 THEN
        MOVETO X0C%,mousy%:LINETO X0C%+500,mousy%:'   Draw new Ycursor
        IF FirstYCrsr=1 THEN    MOVETO X0C%,mousyOld%:LINETO X0C%+500,mousyOld%:'   Erase old
Ycursor if it exists
      END IF
       FirstYCrsr=1
       mousyOld%=mousy%
    END IF:REM mousy%<>mousyOld%  OR FirstYCrsr=0
    IF Xpt%<3 THEN  XcursorVal=Xcursor
    IF Xpt%=3 THEN XcursorVal=Xmin3Plot+(Xcursor-Xmin3)*CursorScale
    MOVETO 10,75:PRINT USING "####.##"; XcursorVal
    MOVETO 10,110:PRINT USING "#######."; Ycursor:REM ,yplt%
  ELSE
    SHOWCURSOR
  END IF:REM in%<>0
  Mous0=MOUSE(0)
IF Mous0<>0  AND ROIS>0 THEN
  IF MenuState42=2 THEN GOSUB ViewROI
  IF MenuState43=2 THEN GOSUB AddROI
  IF MenuState44=2 THEN GOSUB AlterROI
END IF
RETURN
REM -----------------------------------------------------------------

REM Region of Interest (ROI) Routines

ViewROI:
RETURN

AddROI:
IF Mous0<0 THEN
   REM button still down
   REM ROI Start
     ROIStart(1)=XcursorVal
     PixStart%(1)=MOUSE(3)
   REM ROI End
     ROIEnd(1)=XcursorVal
     PixEnd%(1)=MOUSE(5)

   IF PixStart%(1)>PixEnd%(1) THEN
     Dummy=PixStart%(1)
     PixStart%(1)=PixEnd%(1)
     PixEnd%(1)=Dummy
     Dummy=ROIStart(1)
     ROIStart(1)=ROIEnd(1)
     ROIEnd(1)=Dummy
   END IF
   IF PixEnd%(1)<>PixEndOld%(1) OR PixStart%(1)<>PixStartOld%(1) THEN
```

```
REM Redraw selection rectangle
  PENMODE 8
  ForeColor Magenta%
   SetRect RectROI1%(0),PixStart%(1),Y0C%+1,PixEnd%(1),Y0C%+400
  CALL ERASERECT (VARPTR(RectROI1Old%(0)))
  CALL PAINTRECT (VARPTR(RectROI1%(0)))
  PENMODE 10
   IF PixStart%(1)<PixStartMin%(1) THEN  PixStartMin%(1)=PixStart%(1)
  IF PixEnd%(1)>PixEndMax%(1) THEN  PixEndMax%(1)=PixEnd%(1)
  PixEndOld%(1)=PixEnd%(1)
   PixStartOld%(1)=PixStart%(1)
  RectROI1Old%(0)=RectROI1%(0)
  RectROI1Old%(1)=RectROI1%(1)
  RectROI1Old%(2)=RectROI1%(2)
  RectROI1Old%(3)=RectROI1%(3)
 REM  now replot data
     BinStart%=(PixStartMin%(1)-X0C%)*BinRange/500
    PixStartMin%(1)=PixStart%(1)
    BinEnd%=(PixEndMax%(1)-X0C%)*BinRange/500
   PixEndMax%(1)=PixEnd%(1)
 MOVETO 300,450:PRINT BinStart%,BinEnd%
   FOR bin%=BinStart% TO BinEnd%
     IF Xpt%=1 THEN bin1%=bin%
     IF Xpt%=2 THEN bin2%=bin%
     IF Xpt%=3 THEN bin3%=bin%
     FOR rgn%=1 TO 2
       IF DispWindo (Xpt%,rgn%)>0 THEN GOSUB RePlotData
     NEXT
   NEXT
 END IF:REM Redraw selection rectangle
END IF:REM Mous0<0 (mouse depressed)
RETURN

AlterROI:
RETURN

 REM include "ChkErr.bas"
```

What is claimed is:

1. A time-of-flight direct recoil ion scattering spectrometer, comprising:

means for producing a paraxial beam of ions;

means for pulsing said beam of ions, said pulsing means operative to dynamically adjust the interval between successive beam pulses in accordance with the combination of ion beam mass and energy to maximize repetition rate consistent with resolved data separation, said means for pulsing comprising a plurality of pulsed deflection plates separated from each other by an ion drift space for removing ions with laterally directed velocities;

means for detecting particles emitted from a sample bombarded by said pulsed beam of ions; and means for providing differential pumping of an incoming ion beam path and an outgoing beam path of said spectrometer.

2. The spectrometer as defined in claim 1 wherein said pulsed deflection plates are coupled to means for applying a different voltage to different ones of said pulsed deflection plates.

3. The spectrometer as defined in claim 2 wherein said detector comprises a channeltron multiplier.

4. The spectrometer as defined in claim 3 wherein said channeltron multiplier comprises at least one smaller area detector and a segmented anode collector.

5. The spectrometer as defined in claim 2 wherein said detector comprises at least one detector disposed for detecting backscattered ones of said particles emitted from said sample.

6. The spectrometer as defined in claim 5 further including a detector disposed for detecting forward scattered ones of said particles emitted from said sample.

7. The spectrometer as defined in claim 6 further including a segmented anode collector.

8. The spectrometer as defined in claim 1 wherein said pulsing means includes means for directing signal events per ion beam pulse of consecutive signal events to separate data accumulation means.

9. The spectrometer as defined in claim 8 further including means for processing said consecutive signal events by adjusting time scale of each spectrum.

10. The spectrometer as defined in claim 1 wherein said differential pumping means includes a small aperture at the entrance to said means for detecting particles.

11. A method of performing time of flight direct recoil ion scattering spectrometry on a sample in a spectrometer, comprising the steps of:

producing a pulsed paraxial beam of ions and further including the steps of dynamically adjusting at least one of the interval between successive beam pulses and beam width, said paraxial beam of ions being transmitted through apertures of a plurality of deflection plates by selected timed removal of deflection voltages applied to said deflection plates;

detecting particles emitted from a sample bombarded by said pulsed beam of ions; and providing differential pumping of an incoming ion beam path and an outgoing beam path of said spectrometer.

12. The method as defined in claim 11 further including the step of aligning a sample area for analysis by said beam of ions by casting a bright pinpoint of light from a light source located on the detector axis onto an identifiable area of the sample to be examined.

13. The method as defined in claim 11 wherein said spectrometer includes an ion deflection region and deflection plates running the entire length of said ion deflection region thereby avoiding introduction of longitudinal velocity components to said ion beam.

14. The method as defined in claim 13 further including the step of forming a well-defined beam spot using ion beam focus means.

15. The method as defined in claim 14 wherein the beam spot size ranges upward from 1 micron in diameter.

16. The method as defined in claim 14 wherein said step of detecting particles includes using a coaxial detector having a segmented anode and a hole in the center and centered on the axis of said ion beam, and the hole allowing said beam of ions to scatter from a sample backward to said coaxial detector.

17. The method as defined in claim 16 wherein said coaxial detector comprises a segmented detector.

18. The method as defined in claim 14 wherein said ion beam focus means comprises an einzel lens capable of focusing said ion beam to a small spot, thereby providing high spatial resolution for performing high resolution surface analysis.

19. The method as defined in claim 11 where said step of producing a pulsed beam of ions includes executing a computer program by a computer to establish an ion beam pulse frequency based on ion beam mass and energy.

20. The method as defined in claim 11 wherein said step of detecting particles includes detection of more than one signal event per ion pulse by routing each said signal event to separate channels of a multi-channel input scaler.

21. The method as defined in claim 11 further including the step of ion beam analyzing a thin film during deposition.

22. The method as defined in claim 21 wherein said method is carried out at high pressure using a single differential pumping aperture plate disposed before the detector.

23. The method as defined in claim 11 further including the ability to perform depth profiling between performing time of flight scattering by the step of stopping pulsing of said beam of ions by removing deflection voltages applied to said deflection plates thereby applying a DC current of said beam of ions to the sample.

24. The method as defined in claim 11 further including the step of analyzing data produced by detecting the particles, including the steps of designating different portions of a memory for different detectors of said spectrometer and applying an offset to each detector signal and adding data characteristic of the detector signal into designated portions of said memory.

25. A time-of-flight direct recoil ion scattering spectrometer, comprising:

means for producing a paraxial beam of ions;

means for detecting particles emitted from a sample bombarded by said pulsed beam of ions;

a plurality of deflection plates for applying deflection fields to said beam of ions, said deflection plates separated from each other by an ion drift space for removing ions with laterally directed velocities; and means for providing differential pumping of an incoming ion beam path and an outgoing beam path of said spectrometer.

* * * * *